(12) United States Patent
Tamura et al.

(10) Patent No.: US 8,778,507 B2
(45) Date of Patent: Jul. 15, 2014

(54) ORGANIC ELECTROLUMINESCENT DEVICE, DISPLAY AND ILLUMINATING DEVICE

(75) Inventors: Junko Tamura, Tokyo (JP); Hiroshi Kita, Tokyo (JP); Eisaku Katoh, Tokyo (JP); Noriko Yasukawa, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 718 days.

(21) Appl. No.: 11/911,186

(22) PCT Filed: Apr. 6, 2006

(86) PCT No.: PCT/JP2006/307306
§ 371 (c)(1),
(2), (4) Date: Oct. 10, 2007

(87) PCT Pub. No.: WO2006/112265
PCT Pub. Date: Oct. 26, 2006

(65) Prior Publication Data
US 2009/0236974 A1    Sep. 24, 2009

(30) Foreign Application Priority Data
Apr. 14, 2005    (JP) .................................. 2005-116771

(51) Int. Cl.
| H01L 51/54 | (2006.01) |
| C09K 11/06 | (2006.01) |
| C09K 11/02 | (2006.01) |
| H05B 33/14 | (2006.01) |
| H05B 33/20 | (2006.01) |
| H01L 51/50 | (2006.01) |
| H01L 51/00 | (2006.01) |

(52) U.S. Cl.
CPC ......... *C09K 11/06* (2013.01); *C09K 2211/1011* (2013.01); *H01L 51/5036* (2013.01); *H01L 51/5016* (2013.01); *H01L 51/0085* (2013.01); *C09K 2211/1055* (2013.01); *C09K 2211/104* (2013.01); *C09K 11/025* (2013.01); *H01L 51/0081* (2013.01); *C09K 2211/1051* (2013.01); *C09K 2211/1033* (2013.01); *C09K 2211/1014* (2013.01); *C09K 2211/1007* (2013.01); *C09K 2211/1074* (2013.01); *C09K 2211/1044* (2013.01); *C09K 2211/185* (2013.01); *H05B 33/14* (2013.01); *C09K 2211/1059* (2013.01); *C09K 2211/1048* (2013.01); *C09K 2211/1088* (2013.01); *C09K 2211/107* (2013.01); *C09K 2211/1029* (2013.01); *H01L 2251/552* (2013.01); *H05B 33/20* (2013.01); *C09K 2211/1092* (2013.01); *H01L 51/0072* (2013.01); *C09K 2211/1037* (2013.01); *Y10S 428/917* (2013.01)

USPC .............. 428/690; 428/917; 313/504; 257/40

(58) Field of Classification Search
None
See application file for complete search history.

(56) References Cited

U.S. PATENT DOCUMENTS

| 7,371,469 B2 * | 5/2008 | Oshiyama et al. ............ 428/690 |
| 2005/0069729 A1 | 3/2005 | Ueda et al. |
| 2005/0123787 A1 * | 6/2005 | Robello et al. ................ 428/690 |
| 2006/0134461 A1 * | 6/2006 | Huo et al. ..................... 428/690 |

FOREIGN PATENT DOCUMENTS

| JP | 2001-110568 | 4/2001 |
| JP | 2004-221063 | 8/2004 |
| JP | 2006-128636 | 5/2006 |
| WO | 2004034751 A1 | 4/2004 |
| WO | WO 2005004549 A1 * | 1/2005 |

OTHER PUBLICATIONS

Inomata et al. "High-Efficiency Organic Electrophosphorescent Diodes Using 1,3,5-Triazine Electron Transport Materials" Chem. Mater. 2004, 16, 1285-1291. Date of web publication: Mar. 3, 2004.*
Publication 2: "Denshi Ido no Kagaku—Denkikagaku Nyumon (Chemistry of Electron Transfer—Introduction to Electrochemistry)", The Chemical Society of Japan, pp. 74-76.
Japanese Office Action, Notification of Reasons of Rejections, Japanese Patent No. 2012-266821, drafting date: Nov. 29, 2013 (3 pages).
English translation of Japanese Office Action, Notification of Reasons of Rejections, Japanese Patent No. 2012-266821, drafting date: Nov. 29, 2013 (3 pages).

* cited by examiner

*Primary Examiner* — Andrew K Bohaty
(74) *Attorney, Agent, or Firm* — Lucas & Mercanti, LLP

(57) ABSTRACT

Disclosed is an organic electroluminescent (EL) device having high emission luminance and high emission efficiency. Particularly disclosed are a blue-light emitting organic EL device, which is high in emission luminance, color purity, emission efficiency and durability, a display and an illuminating device each employing the organic EL device. The organic El device is characterized in that it comprises a light emission layer containing two or more kinds of host compounds and at least one dopant, wherein at least one of the two or more kinds of host compounds has an excited triplet energy of not less than 2.7 eV, and the dopant is a phosphorescent compound.

18 Claims, 4 Drawing Sheets

LIGHT

LIGHT

ORGANIC ELECTROLUMINESCENT DEVICE, DISPLAY AND ILLUMINATING DEVICE

FIELD OF THE INVENTION

This invention relates to an organic electroluminescent device (hereinafter also referred to as an EL device), and a display and an illuminating device each employing the same, and particularly to an EL device emitting light with high emission efficiency, and a display and an illuminating device each employing the same.

TECHNICAL BACKGROUND

As an emission type electronic displaying device, there is an electroluminescent device (ELD). As elements constituting the ELD, there are an inorganic electroluminescent device and an organic electroluminescent device. The inorganic electroluminescent device has been used for a plane-shaped light source, but a high voltage alternating current has been required to drive the device.

An organic EL device has a structure in which a light emission layer containing a light emission compound is arranged between a cathode and an anode, and an electron and a hole were injected into the light emission layer and recombined to form an exciton. The device emits light, utilizing light (fluorescent light or phosphorescent light) generated by inactivation of the exciton, and the device can emit light by applying a relatively low voltage of from several volts to several decade volts. The device has a wide viewing angle and a high visuality since the device is of self light emission type. Further, the device is a thin, complete solid device, and therefore, the device is noted from the viewpoint of space saving and portability.

However, an organic EL device for practical use is required which efficiently emits light with high luminance at a lower power.

A conventional organic EL device employs emission (i.e., fluorescence) through an excited singlet state. When light emitted through such an excited singlet state is used, the upper limit of the external quantum efficiency ($\eta$ext) is considered to be at most 5%, as the generation ratio of singlet excited species to triplet excited species is 1:3, that is, the generation probability of excited species capable of emitting light is 25%, and further, external light emission efficiency is 20%.

Since an organic EL element, employing phosphorescence through the excited triplet, was reported by Prinston University (for example, see Non-Patent Document 1 below), study on materials emitting phosphorescence at room temperature has been actively. The similar device as above was disclosed in Non-Patent Document 2 or Patent Document 1 below.

As the upper limit of the internal quantum efficiency of the excited triplet is 100%, the light emission efficiency of the excited triplet is theoretically four times that of the excited singlet. Accordingly, light emission employing the excited triplet can obtain the same performance as a cold cathode tube, and can be applied to illumination, which is noticed in various fields.

For example, many kinds of heavy metal complexes such as iridium complexes has been synthesized and studied (see Non-Patent Document 3 below).

An example employing tris(2-phenylpyridine)iridium as a dopant has been studied (see Non-Patent Document 1 below).

Further, M. E. Tompson et al. studies an example employing as a dopant L$_2$Ir (acac) (in which L represents a bidentate ligand, and "acac represents acetyl acetone) such as (ppy)$_2$Ir (acac) in "The 10$^{th}$ International Workshop on Inorganic and Organic Electroluminescence (EL' 00, Hamamatsu)". Moon-Jae Youn. Og, Tetsuo Tsutsui et al. studies an example employing as a dopant tris(2-p-tolylpyridine)iridium {Ir (ptpy)$_3$}, tris(benzo-[h]-quinoline)iridium {Ir(bzq)$_3$}, or Ir(bzq)$_2$ClP (Bu)$_3$ in "The 10$^{th}$ International Workshop on Inorganic and Organic Electroluminescence (EL' 00, Hamamatsu).

In addition to attempts employing various iridium complexes as described above (see the Non-Patent Document 3 above-described), Ikai et al. employ a hole transporting material as a host of a phosphorescent compound in order to increase emission efficiency in "The 10$^{th}$ International Workshop on Inorganic and Organic Electroluminescence (EL' 00, Hamamatsu)".

M. E. Tompson et al. employ various kinds of electron transporting materials doped with a new iridium complex as a host of a phosphorescent compound. Tsutsui et al. obtain high emission efficiency by incorporation of a hole blocking layer.

An external qauntum efficiency of around 20%, which is a theoretical threshold, is attained in green light emission, but the light emission efficiency extremely lowers in a high luminance region. Further, a sufficient emission efficiency is not attained in another color emission, particularly in blue light emission, where there is room to be improved.

In order to obtain high efficiency, a light emission layer containing plural materials has been sought. There is, for example, an organic electroluminescent device comprising a light emission layer containing a dopant and a hole transporting material and/or an electron transporting material. In such a device employing the plural materials and emitting a green light, high efficiency is obtained employing a phosphorescent dopant (see Patent Documents 2 to 4). However, a blue light-emitting device employing a fluorescent dopant as a light emission material is inferior in efficiency to a device employing a phosphorescent dopant, and is insufficient in efficiency and lifetime (see Patent Document 5).

Patent Document 1: U.S. Pat. No. 6,097,147
Patent Document 2: Japanese Patent O.P.I. Publication No. 2002-184581
Patent Document 3: Japanese Patent O.P.I. Publication No. 2003-68465
Patent Document 4: Japanese Patent O.P.I. Publication No. 2003-68466
Patent Document 5: Japanese Patent O.P.I. Publication No. 2004-311231
Non-Patent Document 1: M. A. Baldo et al., Nature, 395, p. 151-154 (1998)
Non-Patent Document 2: M. A. Baldo et al., Nature, 40, 17, p. 750-753 (2000)
Non-Patent Document 3: S. Lamansky et al., J. Am. Chem. Soc., 123, 4304 (2001).

DISCLOSURE OF THE INVENTION

Problems to be Solved by the Invention

The present invention has been made in view of the above. An object of the invention is to provide an organic EL device having high emission luminance and high emission efficiency, and particularly a blue-light emitting organic EL device which is high in emission luminance, color purity, emission efficiency and durability, and to provide a display and an illuminating device each employing the organic EL device.

Means for Solving the Above Problems

The above object of the invention can be attained by the following constitution:

(1) An organic electroluminescent device characterized in that it comprises a light emission layer containing two or more kinds of host compounds and at least one dopant, wherein at least one of the two or more kinds of host compounds has an excited triplet energy of not less than 2.7 eV, and the dopant is a phosphorescent compound.

(2) The organic electroluminescent device of item 1 above characterized in that each of the two or more kinds of host compounds, which are different from each other, is selected from compounds represented by formula (1),

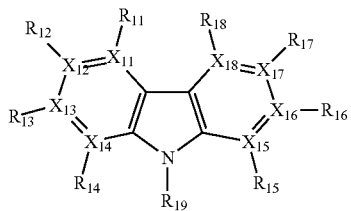

Formula (1)

In formula (1), $X_{11}$ through $X_{18}$ independently represent a carbon atom or a nitrogen atom; any of $R_{11}$ through $R_{18}$ bonding to the carbon atom represents a hydrogen atom or a substituent, in which when the substituent is plural, the plural substituents may be the same or different; any of $R_{11}$ through $R_{18}$ bonding to the nitrogen atom represents a lone electron pair; and $R_{19}$ represents a hydrogen atom or a substituent.

(3) The organic electroluminescent device of item 1 or 2 above characterized in that at least one of the two or more kinds of host compounds, which are different from each other, is selected from carbazole ring-containing compounds represented by formula (2),

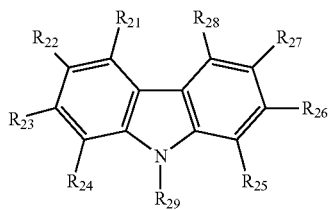

Formula (2)

In formula (2), $R_{21}$ through $R_{28}$ independently represent a hydrogen atom or a substituent, provided that when the substituent is plural, the plural substituents may be the same or different; and $R_{29}$ represents a hydrogen atom or a substituent.

(4) The organic electroluminescent device of item 1 or 2 above characterized in that at least one of the two or more kinds of host compounds, which are different from each other, is selected from azacarbazole ring-containing compounds represented by formula (3),

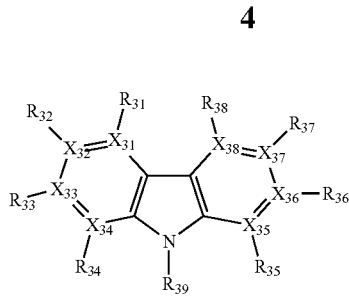

Formula (3)

In formula (3), $X_{31}$ through $X_{38}$ independently represent a carbon atom or a nitrogen atom, provided that any one of $X_{31}$ through $X_{38}$ is a nitrogen atom; any of $R_{31}$ through $R_{38}$ bonding to the carbon atom represents a hydrogen atom or a substituent, in which when the substituent is plural, the plural substituents may be the same or different; any one of $R_{31}$ through $R_{38}$ bonding to the nitrogen atom represents a lone electron pair; and $R_{39}$ represents a hydrogen atom or a substituent.

(5) The organic electroluminescent device of item 1 or 2 above characterized in that at least one of the two or more kinds of host compounds, which are different from each other, is selected from diazacarbazole ring-containing compounds represented by formula (4),

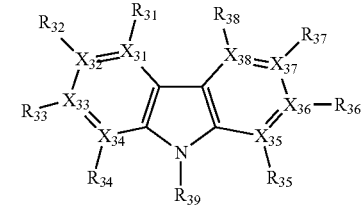

Formula (4)

In formula (4), $X_{41}$ through $X_{48}$ independently represent a carbon atom or a nitrogen atom, provided that $X_{44}$ and $X_{45}$ are nitrogen atoms, $X_{43}$ and $X_{46}$ are nitrogen atoms $X_{42}$ and $X_{47}$ are nitrogen atoms or $X_{41}$ and $X_{48}$ are nitrogen atoms; any of $R_{41}$ through $R_{48}$ bonding to the carbon atom represents a hydrogen atom or a substituent, in which when the substituent is plural, the plural substituents may be the same or different; any of $R_{41}$ through $R_{48}$ bonding to the nitrogen atom represents a lone electron pair; and $R_{49}$ represents a hydrogen atom or a substituent.

(6) The organic electroluminescent device of item 1 or 2 above characterized in that the light emission layer contains two kinds of host compounds, which are different from each other, each of the two kinds of host compounds being selected from carbazole ring-containing compounds represented by formula (2),

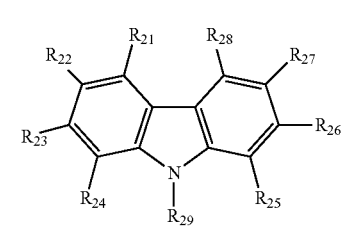

Formula (2)

In formula (2), $R_{21}$ through $R_{28}$ independently represent a hydrogen atom or a substituent, provided that when the substituent is plural, the plural substituents may be the same or different; and $R_{29}$ represents a hydrogen atom or a substituent.

(7) The organic electroluminescent device of item 1 or 2 above characterized in that the light emission layer contains two kinds of host compounds, which are different from each other, each of the two kinds of host compounds being selected from azacarbazole ring-containing compounds represented by formula (3),

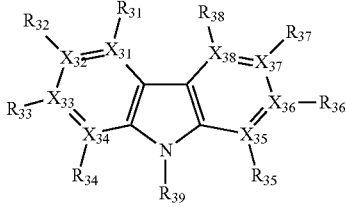

Formula (3)

In formula (3), $X_{31}$ through $X_{38}$ independently represent a carbon atom or a nitrogen atom, provided that any one of $X_{31}$ through $X_{38}$ is a nitrogen atom; any of $R_{31}$ through $R_{38}$ bonding to the carbon atom represents a hydrogen atom or a substituent, in which when the substituent is plural, the plural substituents may be the same or different; any one of $R_{31}$ through $R_{38}$ bonding to the nitrogen atom represents a lone electron pair; and $R_{39}$ represents a hydrogen atom or a substituent.

(8) The organic electroluminescent device of item 1 or 2 above characterized in that the light emission layer contains two kinds of host compounds, which are different from each other, one of the two kinds of host compounds being selected from carbazole ring-containing compounds represented by formula (2), and the other being selected from azacarbazole ring-containing compounds represented by formula (3),

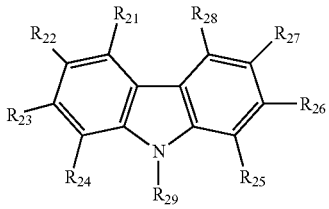

Formula (2)

In formula (2), $R_{21}$ through $R_{28}$ independently represent a hydrogen atom or a substituent, provided that when the substituent is plural, the plural substituents may be the same or different; and $R_{29}$ represents a hydrogen atom or a substituent,

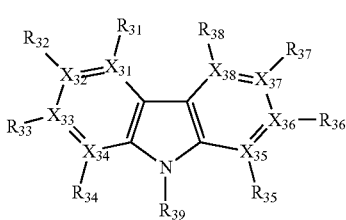

Formula (3)

In formula (3), $X_{31}$ through $X_{38}$ independently represent a carbon atom or a nitrogen atom, provided that any one of $X_{31}$ through $X_{38}$ is a nitrogen atom; any of $R_{31}$ through $R_{38}$ bonding to the carbon atom represents a hydrogen atom or a substituent, in which when the substituent is plural, the plural substituents may be the same or different; any one of $R_{31}$ through $R_{38}$ bonding to the nitrogen atom represents a lone electron pair; and $R_{39}$ represents a hydrogen atom or a substituent.

(9) The organic electroluminescent device of any one of items 1 through 8 above, comprising a light emission layer containing two or more kinds of host compounds and at least one dopant, characterized in that it emits a white light.

(10) A display characterized in that it comprises the organic electroluminescent device of any one of items 1 through 9 above.

(11) An illuminating device characterized in that it comprises the organic electroluminescent device of any one of items 1 through 9 above.

(12) A display characterized in that it comprises a liquid crystal device as a displaying means and the illuminating device of item 11 above.

Effects of the Invention

The present invention can provide an organic EL device having high emission luminance and high emission efficiency, and particularly a blue-light emitting organic EL device which is high in emission luminance, color purity, emission efficiency and durability, and can provide a display and an illuminating device each employing the organic EL device.

EXPLANATION OF SYMBOLS

Figures 1A, 1B, 1C:
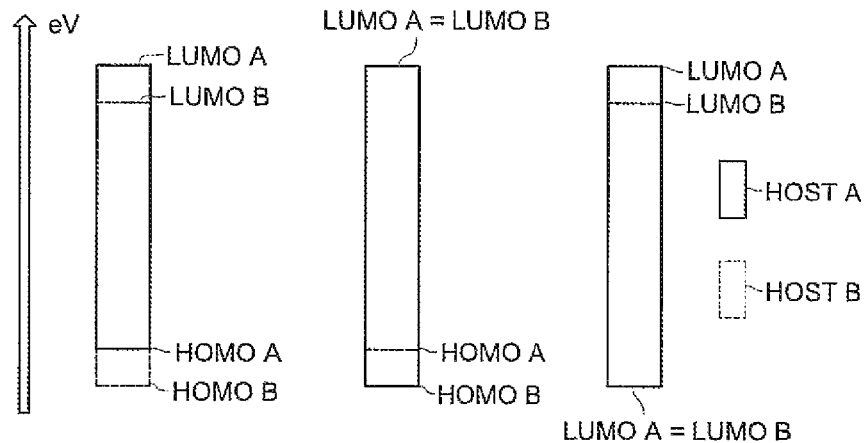
FIG. 1 is a diagram showing an energy level of two kinds of host compounds (HOST A and HOST B) in the light emission layer.

1. Display
3. Pixel
5. Scanning line
6. Data line
7. Electric source line
10. Organic EL device
11. Switching transistor
12. Driving transistor
13. Capacitor
21. Glass substrate
22. Transparent anode
23. Hole transporting layer 24. Light emission layer
25. Hole inhibiting (hole blocking) or electron transporting layer
26. Cathode buffer layer
27. Cathode
A. Display section
B. Control section
102. Glass cover
103. Power source line (Anode)
104. Power source line (Cathode)
105. Cathode
106. Organic EL layer
107. Glass substrate with transparent electrode
108. Nitrogen gas
109. Water trapping agent

PREFERRED EMBODIMENT OF THE INVENTION

The present inventors have succeeded in obtaining an electroluminescence element comprising a light emission layer containing two or more kinds of host compounds and at least one dopant, wherein at least one of the two or more kinds of host compounds has an excited triplet energy of not less than 2.7 eV, and the dopant is a phosphorescent compound, which provides high emission luminance and high luminous efficiency, and particularly a blue light-emitting organic EL device which is high in emission luminance, color purity, luminous efficiency and durability. Further, they have found that use of a carbazole compound, an azacarbazole compound or a diazacarbazole compound as a host compound provides long lifetime as well as high luminous efficiency, and completed the invention.

The excited triplet energy (eV) in the invention is defined by the following formula:

$$Y=1239.8/Y$$

Wherein X represents an excited triplet energy (eV), and Y represents a 0-0 band of phosphorescence.

The 0-0 band of phosphorescence can be obtained according to the following procedure.

A host compound to be measured is dissolved in a mixture solvent of ethanol and methanol (=4:1 by volume) which is deoxygenated, placed in a cell for phosphorescence measurement, and exposed to excited light at a liquid nitrogen temperature of 77 K. Spectra of emission light are measured 100 ms after the excited light exposure. As emission life of phosphorescence is longer than that of fluorescence, emission observed 100 ms after the excited light exposure is considered to be phosphorescence. A compound having a phosphorescence life of less than 100 ms may be measured less than 100 ms after the exposure. However, when time after the exposure is too short, problem is caused that phosphorescence cannot be distinguished from fluorescence. It is necessary to select time which can distinguish phosphorescence from fluorescence.

In a compound, which is insoluble in the above solvent mixture, any solvent capable of dissolving the compound can be used. (In the above-described measuring method, solvent effect upon phosphorescence wavelength is substantially extremely small and does not cause problem.)

In the invention, the shortest wavelength which gives emission maximum in the phosphorescence spectra measured according to the procedure described above is defined as a 0-0 band.

Next, the present invention will be explained in detail.
Formulae (1) through (4) will be explained below.
In formula (1), examples of the substituent represented by $R_{11}$ through $R_{19}$ include an alkyl group (for example, a methyl group, an ethyl group, a propyl group, an isopropyl group, a t-butyl group, a pentyl group, a hexyl group, an octyl group, a dodecyl group, a tridecyl group, a tetradecyl group, or a pentadecyl group), a cycloalkyl group (for example, a cyclopentyl group or a cyclohexyl group), an alkenyl group (for example, a vinyl group or a allyl group), an alkinyl group (for example, an ethinyl group, or a propargyl group), an aromatic hydrocarbon ring group (an aromatic carbon ring group or an aryl group, for example, a phenyl group, a p-chlorophenyl group, a mesityl group, a tolyl group, a xylyl group, a naphthyl group, an anthryl group, azulenyl group, acenaphthyl group, a fluorenyl group, a phenanthryl group, an indenyl group, a pyrenyl group, or a biphenyl group), an aromatic heterocyclic group (for example, a pyridyl group, a pyrimidinyl group, a furyl group, a pyrrolyl group, an imidazolyl group, an benzoimidazolyl group, a pyrazolyl group, a triazolyl group such as 1,2,4-triazole-1-yl group or 1,2,3-triazole-1-yl group), an oxazolyl group, a benzoxazolyl group, a thiazolyl group, an isooxazolyl group, an isothiazolyl group, a phthalazinyl group, a thienyl group, a quinolyl group,la benzofuryl group, a benzothienyl group, a dibenzothienyl group, an indonyl group, a carbazolyl group, a carbolinyl group, a diazacarbazolyl group (a group in which one of the carbon atoms constituting a carboline ring of the carbolinyl group is replased with a nitrogen atom), a quinoxalinyl group, a pyridazinyl group, a triazinyl group, a quinazolinyl group, or a phtharazinyl group), a heterocyclic group (for example, a pyrrolidinyl group, an imidazolidinyl group, a morpholinyl group or an oxazolidinyl group), an alkoxy group (for example, a methoxy group, an ethoxy group, a propoxy group, a pentyloxy group, a hexyloxy group, an octyloxy group, or a dodecyloxy group), a cycloalkoxy group (for example, a cyclopentyloxy group, or a cyclohexyloxy group), an aryloxy group (for example, a phenoxy group or a naphthyloxy group), an alkylthio group (for example, a methylthio group, an ethylthio group, a propylthio group, a pentylthio group, a hexylthio group, an octylthio group, or a dodecylthio group), a cycloalkylthio group (for example, a cyclopentylthio group or a cyclohexylthio group), an arylthio group (for example, a phenylthio group, or a naphthylthio group), an alkoxycarbonyl group (for example, a methyloxycarbonyl group, an ethyloxycarbonyl group, a butyloxycarbonyl group, an octyloxycarbonyl group, or a dodecyloxycarbonyl group), an aryloxycarbonyl group (for example, a phenyloxycarbonyl group, or a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, or a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecycarbonyl group, a phenylcarbonyl group, a naphthylcarbonyl group, or a pyridylcarbonyl group), an acyloxy group (for example, an acetyloxy group, an ethylcarbonyloxy group, a butylcarbonyloxy group, an octylcarbonyloxy group, a dodecycarbonyloxy group, or a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, 2-ethylhexylcarbonylamino group, an octylcarbonylamino group, a a dodecycarbonylamino group, a phenylcarbonylamino group, a naphthylcarbonylamino group, or a pyridylcarbonyl group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecyaminocarbonyl group, a phenylaminocarbonyl group, a naphthylaminocarbonyl group, or a 2-pyridylaminocarbonyl group), a ureido group (for example, a methylureido group, an ethylureido group, a pentylureido group, a cyclohexylureido group, an octylureido group, a dodecylureido group, a phenylureido group, a naphthylureido group, or a 2-pyridylureido group), a sulfinyl group (for example, a methylsulfinyl group, an ethylsulfinyl group, a butylsulfinyl group, a cyclohexylsulfinyl group, a 2-ethylhexylsulfinyl group, a dodecysulfinyl group, a phenylsulfinyl group, a naphthylsulfinyl group, or a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group, or a dodecysulfonyl group), an arylsulfonyl or heteroarylsulfonyl group (for example, a phenylsulfonyl group, a naphthylsulfonyl group, or a 2-pyridylsulfonyl group), an amino group (for example, an amino group, an ethylamino group, a dimethylamino group, a butylaminocarbonyl group, a cyclopentylamino group, a 2-ethylhexylamino group, a dodecyamino group, an anilino group, a naphthylamino group, or a 2-pyridylamino group), a halogen atom (for example, fluorine, chlorine, or bromine), a fluorinated hydrocarbon group (for example, a fluoromethyl group, a trifluoromethyl group, a pentafluoroethyl group, or a pentafluorophenyl group), a cyano group, a nitro group, a hydroxyl group, a mercapto group, and a silyl group (for example, a trimethylsilyl group, a triisopropylsilyl group, a triphenylsilyl group or a phenyldiethylsilyl group).

These substituents may further have the same substituent as described above.

$X_{11}$ through $X_{18}$ independently represent a carbon atom or a nitrogen atom. It is preferred that all of $X_{11}$ through $X_{18}$ are hydrogens or one or two of $X_{11}$ through $X_{18}$ are nitrogens. It is preferred that when two of $X_{11}$ through $X_{18}$ are nitrogens, one of $X_{11}$ through $X_{14}$ is a nitrogen atom and one of $X_{15}$ through $X_{18}$ is a nitrogen atom.

In formula (2), examples of the substituent represented by $R_{21}$ through $R_{29}$ are the same as those denoted in $R_{11}$ through $R_{19}$ of formula (1).

In formula (3), examples of the substituent represented by $R_{31}$ through $R_{39}$ are the same as those denoted in $R_{11}$ through $R_{19}$ of formula (1). $X_{31}$ through $X_{38}$ independently represent a carbon atom or a nitrogen atom, provided that one of $X_{31}$ through $X_{38}$ is a nitrogen atom. One of $X_{31}, X_{32}, X_{37},$ and $X_{38}$ is preferably a nitrogen atom, and $X_{31}$ or $X_{38}$ is more preferably a nitrogen atom.

In formula (4), examples of the substituent represented by $R_{41}$ through $R_{49}$ are the same as those denoted in $R_{11}$ through $R_{19}$ of formula (1). $X_{41}$ through $X_{48}$ independently represent a carbon atom or a nitrogen atom, provided that $X_{44}$ and $X_{45}$ are nitrogens, $X_{43}$ and $X_{46}$ are nitrogens, $X_{42}$ and $X_{47}$ are nitrogens, or $X_{41}$ and $X_{48}$ are nitrogens. It is preferred that $X_{41}$ and $X_{48}$ are nitrogens or $X_{42}$ and $X_{47}$ are nitrogens, and it is more preferred that $X_{42}$ and $X_{47}$ are nitrogens.

[Host Compound]

In order to emit a blue light, a host compound is required to have an especially high excited triplet energy. The excited triplet energy of a hole transporting material or an electron transporting material contained in a layer adjacent to a light emission layer is often lower than that of a host compound contained in the light emission layer. When this structure is driven as a device, energy transfer occurs from the host compound to materials contained in a layer adjacent to the light emission layer, resulting in lowering in efficiency. Emission, which is different from ordinary emission from a phosphorescent dopant, occurs from materials in an adjacent layer to a light emission layer, resulting in color shift and lowering of color purity.

In order to prevent energy transfer from a light emission layer to its adjacent layer, a material having an excited triplet energy greater than that of a host compound can be used in an adjacent layer to a light emission layer. However, this structure has a great potential barrier between a light emission layer and its adjacent layer, resulting in lowering efficiency.

The present inventors have made an extensive study, and found that a light emission layer containing two or more kinds of host compounds, in which at least one of the two or more kinds of host compounds has an excited triplet energy of not less than 2.7 eV, provides high efficiency, high color purity and long lifetime. The reason for the high efficiency and high color purity is as follows. Since flow of holes and electrons into a light emission layer is directed to different host compounds, generation of a triplet exciton from the host compound or energy transfer from the host compound to the adjacent layer is restrained, and light emission from the adjacent layer as well as that from the host compound is restrained. The reason for the long lifetime is as follows. The two kinds of host compounds make it possible to control charge injection barrier from the adjacent layer, whereby driving voltage is lowered.

In the invention, two or more kinds of host compounds are employed. Next, explanation will be made regarding the constitution employing two kinds of host compounds. In the invention, there are mentioned the three constitutions of FIG. 1 (A) to FIG. 1 (C). FIG. 1 is a drawing showing energy level of two kinds of host compounds (Host A and Host B) in the light emission layer.

FIG. 1 (A) shows the constitution that the HOMO energy level and LUMO energy level of one host compound (Host B) are lower than those of the other host compound (Host A). FIG. 1 (B) shows the constitution that there is difference only in the HOMO energy level between one host compound and the other host compound. FIG. 1 (C) shows the constitution that there is difference only in the LUMO energy level between one host compound and the other host compound.

Herein, HOMO means the highest occupied molecular orbital of compound, and LUMO means the lowest unoccupied molecular orbital of compound. An energy level of HOMO is defined as energy necessary to release an electron in the HOMO level to vacuum level. An energy level of LUMO is defined as energy in which an electron in vacuum level is introduced in LUMO level of a compound so that the compound is stabilized.

Figure 2:
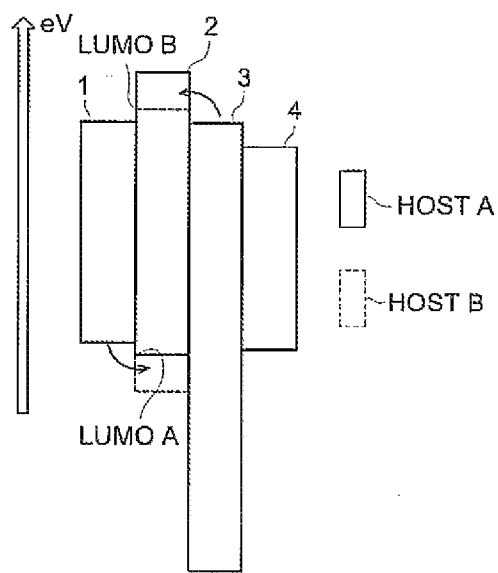
FIG. 2 is a diagram showing an energy level of two kinds of host compounds (HOST A and HOST B) in the light emission layer.

In the invention, the constitution as shown in FIG. 1(A) is preferred. When the energy level of the adjacent layer is specified as shown in FIG. 2, Host A forms a radical cation and Host B a radical anion in a constitution as shown in FIG. 1(A) such that holes flow into Host A and electrons into Host B. That is, the percentage of a triplet exciton formed from one host compound can be reduced, since a radical cation is formed from one compound and a radical anion from another compound.

The relationship between the phosphorescent dopant compound and the host compound in the invention is not specifically limited, as long as the excited triplet energy of the host compound is higher than that of the phosphorescent dopant compound. It is preferred that formula |HOMO-D|<|HOMO- H| is satisfied, wherein HOMO-H represents energy level of HOMO of a host compound having the deepest HOMO among the host compounds, and HOMO-D represents energy level of HOMO of a dopant. It is also preferred that formula |LUMO-H|<|LUMO-D| is satisfied, wherein LUMO-H represents energy level of LUMO of a host compound having the shallowest LUMO among the host compounds, and LUMO-D represents energy level of LUMO of a dopant.

It is more preferred that two kinds of host compounds are used. In the case where one phosphorescent compound and two host compounds Host A and Host B are used, the following formulae are preferably satisfied,

|LUMO-*A*|<|LUMO-*D*|<|LUMO-*B*|, and

Figure 3:
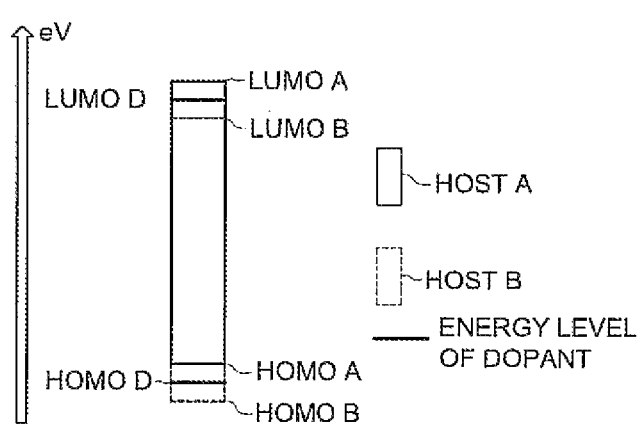
FIG. 3 is a drawing showing an energy level of two kinds of host compounds (HOST A and HOST B) in the light emission layer.

|HOMO-*A*|<|HOMO-*D*|<|HOMO-*B*| wherein HOMO-A and HOMO-B represent energy level of HOMO of Host A and energy level of HOMO of Host B, respectively; LUMO-A and LUMO-B represent energy level of LUMO of Host A and energy level of LUMO of Host B, respectively; and HOMO-D and LUMO-D represent energy level of HOMO of a phosphorescent dopant and energy level of LUMO of the phosphorescent dopant, respectively (see FIG. 3).

There is considered a white light-emitting device comprising one light emission layer containing two or three kinds of dopants. Use of two or more kinds of host compounds provide small potential difference between each dopant and any of the host compounds and small barrier to charge flow to the phosphorescent dopant as compared to use of one host compound, resulting in high efficiency.

The host compounds are not specifically limited as long as the excited triplet energy of at least one of the host compounds is not less than 2.7 eV. The excited triplet energy of the host compound is preferably not less than 3.5 eV in view of stability of the compound. It is more preferred that the excited triplet energy of all the host compounds contained in the light emission layer is not less than 2.7 eV. It is still more preferred that the energy level of HOMO is −5.5 to −6.5 eV and the energy level of LUMO is −2.3 to −3.0 eV. A combination of two or more kinds host compounds is preferably a combination of an electron transporting material and a hole transporting material or a combination in which one of difference in HOMO energy level between the two and difference in LUMO energy level between the two is 0.1 to 2.0 eV.

The host compound in the invention is not specifically limited and may be a known compound, as long as the above-described relationship is satisfied. The host compound in the invention is preferably a carbazole compound, an azacarbazole compound or a diazacarbazole compound represented by formulae (1) through (4).

Typical examples of the host compound include those described in the following Documents.

For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Specific examples of the host compound in the invention will be listed below, however, this invention is not limited thereto.

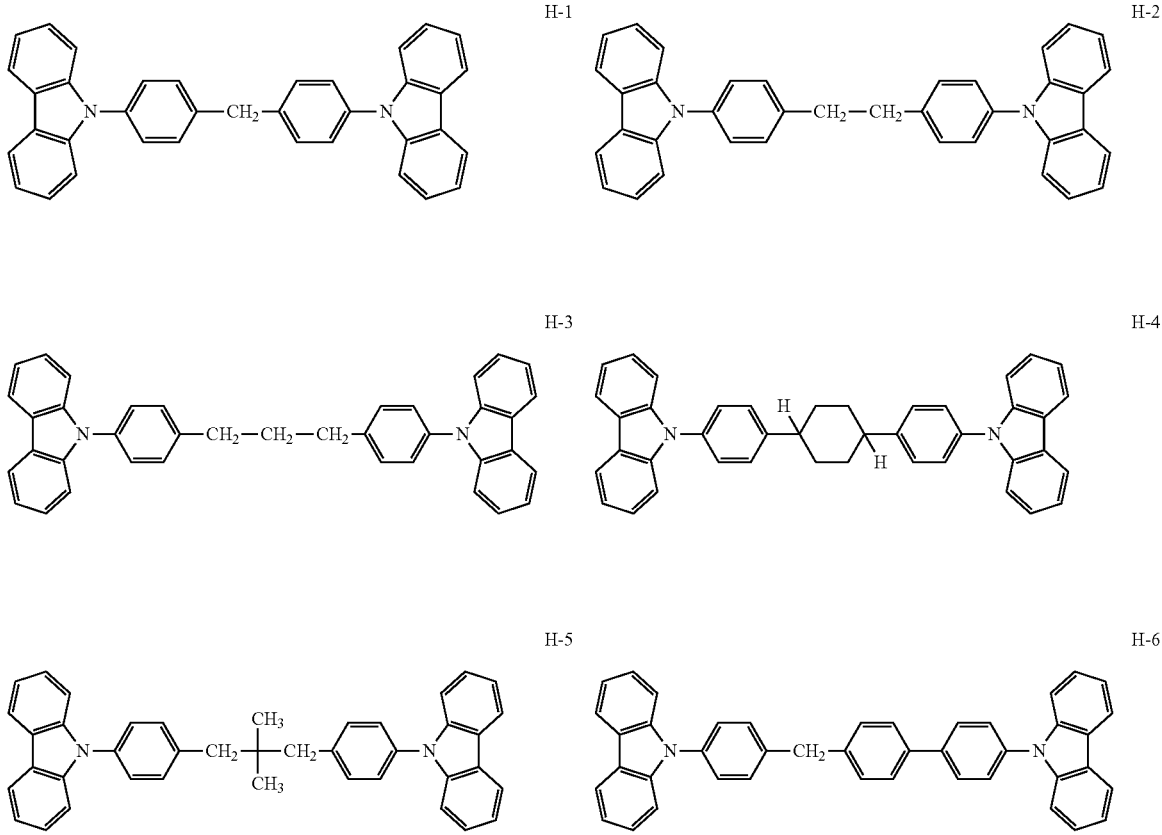

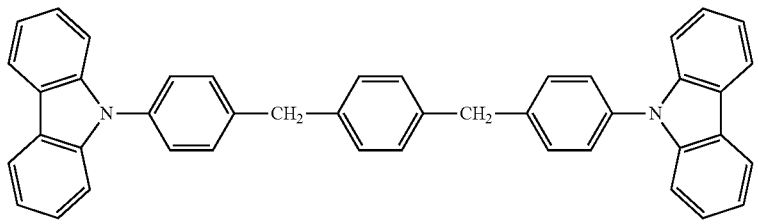
H-7
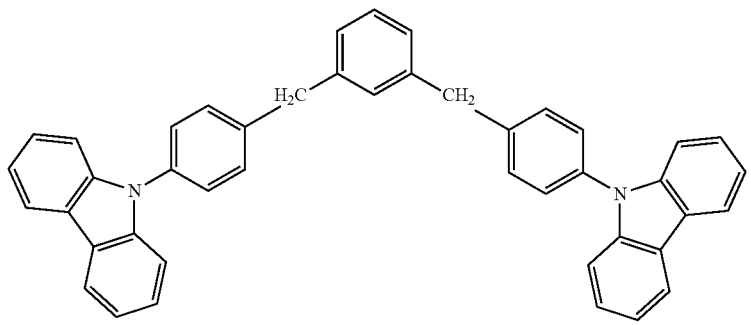
H-8
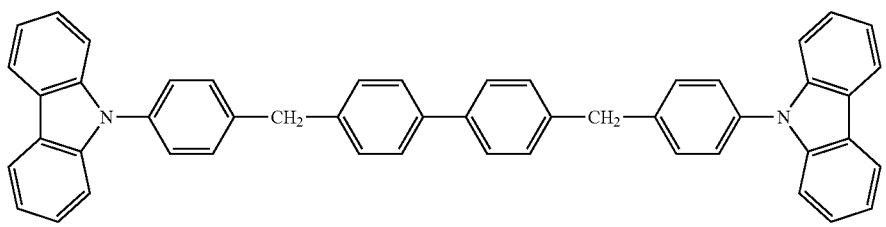
H-9
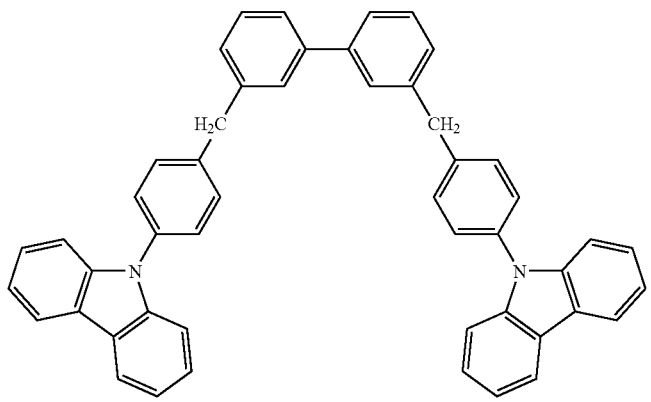
H-10

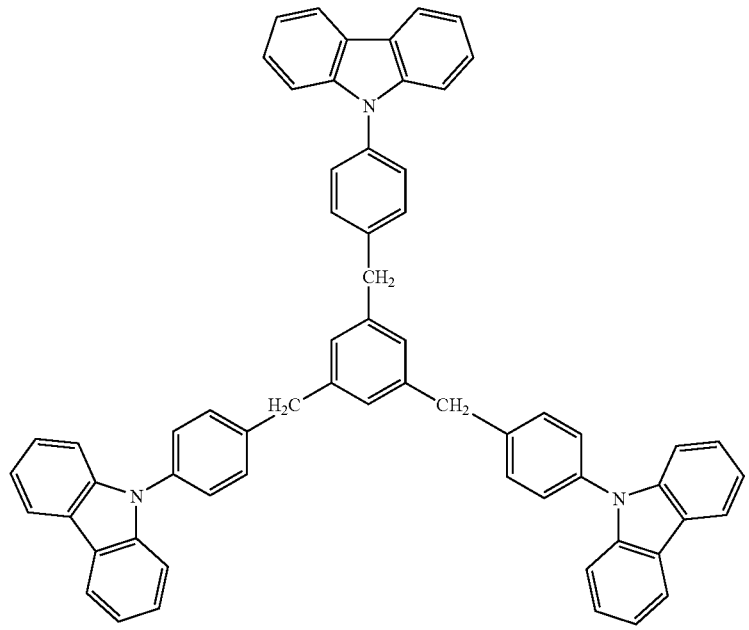
H-11
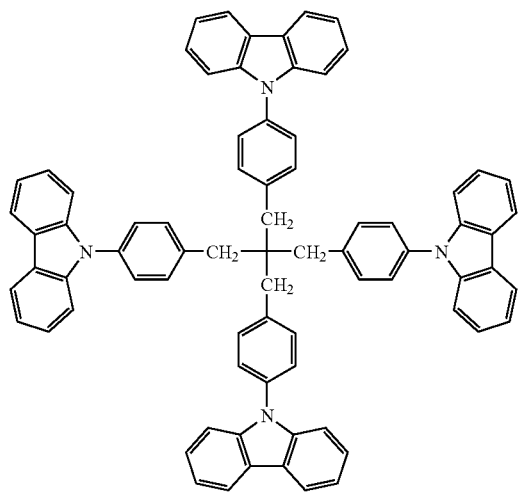
H-12
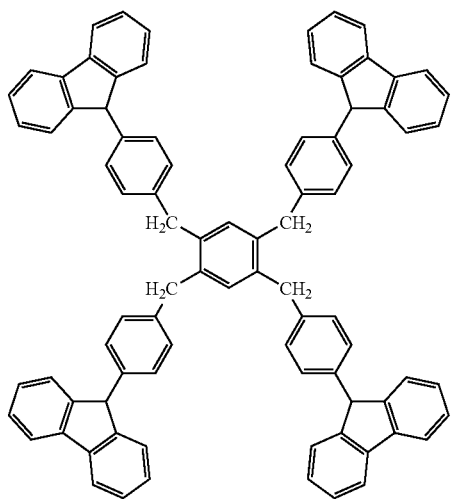
H-13

-continued
H-14
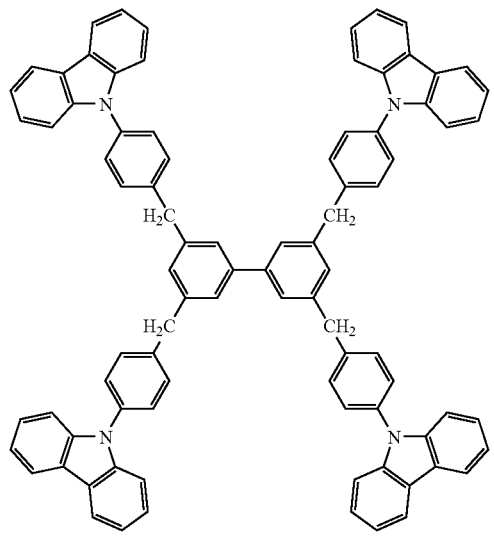
H-15
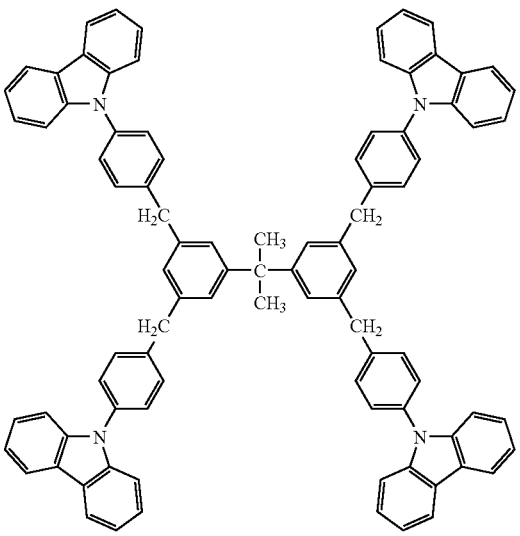
H-16
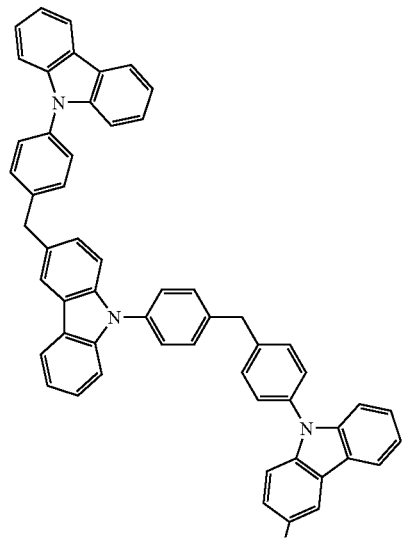
H-17
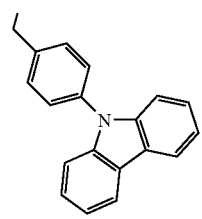
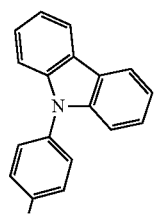

-continued
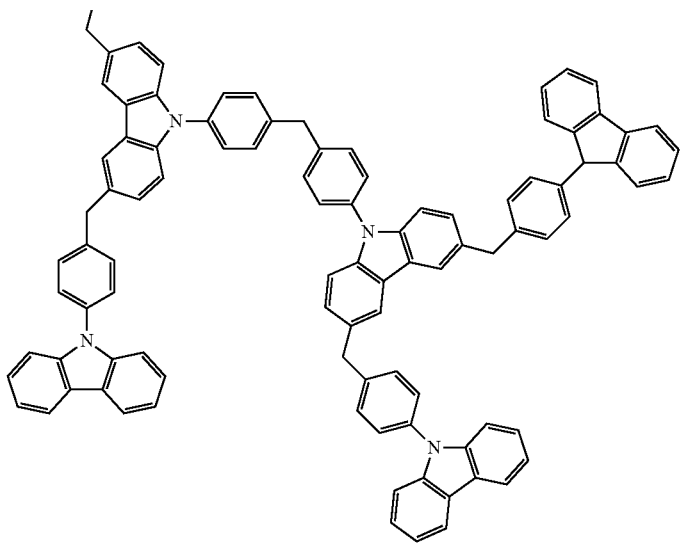
H-18
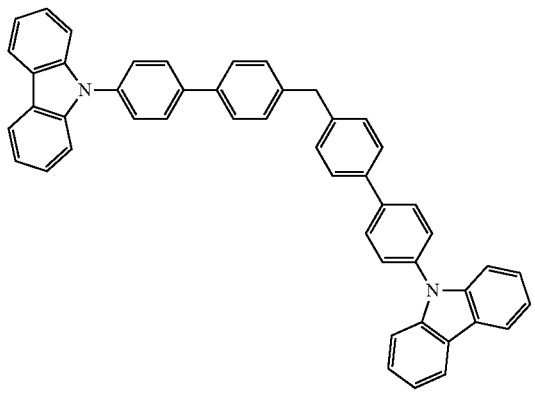
H-19
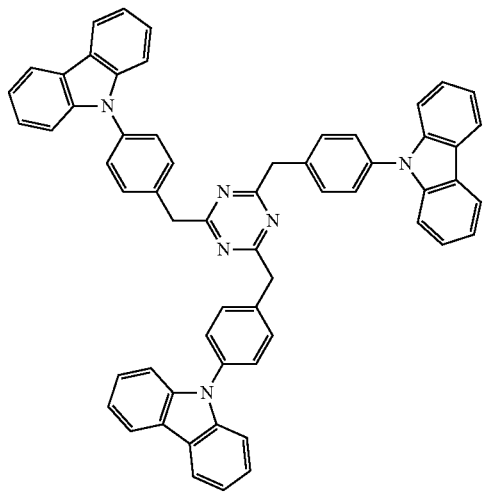
H-20
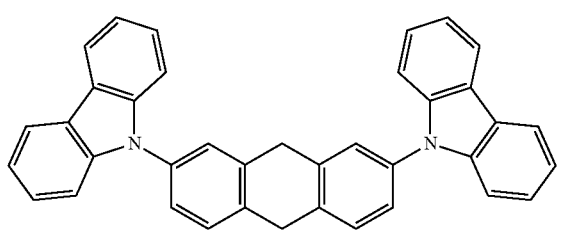
H-21
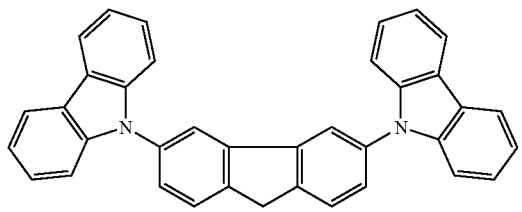
H-22
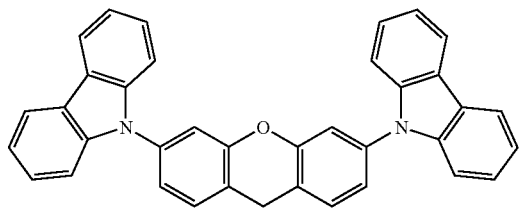

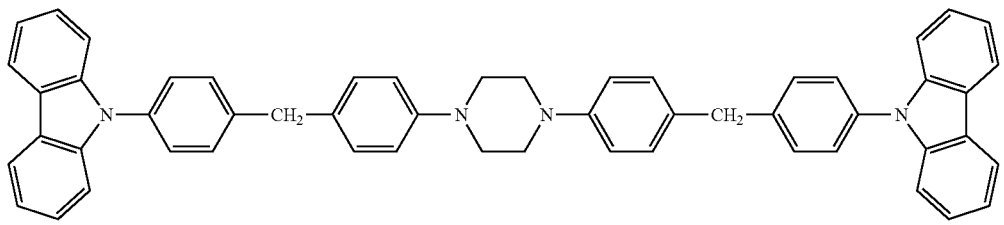
H-23
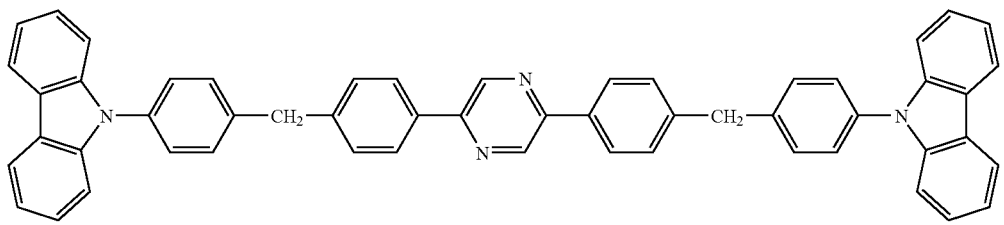
H-24
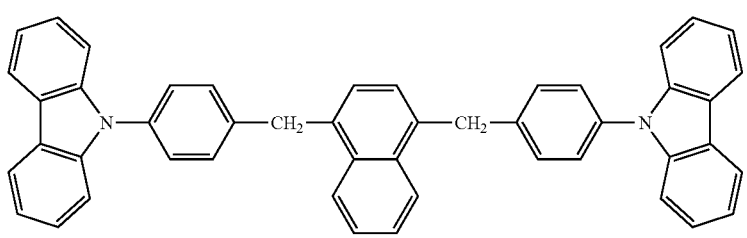
H-25
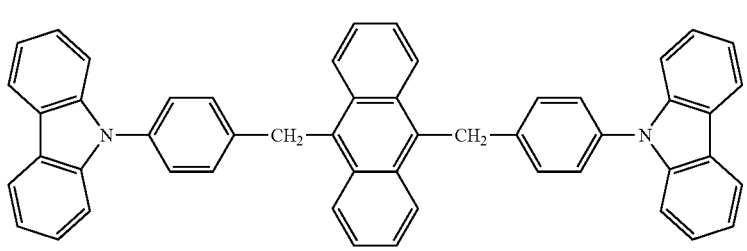
H-26
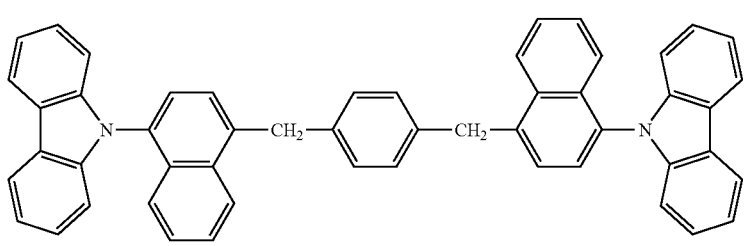
H-27
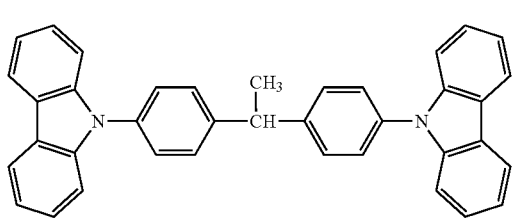
H-28
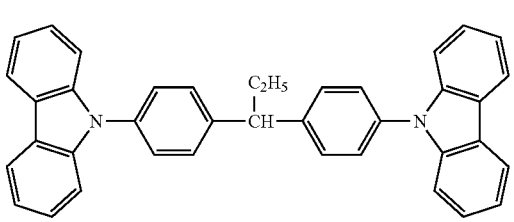
H-29
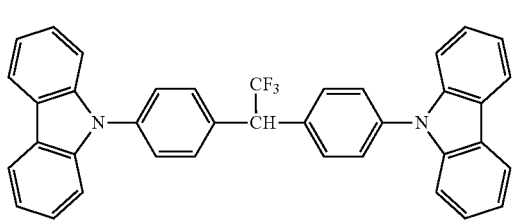
H-30
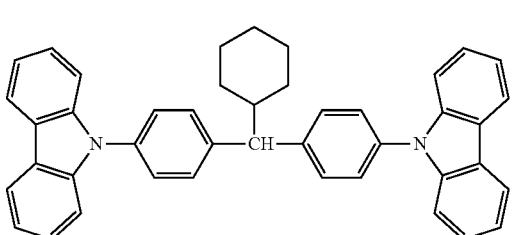
H-31

-continued
H-32
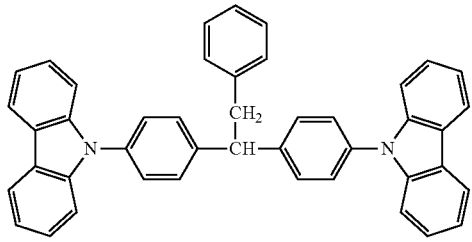
H-33
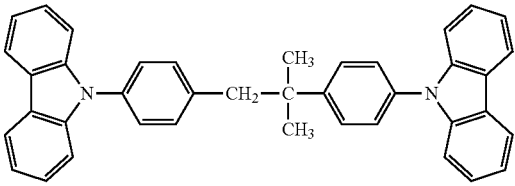
H-34
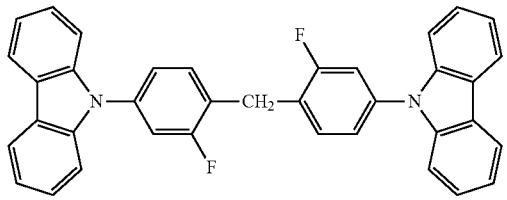
H-35
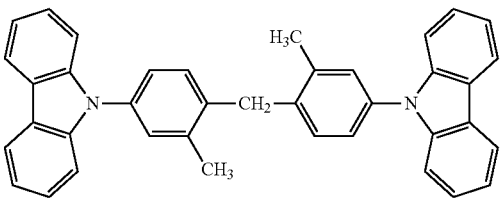
H-36
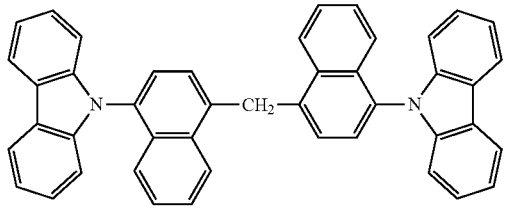
H-37
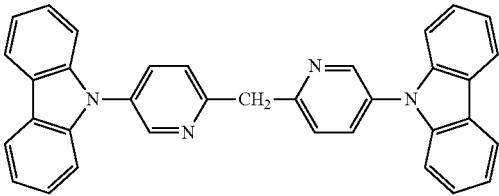
H-38
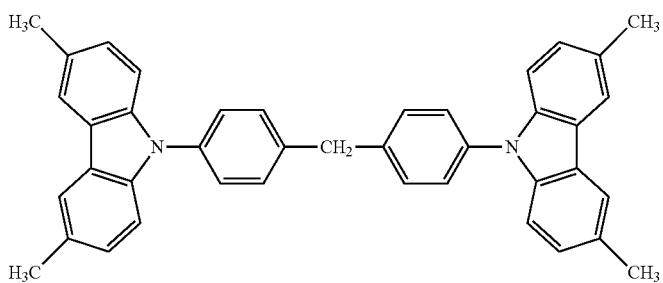
H-39
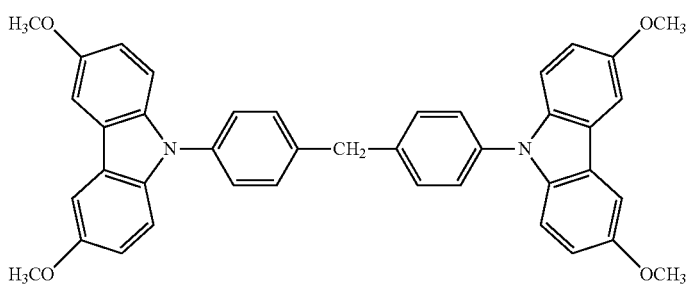
H-40
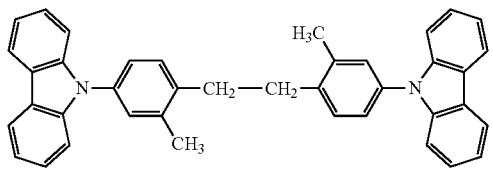
H-41
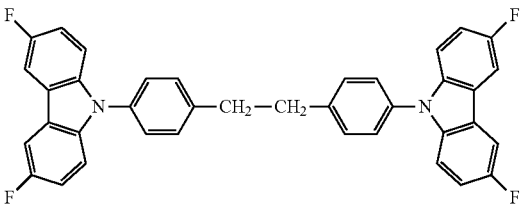

-continued
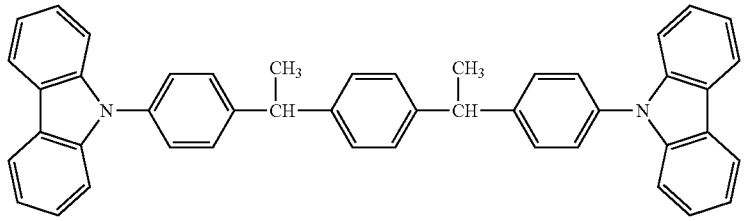
H-42
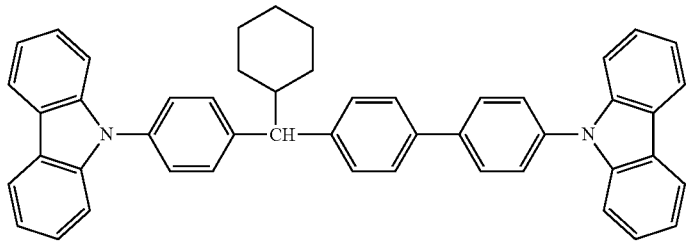
H-43
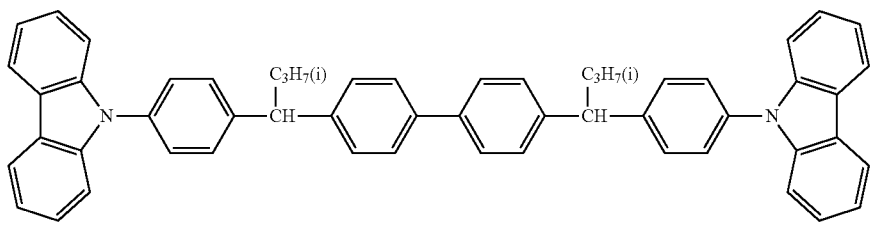
H-44
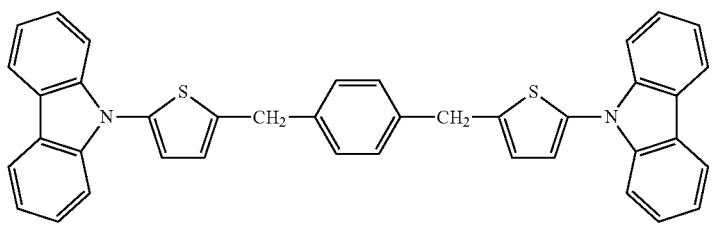
H-45
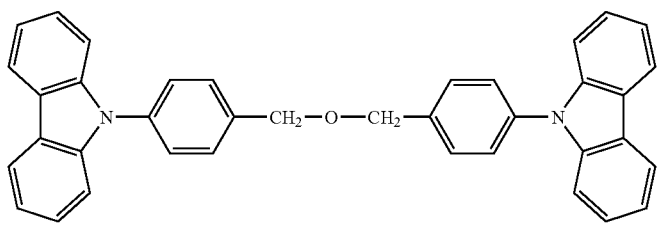
H-46
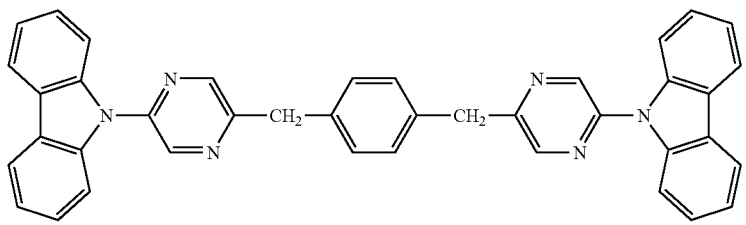
H-47
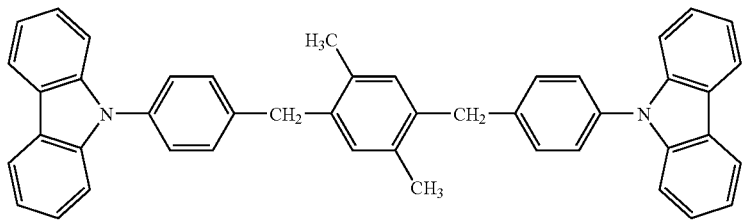
H-48

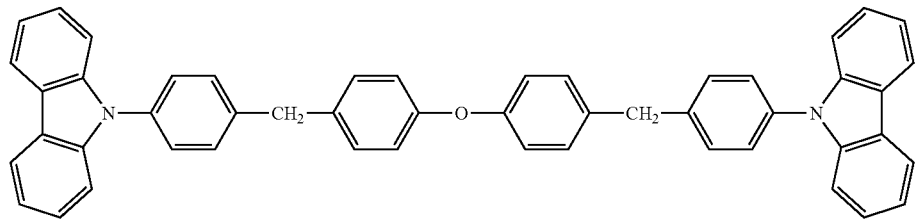
H-49
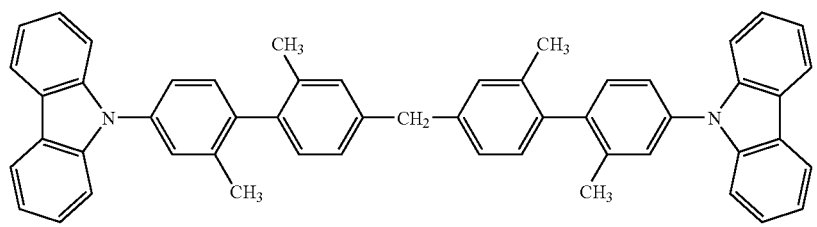
H-50
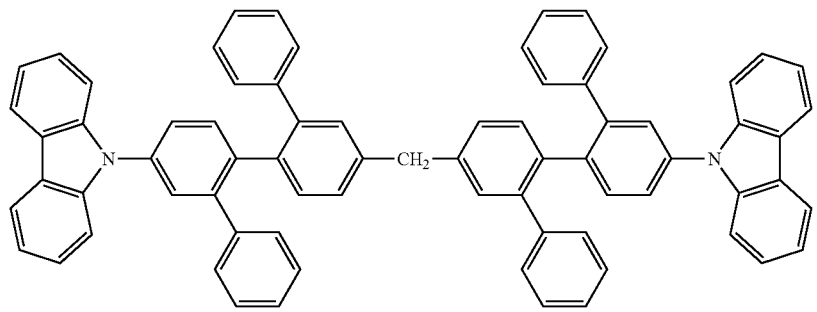
H-51
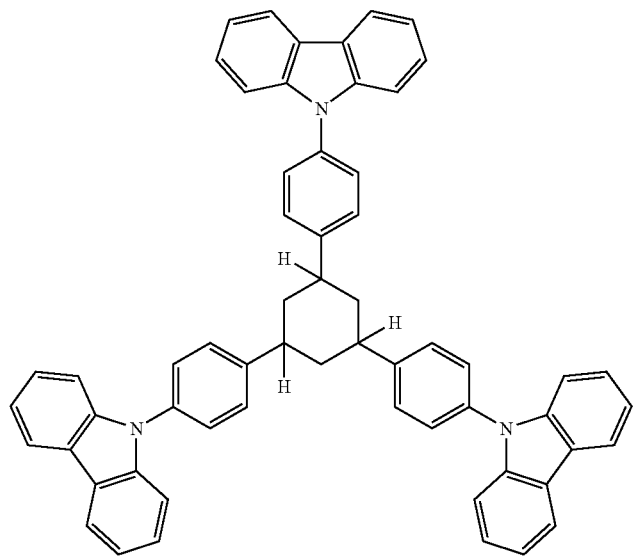
H-52

-continued
H-53
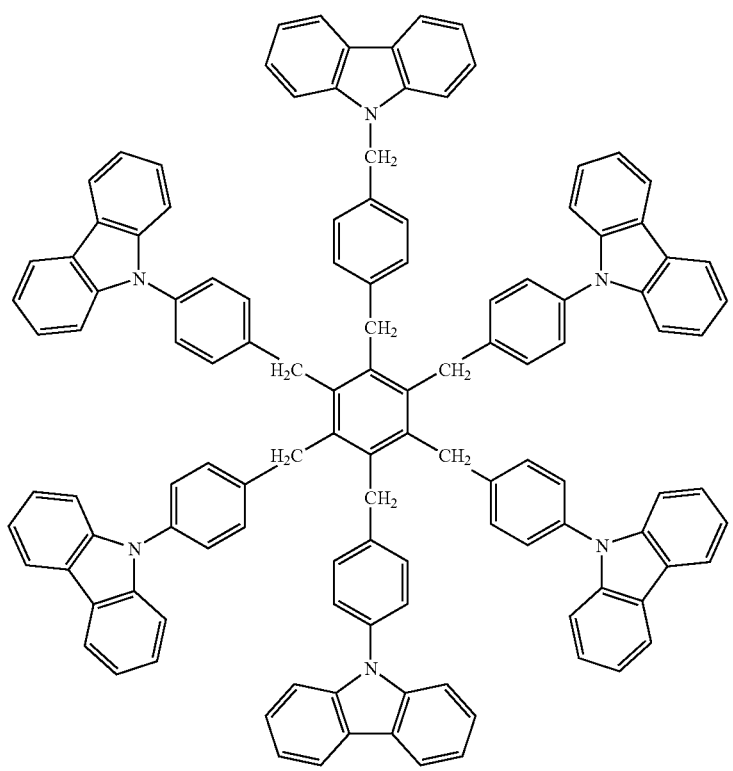
H-54
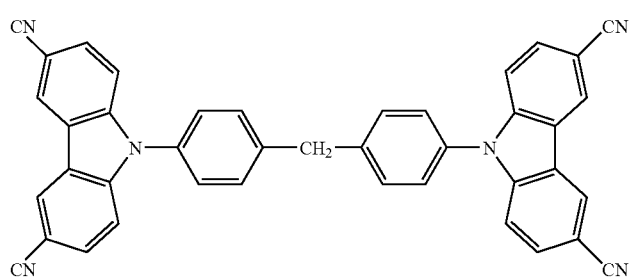
H-55
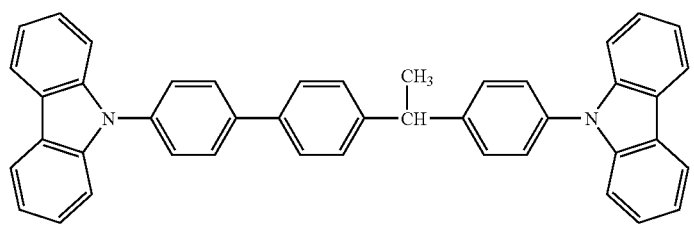
H-56
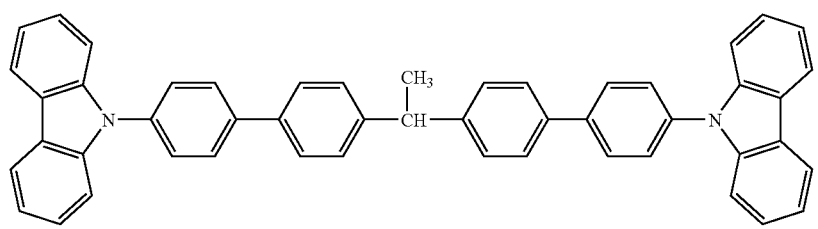

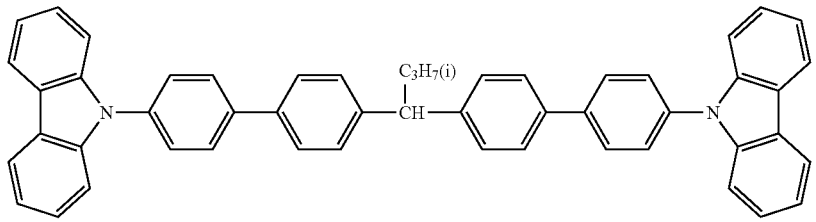 H-57
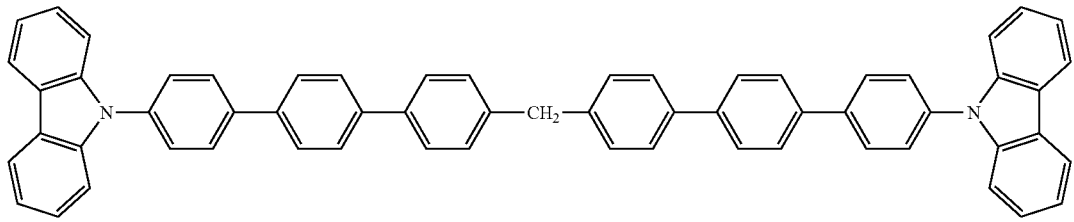 H-58
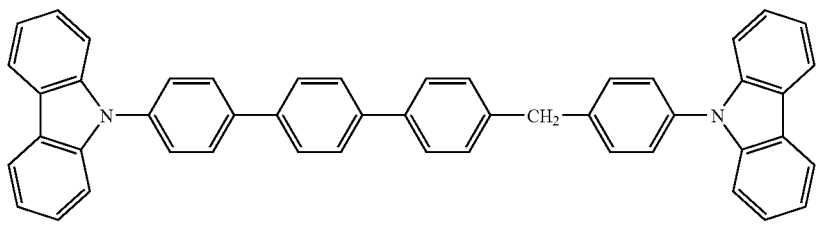 H-59
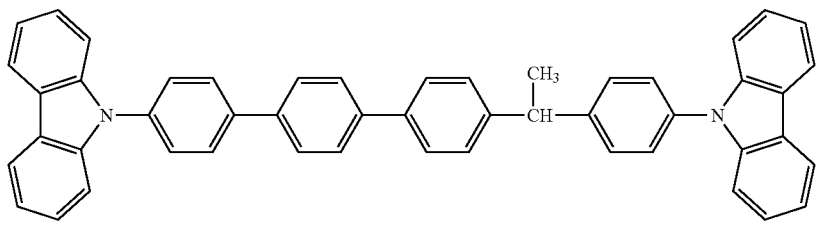 H-60
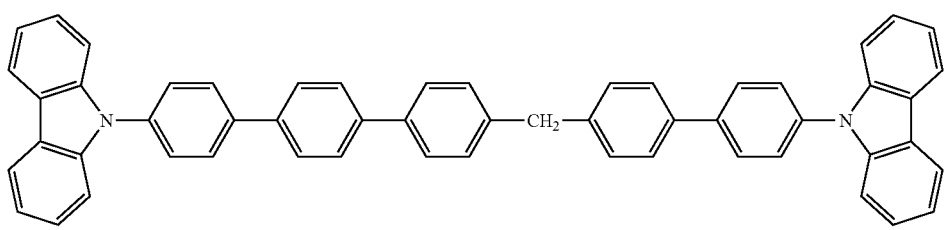 H-61
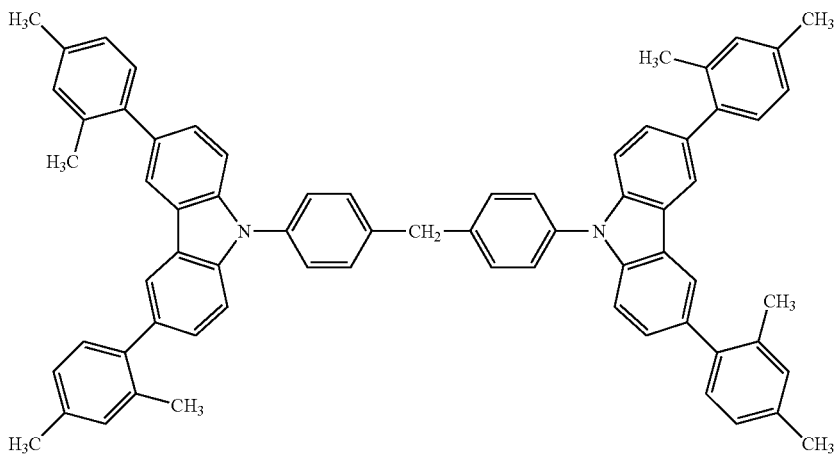 H-62

-continued
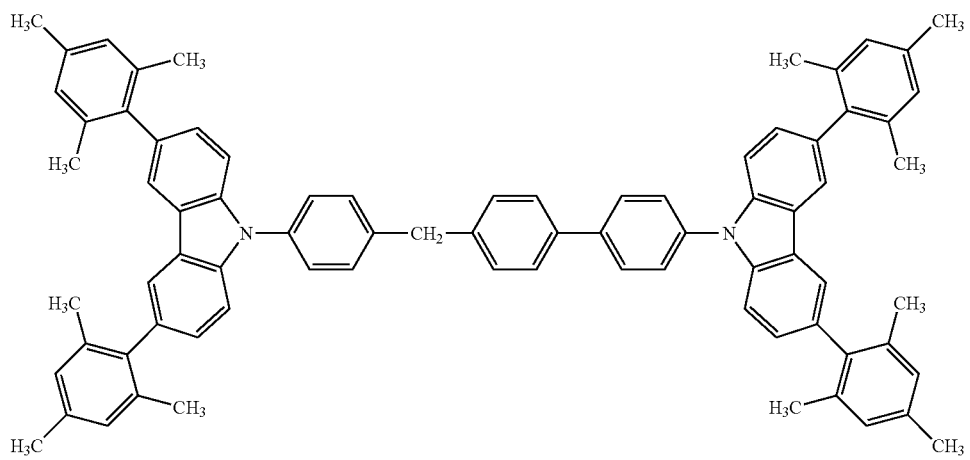
H-63
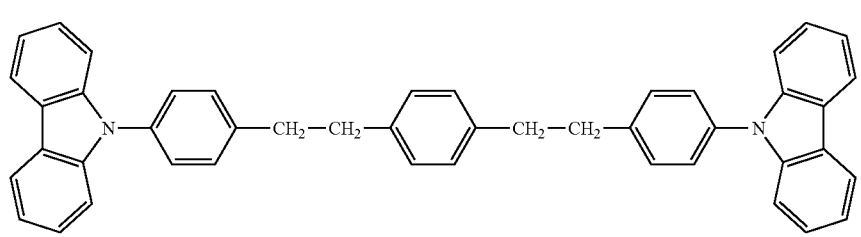
H-64
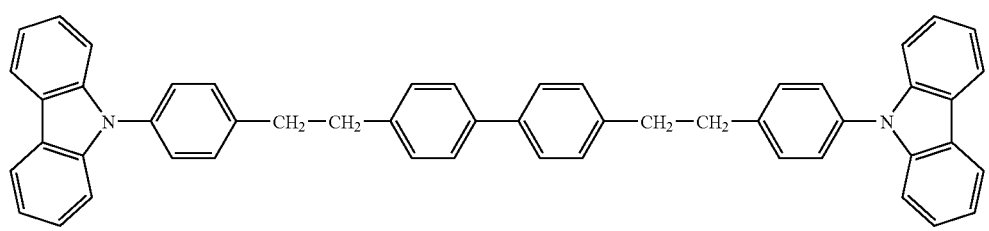
H-65
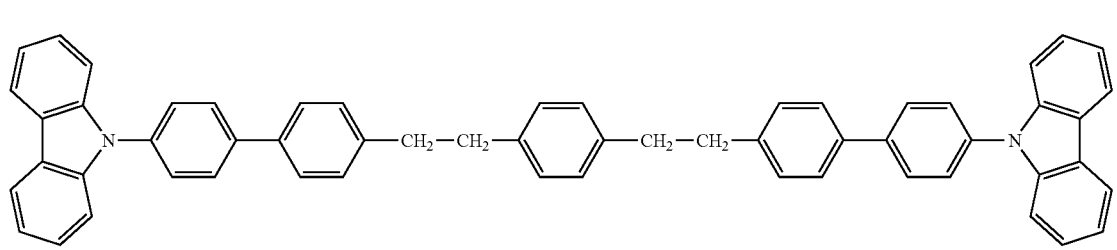
H-66
| Compound | Nucleus | A |
|---|---|---|
| 1 | ![](tri-A benzene) | ![](methyl pyrrolo-dipyridine) |
| 2 | ![](tri-A benzene) | ![](methyl pyrrolo-dipyridine isomer) |

-continued
| | | |
|---|---|---|
| 3 | 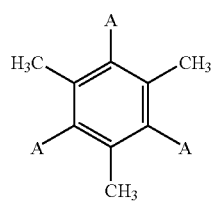 | 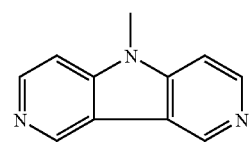 |
| 4 | 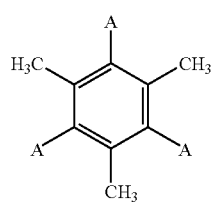 | 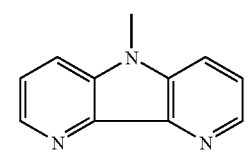 |
| 5 | 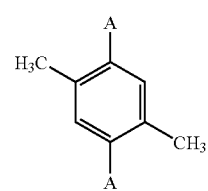 | 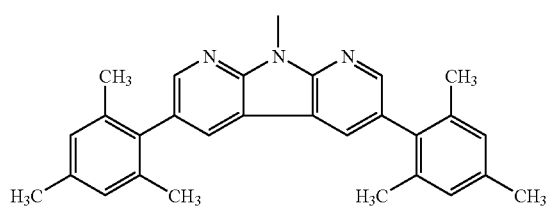 |
| 6 | 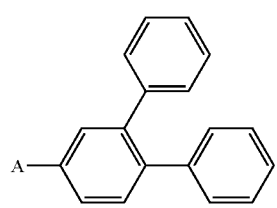 | 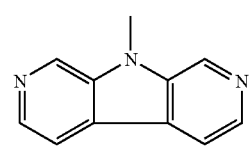 |
| 7 | 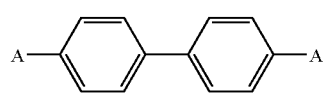 | 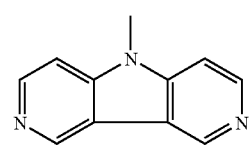 |
| 8 | 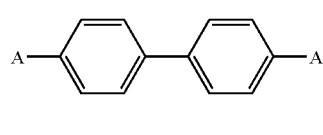 | 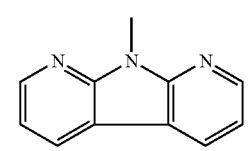 |
| 9 | 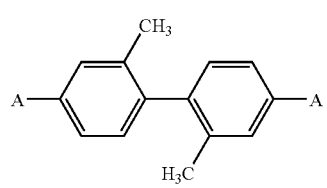 | 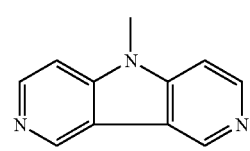 |
| 10 | 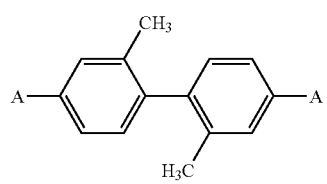 | 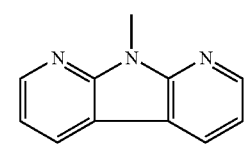 |

-continued
| | | |
|---|---|---|
| 11 | 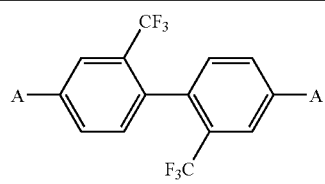 | 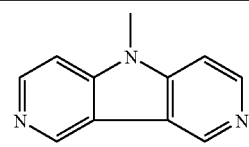 |
| 12 | 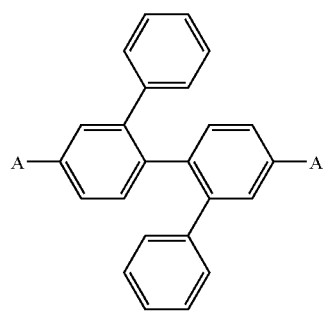 | 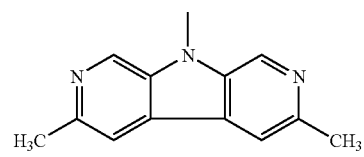 |
| 13 | 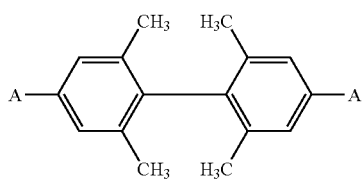 | 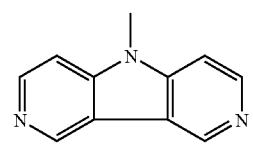 |
| 14 | 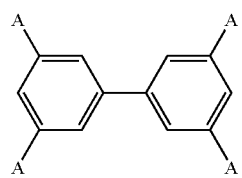 | 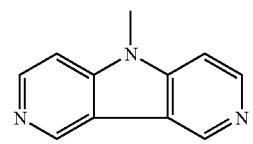 |
| 15 | 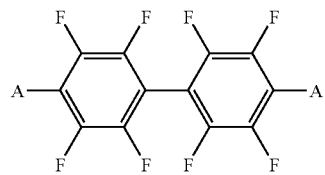 | 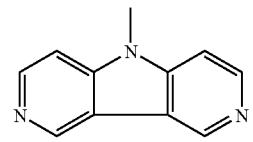 |
| 16 | 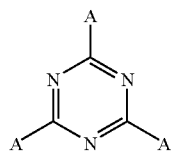 | 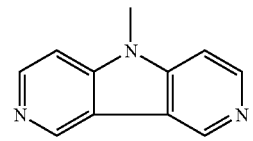 |
| 17 | 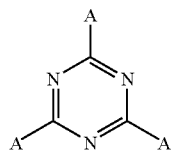 | 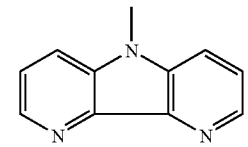 |
| 18 | 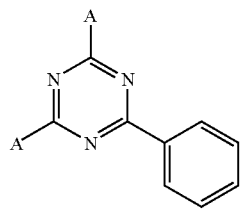 | 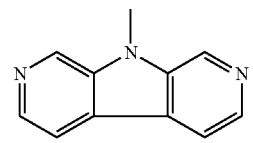 |

-continued
| | | |
|---|---|---|
| 19 | 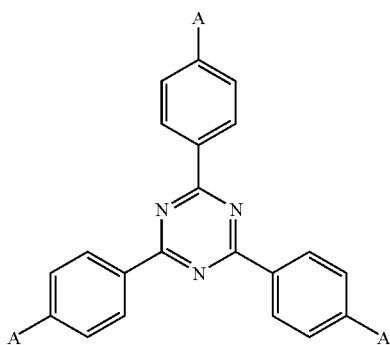 | 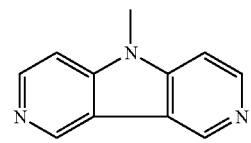 |
| 20 | 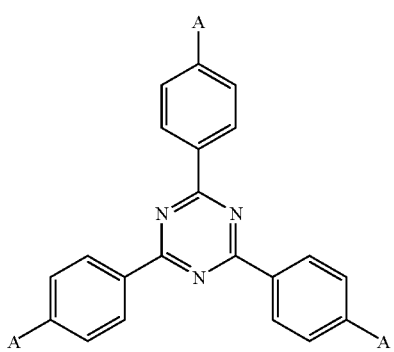 | 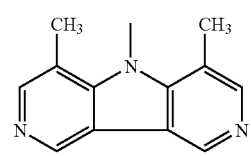 |
| 21 | 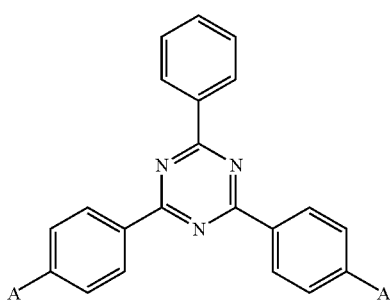 | 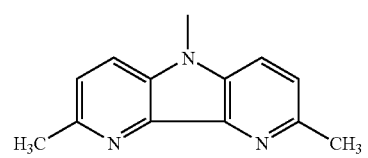 |
| 22 | 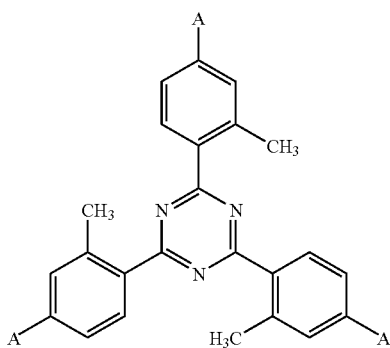 | 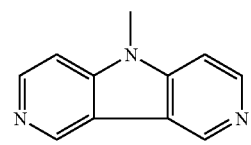 |

-continued
23 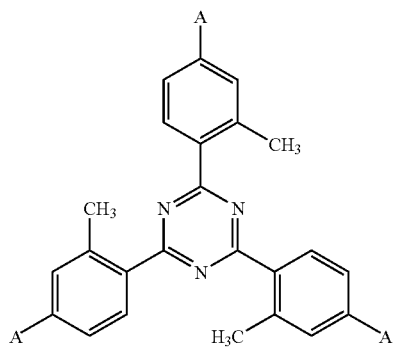 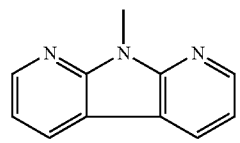
24 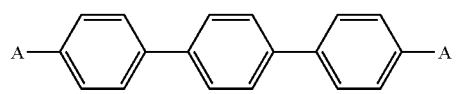 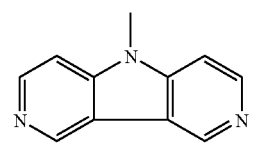
25 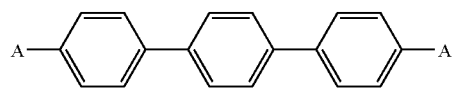 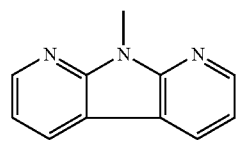
26 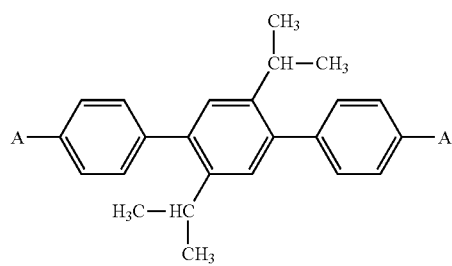 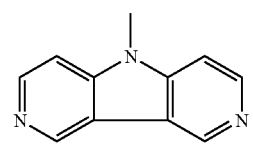
27 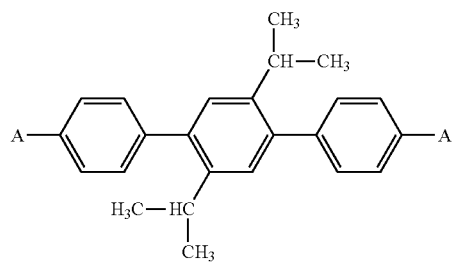 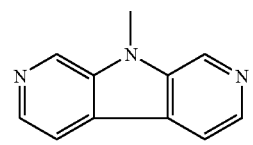
28 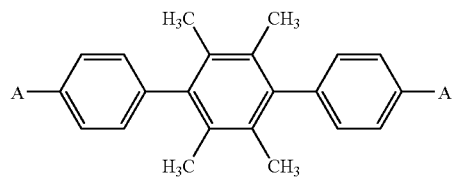 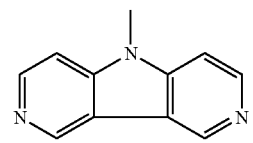
29 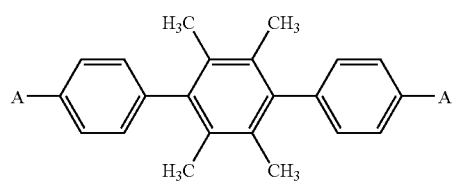 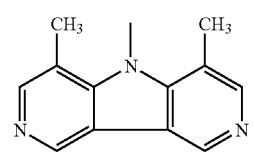

-continued
| | | |
|---|---|---|
| 30 | 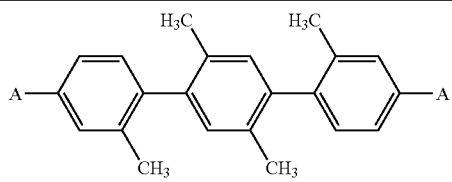 | 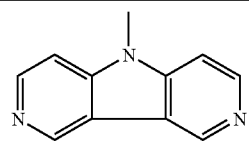 |
| 31 | 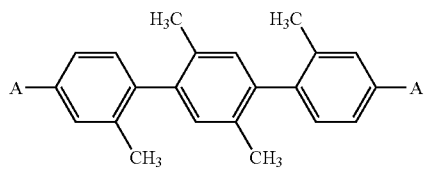 | 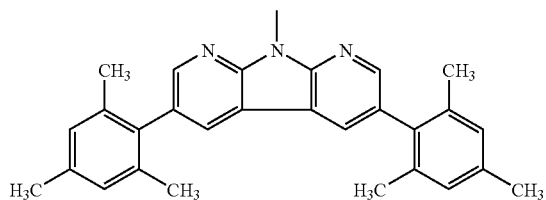 |
| 32 | 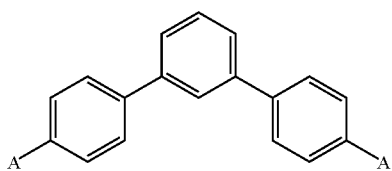 | 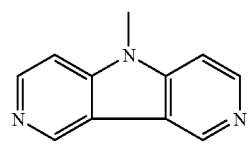 |
| 33 | 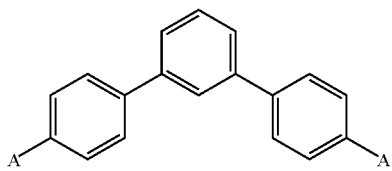 | 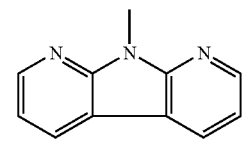 |
| 34 | 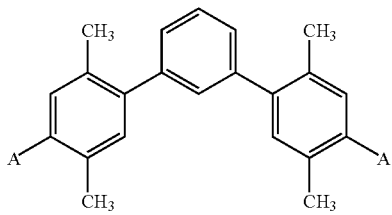 | 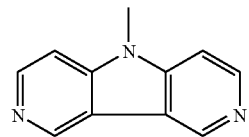 |
| 35 | 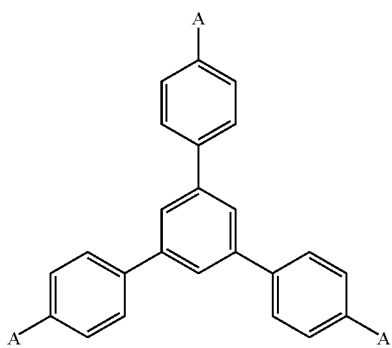 | 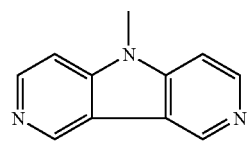 |

-continued
36 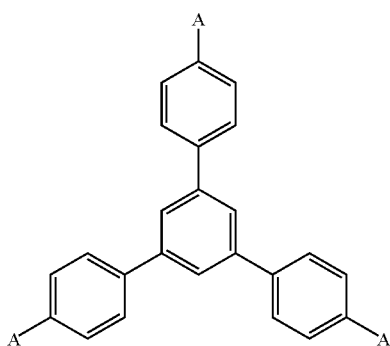 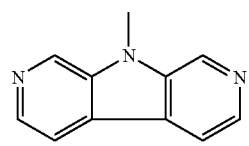
37 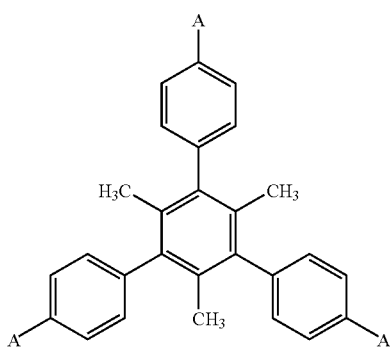 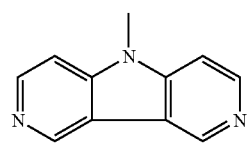
38 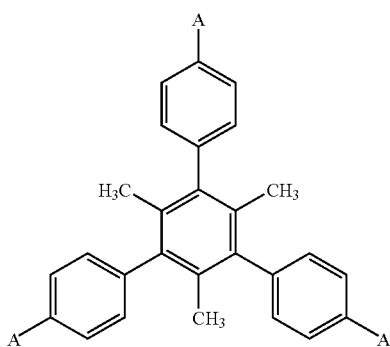 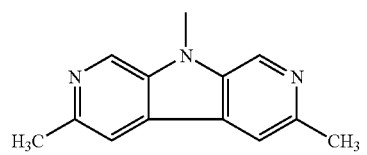
39 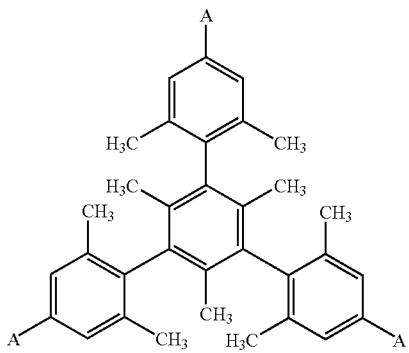 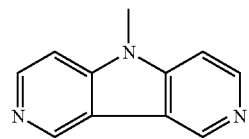

-continued
40 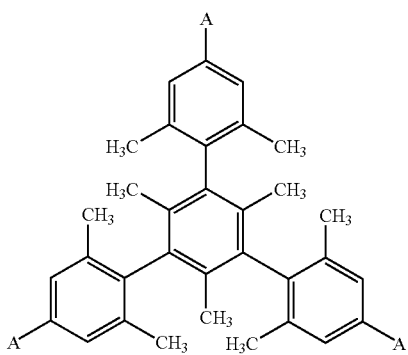 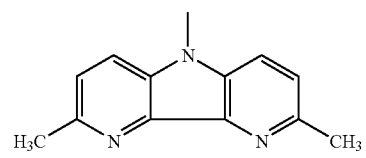
41 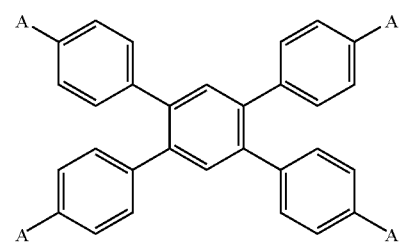 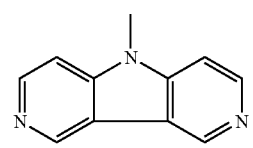
42 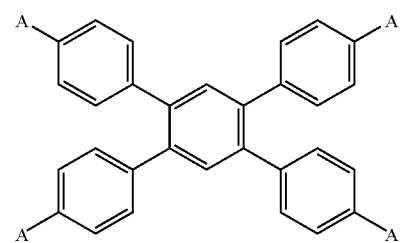 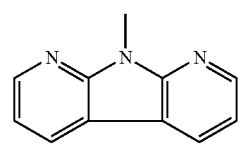
43 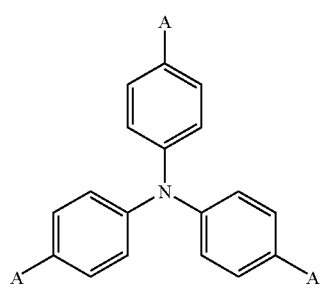 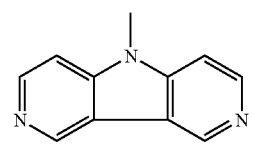
44 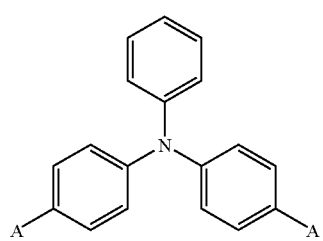 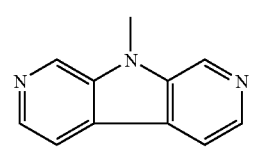
45 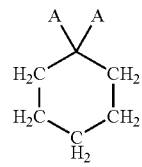 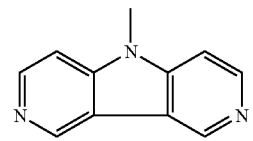

-continued
| | | |
|---|---|---|
| 46 | 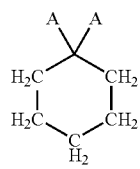 | 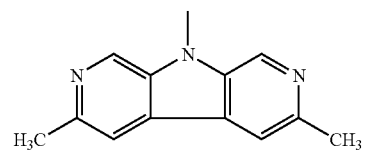 |
| 47 | 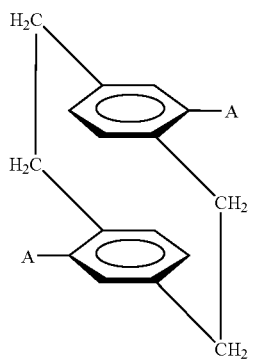 | 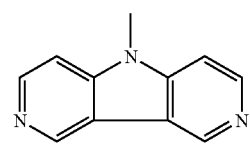 |
| 48 | 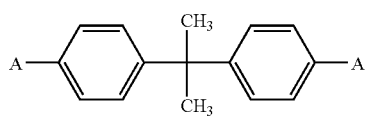 | 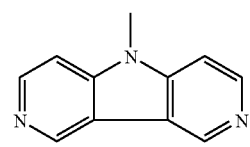 |
| 49 | 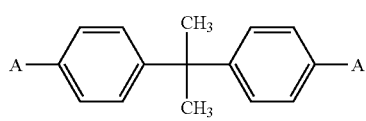 | 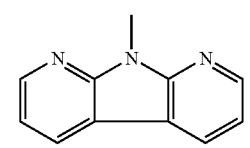 |
| 50 | 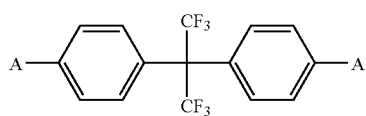 | 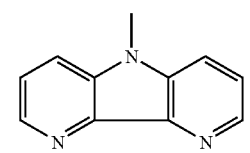 |
| 51 | 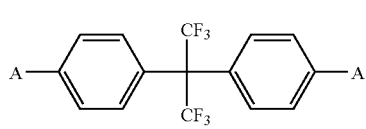 | 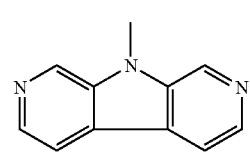 |
| 52 | 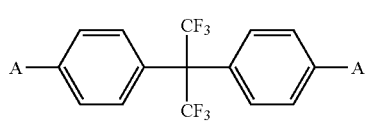 | 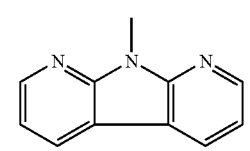 |
| 53 | 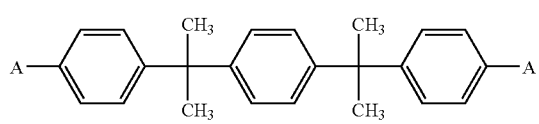 | 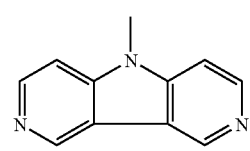 |
| 54 | 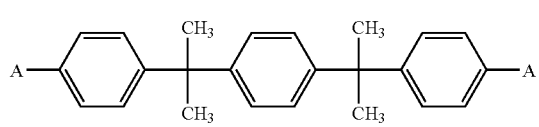 | 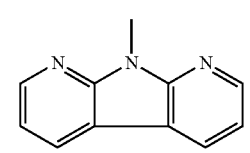 |

-continued
| | | |
|---|---|---|
| 55 | 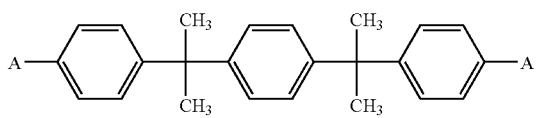 | 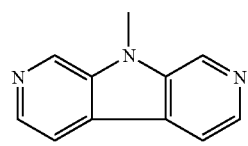 |
| 56 | 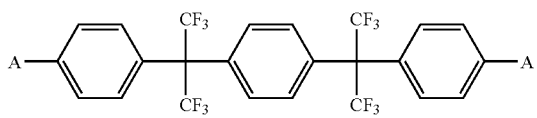 | 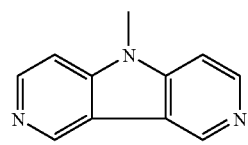 |
| 57 | 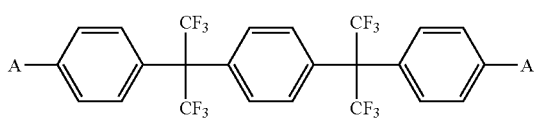 | 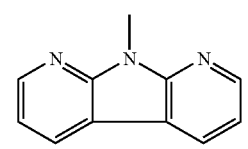 |
| 58 | 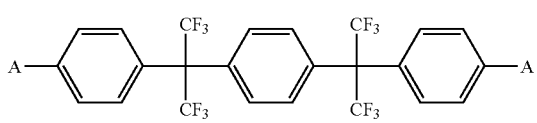 | 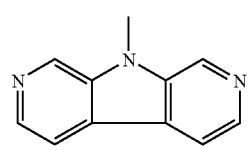 |
| 59 | 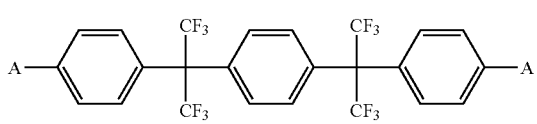 | 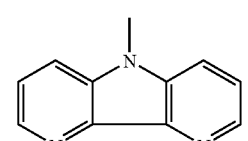 |
| 60 | 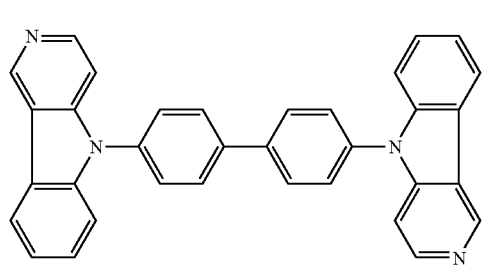 [SMILES: c1ccc2c(c1)c1cnccc1n2-c1ccc(-c2ccc(-n3c4ccccc4c4cnccc43)cc2)cc1] | |
| 61 | 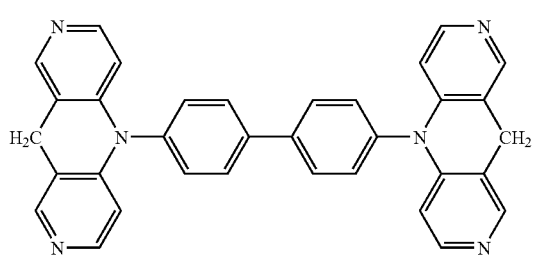 [SMILES: c1cc2c(cn1)Cc1cnccc1N2c1ccc(-c2ccc(N3c4ccncc4Cc4cnccc43)cc2)cc1] | |
| 62 | 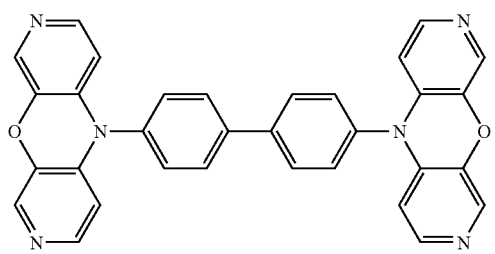 [SMILES: c1cc2c(cn1)Oc1cnccc1N2c1ccc(-c2ccc(N3c4ccncc4Oc4cnccc43)cc2)cc1] | |

-continued
63
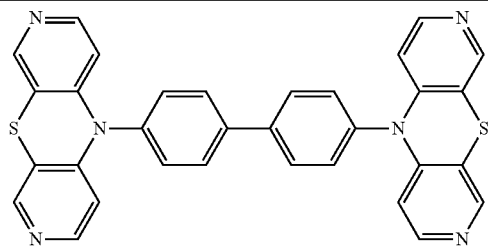
64
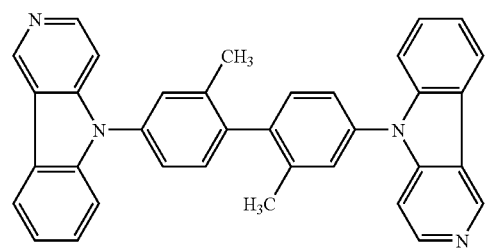 [SMILES: Cc1cc(-n2c3ccccc3c3cnccc32)ccc1-c1ccc(-n2c3ccccc3c3cnccc32)cc1C]
65
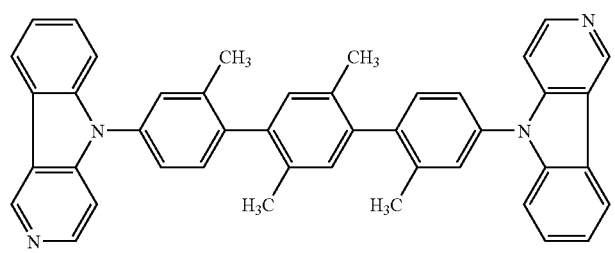 [SMILES: Cc1cc(-n2c3ccccc3c3cnccc32)ccc1-c1cc(C)c(-c2ccc(-n3c4ccccc4c4cnccc43)cc2C)cc1C]
66
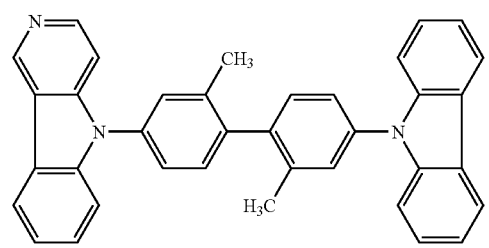 [SMILES: Cc1cc(-n2c3ccccc3c3ccccc32)ccc1-c1ccc(-n2c3ccccc3c3cnccc32)cc1C]
67
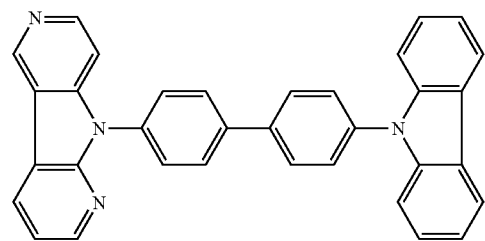 [SMILES: c1ccc2c(c1)c1ccccc1n2-c1ccc(-c2ccc(-n3c4ccncc4c4cccnc43)cc2)cc1]
68
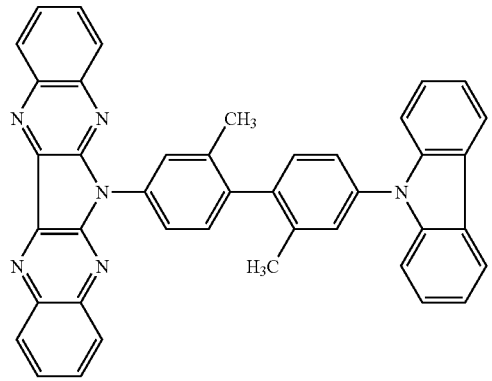 [SMILES: Cc1cc(-n2c3ccccc3c3ccccc32)ccc1-c1ccc(-n2c3nc4ccccc4nc3c3nc4ccccc4nc32)cc1C]

69
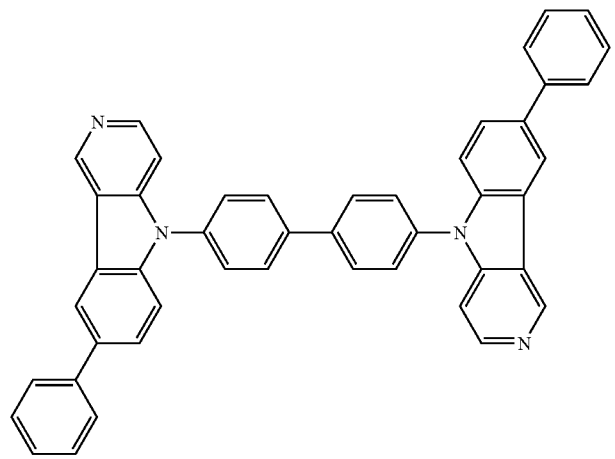 [SMILES: c1ccc(-c2ccc3c(c2)c2cnccc2n3-c2ccc(-c3ccc(-n4c5ccncc5c5cc(-c6ccccc6)ccc54)cc3)cc2)cc1]
70
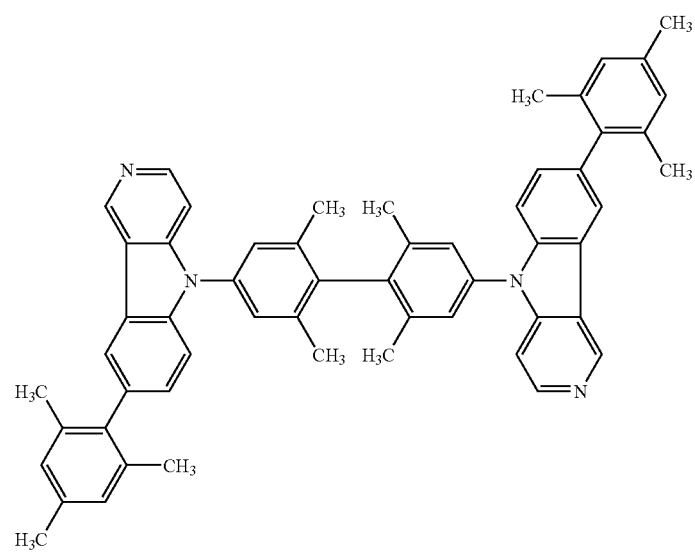 [SMILES: Cc1cc(C)c(-c2ccc3c(c2)c2cnccc2n3-c2cc(C)c(-c3c(C)cc(-n4c5ccncc5c5cc(-c6c(C)cc(C)cc6C)ccc54)cc3C)c(C)c2)c(C)c1]
71
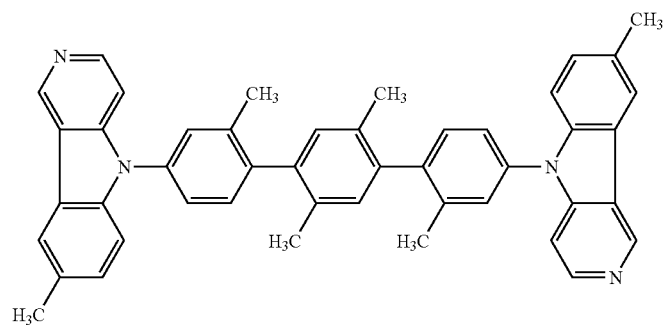 [SMILES: Cc1ccc2c(c1)c1cnccc1n2-c1ccc(-c2cc(C)c(-c3ccc(-n4c5ccncc5c5cc(C)ccc54)cc3C)cc2C)c(C)c1]
72
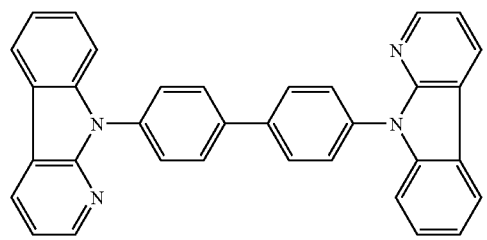 [SMILES: c1ccc2c(c1)c1cccnc1n2-c1ccc(-c2ccc(-n3c4ccccc4c4cccnc43)cc2)cc1]

-continued
73 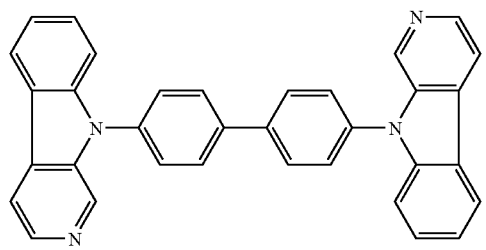
74 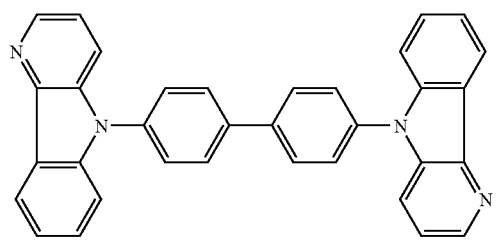 [SMILES: c1ccc2c(c1)c1ncccc1n2-c1ccc(-c2ccc(-n3c4ccccc4c4ncccc43)cc2)cc1]
75 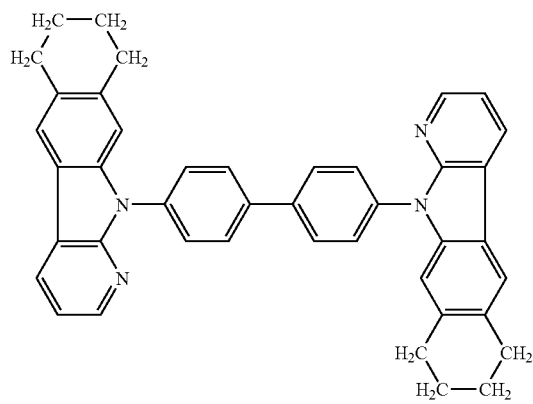 [SMILES: c1cnc2c(c1)c1cc3c(cc1n2-c1ccc(-c2ccc(-n4c5cc6c(cc5c5cccnc54)CCCC6)cc2)cc1)CCCC3]
76 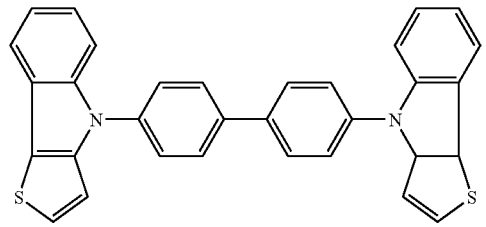 [SMILES: C1=CC2C(S1)c1ccccc1N2c1ccc(-c2ccc(-n3c4ccccc4c4sccc43)cc2)cc1]
77 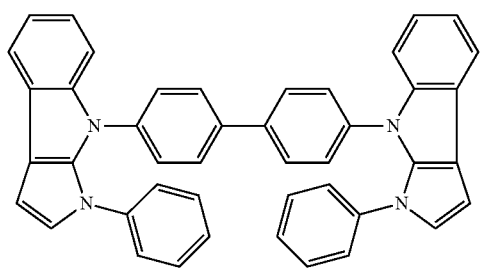 [SMILES: c1ccc(-n2ccc3c4ccccc4n(-c4ccc(-c5ccc(-n6c7ccccc7c7ccn(-c8ccccc8)c76)cc5)cc4)c32)cc1]

78
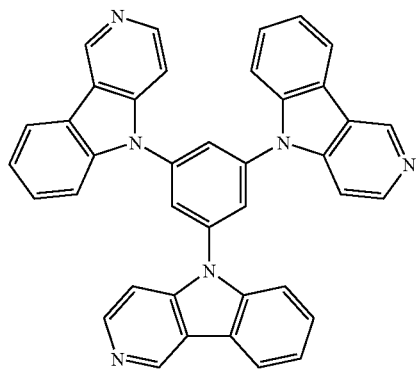 [SMILES: c1ccc2c(c1)c1cnccc1n2-c1cc(-n2c3ccccc3c3cnccc32)cc(-n2c3ccccc3c3cnccc32)c1]
79
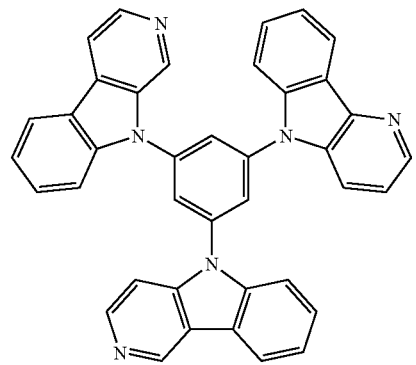 [SMILES: c1ccc2c(c1)c1cnccc1n2-c1cc(-n2c3ccccc3c3ccncc32)cc(-n2c3ccccc3c3ncccc32)c1]
80
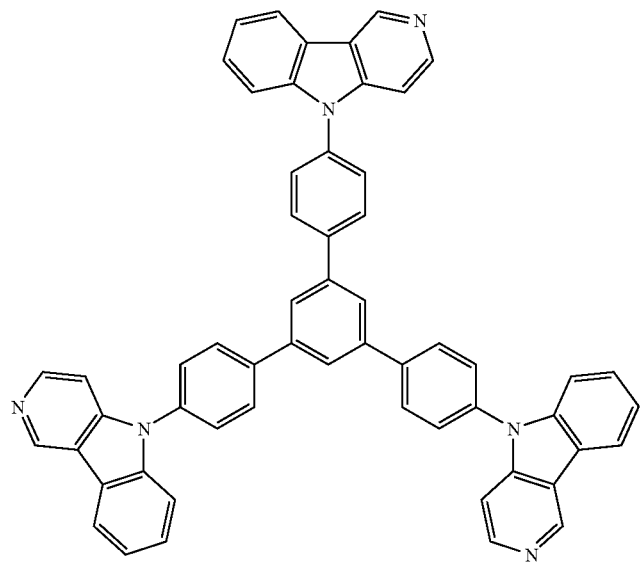 [SMILES: c1ccc2c(c1)c1cnccc1n2-c1ccc(-c2cc(-c3ccc(-n4c5ccccc5c5cnccc54)cc3)cc(-c3ccc(-n4c5ccccc5c5cnccc54)cc3)c2)cc1]

81
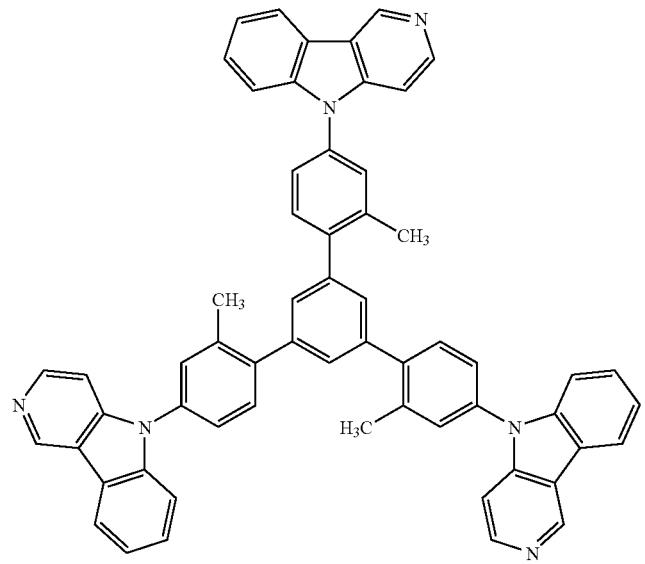
82
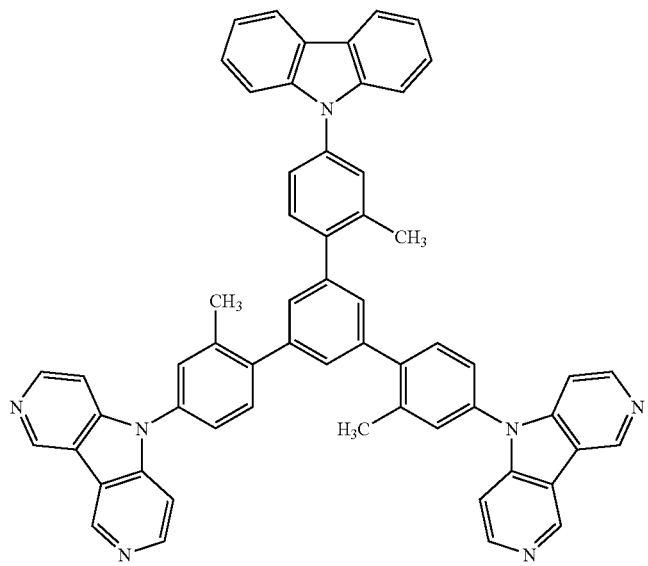 [SMILES: Cc1cc(-n2c3ccccc3c3ccccc32)ccc1-c1cc(-c2ccc(-n3c4ccncc4c4cnccc43)cc2C)cc(-c2ccc(-n3c4ccncc4c4cnccc43)cc2C)c1]

83
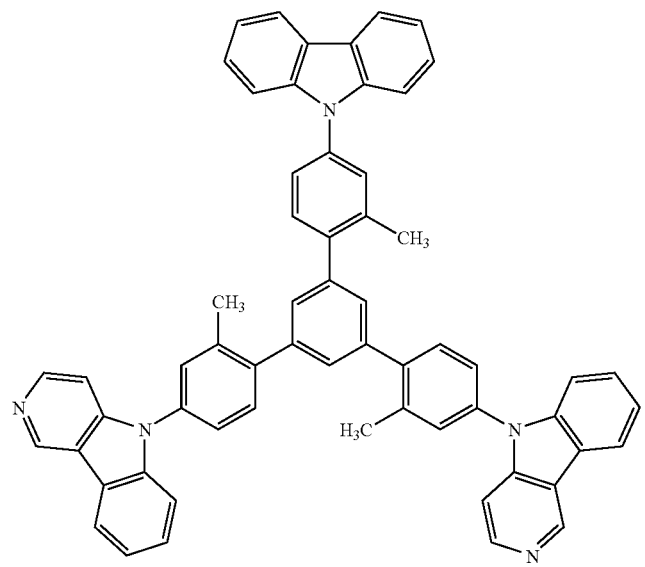 [SMILES: Cc1cc(-n2c3ccccc3c3ccccc32)ccc1-c1cc(-c2ccc(-n3c4ccccc4c4cnccc43)cc2C)cc(-c2ccc(-n3c4ccccc4c4cnccc43)cc2C)c1]
84
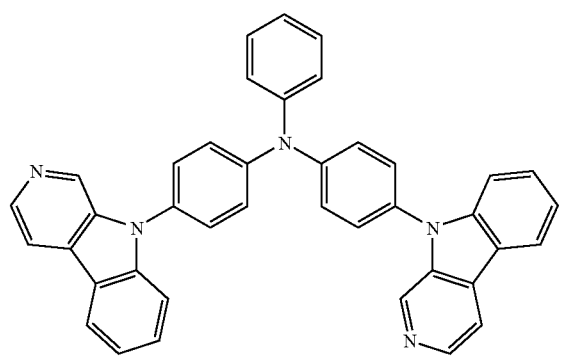 [SMILES: c1ccc(N(c2ccc(-n3c4ccccc4c4ccncc43)cc2)c2ccc(-n3c4ccccc4c4ccncc43)cc2)cc1]
85
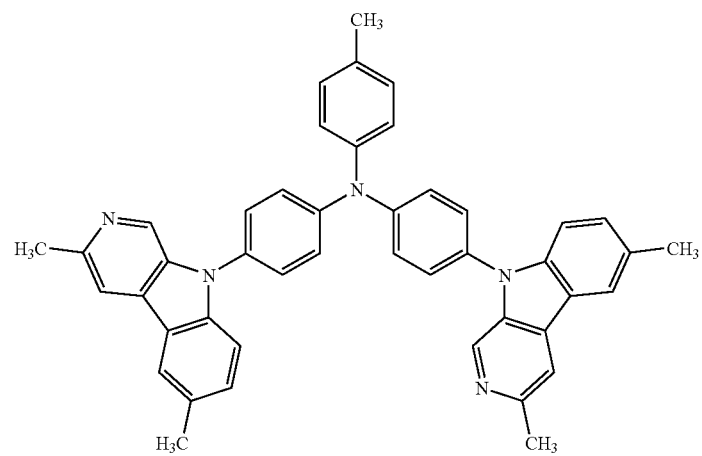

86 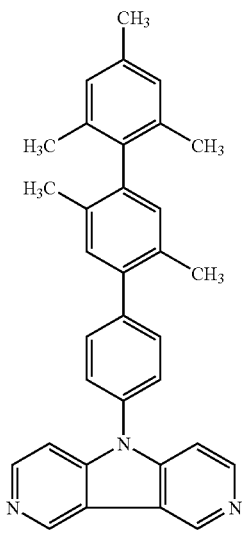 [SMILES: Cc1cc(C)c(-c2cc(C)c(-c3ccc(-n4c5ccncc5c5cnccc54)cc3)cc2C)c(C)c1]
87 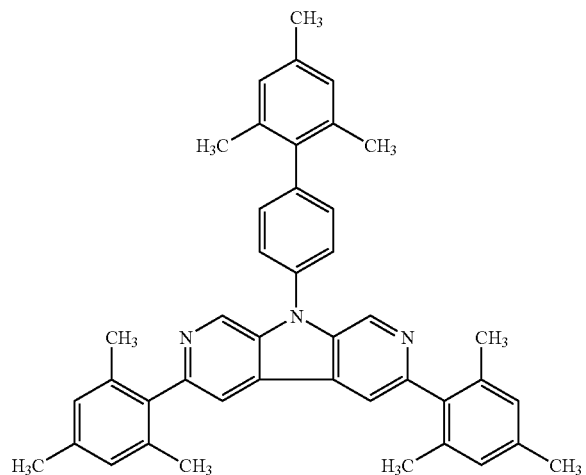
88 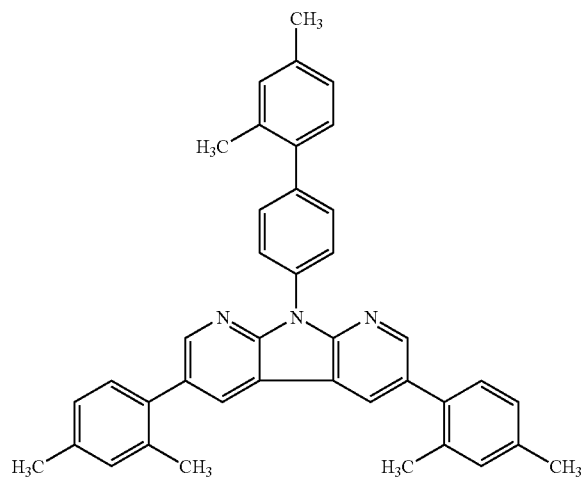

89
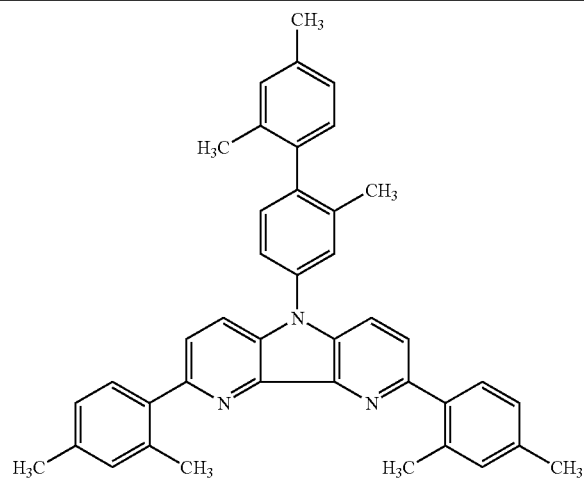
90
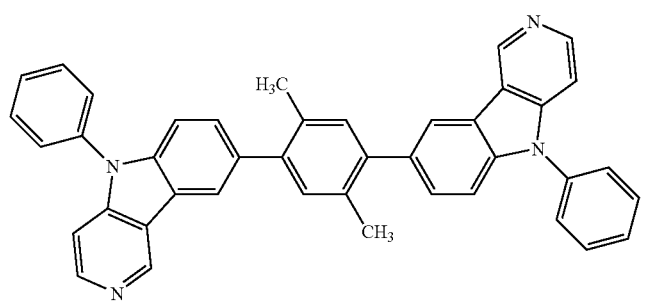 [SMILES: Cc1cc(-c2ccc3c(c2)c2cnccc2n3-c2ccccc2)c(C)cc1-c1ccc2c(c1)c1cnccc1n2-c1ccccc1]
91
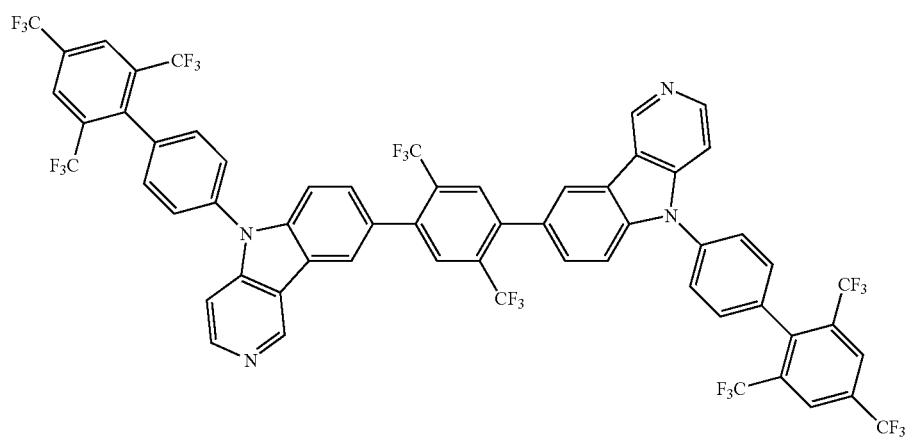 [SMILES: FC(F)(F)c1cc(C(F)(F)F)c(-c2ccc(-n3c4ccncc4c4cc(-c5cc(C(F)(F)F)c(-c6ccc7c(c6)c6cnccc6n7-c6ccc(-c7c(C(F)(F)F)cc(C(F)(F)F)cc7C(F)(F)F)cc6)cc5C(F)(F)F)ccc43)cc2)c(C(F)(F)F)c1]
92
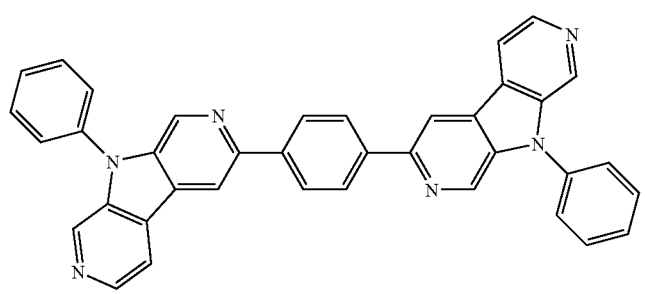 [SMILES: c1ccc(-n2c3cnccc3c3cc(-c4ccc(-c5cc6c7ccncc7n(-c7ccccc7)c6cn5)cc4)ncc32)cc1]

-continued
93
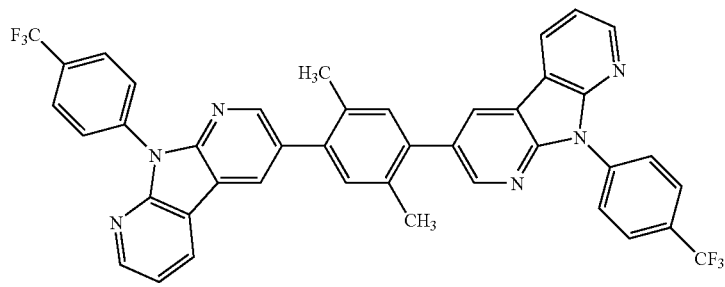 [SMILES: Cc1cc(-c2cnc3c(c2)c2cccnc2n3-c2ccc(C(F)(F)F)cc2)c(C)cc1-c1cnc2c(c1)c1cccnc1n2-c1ccc(C(F)(F)F)cc1]
94
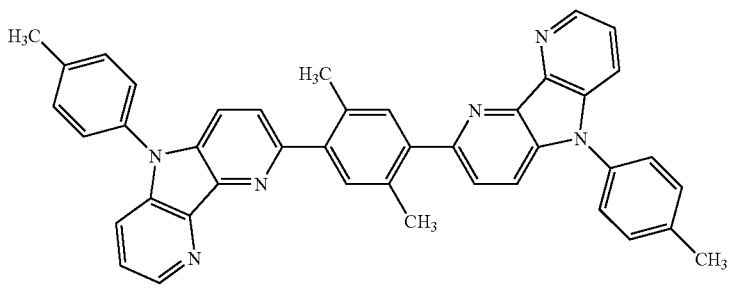
95
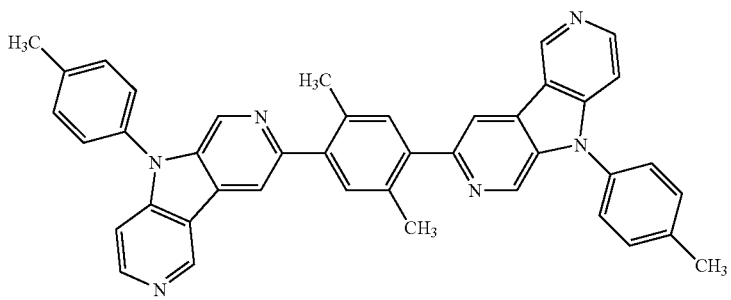
96
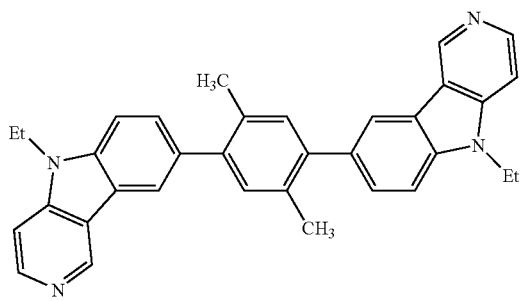 [SMILES: CCn1c2ccncc2c2cc(-c3cc(C)c(-c4ccc5c(c4)c4cnccc4n5CC)cc3C)ccc21]
97
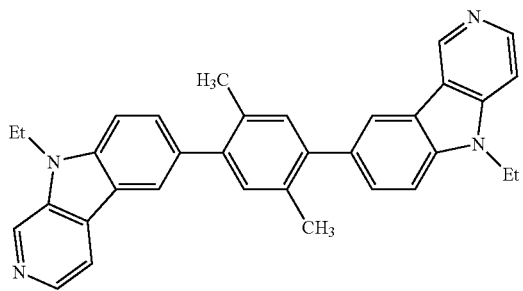 [SMILES: CCn1c2ccncc2c2cc(-c3cc(C)c(-c4ccc5c(c4)c4ccncc4n5CC)cc3C)ccc21]

-continued
98 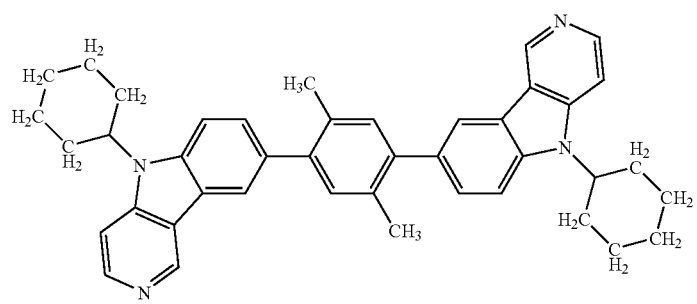 [SMILES: Cc1cc(-c2ccc3c(c2)c2cnccc2n3C2CCCCC2)c(C)cc1-c1ccc2c(c1)c1cnccc1n2C1CCCCC1]
99 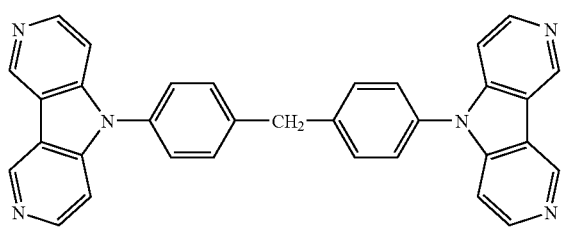 [SMILES: c1cc2c(cn1)c1cnccc1n2-c1ccc(Cc2ccc(-n3c4ccncc4c4cnccc43)cc2)cc1]
100 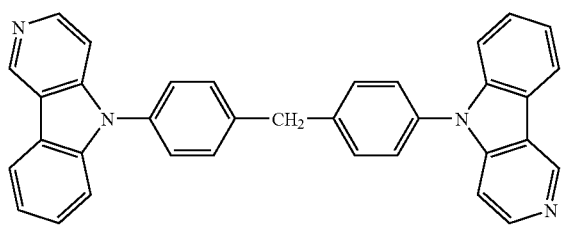 [SMILES: c1ccc2c(c1)c1ccccc1n2-c1ccc(Cc2ccc(-n3c4ccncc4c4cnccc43)cc2)cc1]
101 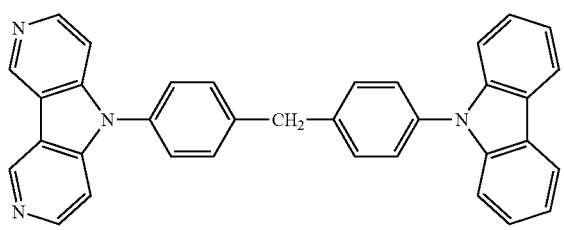
102 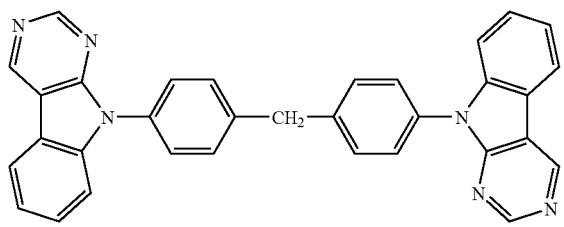 [SMILES: c1ccc2c(c1)c1cncnc1n2-c1ccc(Cc2ccc(-n3c4ccccc4c4cncnc43)cc2)cc1]
103 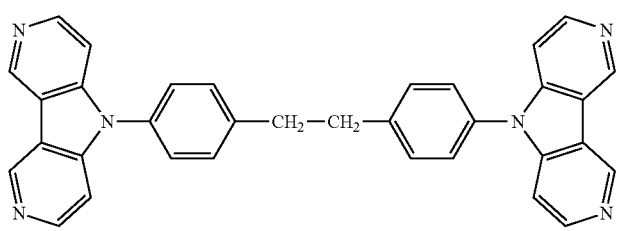 [SMILES: c1cc2c(cn1)c1cnccc1n2-c1ccc(CCc2ccc(-n3c4ccncc4c4cnccc43)cc2)cc1]

-continued
| 104 | 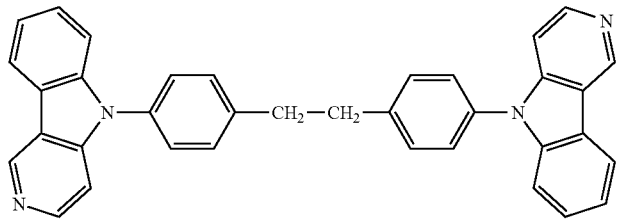 [SMILES: c1ccc2c(c1)c1cnccc1n2-c1ccc(CCc2ccc(-n3c4ccccc4c4cnccc43)cc2)cc1] |
| 105 | 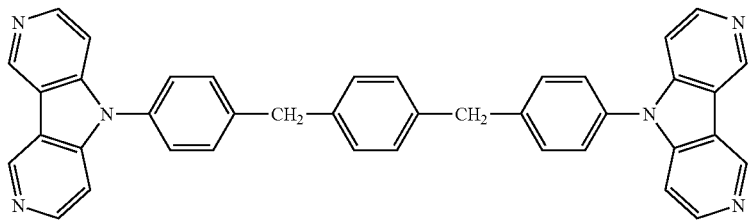 [SMILES: c1cc2c(cn1)c1cnccc1n2-c1ccc(Cc2ccc(Cc3ccc(-n4c5ccncc5c5cnccc54)cc3)cc2)cc1] |
| 106 | 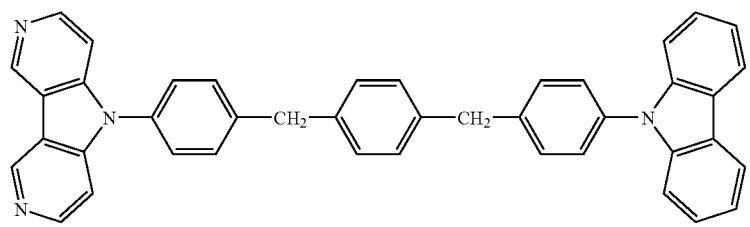 |
| 107 | 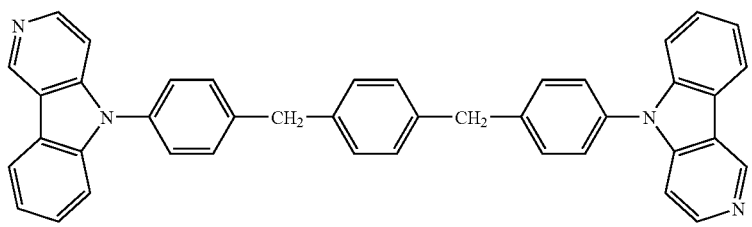 [SMILES: c1ccc2c(c1)c1cnccc1n2-c1ccc(Cc2ccc(Cc3ccc(-n4c5ccccc5c5cnccc54)cc3)cc2)cc1] |
| 108 | 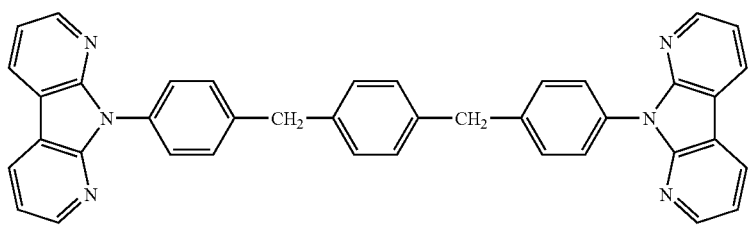 [SMILES: c1cnc2c(c1)c1cccnc1n2-c1ccc(Cc2ccc(Cc3ccc(-n4c5ncccc5c5cccnc54)cc3)cc2)cc1] |
| 109 | 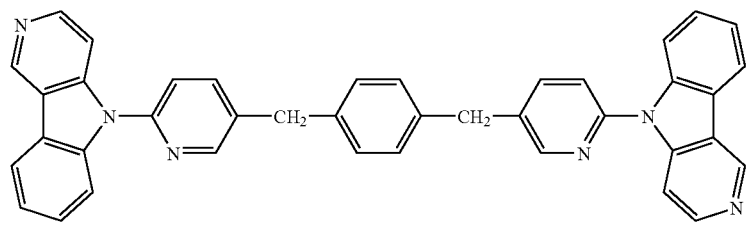 [SMILES: c1ccc2c(c1)c1cnccc1n2-c1ccc(Cc2ccc(Cc3ccc(-n4c5ccccc5c5cnccc54)nc3)cc2)cn1] |
| 110 | 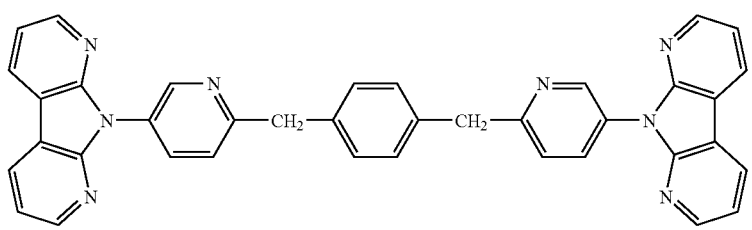 [SMILES: c1cnc2c(c1)c1cccnc1n2-c1ccc(Cc2ccc(Cc3ccc(-n4c5ncccc5c5cccnc54)cn3)cc2)nc1] |

-continued
111
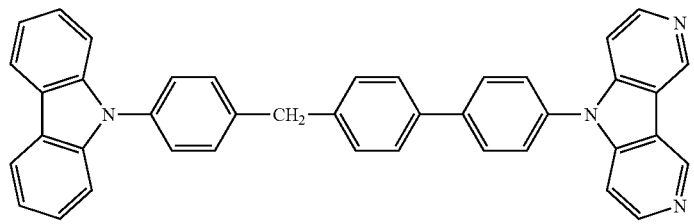 [SMILES: c1ccc2c(c1)c1ccccc1n2-c1ccc(Cc2ccc(-c3ccc(-n4c5ccncc5c5cnccc54)cc3)cc2)cc1]
112
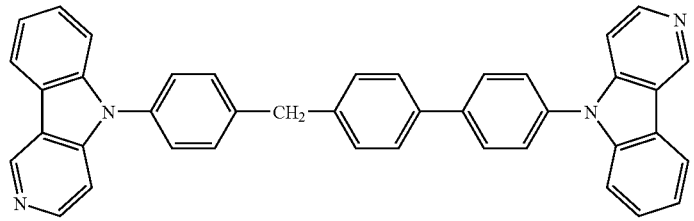 [SMILES: c1ccc2c(c1)c1cnccc1n2-c1ccc(Cc2ccc(-c3ccc(-n4c5ccccc5c5cnccc54)cc3)cc2)cc1]
113
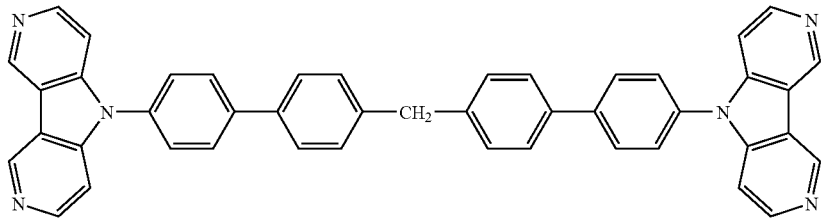 [SMILES: c1cc2c(cn1)c1cnccc1n2-c1ccc(-c2ccc(Cc3ccc(-c4ccc(-n5c6ccncc6c6cnccc65)cc4)cc3)cc2)cc1]
114
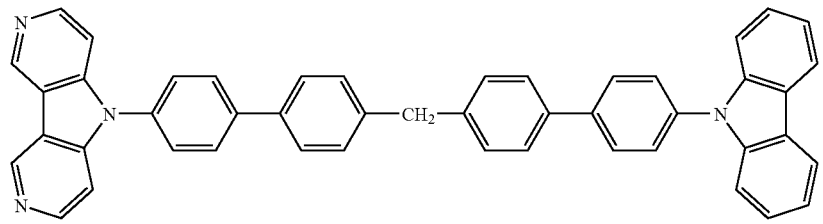 [SMILES: c1ccc2c(c1)c1ccccc1n2-c1ccc(-c2ccc(Cc3ccc(-c4ccc(-n5c6ccncc6c6cnccc65)cc4)cc3)cc2)cc1]
115
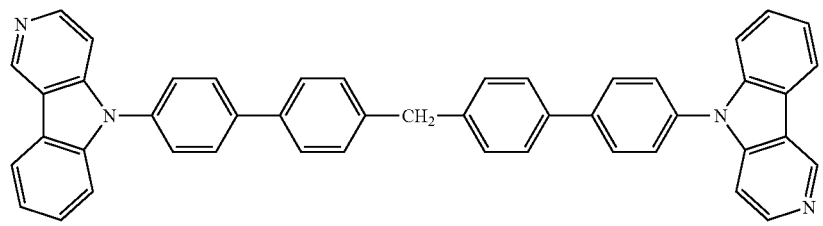 [SMILES: c1ccc2c(c1)c1cnccc1n2-c1ccc(-c2ccc(Cc3ccc(-c4ccc(-n5c6ccccc6c6cnccc65)cc4)cc3)cc2)cc1]
116
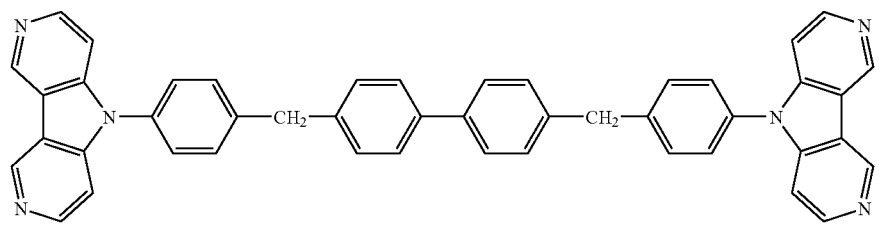 [SMILES: c1cc2c(cn1)c1cnccc1n2-c1ccc(Cc2ccc(-c3ccc(Cc4ccc(-n5c6ccncc6c6cnccc65)cc4)cc3)cc2)cc1]
117
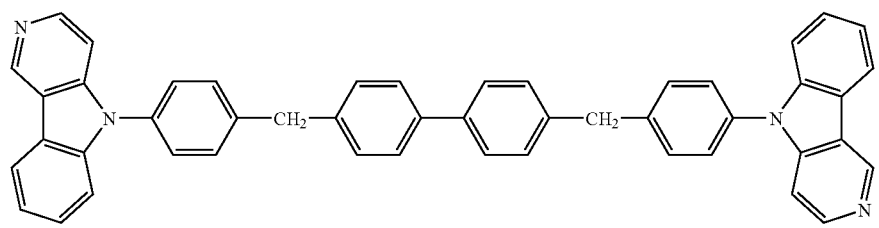 [SMILES: c1ccc2c(c1)c1ccccc1n2-c1ccc(Cc2ccc(-c3ccc(Cc4ccc(-n5c6ccncc6c6cnccc65)cc4)cc3)cc2)cc1]

-continued
118
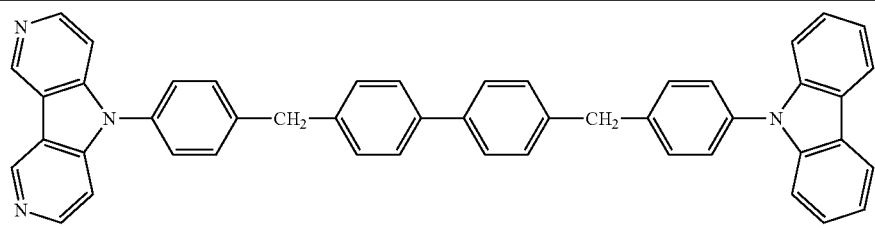
119
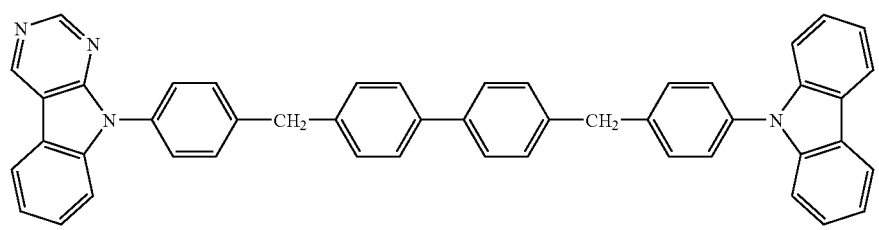 [SMILES: c1ccc2c(c1)c1ccccc1n2-c1ccc(Cc2ccc(-c3ccc(Cc4ccc(-n5c6ccccc6c6cncnc65)cc4)cc3)cc2)cc1]
120
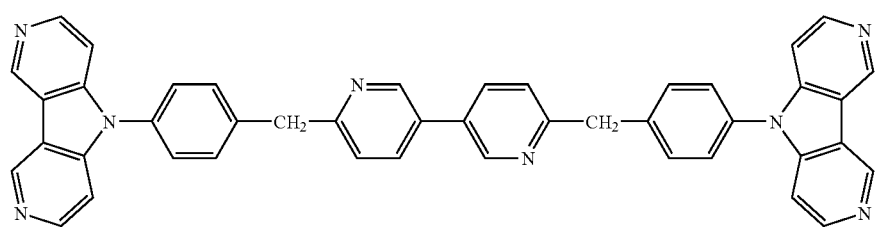 [SMILES: c1cc2c(cn1)c1cnccc1n2-c1ccc(Cc2ccc(-c3ccc(Cc4ccc(-n5c6ccncc6c6cnccc65)cc4)nc3)cn2)cc1]
121
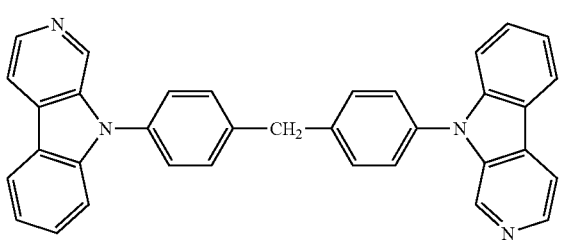 [SMILES: c1ccc2c(c1)c1ccncc1n2-c1ccc(Cc2ccc(-n3c4ccccc4c4ccncc43)cc2)cc1]
122
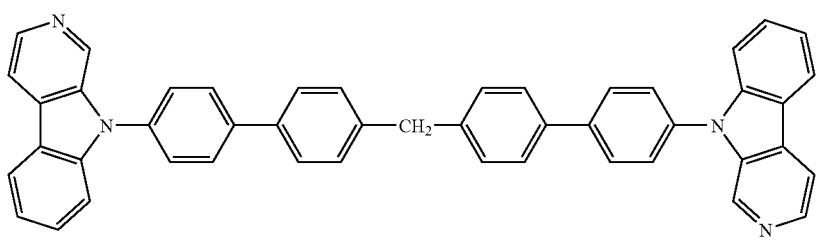 [SMILES: c1ccc2c(c1)c1ccncc1n2-c1ccc(-c2ccc(Cc3ccc(-c4ccc(-n5c6ccccc6c6ccncc65)cc4)cc3)cc2)cc1]
123
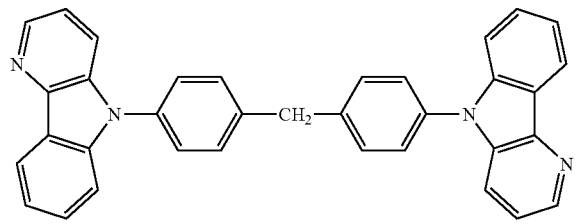 [SMILES: c1ccc2c(c1)c1ncccc1n2-c1ccc(Cc2ccc(-n3c4ccccc4c4ncccc43)cc2)cc1]
124
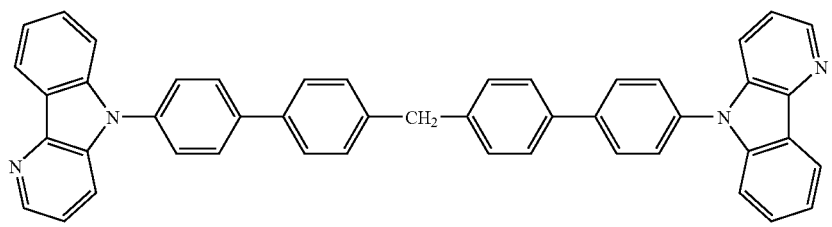 [SMILES: c1ccc2c(c1)c1ncccc1n2-c1ccc(-c2ccc(Cc3ccc(-c4ccc(-n5c6ccccc6c6ncccc65)cc4)cc3)cc2)cc1]

125
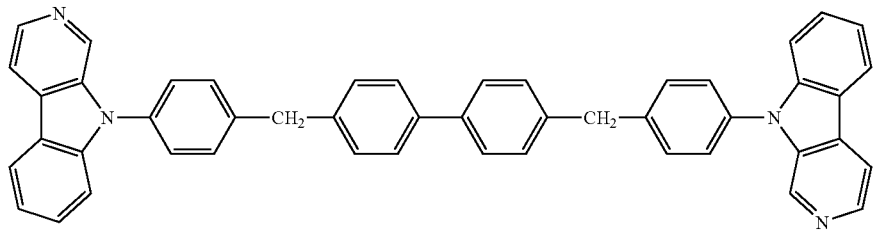 [SMILES: c1ccc2c(c1)c1ccncc1n2-c1ccc(Cc2ccc(-c3ccc(Cc4ccc(-n5c6ccccc6c6ccncc65)cc4)cc3)cc2)cc1]
126
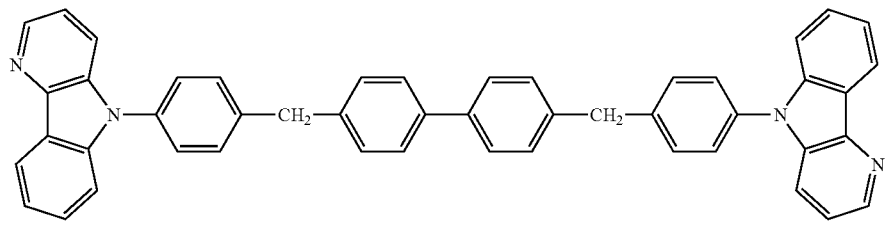 [SMILES: c1ccc2c(c1)c1ncccc1n2-c1ccc(Cc2ccc(-c3ccc(Cc4ccc(-n5c6ccccc6c6ncccc65)cc4)cc3)cc2)cc1]
127
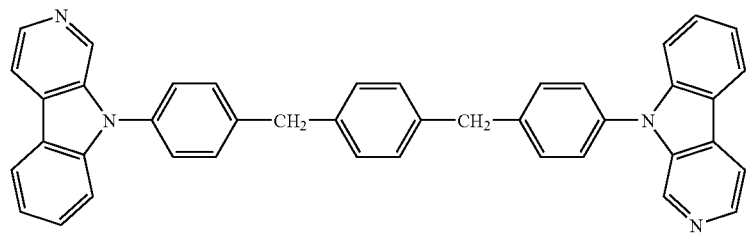 [SMILES: c1ccc2c(c1)c1ccncc1n2-c1ccc(Cc2ccc(Cc3ccc(-n4c5ccccc5c5ccncc54)cc3)cc2)cc1]
128
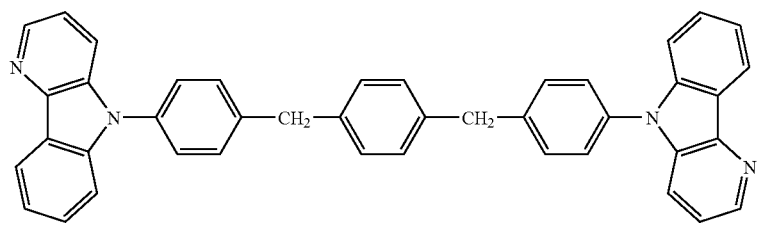 [SMILES: c1ccc2c(c1)c1ncccc1n2-c1ccc(Cc2ccc(Cc3ccc(-n4c5ccccc5c5ncccc54)cc3)cc2)cc1]
129
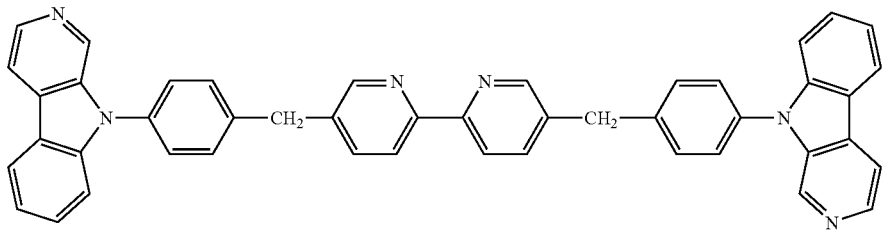 [SMILES: c1ccc2c(c1)c1ccncc1n2-c1ccc(Cc2ccc(-c3ccc(Cc4ccc(-n5c6ccccc6c6ccncc65)cc4)cn3)nc2)cc1]
130
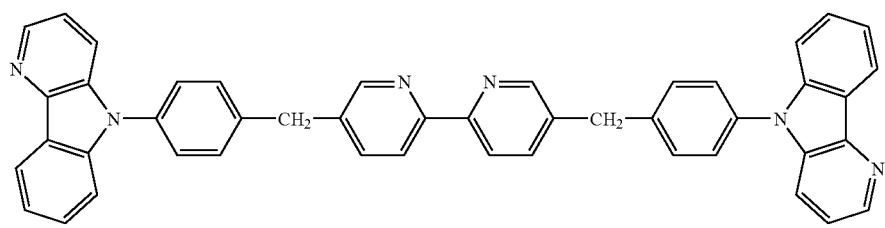 [SMILES: c1ccc2c(c1)c1ncccc1n2-c1ccc(Cc2ccc(-c3ccc(Cc4ccc(-n5c6ccccc6c6ncccc65)cc4)cn3)nc2)cc1]

131
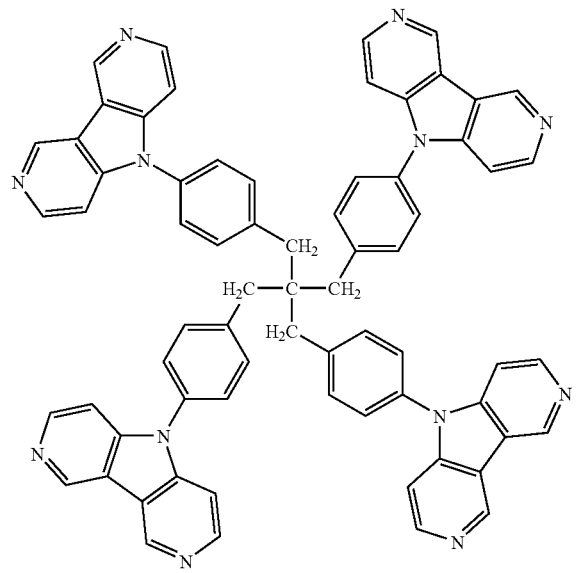 [SMILES: c1cc2c(cn1)c1cnccc1n2-c1ccc(CC(Cc2ccc(-n3c4ccncc4c4cnccc43)cc2)(Cc2ccc(-n3c4ccncc4c4cnccc43)cc2)Cc2ccc(-n3c4ccncc4c4cnccc43)cc2)cc1]
132
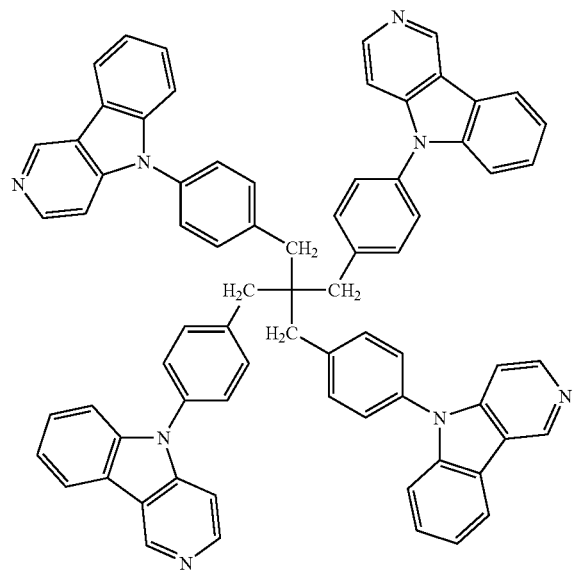 [SMILES: c1ccc2c(c1)c1cnccc1n2-c1ccc(CC(Cc2ccc(-n3c4ccccc4c4cnccc43)cc2)(Cc2ccc(-n3c4ccccc4c4cnccc43)cc2)Cc2ccc(-n3c4ccccc4c4cnccc43)cc2)cc1]
133
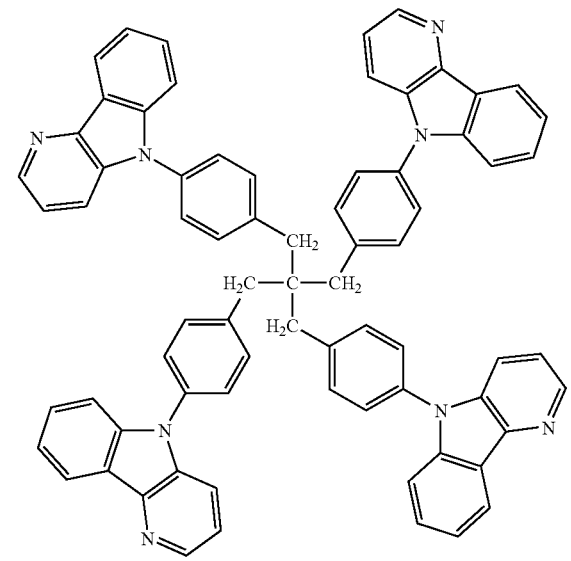 [SMILES: c1ccc2c(c1)c1ncccc1n2-c1ccc(CC(Cc2ccc(-n3c4ccccc4c4ncccc43)cc2)(Cc2ccc(-n3c4ccccc4c4ncccc43)cc2)Cc2ccc(-n3c4ccccc4c4ncccc43)cc2)cc1]

134
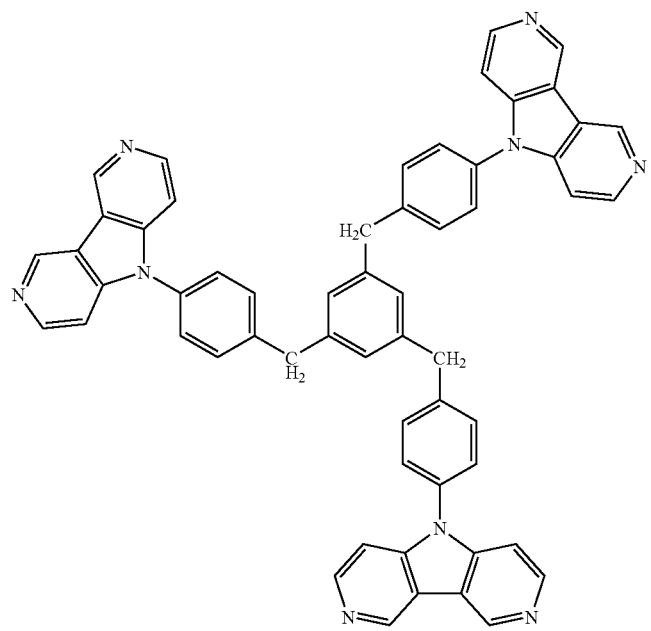 [SMILES: c1cc2c(cn1)c1cnccc1n2-c1ccc(Cc2cc(Cc3ccc(-n4c5ccncc5c5cnccc54)cc3)cc(Cc3ccc(-n4c5ccncc5c5cnccc54)cc3)c2)cc1]
135
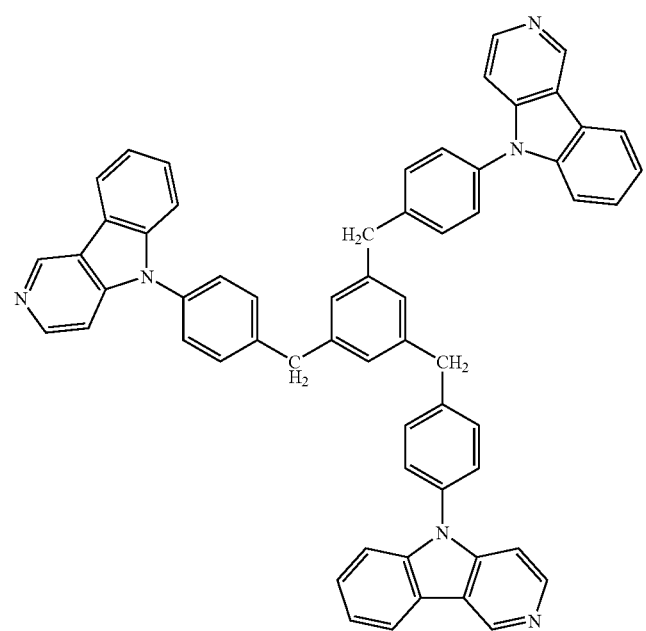 [SMILES: c1ccc2c(c1)c1cnccc1n2-c1ccc(Cc2cc(Cc3ccc(-n4c5ccccc5c5cnccc54)cc3)cc(Cc3ccc(-n4c5ccccc5c5cnccc54)cc3)c2)cc1]

136 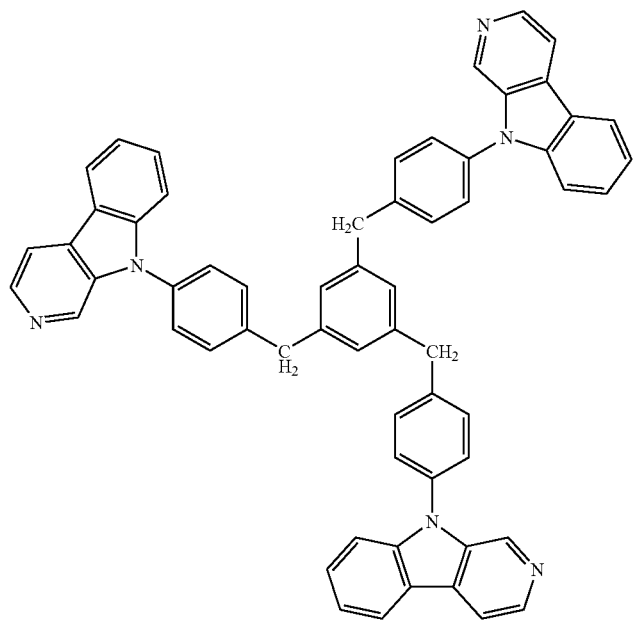 [SMILES: c1ccc2c(c1)c1ccncc1n2-c1ccc(Cc2cc(Cc3ccc(-n4c5ccccc5c5ccncc54)cc3)cc(Cc3ccc(-n4c5ccccc5c5ccncc54)cc3)c2)cc1]
137 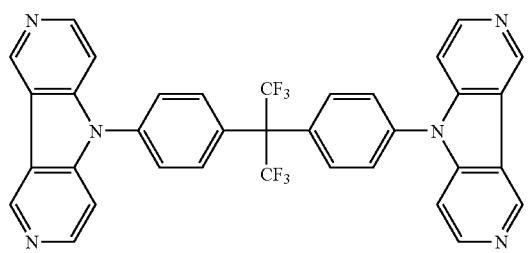 [SMILES: FC(F)(F)C(c1ccc(-n2c3ccncc3c3cnccc32)cc1)(c1ccc(-n2c3ccncc3c3cnccc32)cc1)C(F)(F)F]
138 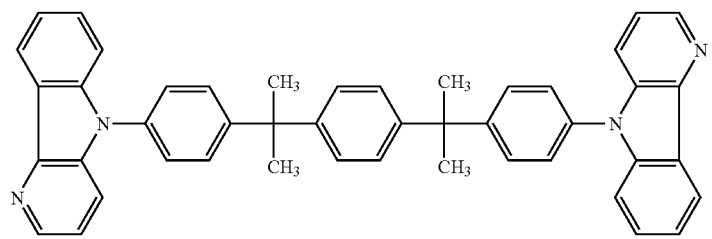 [SMILES: CC(C)(c1ccc(-n2c3ccccc3c3ncccc32)cc1)c1ccc(C(C)(C)c2ccc(-n3c4ccccc4c4ncccc43)cc2)cc1]
139 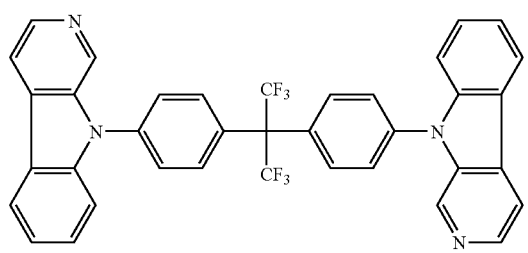 [SMILES: FC(F)(F)C(c1ccc(-n2c3ccccc3c3ccncc32)cc1)(c1ccc(-n2c3ccccc3c3ccncc32)cc1)C(F)(F)F]
140 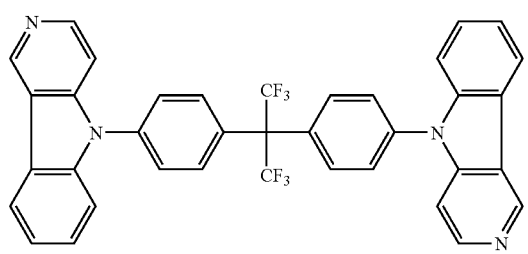 [SMILES: FC(F)(F)C(c1ccc(-n2c3ccccc3c3cnccc32)cc1)(c1ccc(-n2c3ccccc3c3cnccc32)cc1)C(F)(F)F]

141
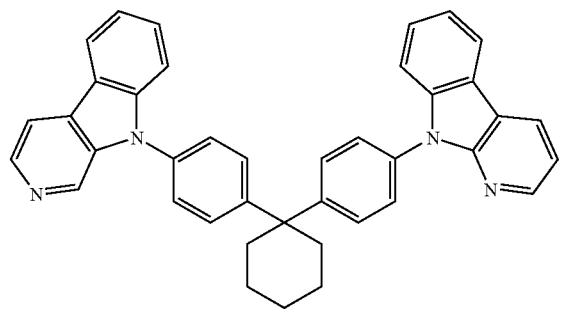 [SMILES: c1ccc2c(c1)c1ccncc1n2-c1ccc(C2(c3ccc(-n4c5ccccc5c5cccnc54)cc3)CCCCC2)cc1]
142
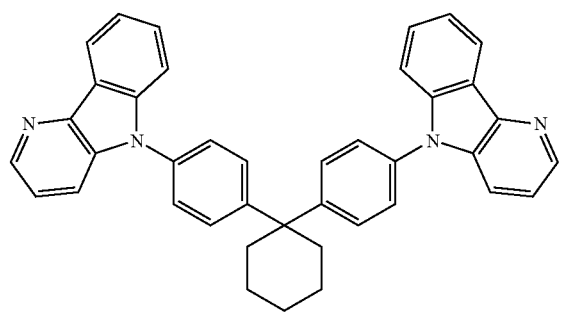 [SMILES: c1ccc2c(c1)c1ncccc1n2-c1ccc(C2(c3ccc(-n4c5ccccc5c5ncccc54)cc3)CCCCC2)cc1]
143
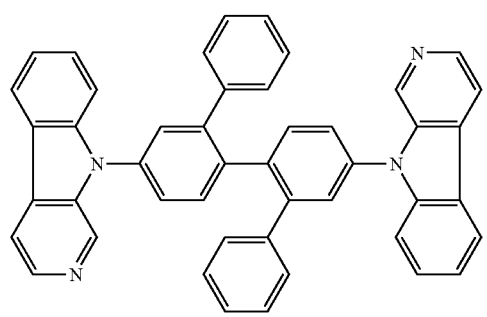 [SMILES: c1ccc(-c2cc(-n3c4ccccc4c4ccncc43)ccc2-c2ccc(-n3c4ccccc4c4ccncc43)cc2-c2ccccc2)cc1]
144
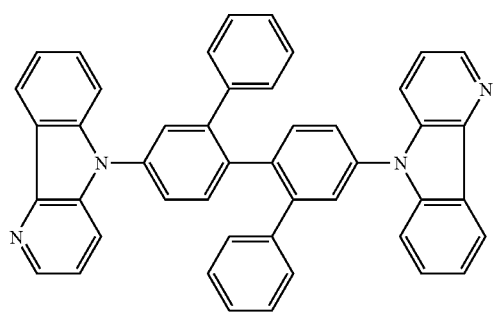 [SMILES: c1ccc(-c2cc(-n3c4ccccc4c4ncccc43)ccc2-c2ccc(-n3c4ccccc4c4ncccc43)cc2-c2ccccc2)cc1]
145
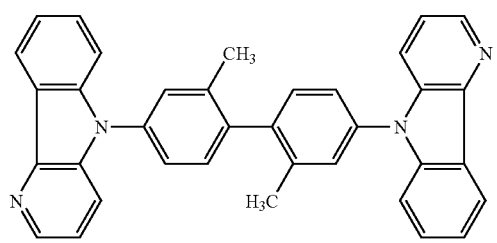 [SMILES: Cc1cc(-n2c3ccccc3c3ncccc32)ccc1-c1ccc(-n2c3ccccc3c3ncccc32)cc1C]

-continued
146
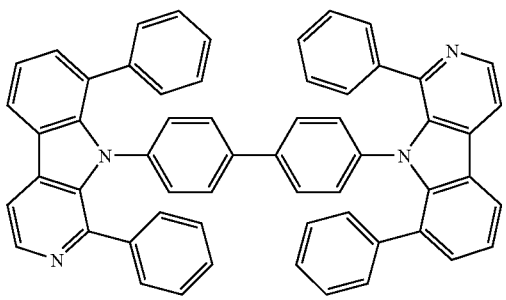 [SMILES: c1ccc(-c2cccc3c4ccnc(-c5ccccc5)c4n(-c4ccc(-c5ccc(-n6c7c(-c8ccccc8)cccc7c7ccnc(-c8ccccc8)c76)cc5)cc4)c23)cc1]
147
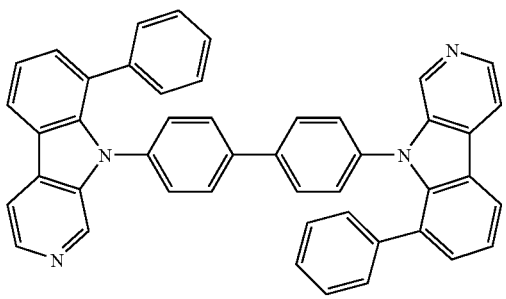 [SMILES: c1ccc(-c2cccc3c4ccncc4n(-c4ccc(-c5ccc(-n6c7cnccc7c7cccc(-c8ccccc8)c76)cc5)cc4)c23)cc1]
148
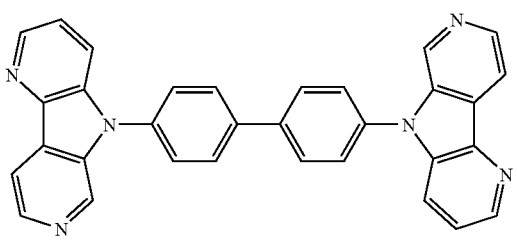 [SMILES: c1cnc2c3ccncc3n(-c3ccc(-c4ccc(-n5c6cnccc6c6ncccc65)cc4)cc3)c2c1]
149
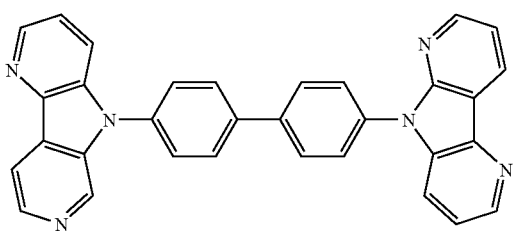 [SMILES: c1cnc2c(c1)c1ncccc1n2-c1ccc(-c2ccc(-n3c4cnccc4c4ncccc43)cc2)cc1]
150
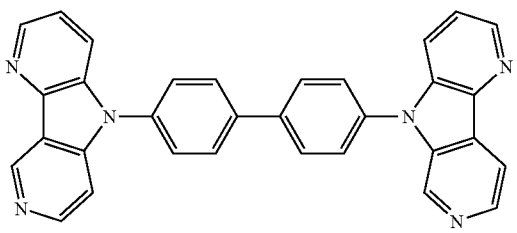
151
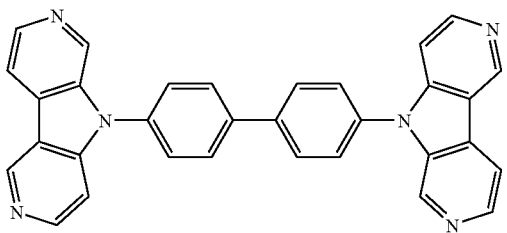 [SMILES: c1cc2c(cn1)c1ccncc1n2-c1ccc(-c2ccc(-n3c4ccncc4c4ccncc43)cc2)cc1]

152 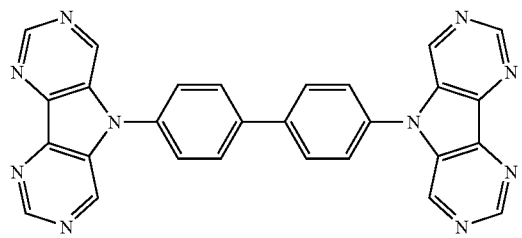 [SMILES: c1ncc2c(n1)c1ncncc1n2-c1ccc(-c2ccc(-n3c4cncnc4c4ncncc43)cc2)cc1]
153 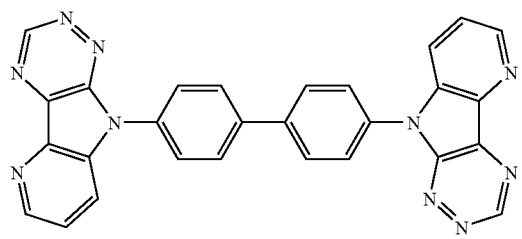 [SMILES: c1cnc2c3ncnnc3n(-c3ccc(-c4ccc(-n5c6cccnc6c6ncnnc65)cc4)cc3)c2c1]
154 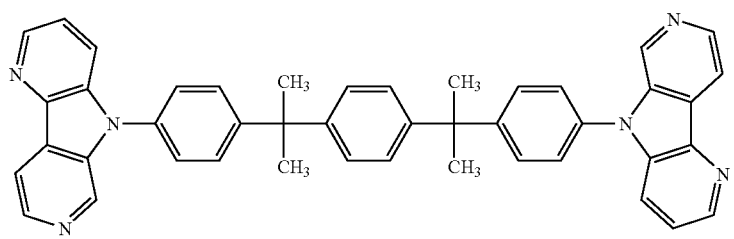 [SMILES: CC(C)(c1ccc(-n2c3cnccc3c3ncccc32)cc1)c1ccc(C(C)(C)c2ccc(-n3c4cnccc4c4ncccc43)cc2)cc1]
155 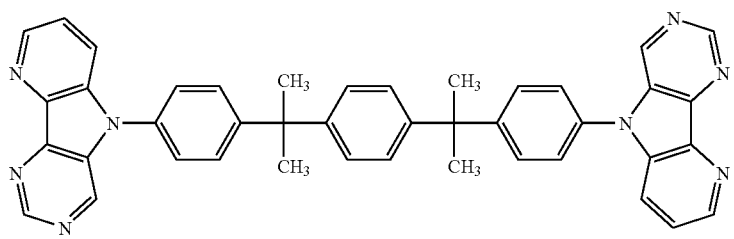 [SMILES: CC(C)(c1ccc(-n2c3cccnc3c3ncncc32)cc1)c1ccc(C(C)(C)c2ccc(-n3c4cccnc4c4ncncc43)cc2)cc1]
156 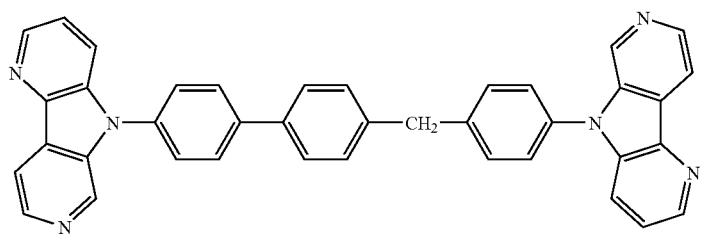 [SMILES: c1cnc2c3ccncc3n(-c3ccc(Cc4ccc(-c5ccc(-n6c7cnccc7c7ncccc76)cc5)cc4)cc3)c2c1]
157 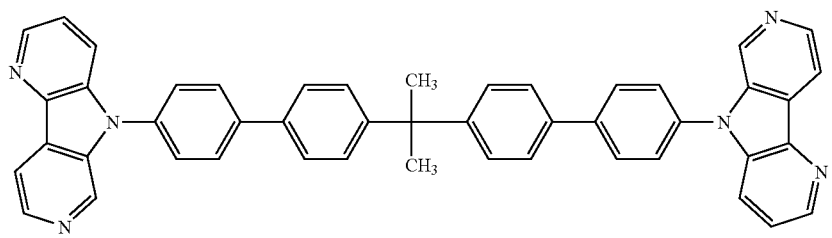 [SMILES: CC(C)(c1ccc(-c2ccc(-n3c4cnccc4c4ncccc43)cc2)cc1)c1ccc(-c2ccc(-n3c4cnccc4c4ncccc43)cc2)cc1]

158 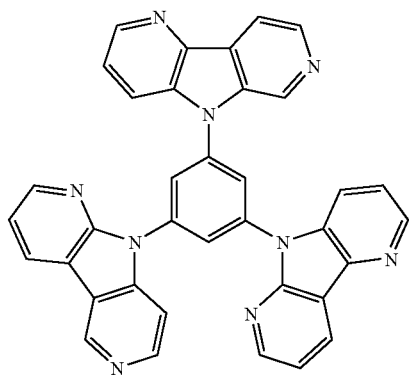 [SMILES: c1cnc2c(c1)c1cnccc1n2-c1cc(-n2c3cnccc3c3ncccc32)cc(-n2c3cccnc3c3cccnc32)c1]
159 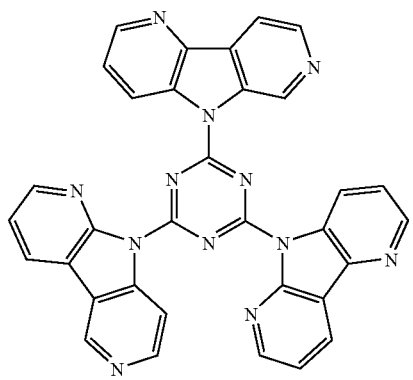 [SMILES: c1cnc2c(c1)c1cnccc1n2-c1nc(-n2c3cnccc3c3ncccc32)nc(-n2c3cccnc3c3cccnc32)n1]
160 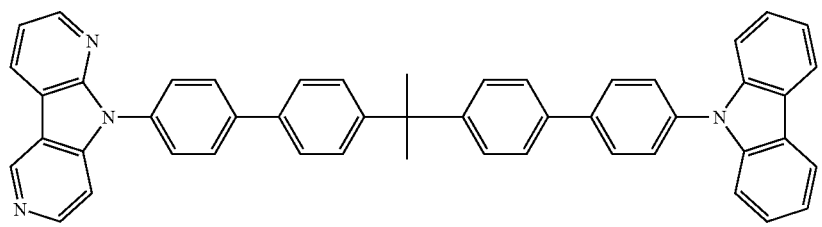 [SMILES: CC(C)(c1ccc(-c2ccc(-n3c4ccccc4c4ccccc43)cc2)cc1)c1ccc(-c2ccc(-n3c4ccncc4c4cccnc43)cc2)cc1]
161 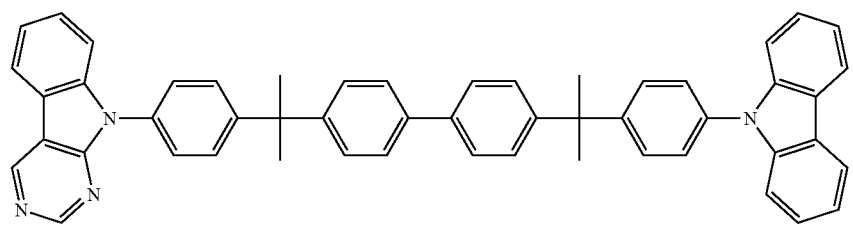 [SMILES: CC(C)(c1ccc(-c2ccc(C(C)(C)c3ccc(-n4c5ccccc5c5cncnc54)cc3)cc2)cc1)c1ccc(-n2c3ccccc3c3ccccc32)cc1]
162 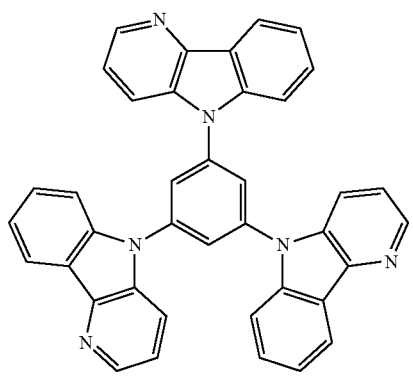 [SMILES: c1ccc2c(c1)c1ncccc1n2-c1cc(-n2c3ccccc3c3ncccc32)cc(-n2c3ccccc3c3ncccc32)c1]

163

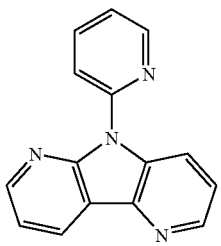 [SMILES: c1ccc(-n2c3cccnc3c3cccnc32)nc1]

164

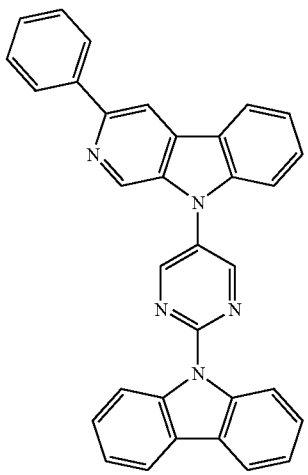 [SMILES: c1ccc(-c2cc3c4ccccc4n(-c4cnc(-n5c6ccccc6c6ccccc65)nc4)c3cn2)cc1]

165

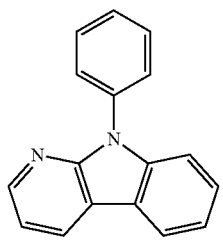 [SMILES: c1ccc(-n2c3ccccc3c3cccnc32)cc1]

In the invention, the energy level of HOMO of an organic compound can be obtained by a method which corrects oxidation potential obtained by electrochemical measurement to a reference electrode. For example, the oxidation potential is obtained according to cyclic voltanmetry (CV) employing BAS100B/W(CV-50W).

The energy level of LUMO, i.e., electron affinity is obtained according to the following formula, (Band gap)=(Energy level of HOMO)−(Energy level of LUMO)

is a difference between ionization potential and electron affinity of a compound. The ionization potential and electron affinity are determined based on a vacuum level. The ionization potential is defined by energy necessary to release electrons of a compound existing in a HOMO (highest occupied molecular orbital) level to a vacuum level, while the electron affinity is defined by energy released when electrons of a compound existing in a vacuum level fall to a LUMO (lowest unoccupied molecular orbital) level and are stabilized.

The band gap is obtained by vacuum depositing an organic compound on a glass plate to obtain a deposit layer with a thickness of 100 nm, measuring absorption spectra of the deposit layer, and determining wavelength Y (nm) at the absorption edge in the absorption spectra in terms of X (eV), where the following formula is used.

$X=1239.8/Y$

In the invention, wavelength providing emission maximum of a dopant refers to the shortest wavelength which gives emission maximum in the emission spectra of the dopant. In the invention, a wavelength providing emission maximum in the range of from 350 to 500 nm is effective.

The phosphorescent compound in the invention is a compound, which emits light from the excited triplet, and has a phosphorescent quantum yield at 25° C. of not less than 0.01, and preferably not less than 0.1. In the invention, a compound other than the dopant contained in the light emission layer is defined as a host compound.

The content in the light emission layer of the host compound and the phosphorescent dopant is from 1 to 99% by weight, respectively, based on the total weight of all the compounds contained in the light emission layer. The content in the light emission layer of the phosphorescent dopant is preferably lower than that of the host compound, and more preferably 1 to 10% by weight of that of the host compound.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescent compound used in the invention is a compound, in which the phosphorescent quantum yield measured employing any one of the solvents falls within the above-described range.

The phosphorescent compound used in the invention is preferably a metal complex containing a metal belonging to a group VIII of the periodic table, more preferably an iridium complex, an osmium complex or a platinum complex, and most preferably an iridium complex.

Examples of the phosphorescent compound used in the invention will be listed below, but the invention is not limited thereto. These compounds can be synthesized according to a method described in Inorg. Chem., 40, 1704-1711.

1-1
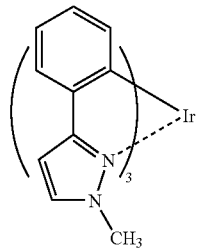

1-2
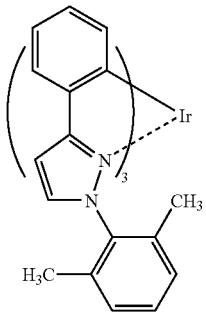

1-3
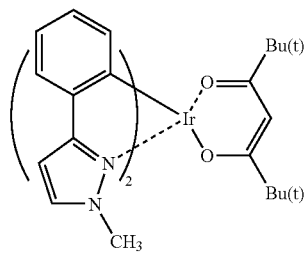

1-4
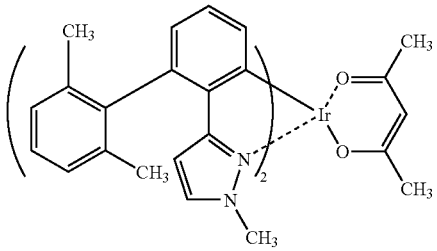

1-5
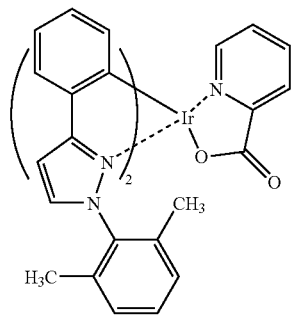

1-6
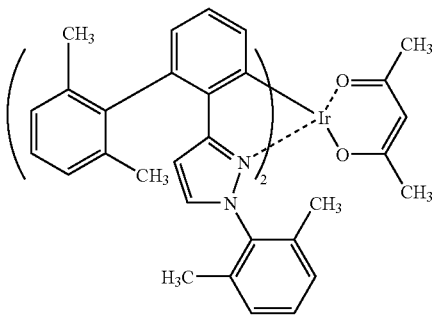

1-7
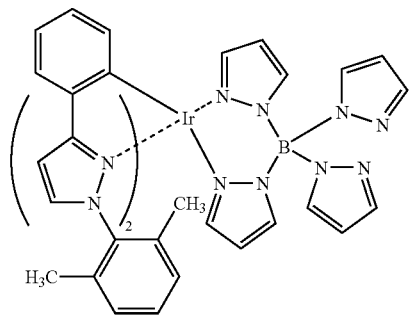

1-8
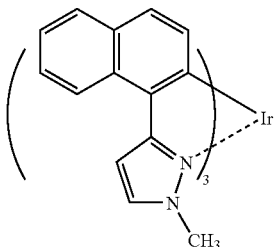

-continued
1-9
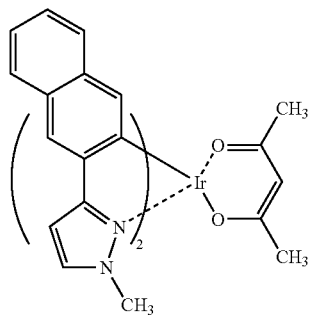
1-10
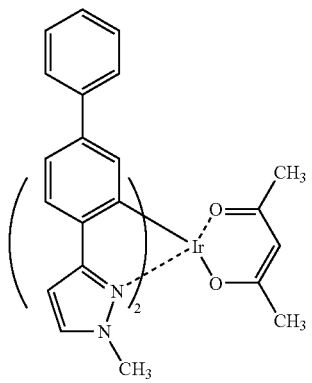
1-11
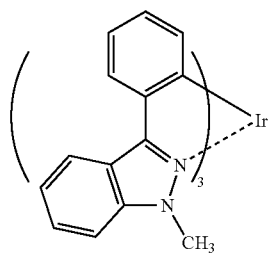
1-12
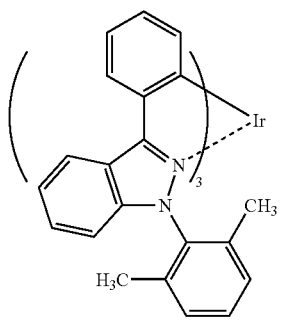
1-13
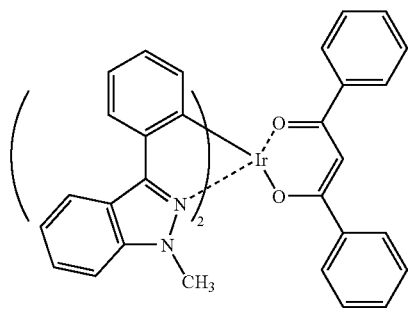
1-14
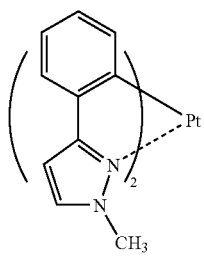
1-15
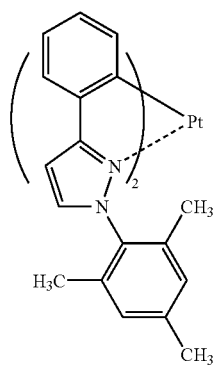
1-16
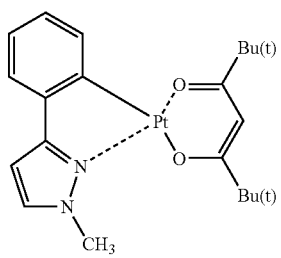

-continued
1-17
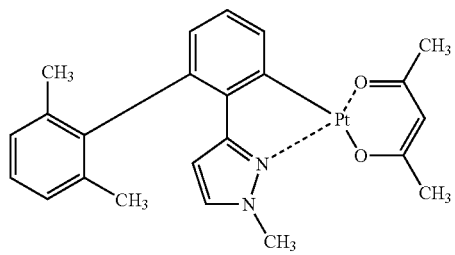
1-18
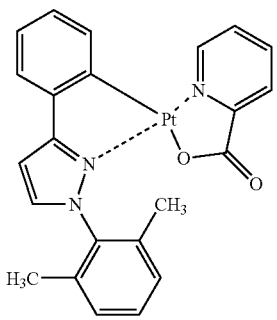
1-19
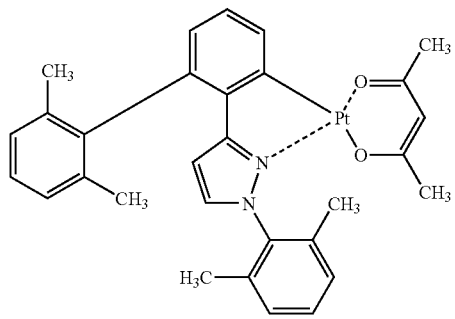
1-20
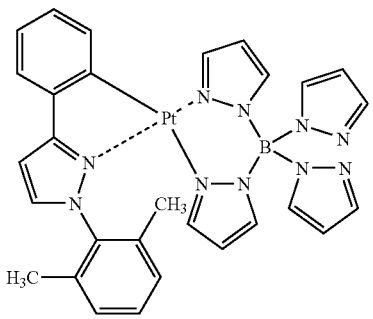
1-21
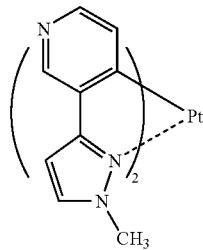
1-22
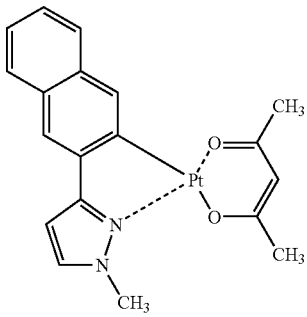
1-23
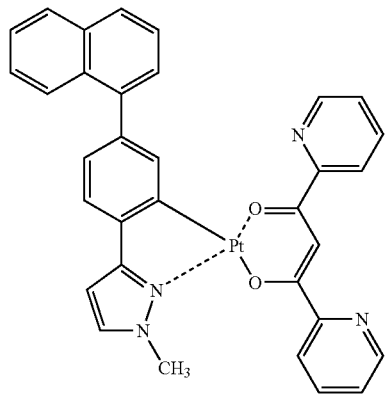
1-24
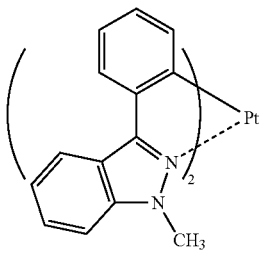

-continued
1-25
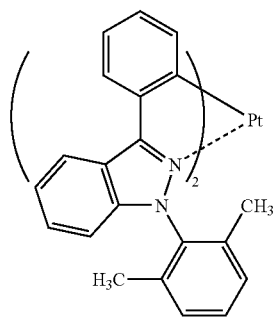
1-26
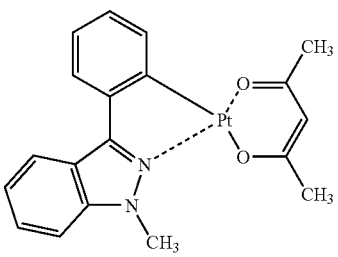
2-1
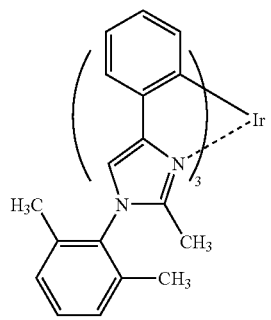
2-2
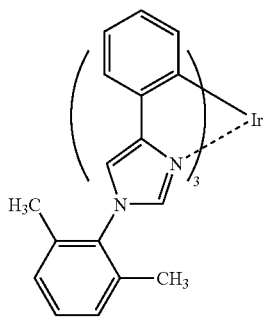
2-3
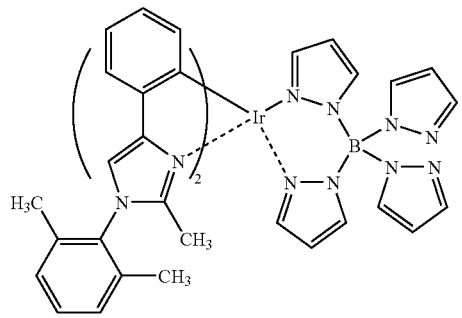
2-4
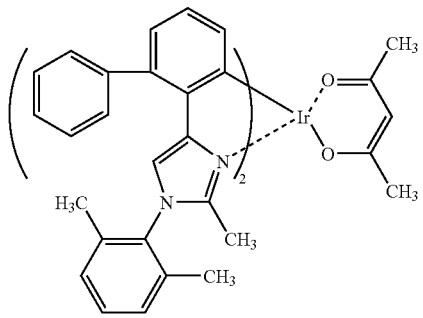
2-5
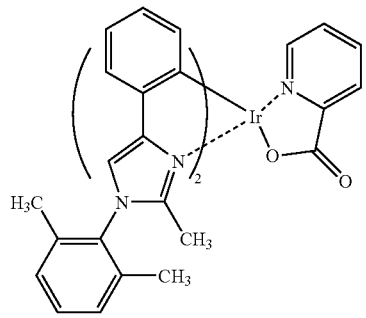
2-6
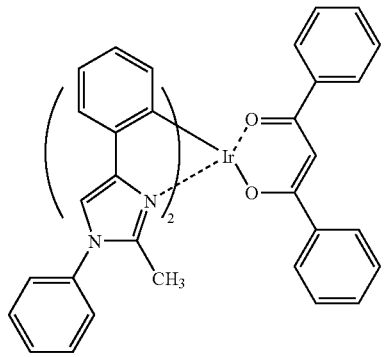
2-7
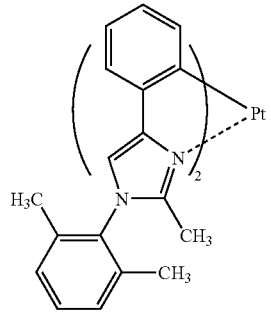
2-8
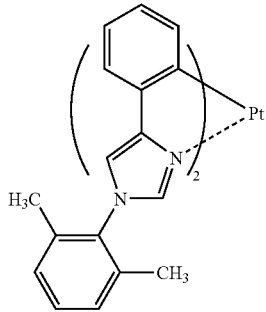

-continued
| | |
|---|---|
| 2-9 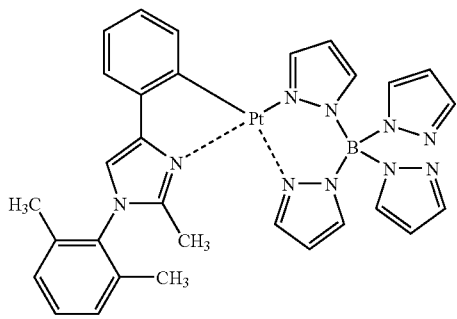 | 2-10 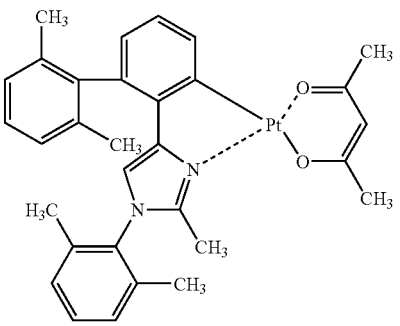 |
| 2-11 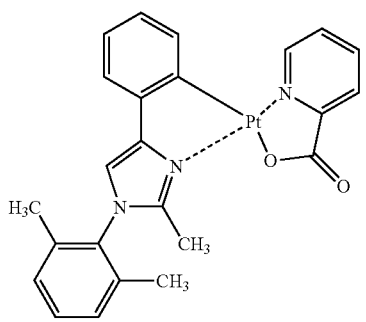 | 2-12 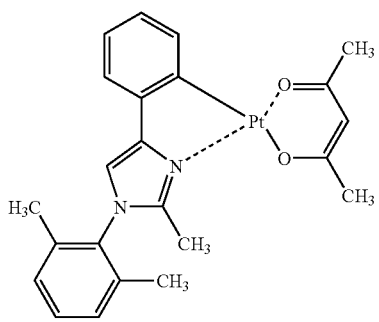 |
| 2-13 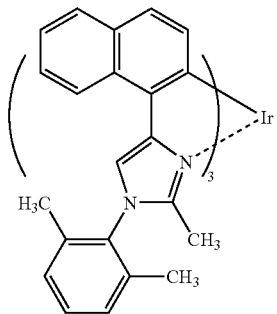 | 2-14 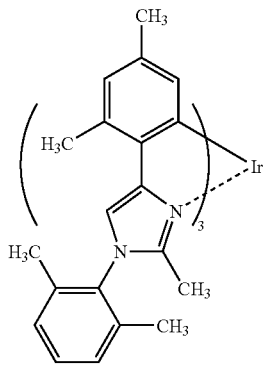 |
| 2-15 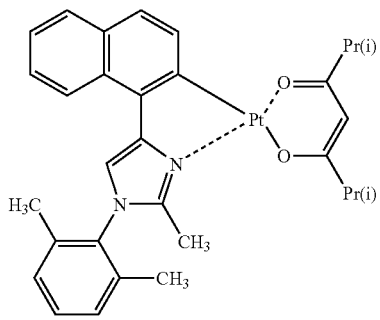 | 2-16 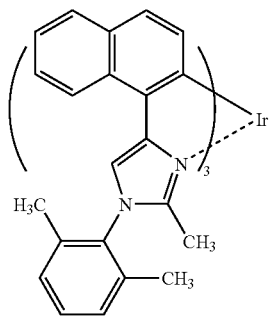 |

-continued
2-17
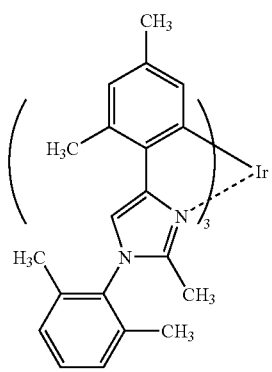
2-18
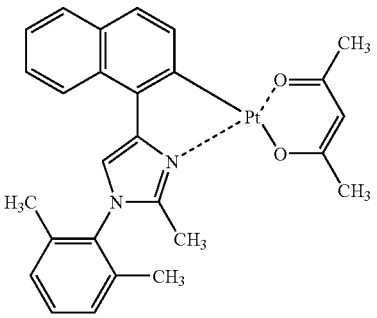
2-19
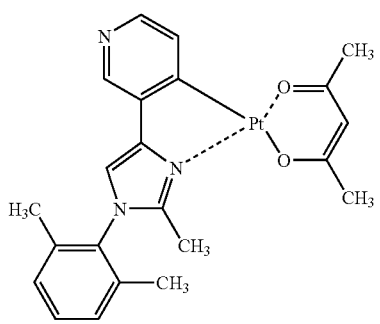
2-20
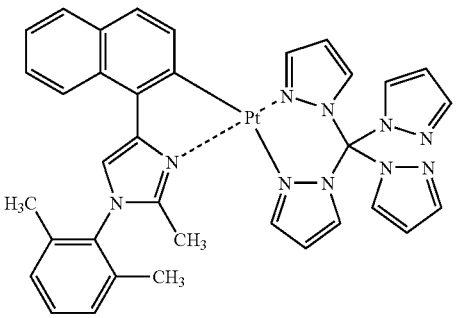
2-21
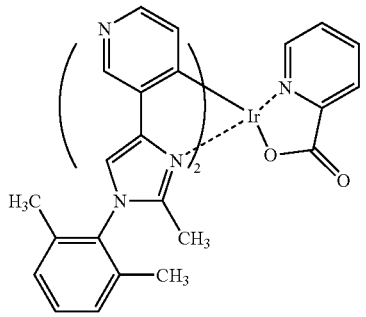
3-1
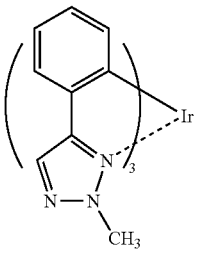
3-2
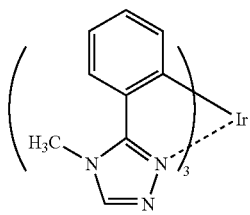
3-3
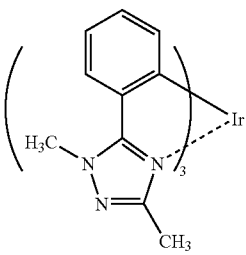
3-4
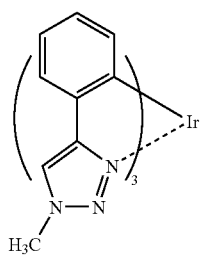
3-5
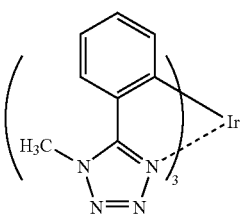

-continued
3-6
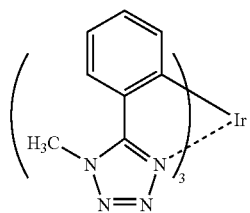
3-7
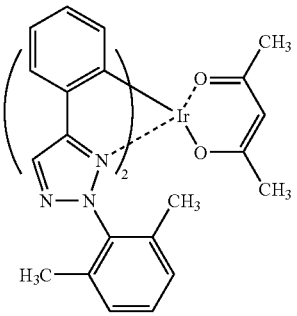
3-8
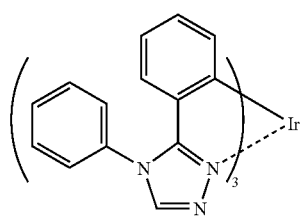
3-9
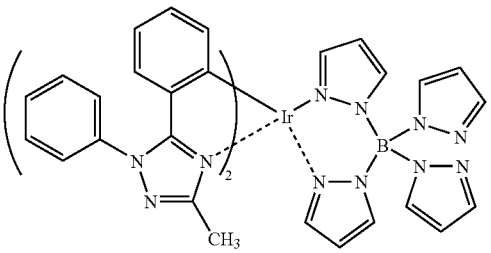
3-10
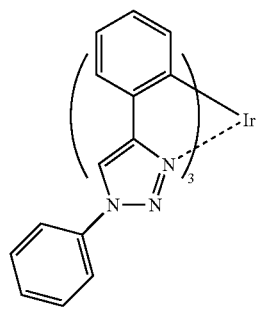
3-11
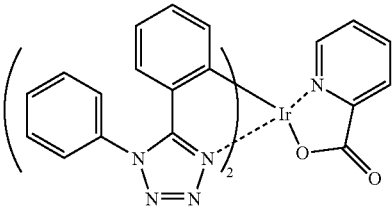
3-12
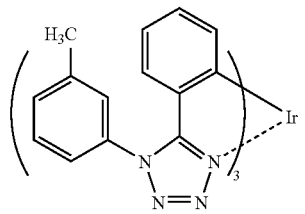
3-13
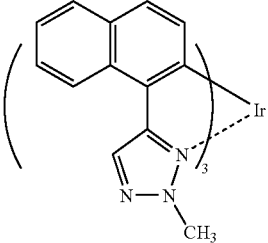
3-14
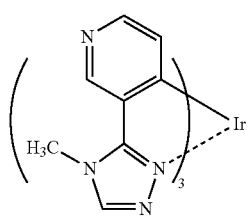
3-15
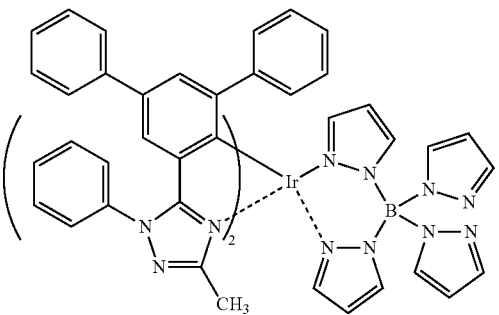

111 112
-continued
3-16 3-17
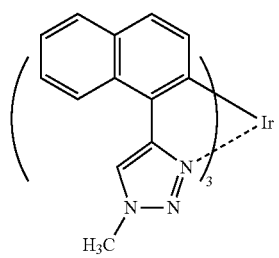
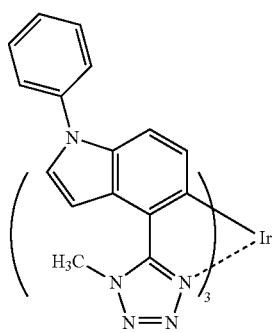
3-18 3-19
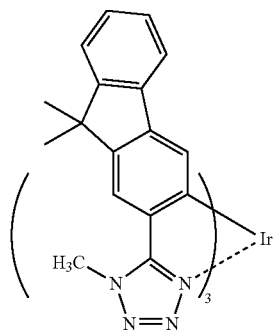
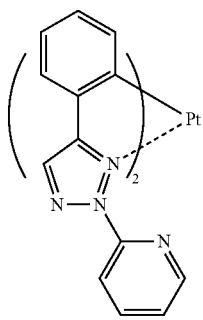
3-20 3-21
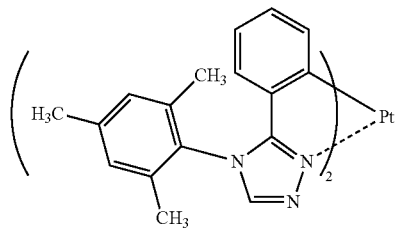
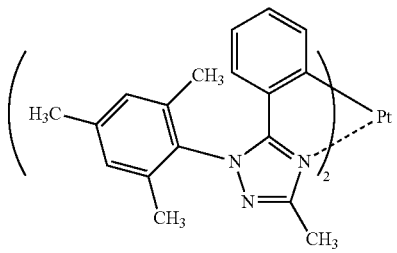
3-22 3-23
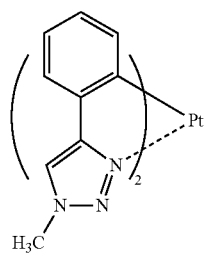
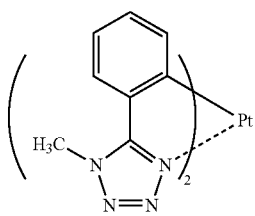
3-24 3-25
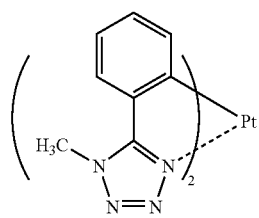
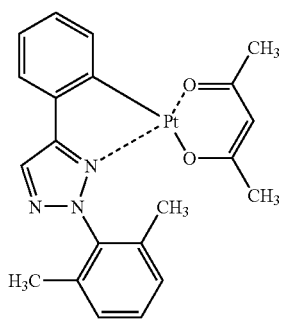

-continued
3-26
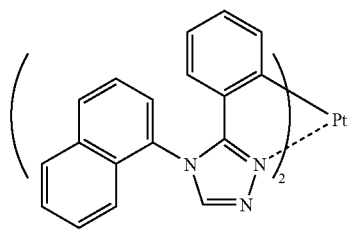
3-27
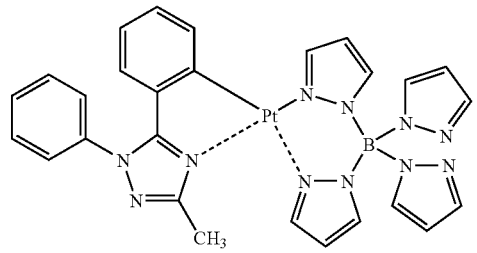
3-28
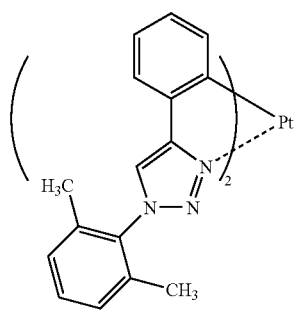
3-29
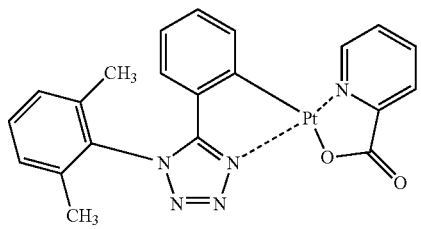
3-30
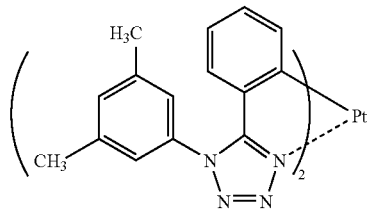
3-31
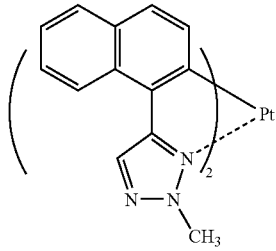
3-32
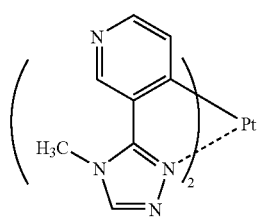
3-33
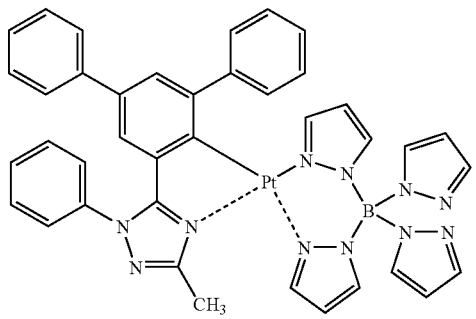
3-34
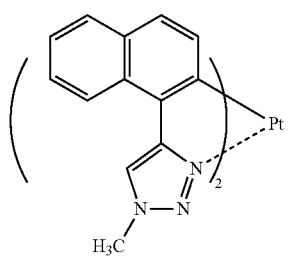
3-35
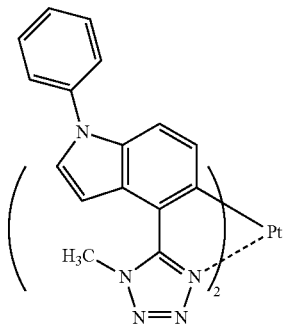

3-36
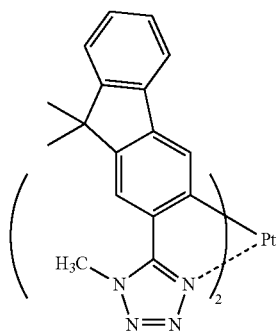
4-1
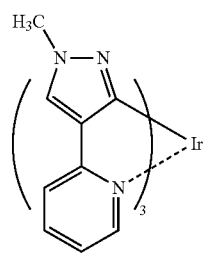
4-2
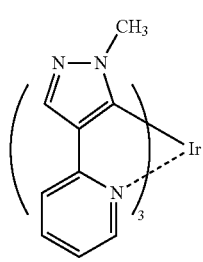
4-3
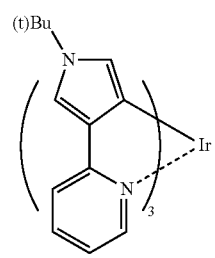
4-4
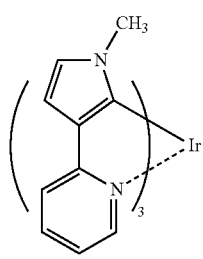
4-5
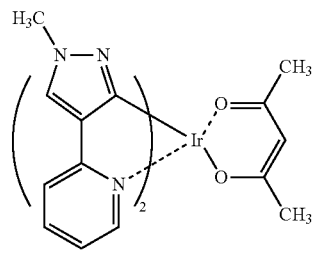
4-6
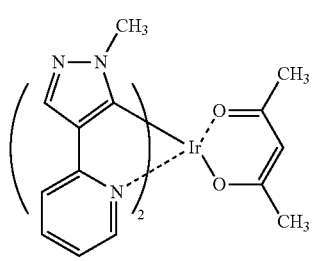
4-7
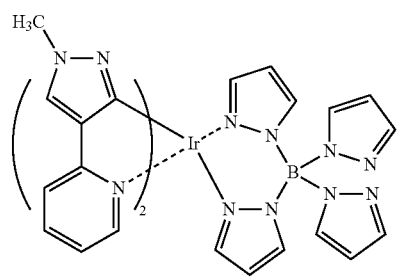
4-8
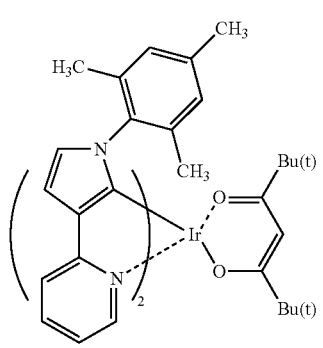
4-9
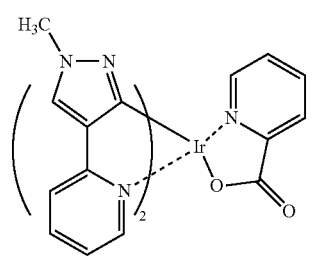

-continued
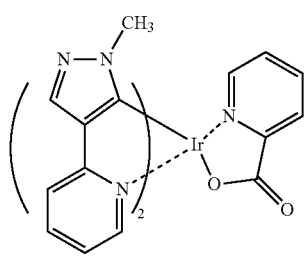
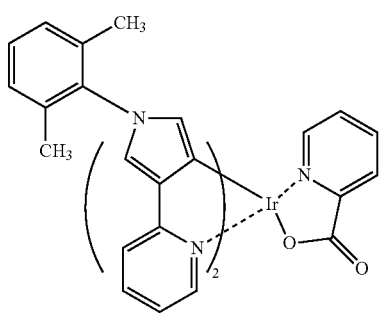
4-10
4-11
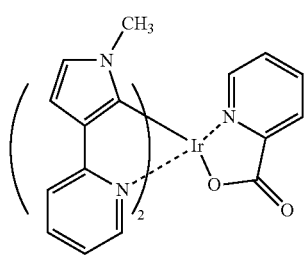
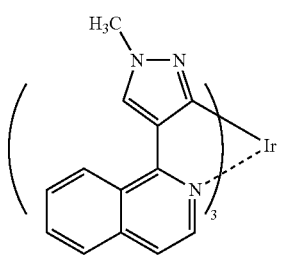
4-12
4-13
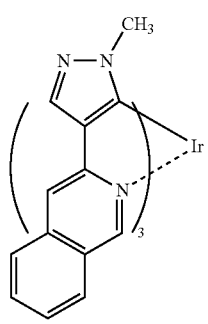
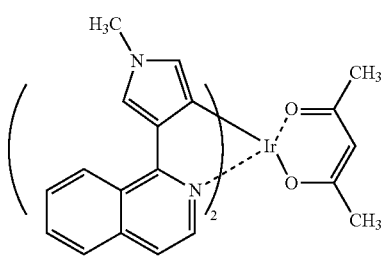
4-14
4-15
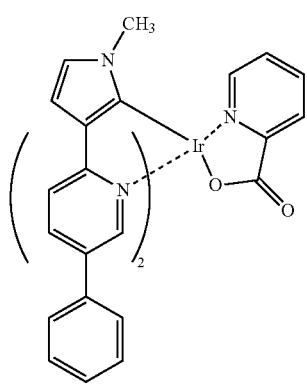
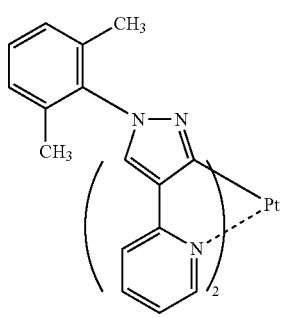
4-16
4-17
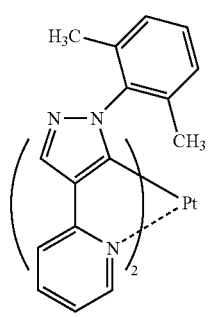
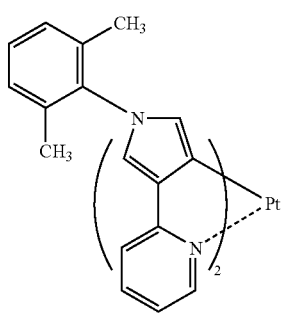
4-18
4-19

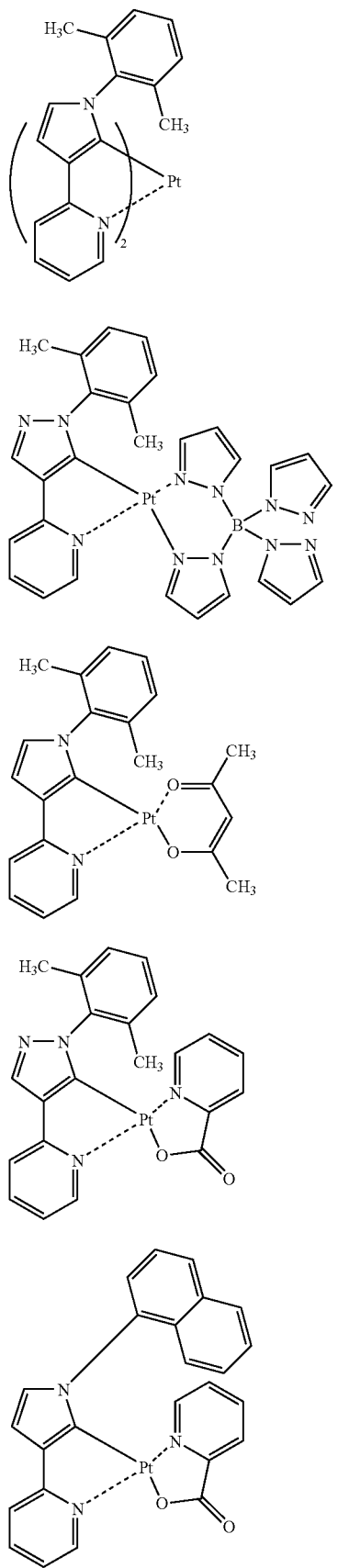

-continued
| 4-30 | 4-31 |
|---|---|
| 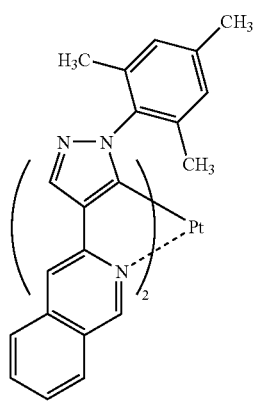 | 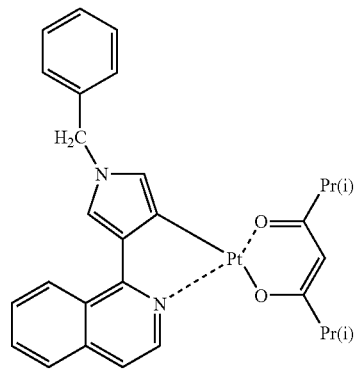 |
| 4-32 | 5-1 |
|---|---|
| 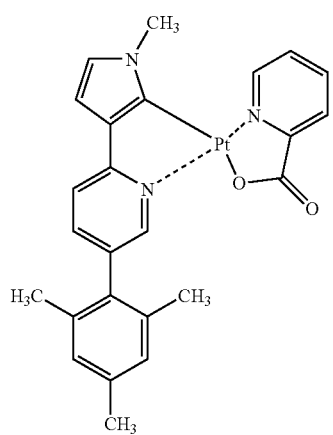 | 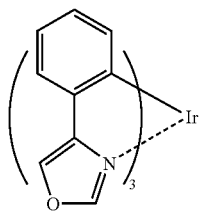 |
| 5-2 | 5-3 |
|---|---|
| 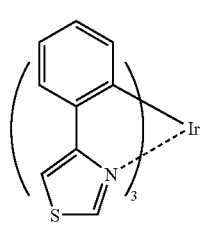 | 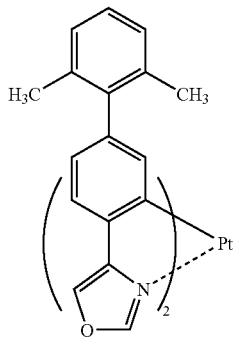 |
| 5-4 | 5-5 |
|---|---|
| 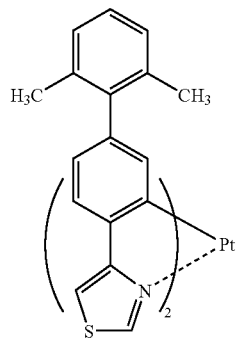 | 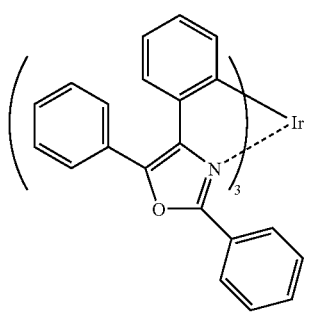 |

-continued
| 5-6 | 5-7 |
|---|---|
| 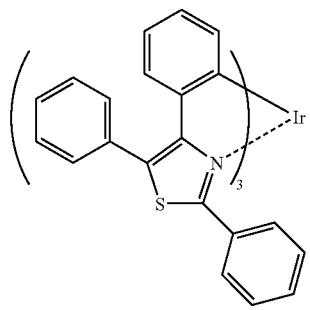 | 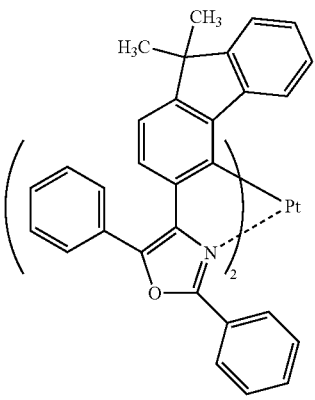 |
| 5-8 | 5-9 |
|---|---|
| 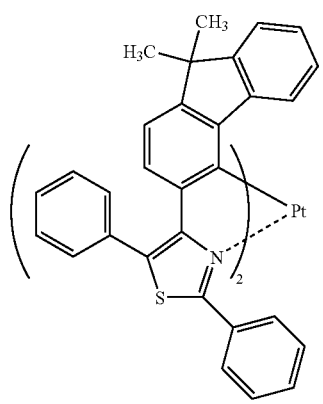 | 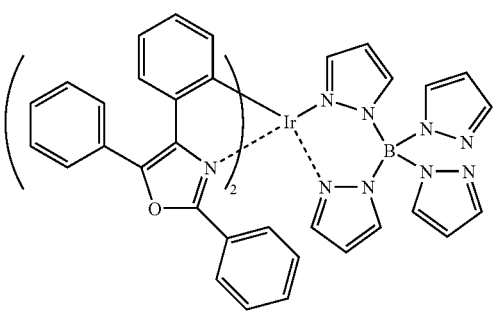 |
| 5-10 | 5-11 |
|---|---|
| 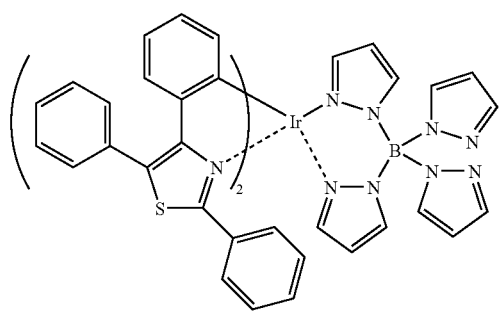 | 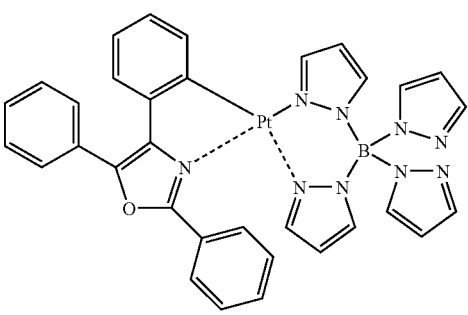 |
| 5-12 | 5-13 |
|---|---|
| 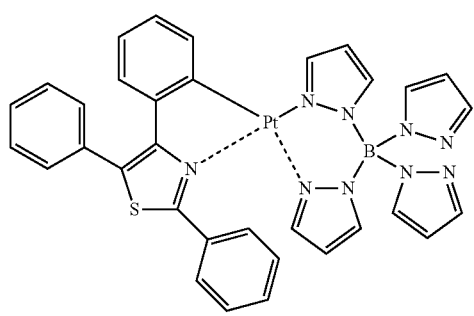 | 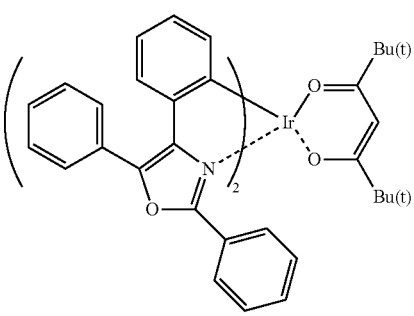 |

-continued
5-14
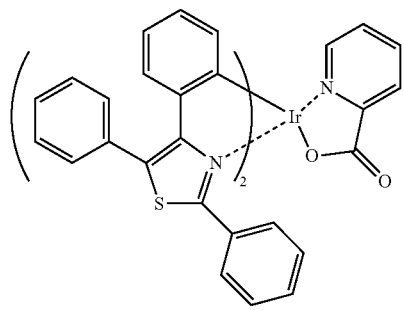
5-15
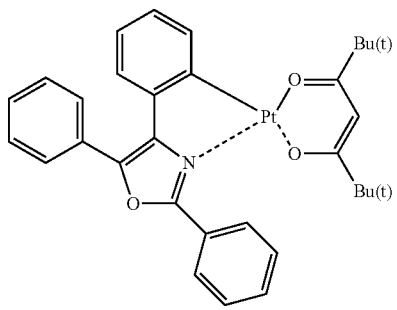
5-16
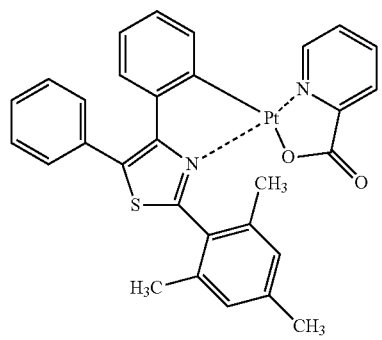
6-1
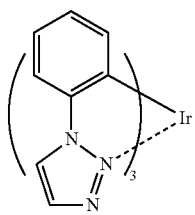
6-2
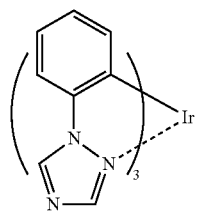
6-3
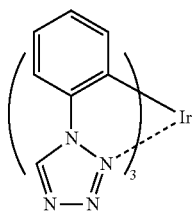
6-4
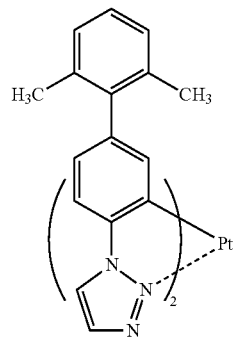
6-5
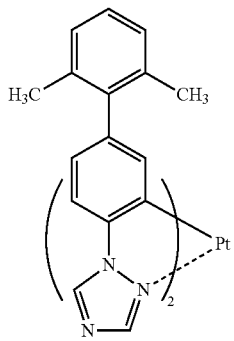
6-6
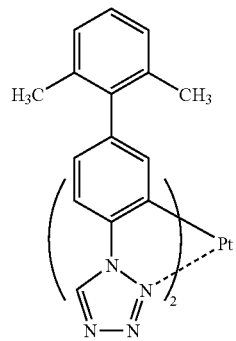
6-7
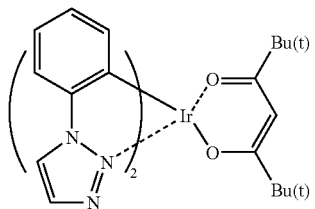

-continued
6-8
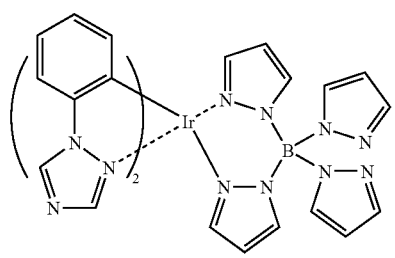
6-9
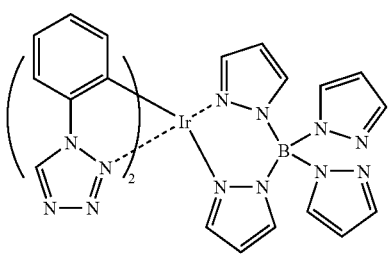
6-10
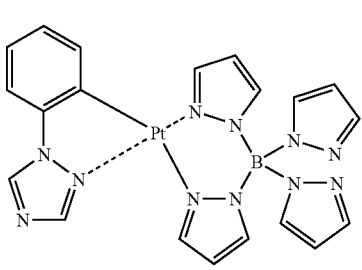
6-11
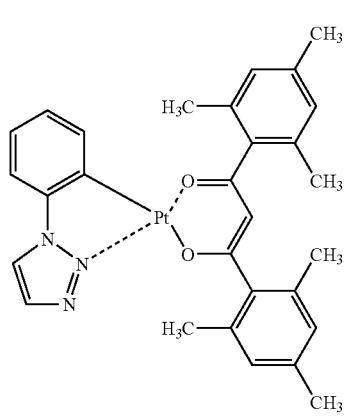
6-12
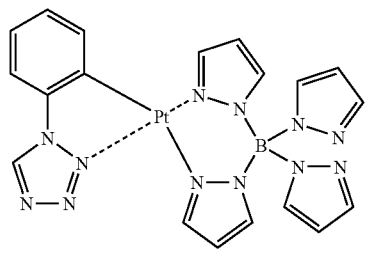
6-13
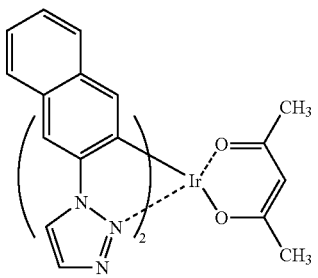
6-14
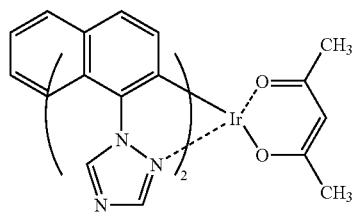
6-15
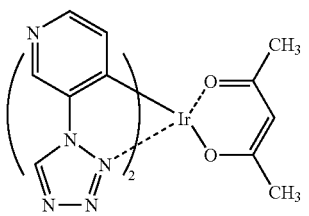
6-16
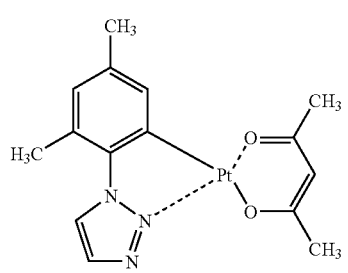
6-17
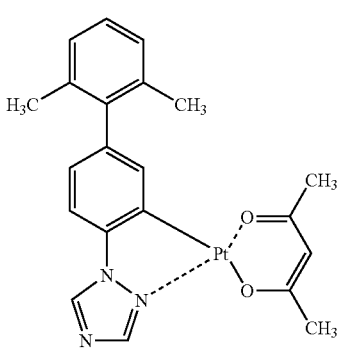

-continued
6-18
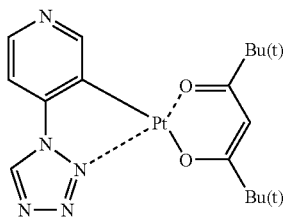
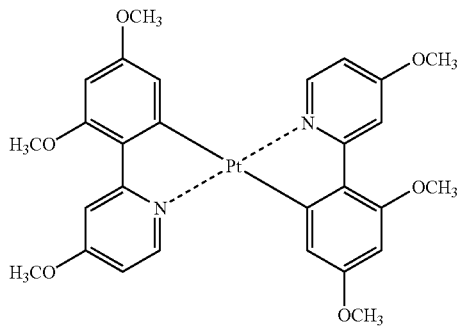
P-1
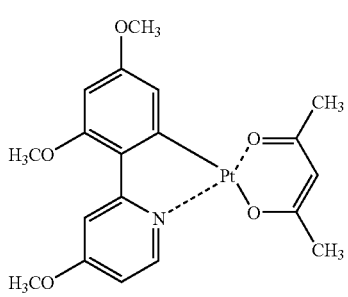
P-2
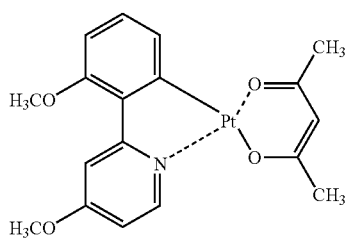
P-3
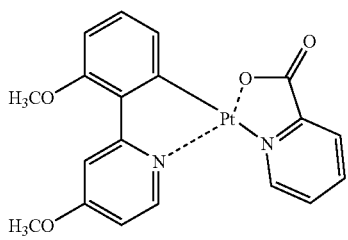
P-4
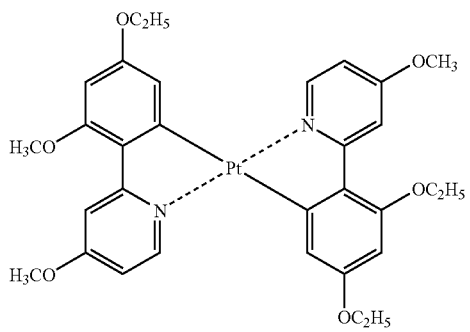
P-5
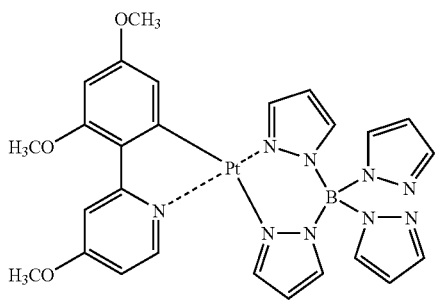
P-6
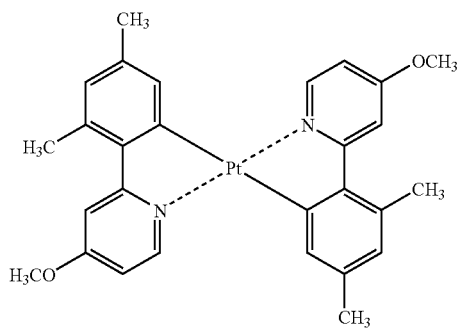
P-7
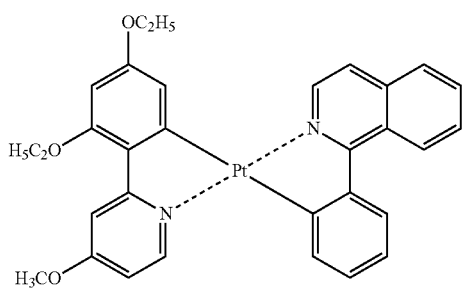
P-8
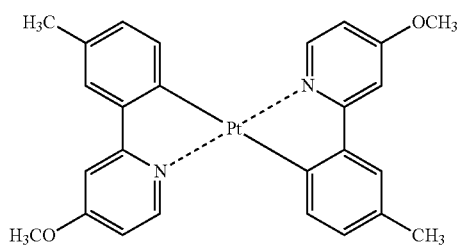
P-9

-continued
P-10
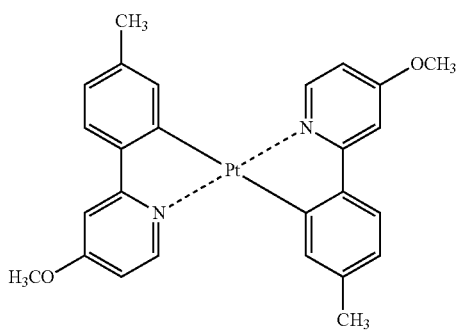
P-11
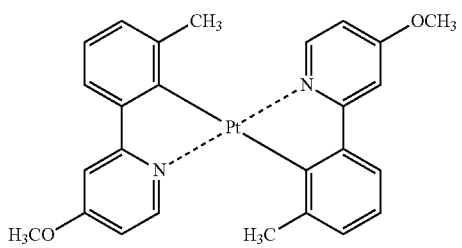
P-12
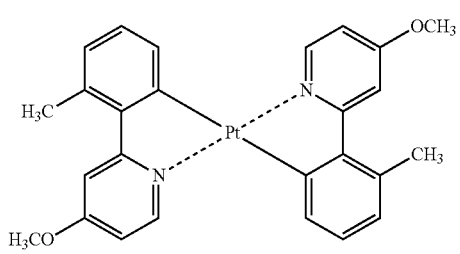
P-13
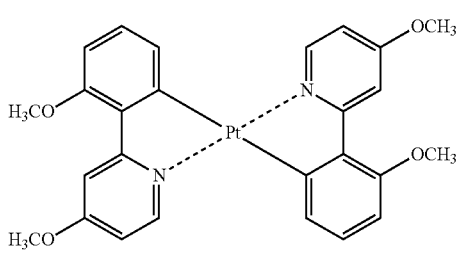
P-14
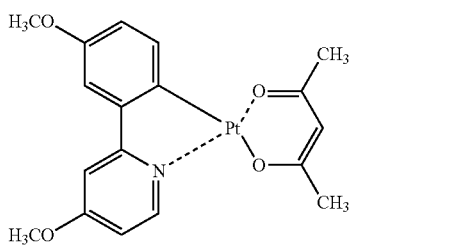
P-15
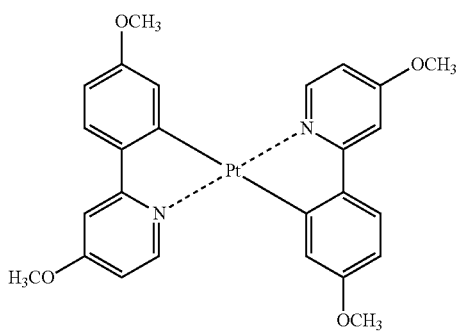
P-16
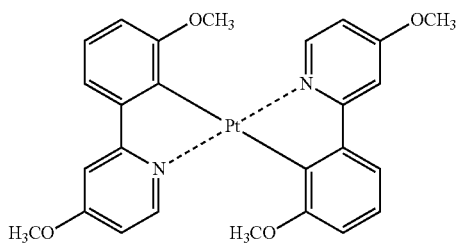
P-17
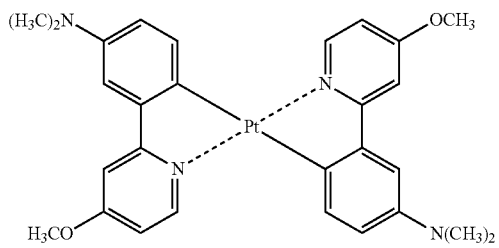
P-18
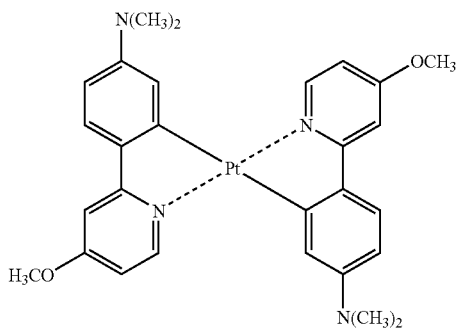
P-19
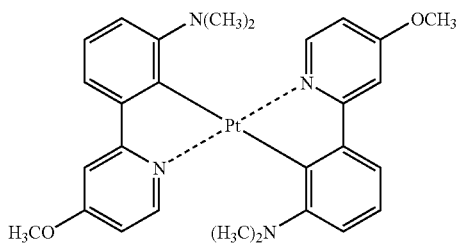

-continued
P-20
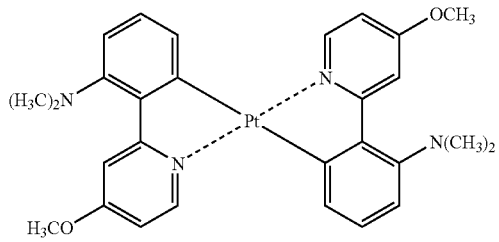
P-21
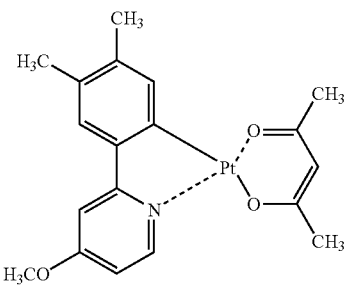
P-22
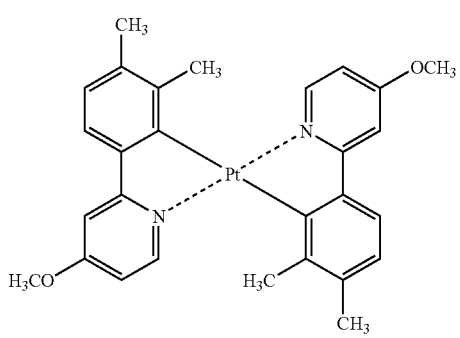
P-23
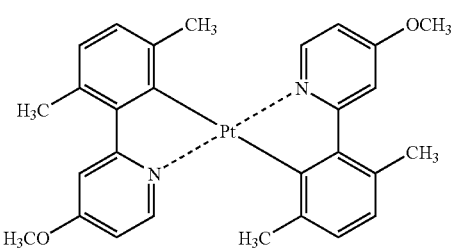
P-24
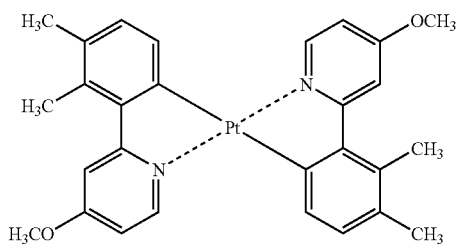
P-25
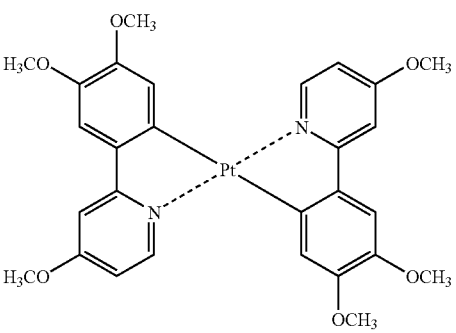
P-26
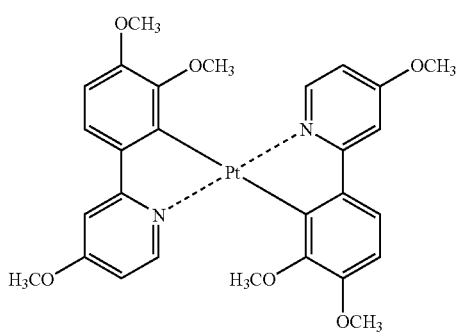
P-27
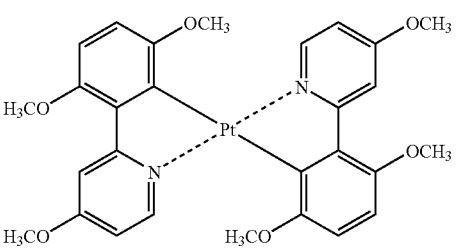
P-28
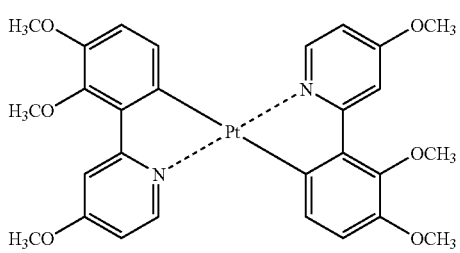
P-29
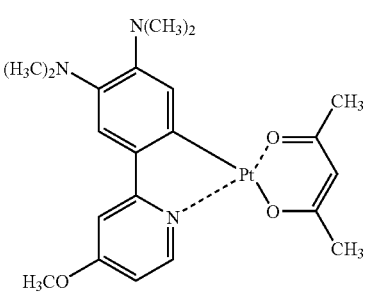

-continued
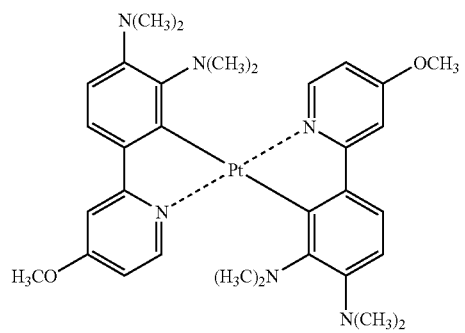
P-30
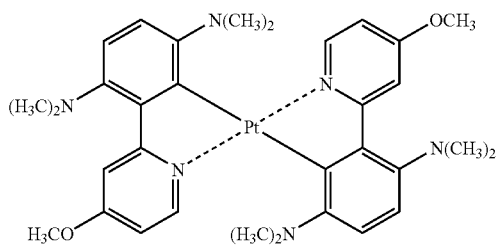
P-31
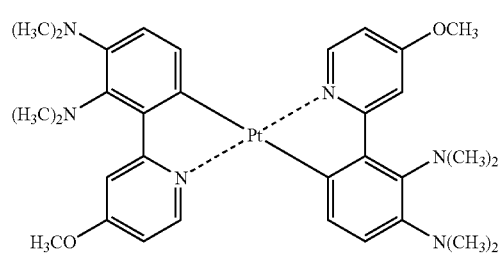
P-32
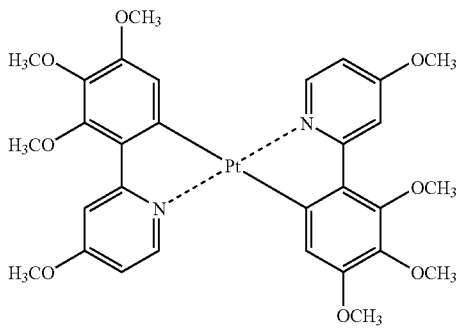
P-33
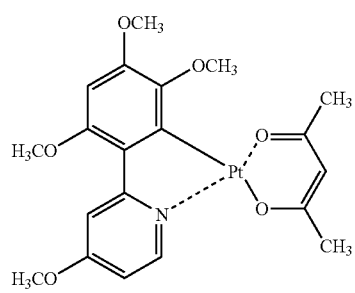
P-34
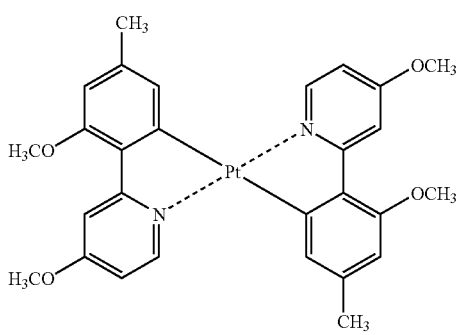
P-35
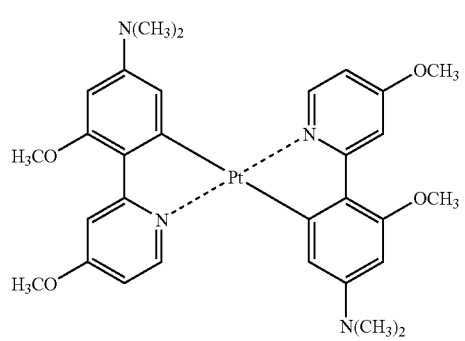
P-36
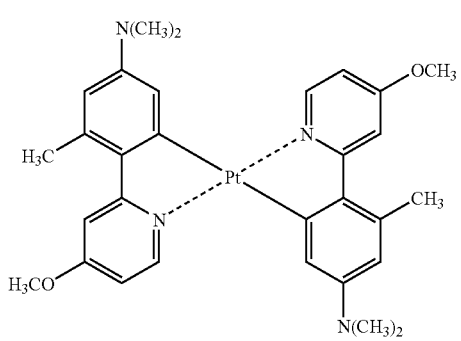
P-37
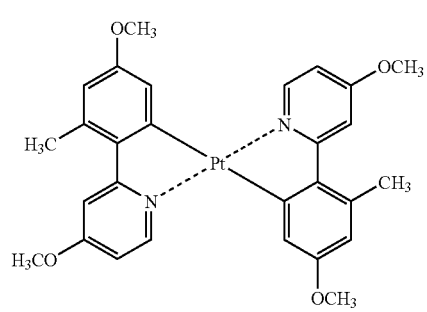
P-38
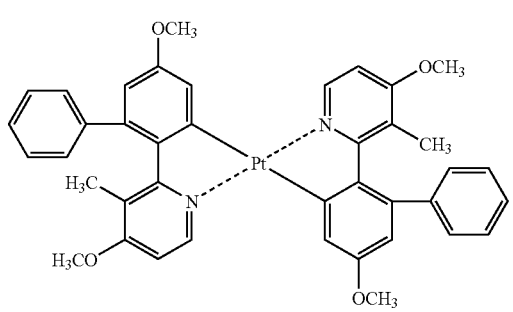
P-39

-continued
P-40
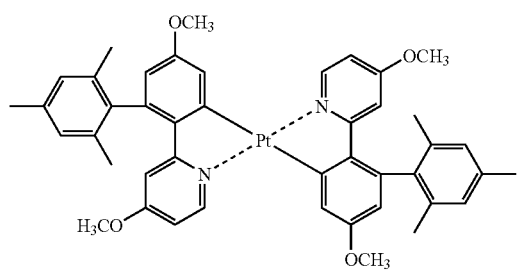
P-41
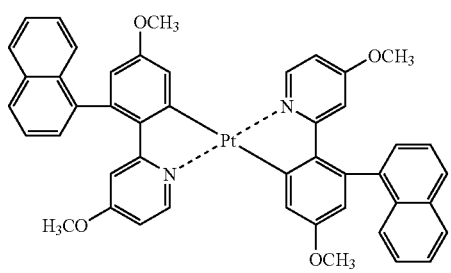
P-42
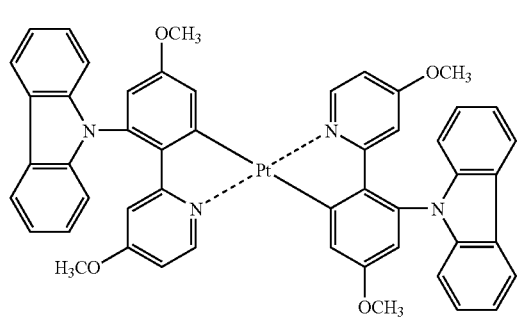
P-43
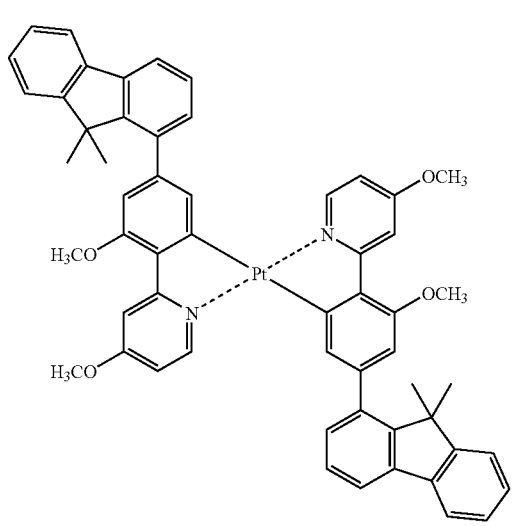
P-44
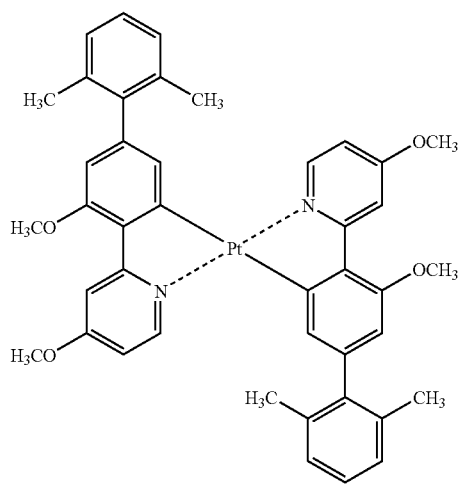
P-45
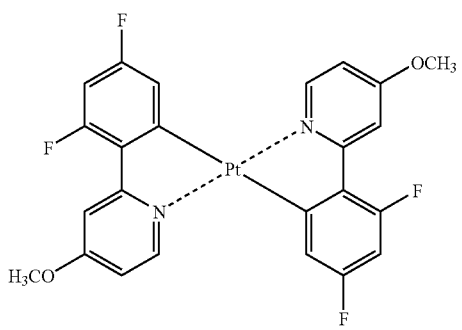
P-46
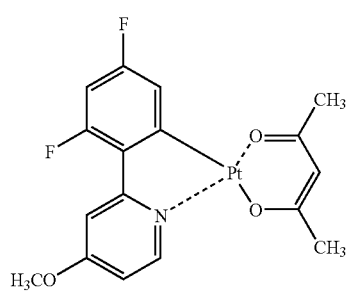
P-47
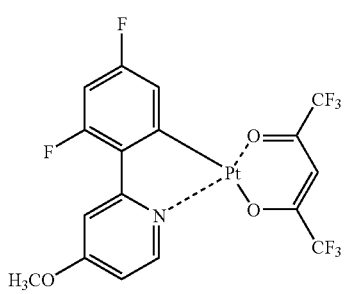

-continued
P-48
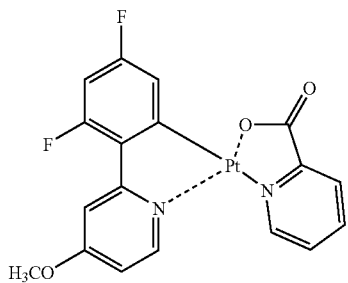
P-49
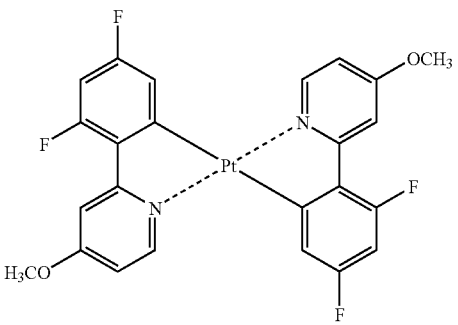
P-50
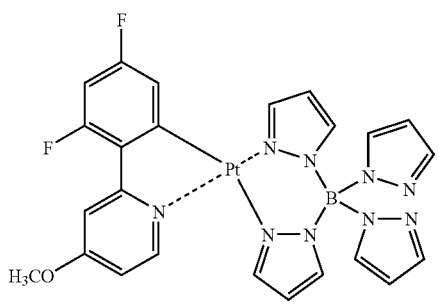
P-51
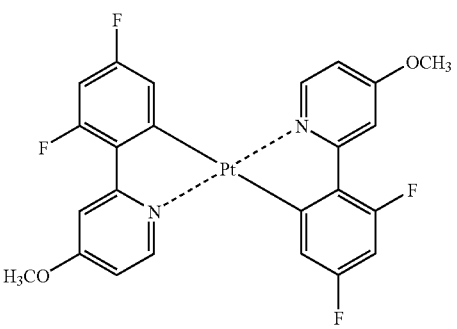
P-52
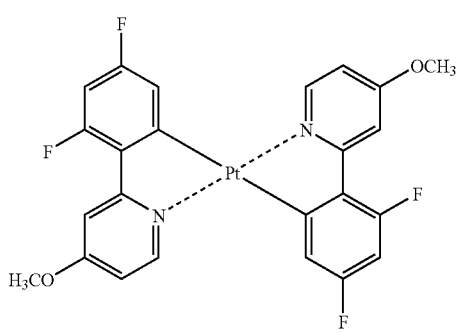
P-53
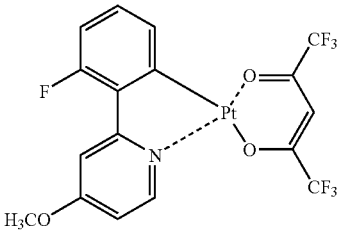
P-54
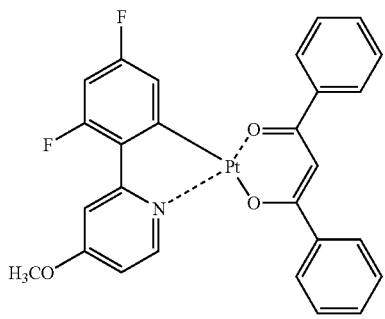
P-55
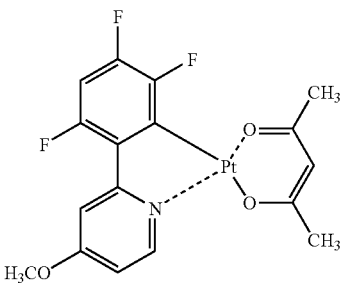
P-56
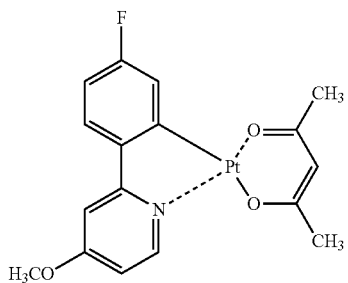
P-57
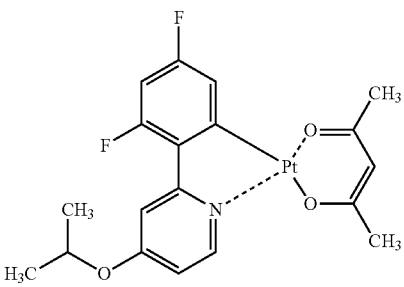

-continued
P-58 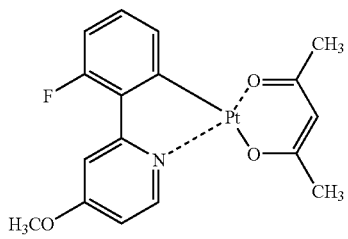 P-59 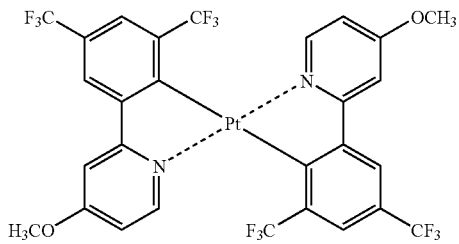
P-60 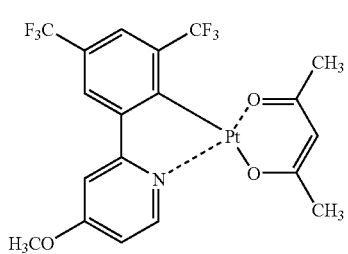 P-61 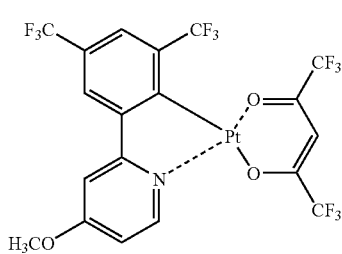
P-62 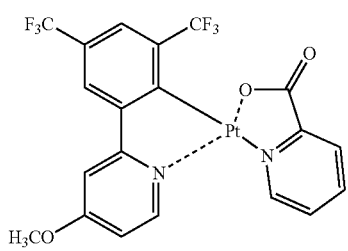 P-63 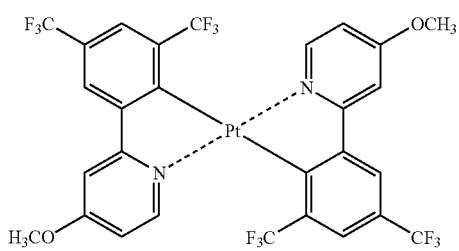
P-64 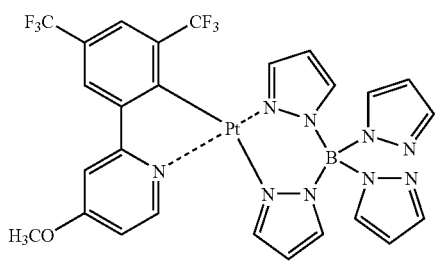 P-65 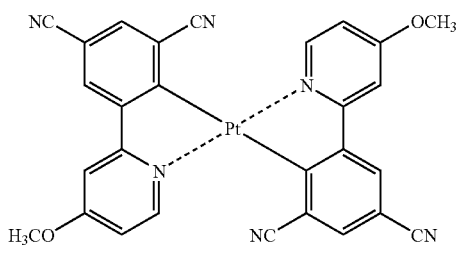
P-66 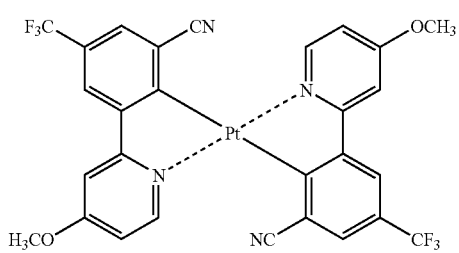 P-67 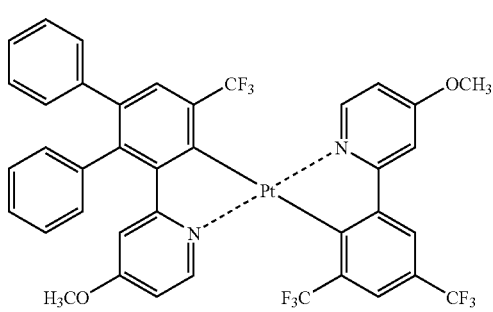

-continued
P-68
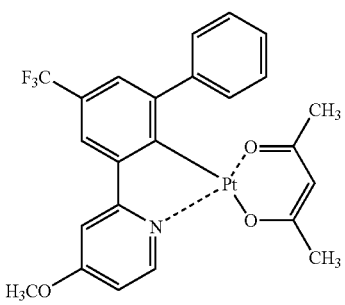
P-69
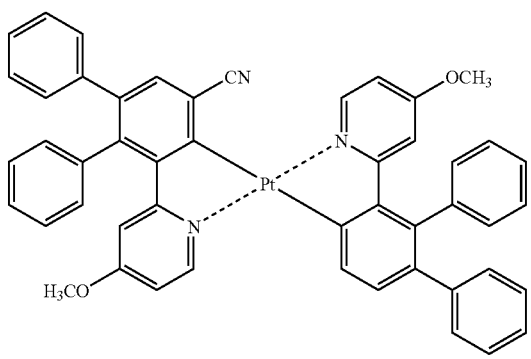
P-70
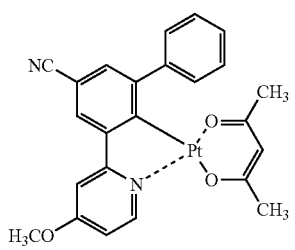
P-71
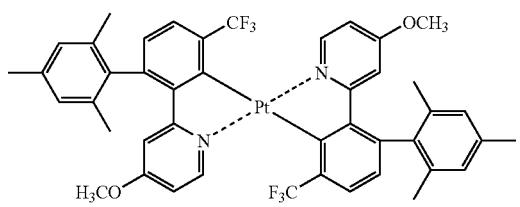
P-72
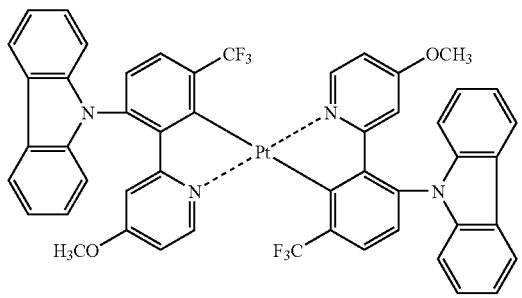
P-73
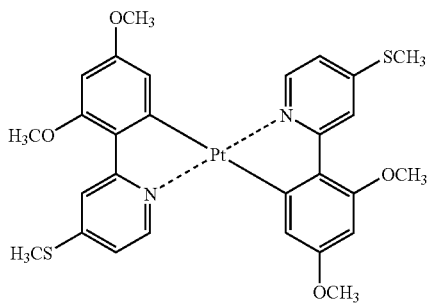
P-74
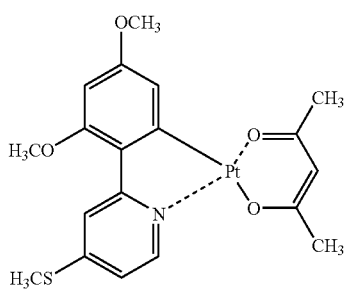
P-75
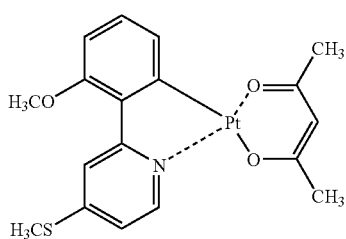
P-76
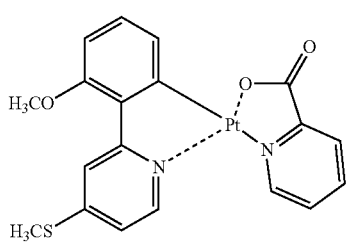
P-77
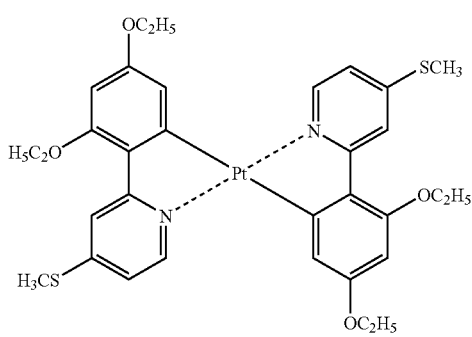

-continued
P-78
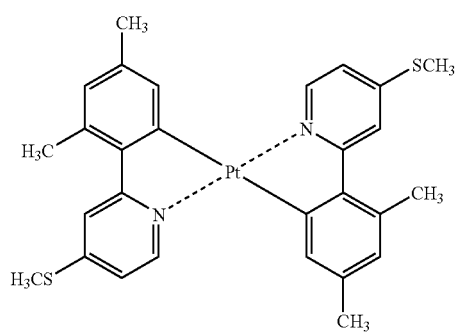
P-79
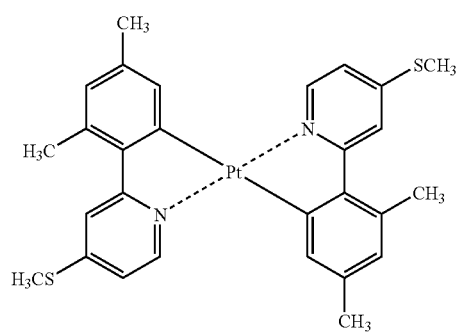
P-80
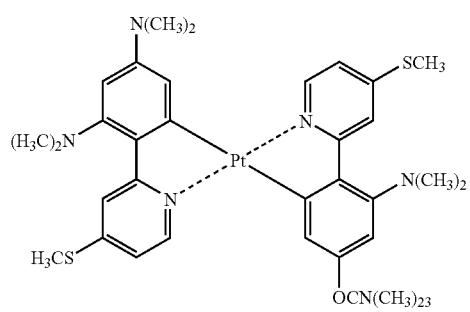
P-81
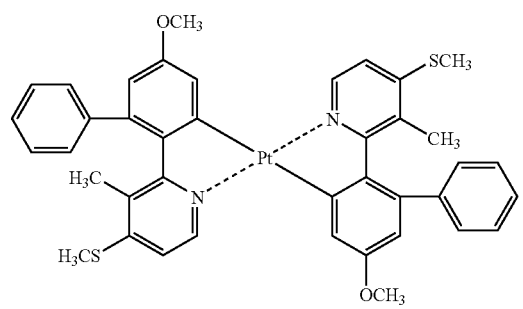
P-82
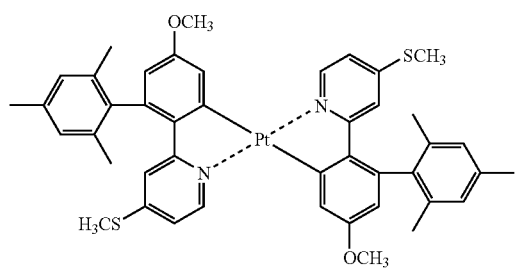
P-83
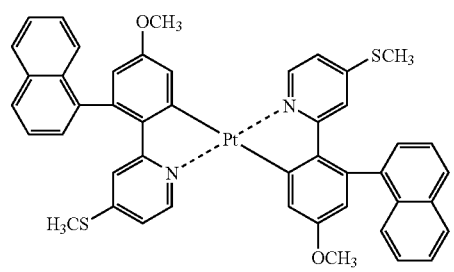
P-84
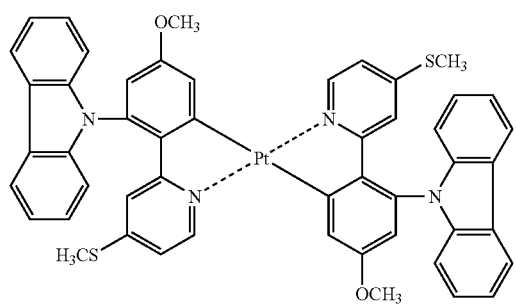
P-85
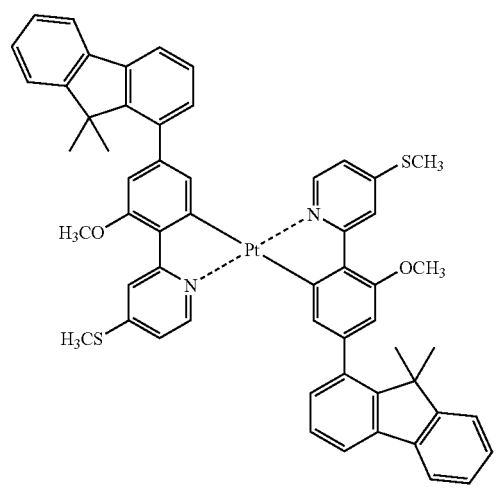

-continued
P-86
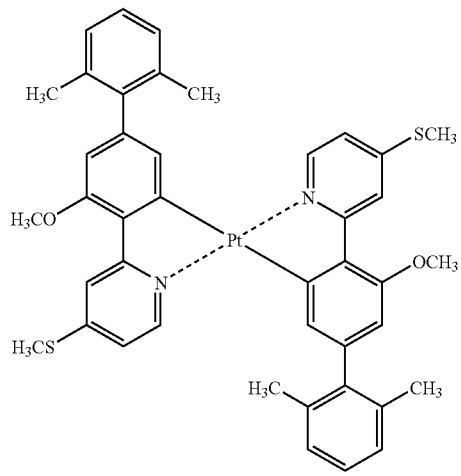
P-87
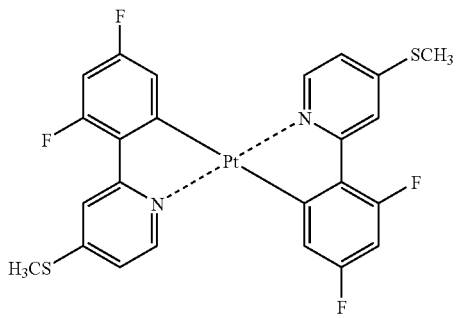
P-88
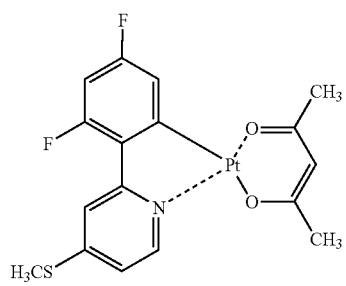
P-89
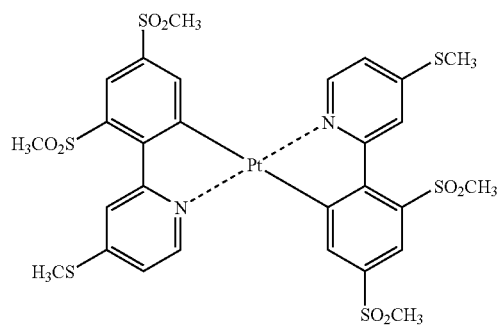
P-90
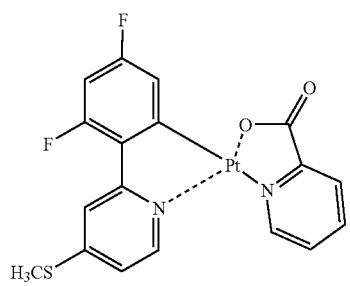
P-91
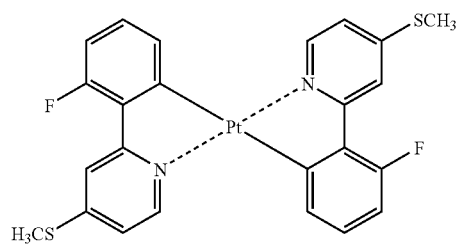
P-92
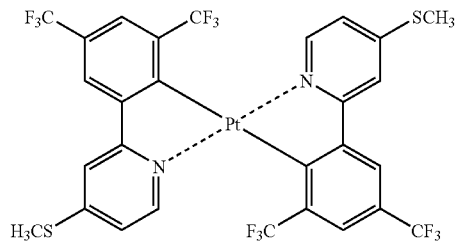
P-93
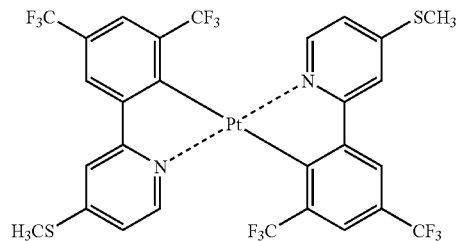
P-94
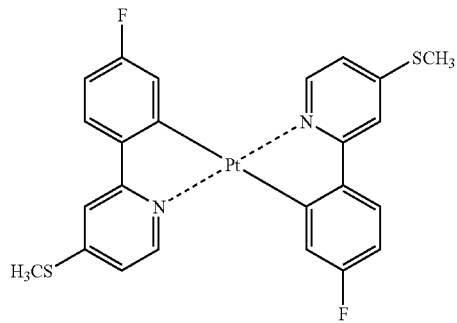
P-95
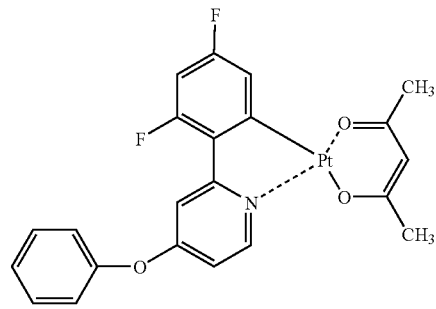

P-96 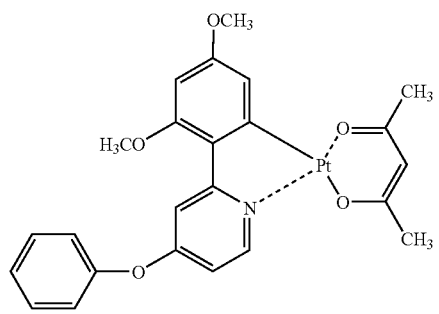
P-97 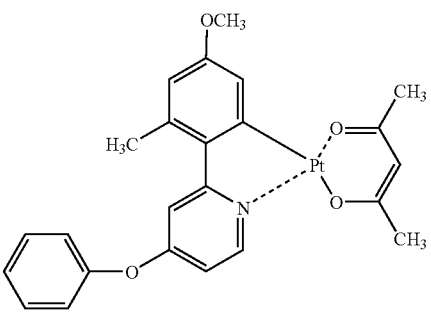
P-98 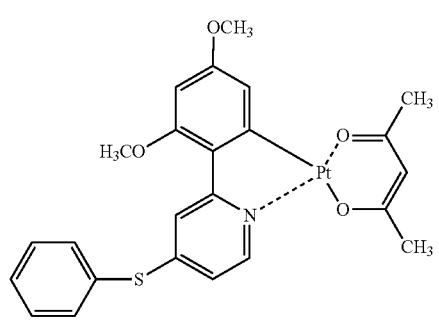
P-99 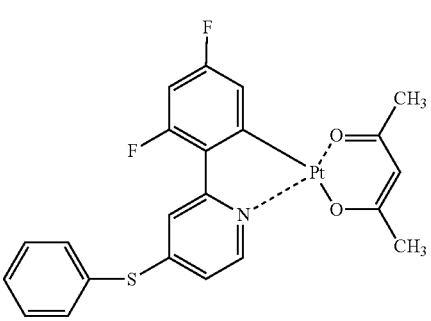
P-100 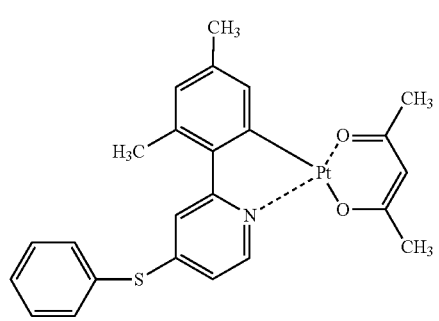
I-1 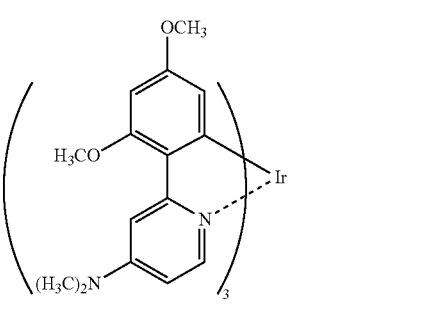
I-2 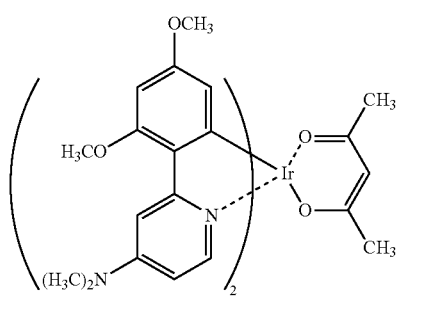
I-3 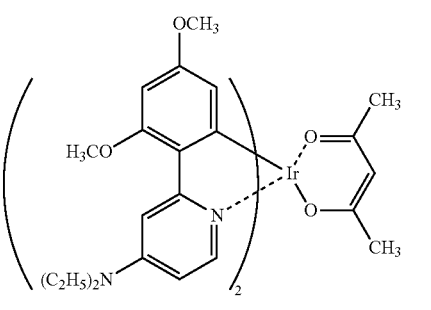
I-4 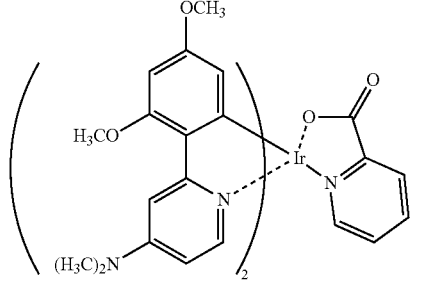
I-5 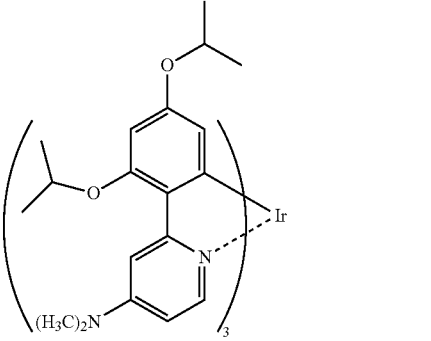

-continued
I-6
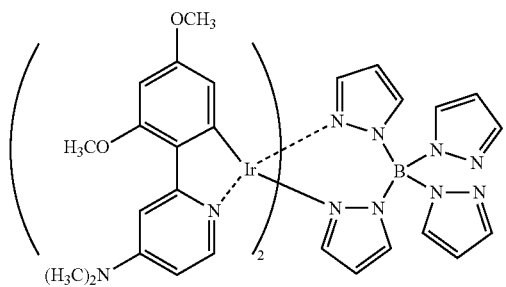
I-7
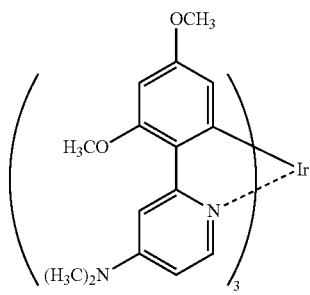
I-8
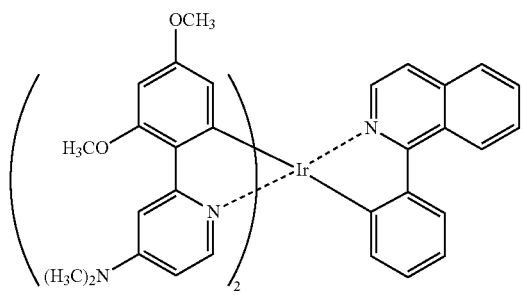
I-9
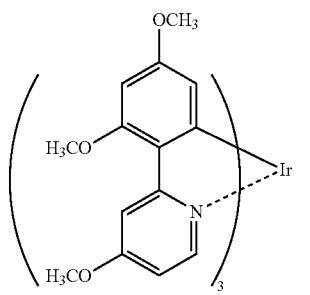
I-10
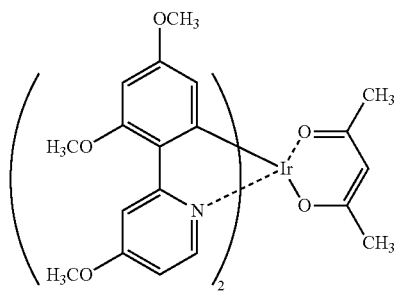
I-11
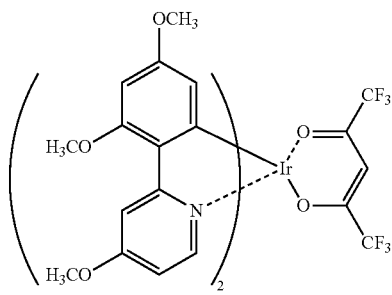
I-12
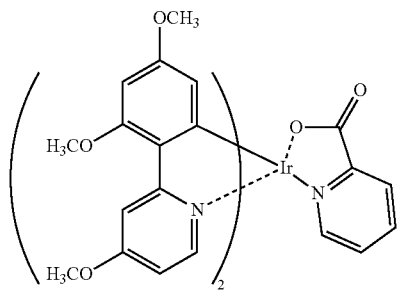
I-13
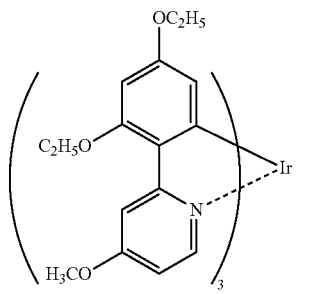
I-14
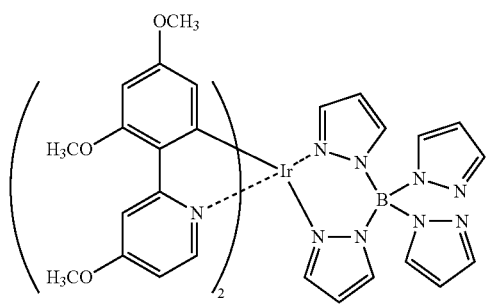
I-15
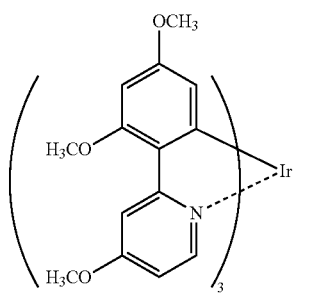

-continued
I-16
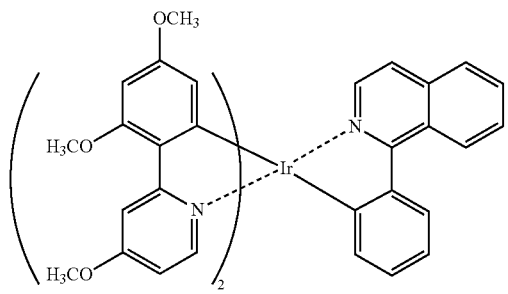
I-17
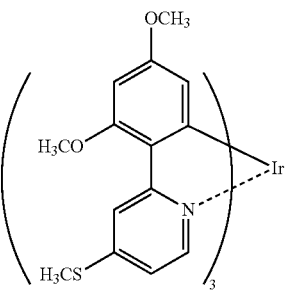
I-18
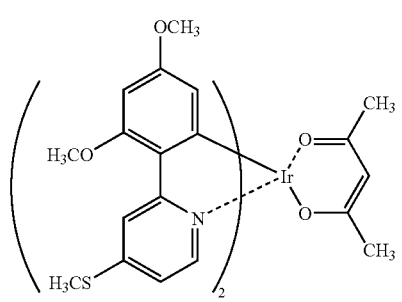
I-19
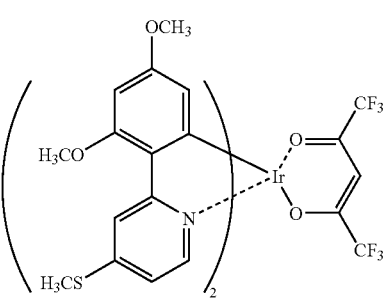
I-20
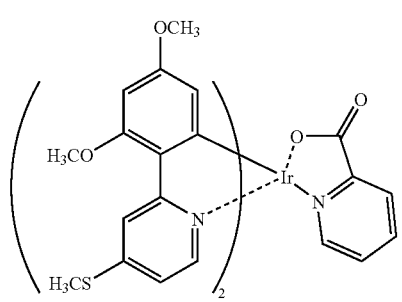
I-21
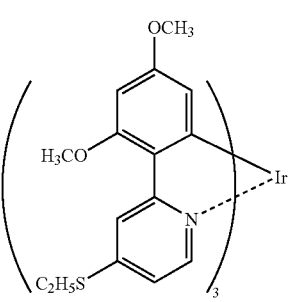
I-22
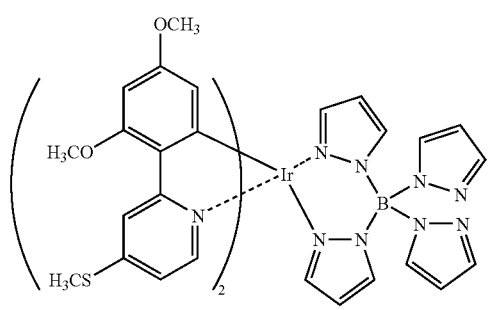
I-23
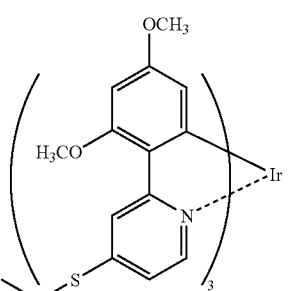
I-24
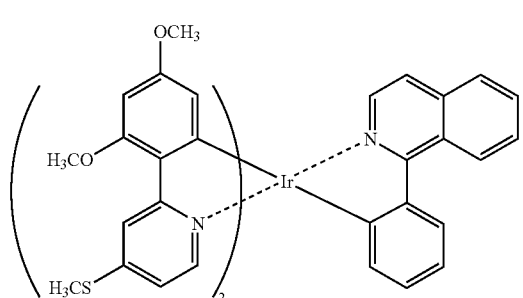
I-25
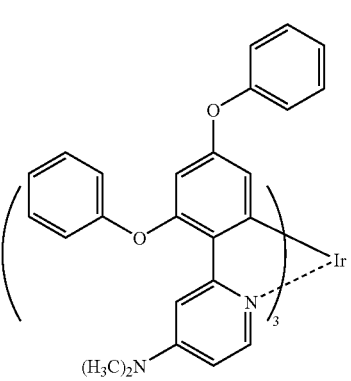

-continued
I-26
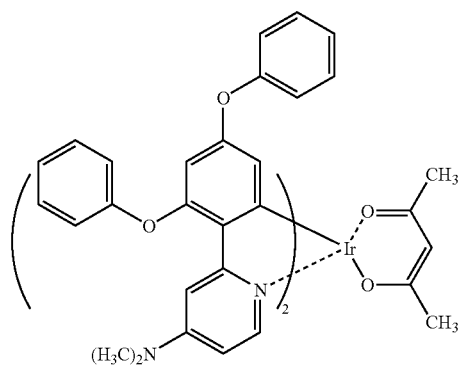
I-27
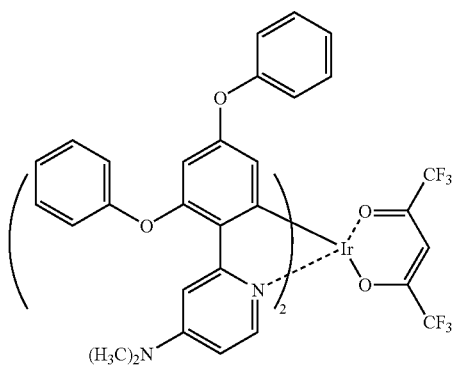
I-28
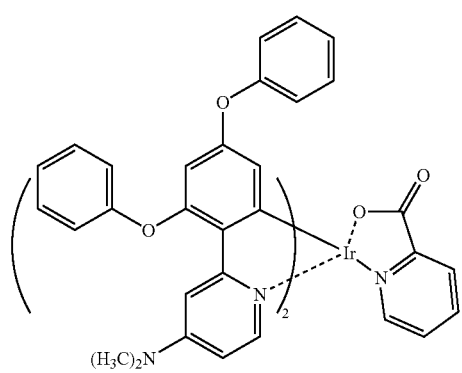
I-29
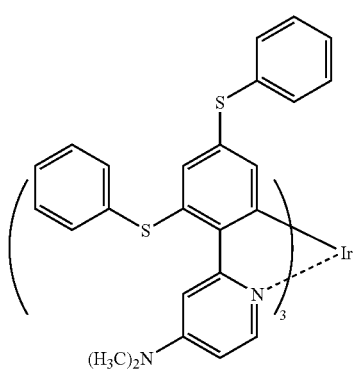
I-30
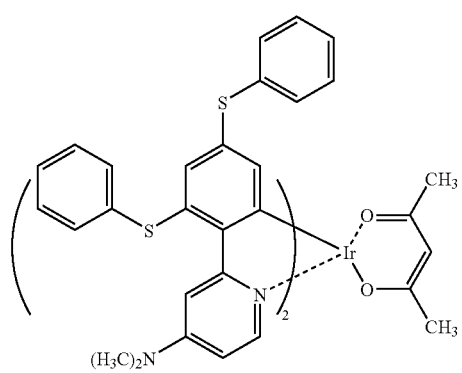
I-31
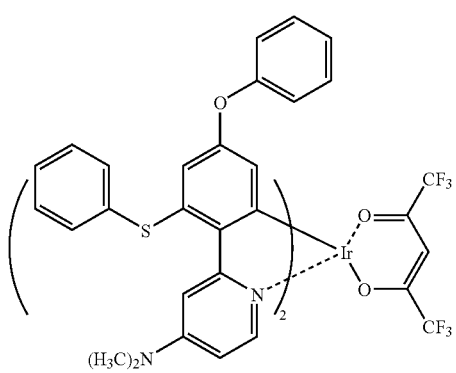
I-32
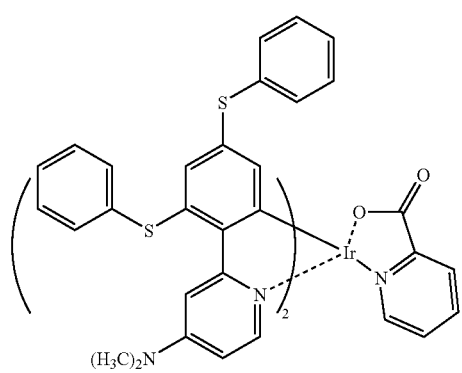
I-33
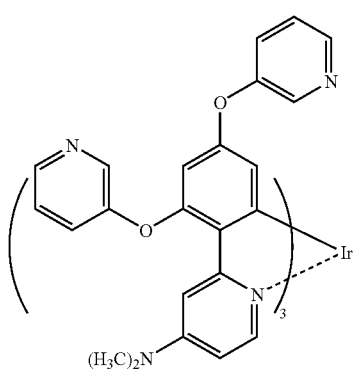

I-34
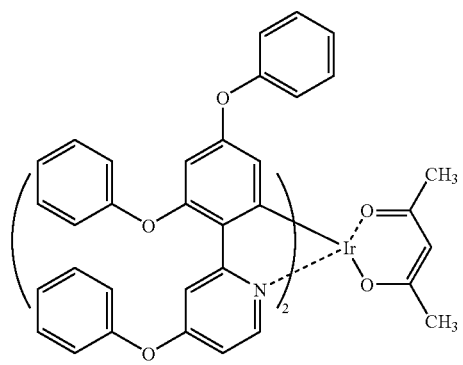
I-35
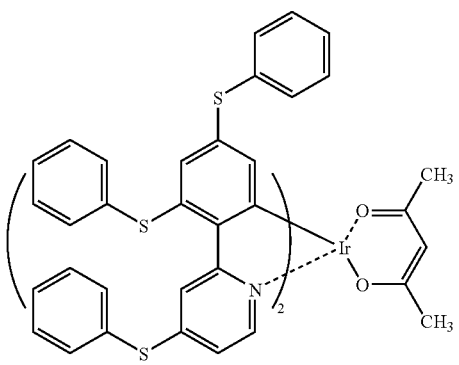
I-36
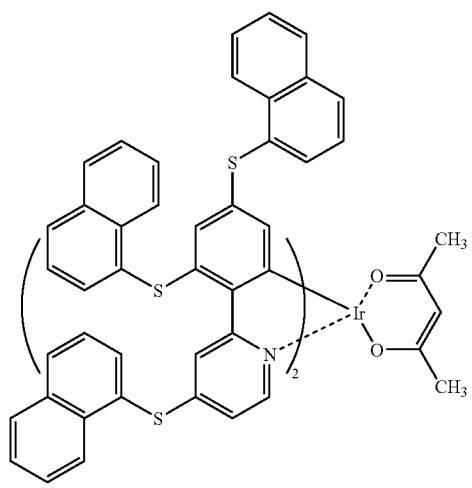
I-37
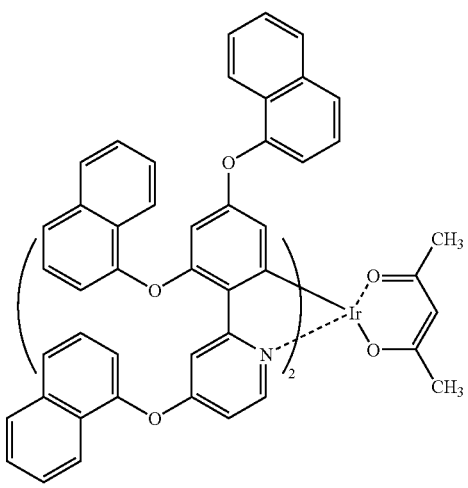
I-38
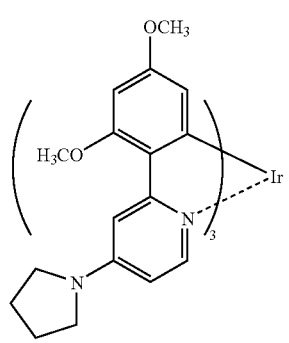
I-39
I-40
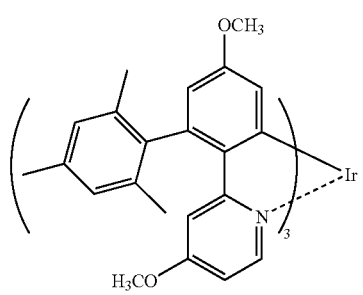
I-41
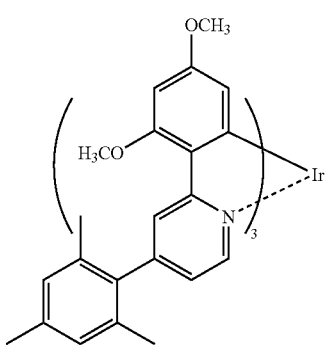

-continued
I-42
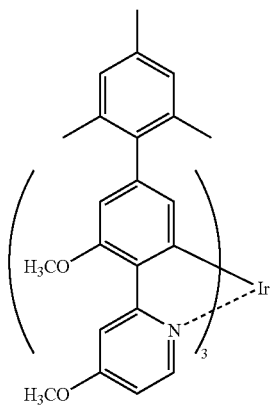
I-43
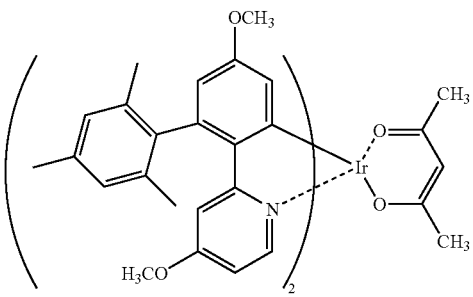
I-44
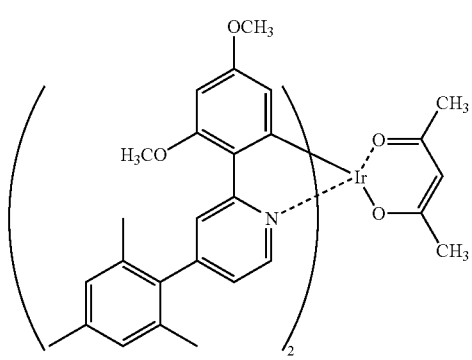
I-45
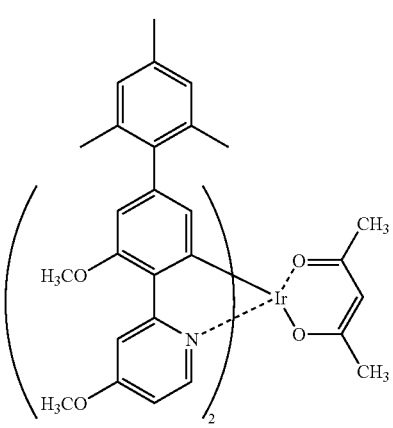
I-46
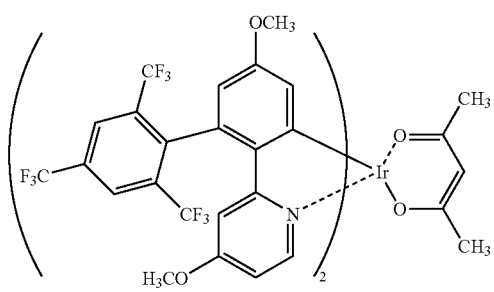
I-47
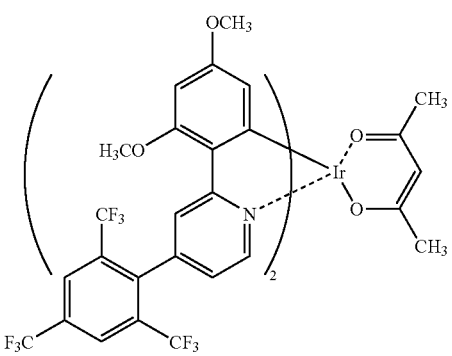
I-48
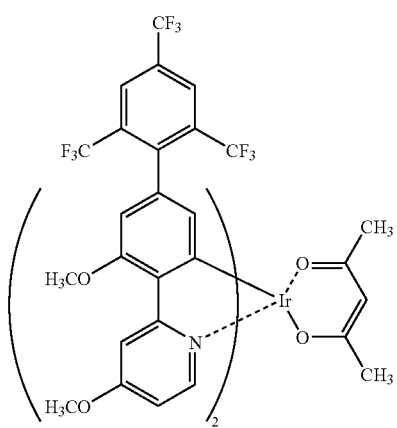
I-49
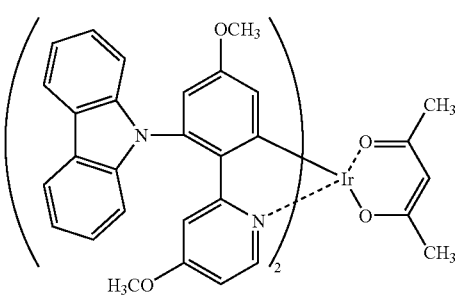

-continued
I-50
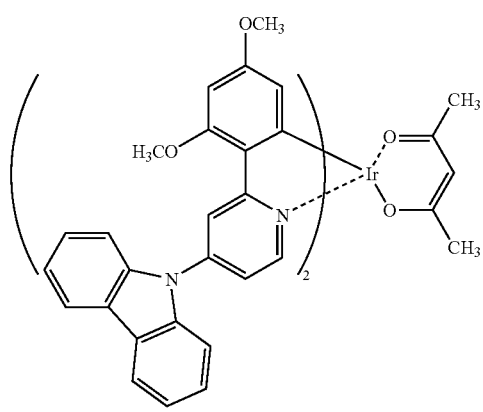
I-51
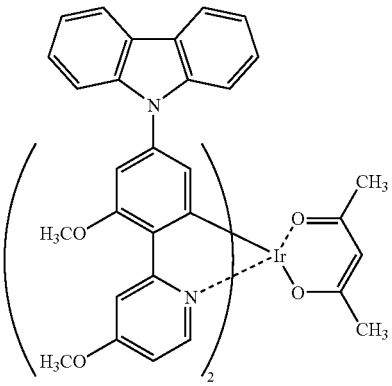
I-52
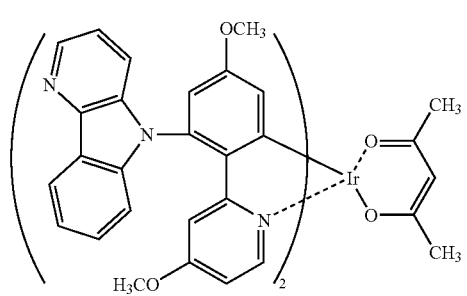
I-53
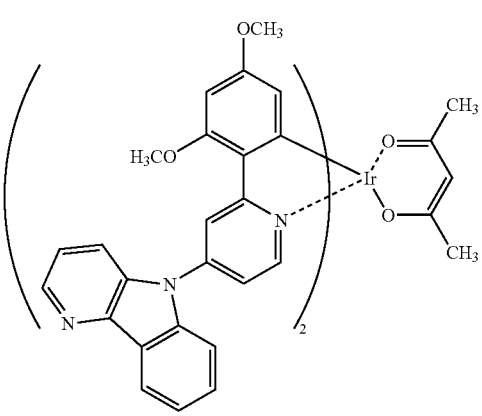
I-54
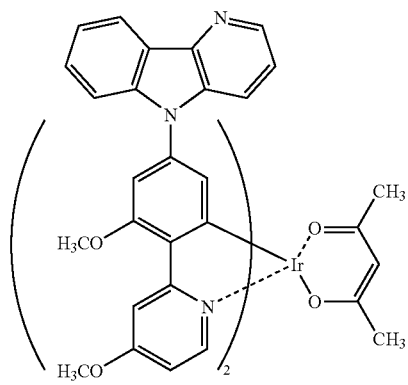
I-55
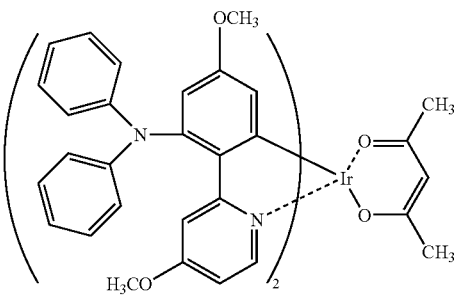
I-56
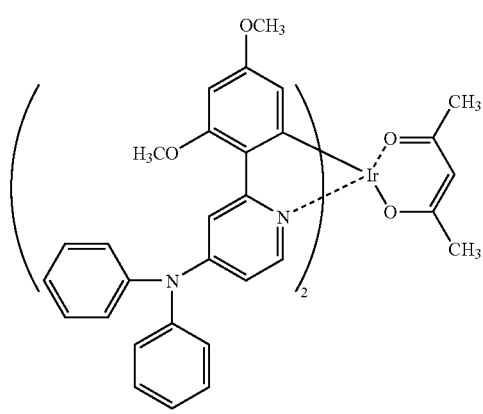
I-57
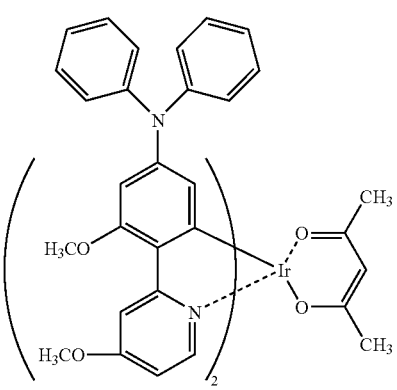

-continued
I-58
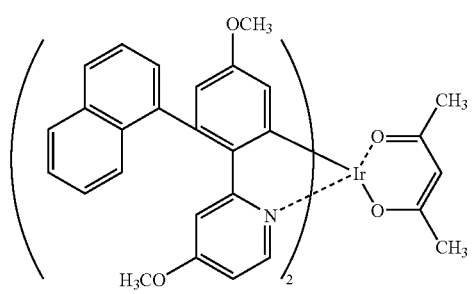
I-59
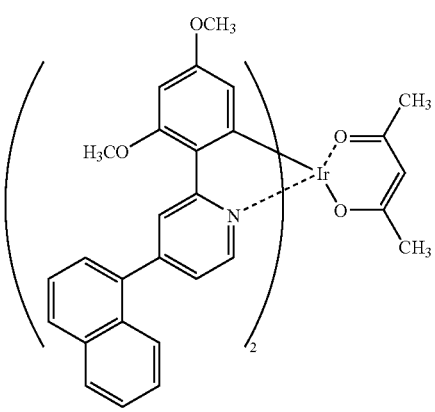
I-60
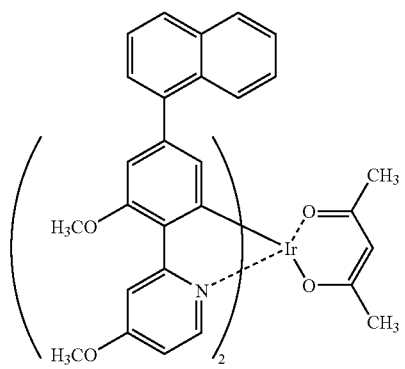
I-61
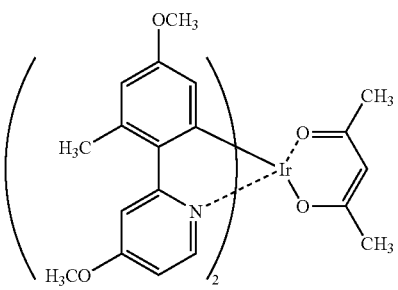
I-62
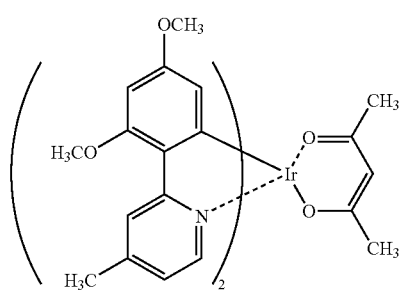
I-63
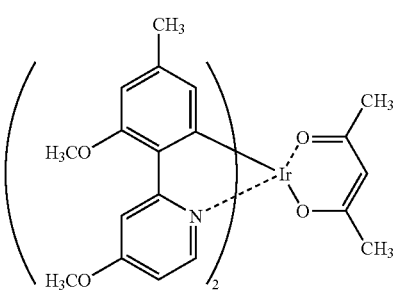
I-64
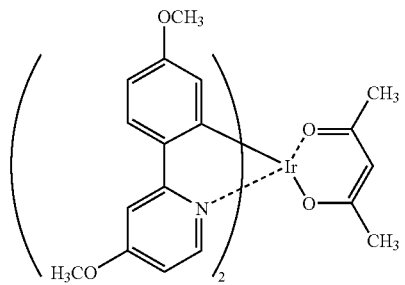
I-65
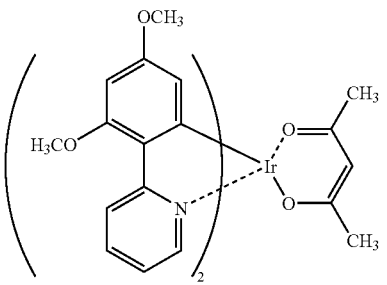

-continued
I-66
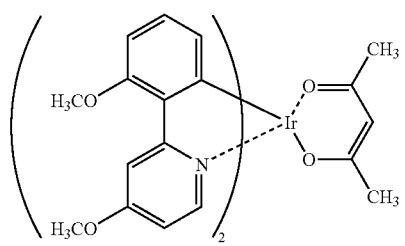
P-101
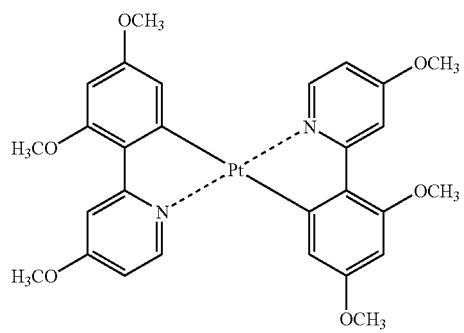
P-102
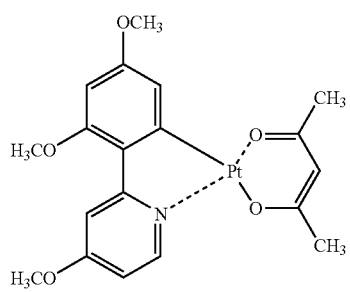
P-103
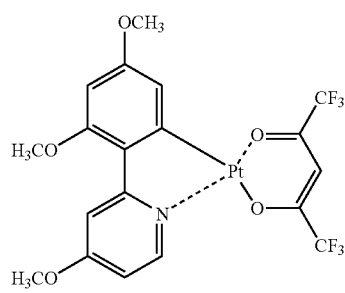
P-104
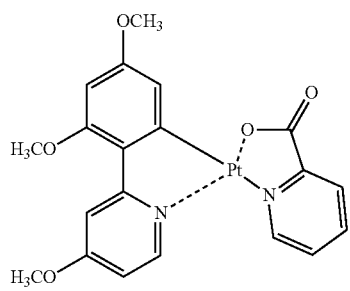
P-105
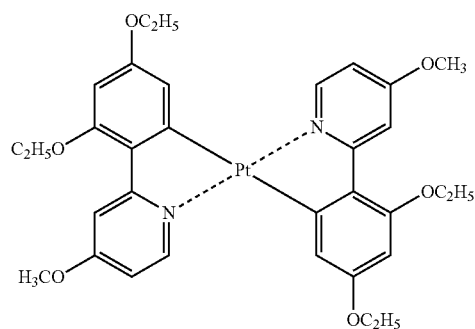
P-106
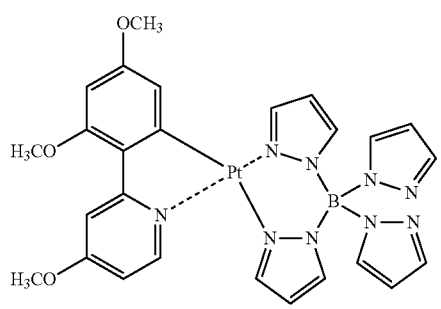
P-107
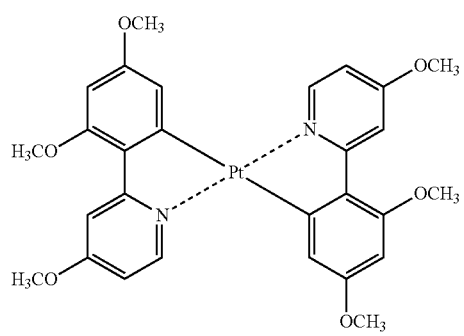
P-108
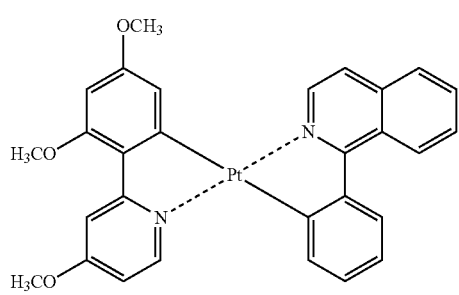
P-109
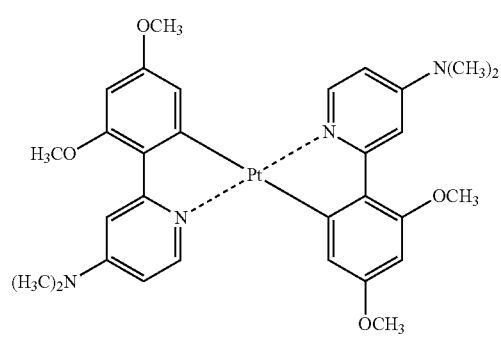

-continued
P-110
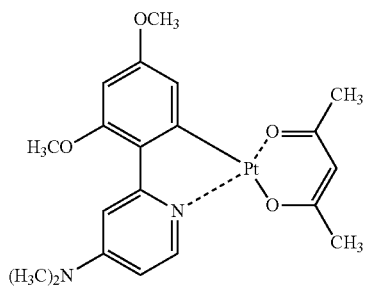
P-111
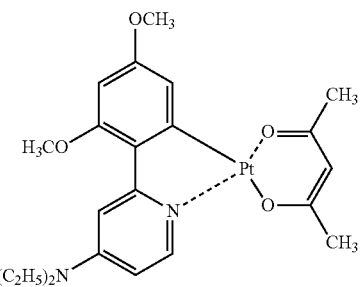
P-112
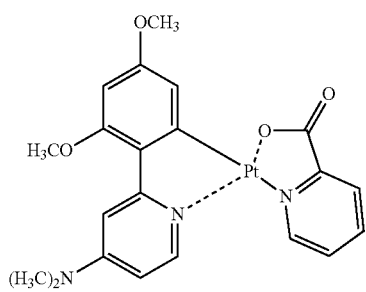
P-113
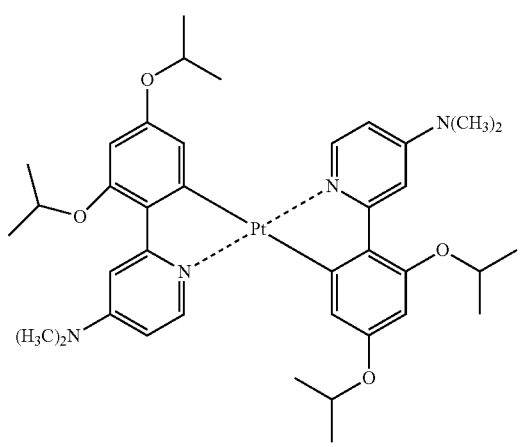
P-114
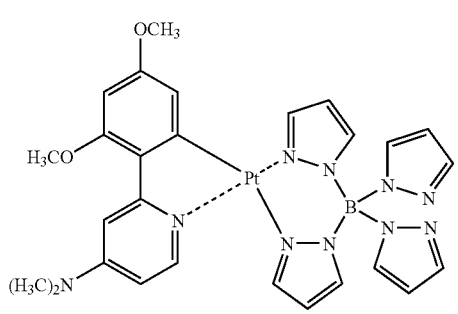
P-115
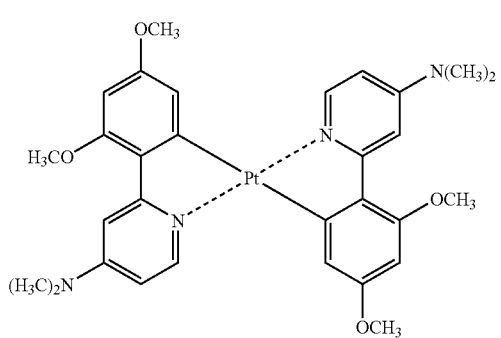
P-116
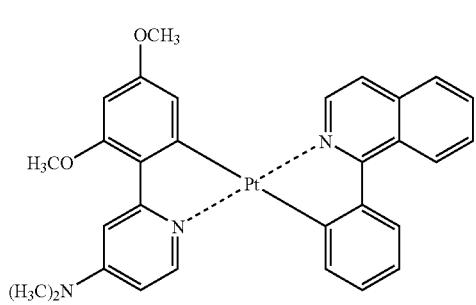
P-117
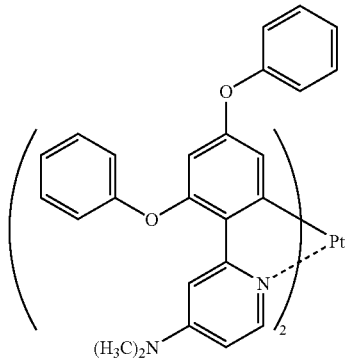

-continued
P-118
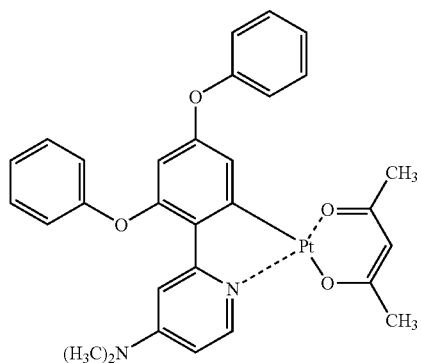
P-119
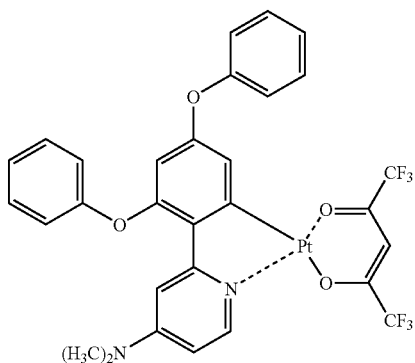
P-120
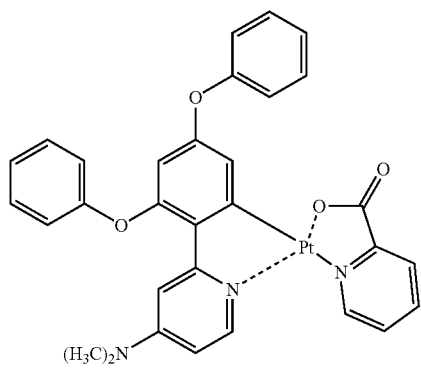
P-121
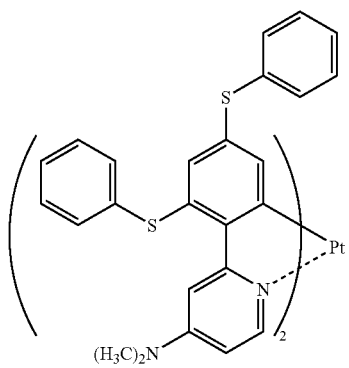
P-122
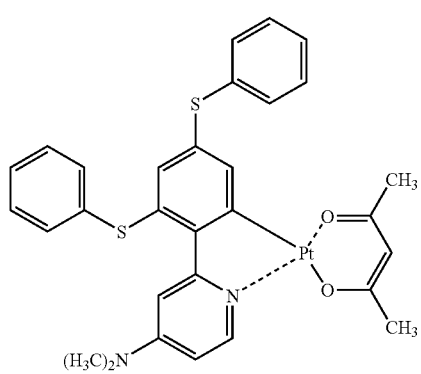
P-123
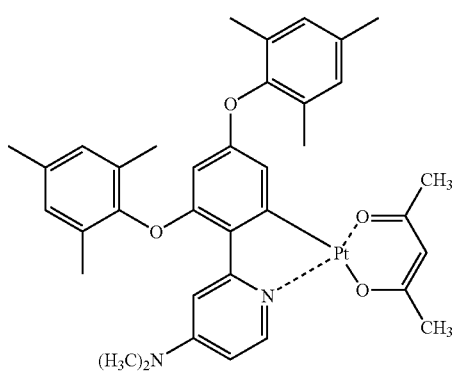
P-124
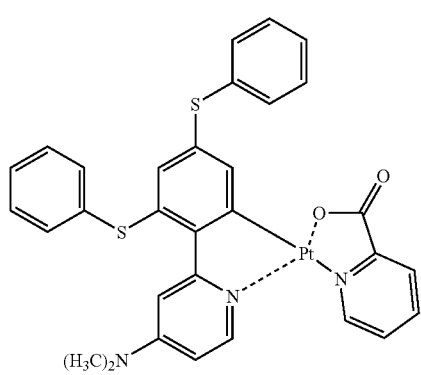
P-125
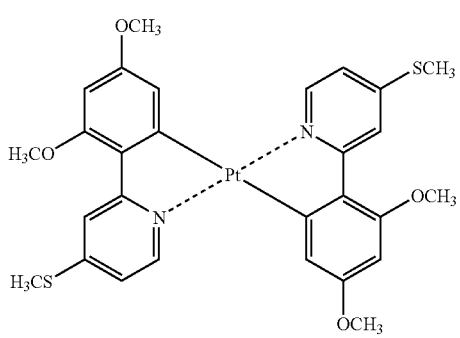

-continued
P-126
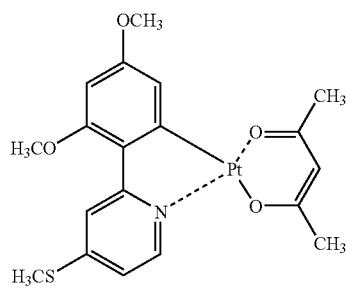
P-127
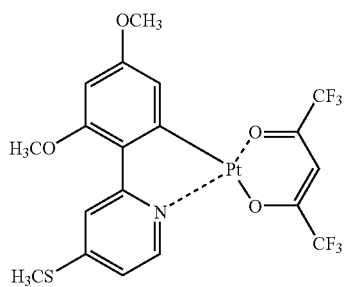
P-128
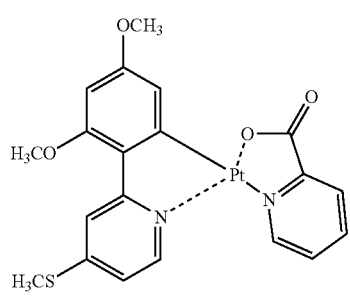
P-129
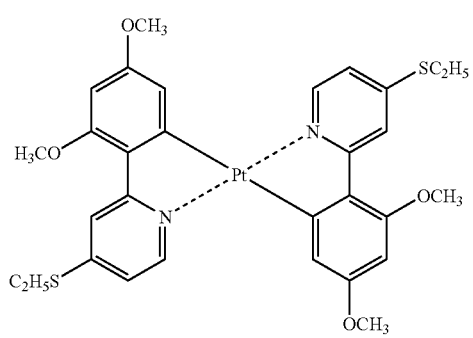
P-130
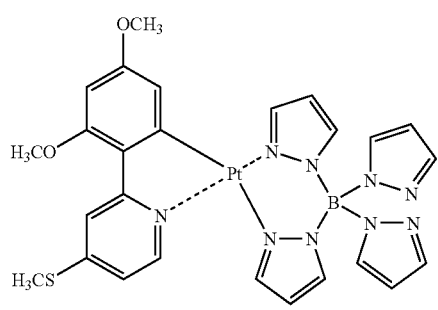
P-131
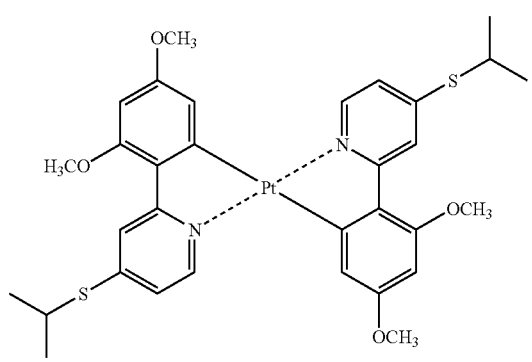
P-132
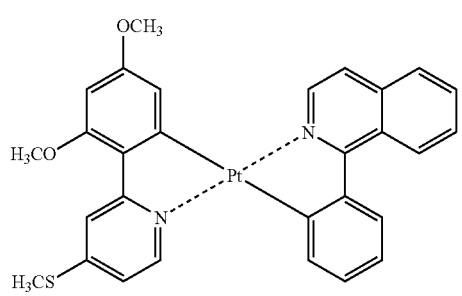
P-133
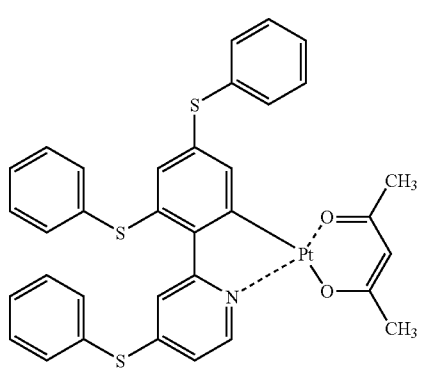

-continued
P-134
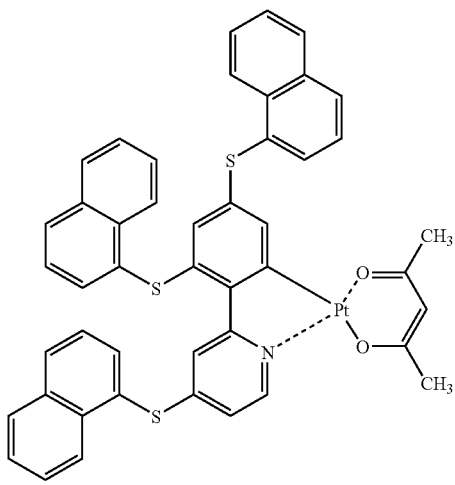
P-135
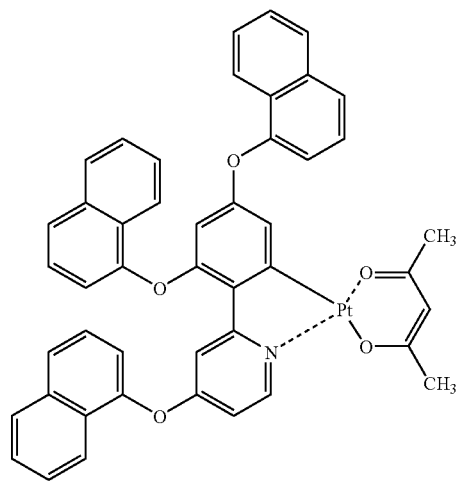
P-136
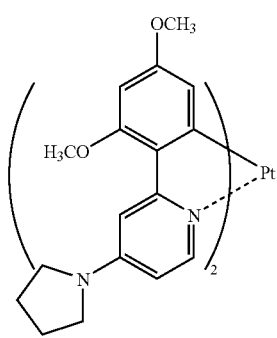
P-137
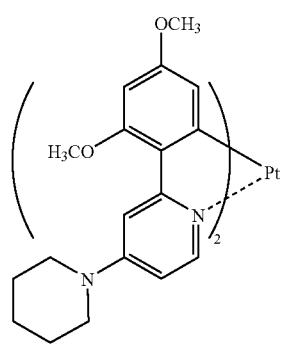
P-138
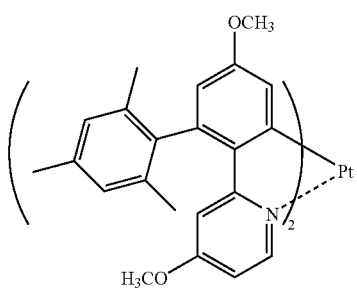
P-139
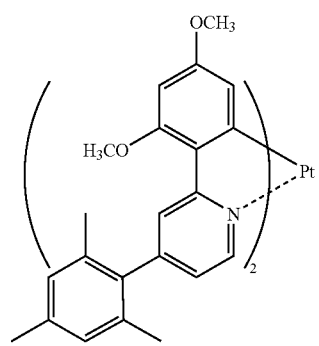
P-140
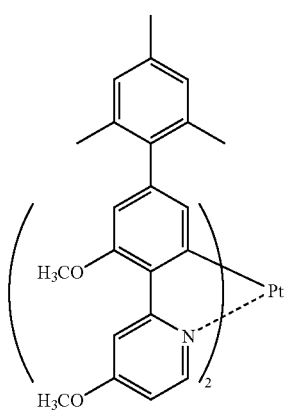
P-141
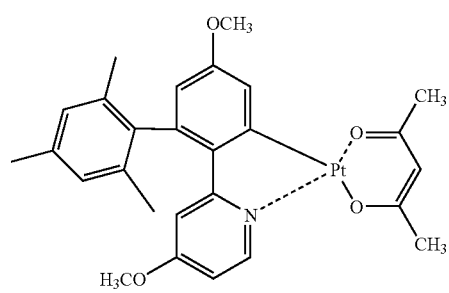

-continued
P-142
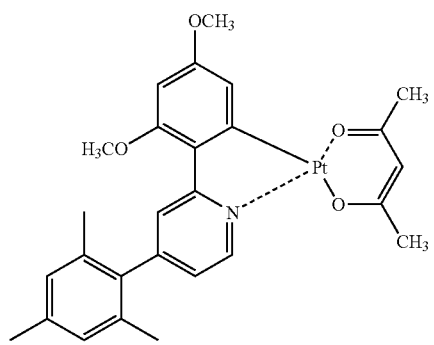
P-143
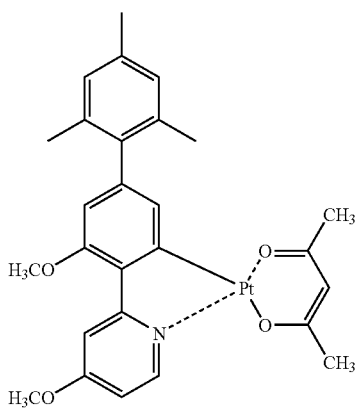
P-144
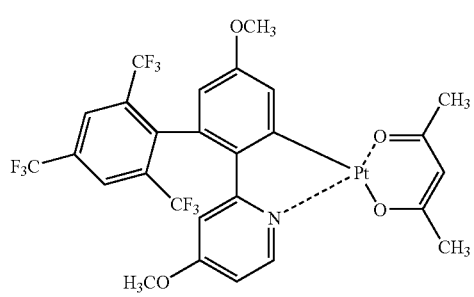
P-145
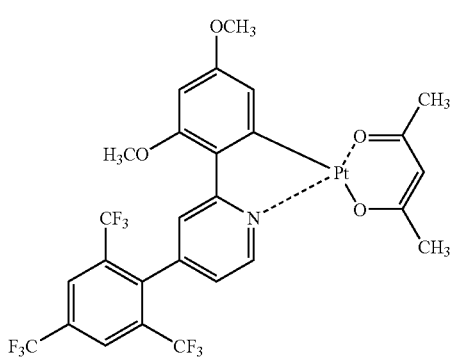
P-146
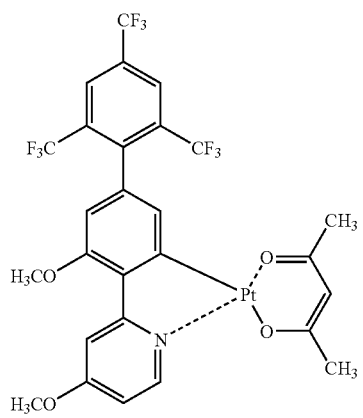
P-147
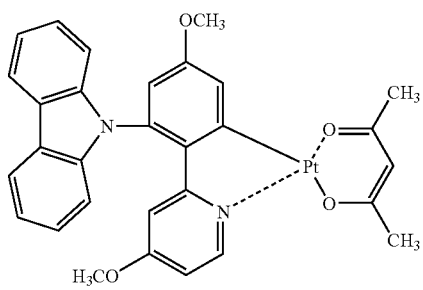
P-148
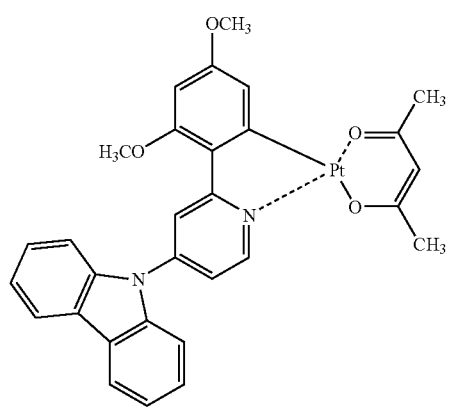
P-149
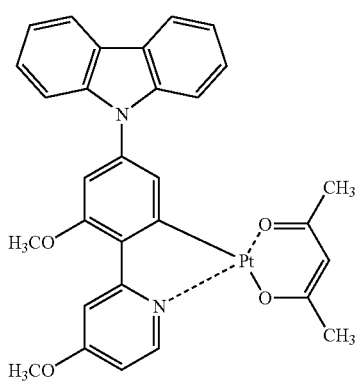

-continued
P-150
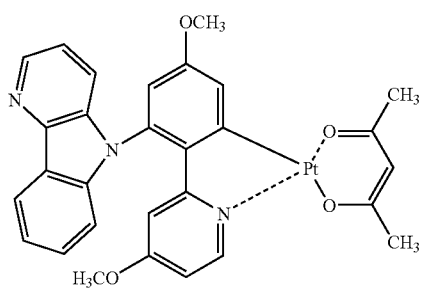
P-151
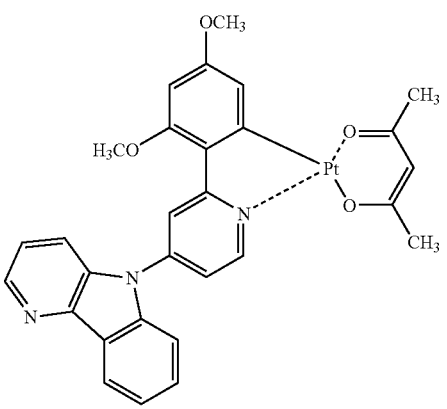
P-152
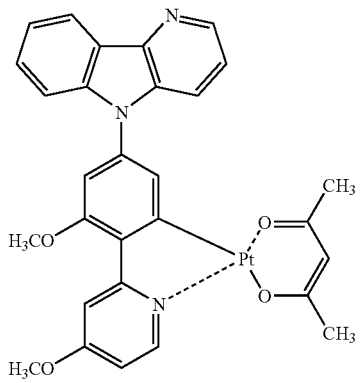
P-153
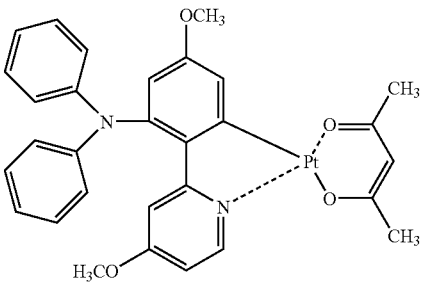
P-154
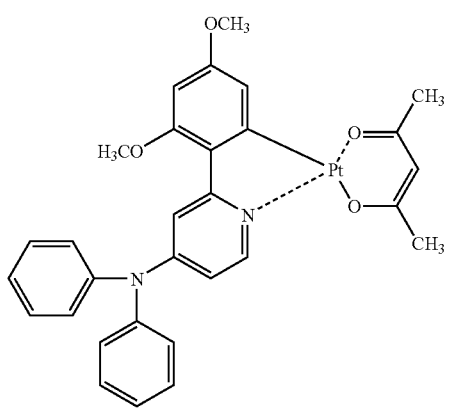
P-155
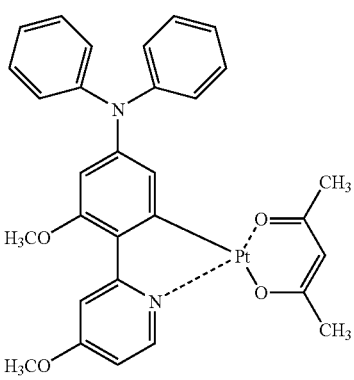
P-156
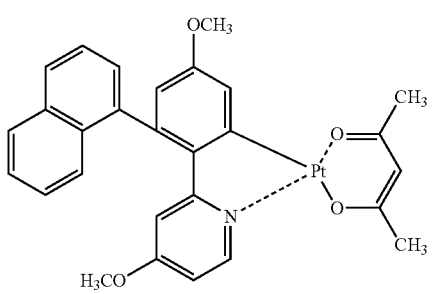
P-157
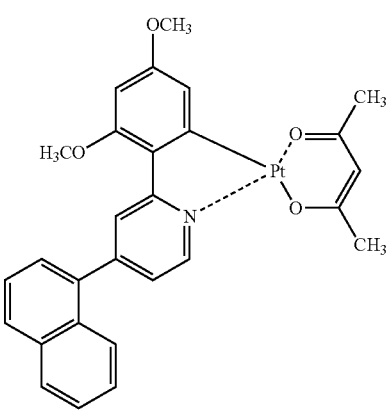

-continued
P-159
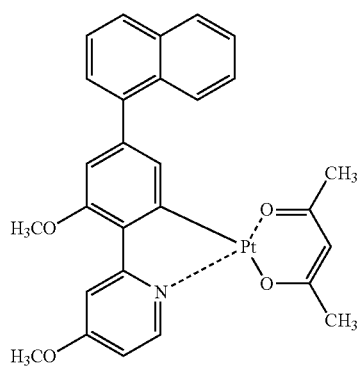
P-159
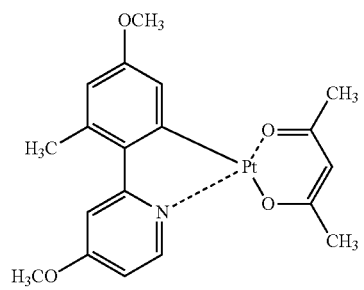
P-160
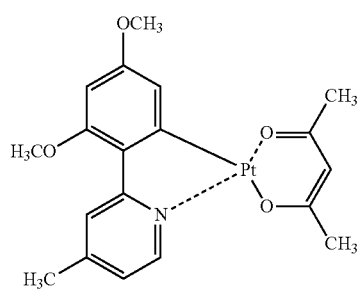
P-161
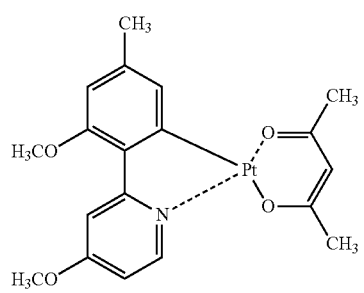
P-162
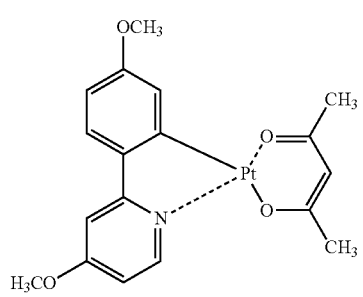
P-163
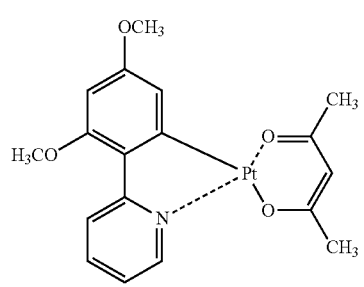
P-164
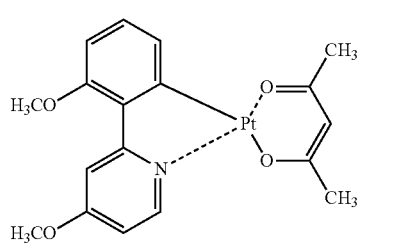
r-1
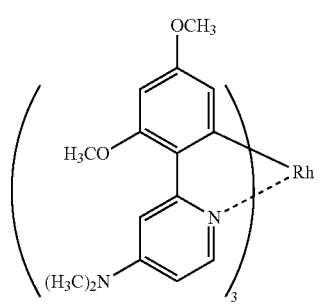
r-2
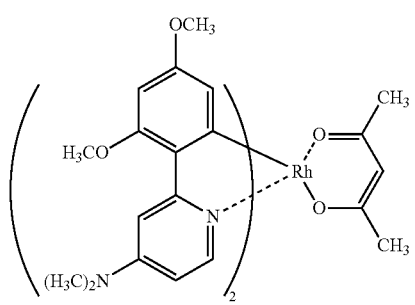
r-3
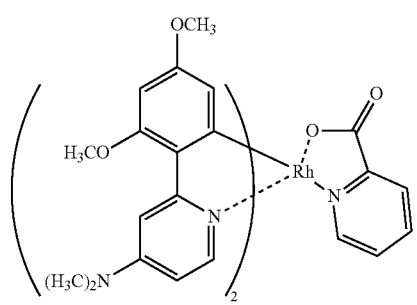

-continued
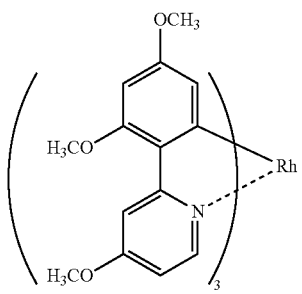
r-4
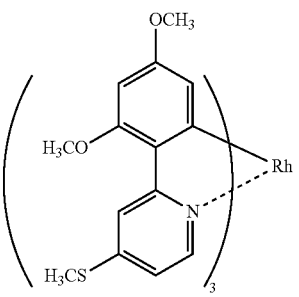
r-5
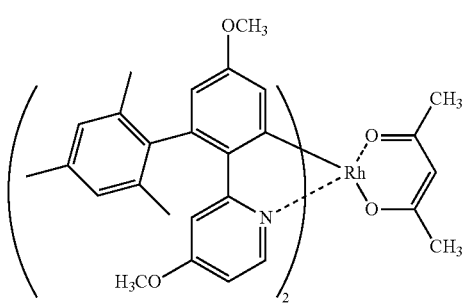
r-6
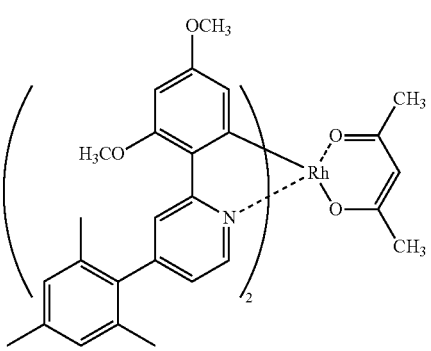
r-7
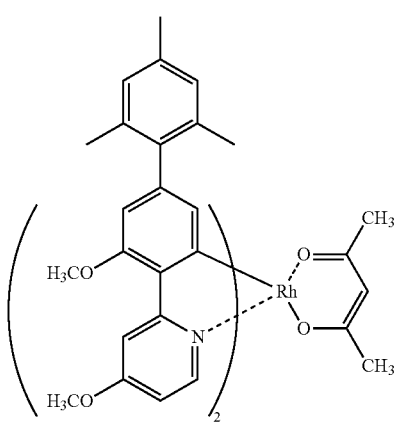
r-8
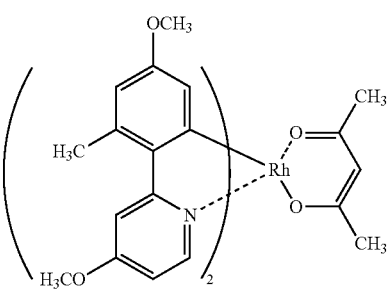
r-9
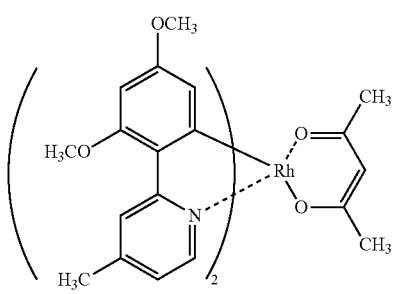
r-10
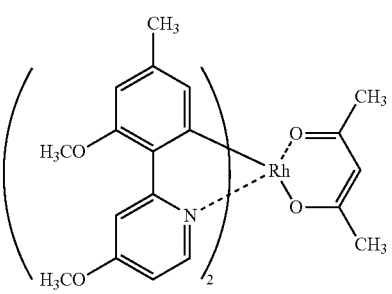
r-11

-continued
P-201
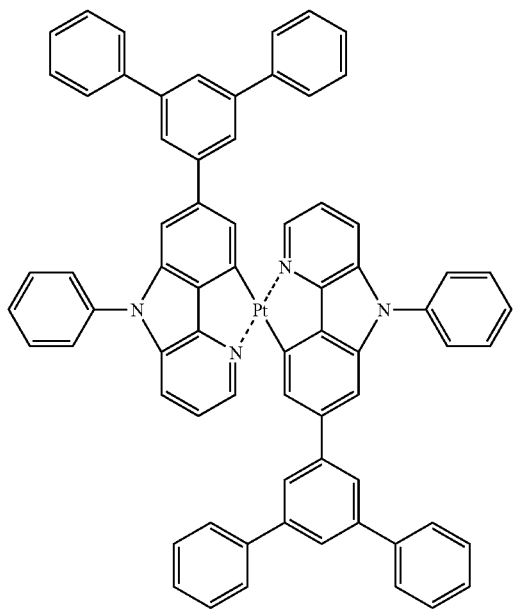
P-202
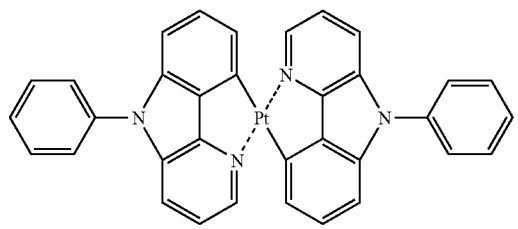
P-203
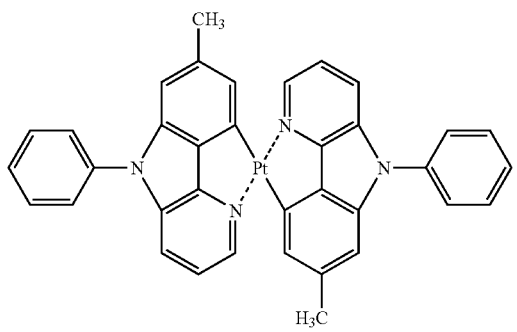
P-204
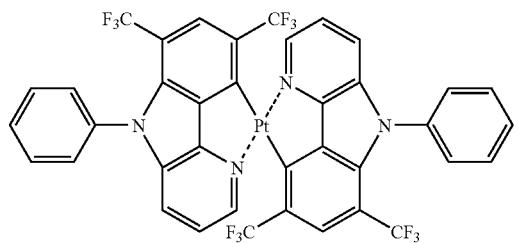
P-205
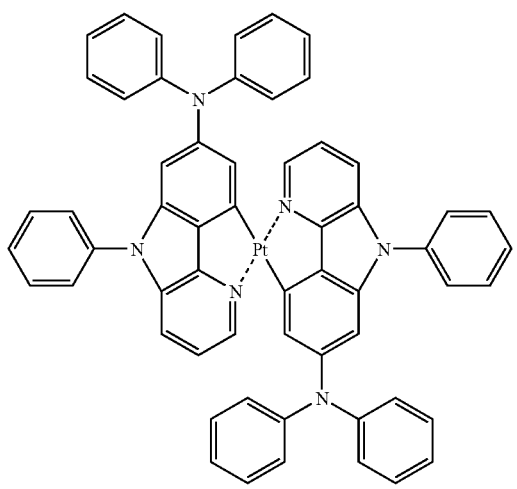
P-206
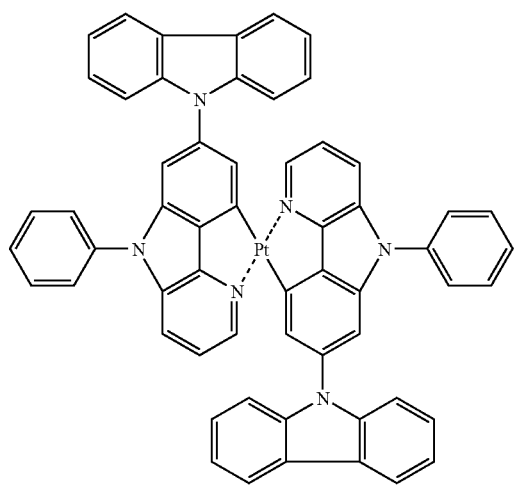

-continued
P-207
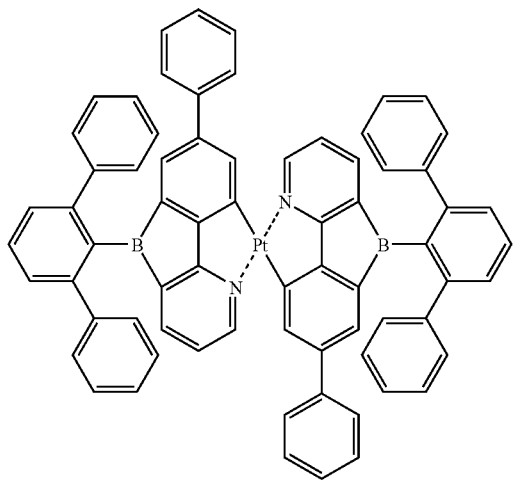
P-208
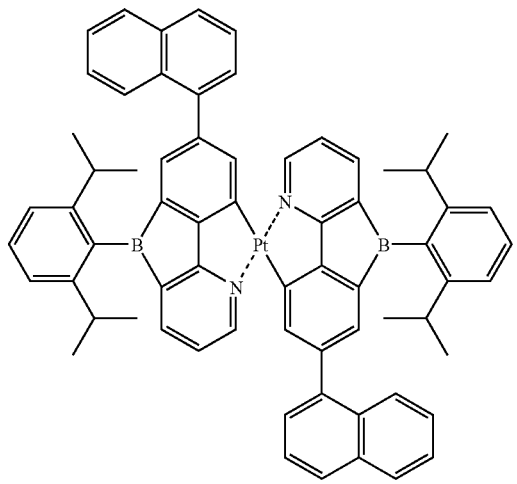
P-209
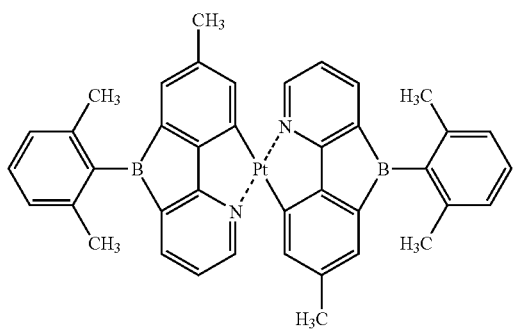
P-210
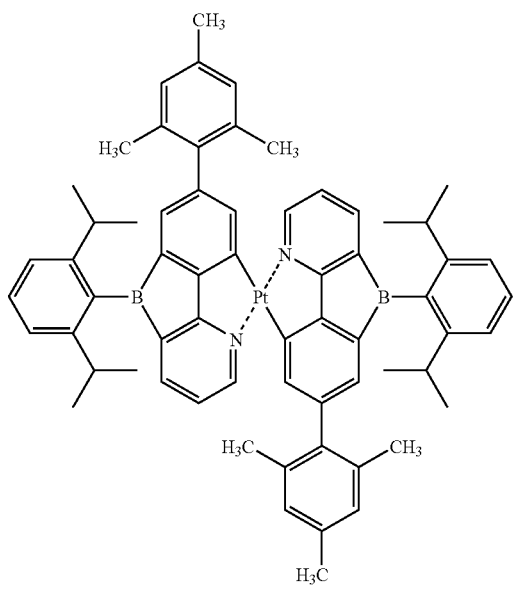
P-211
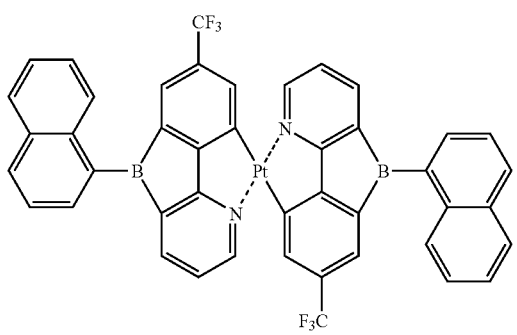
P-212
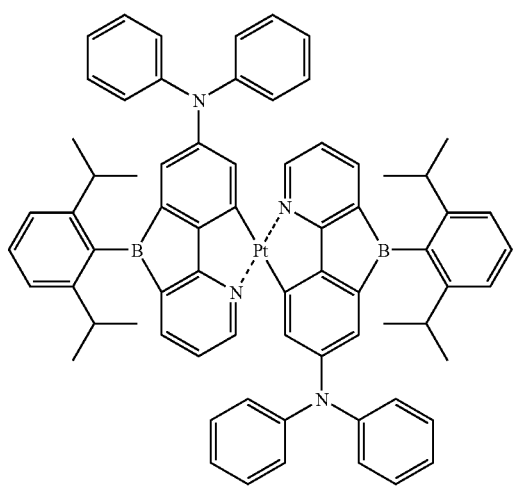

-continued
P-213
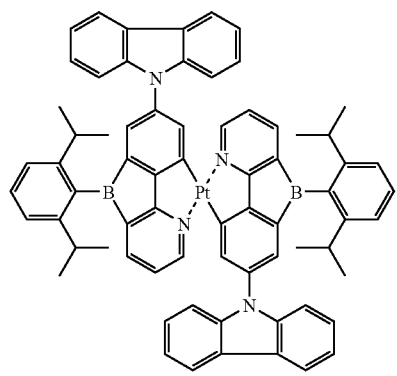
P-214
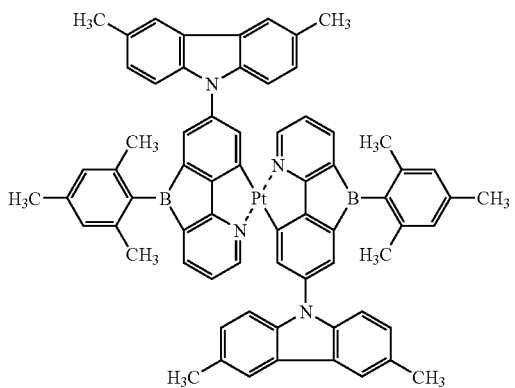
P-215
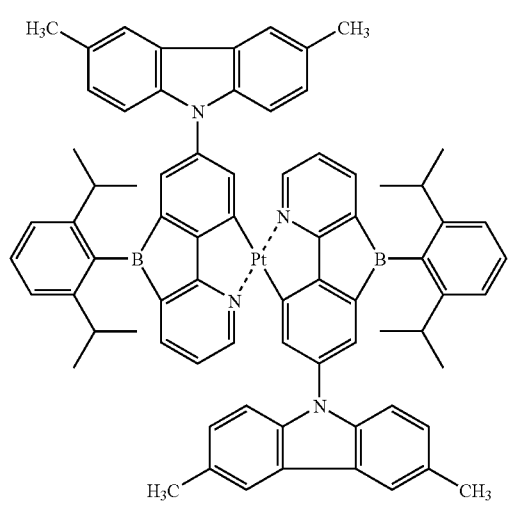
P-216
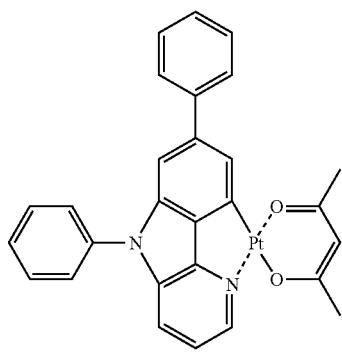
P-217
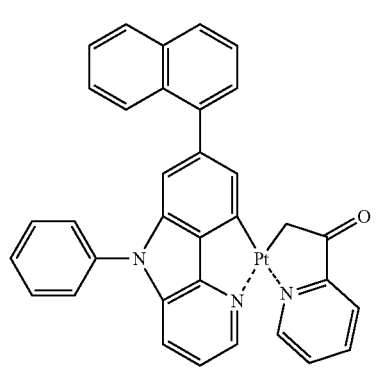
P-218
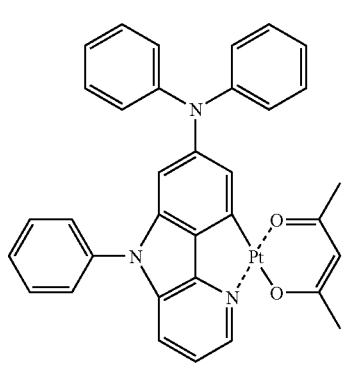
P-219
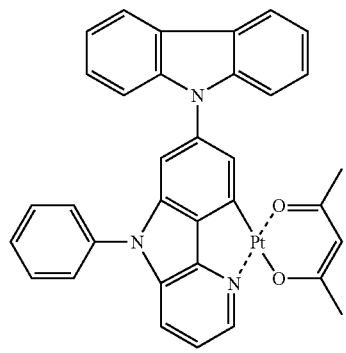
P-220
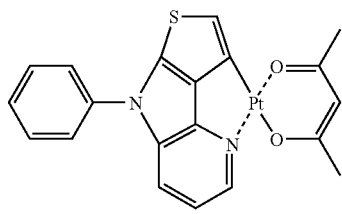

-continued
P-221
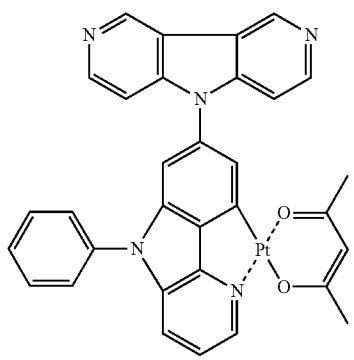
P-222
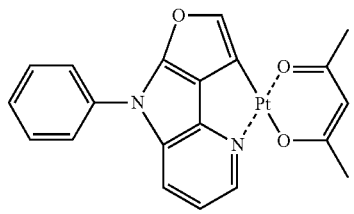
P-223
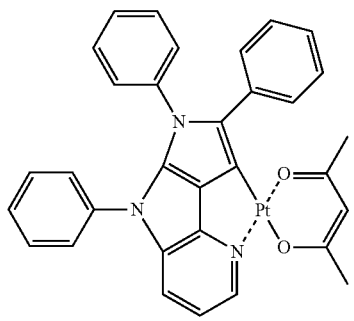
P-224
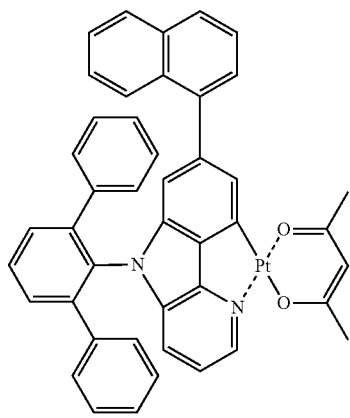
P-225
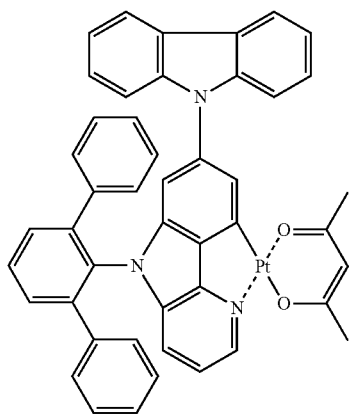
P-226
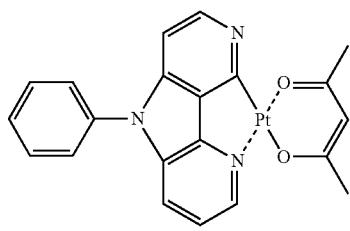
P-227
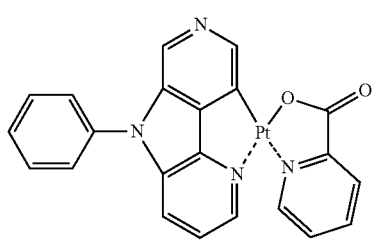
P-228
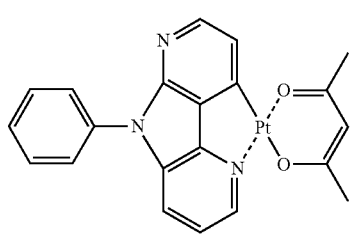

-continued
P-229
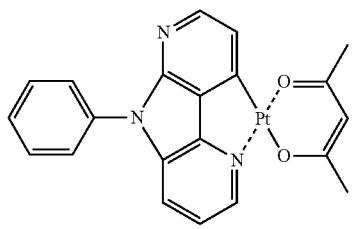
P-230
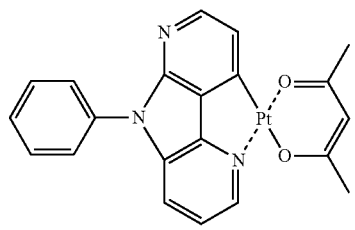
P-231
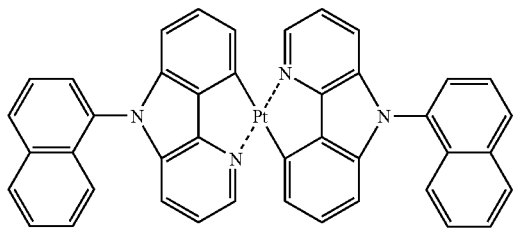
P-232
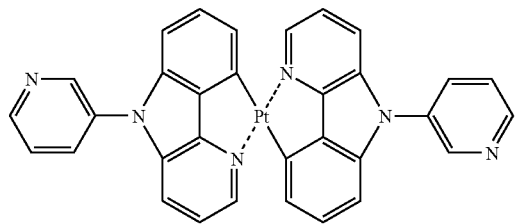
P-233
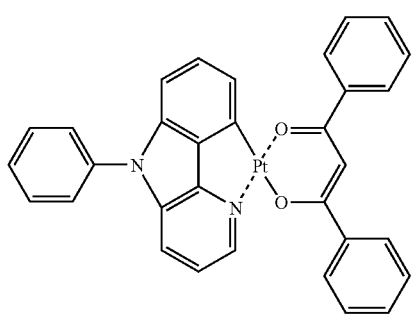
P-234
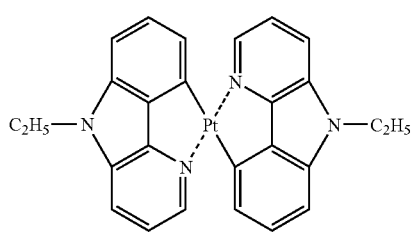
P-235
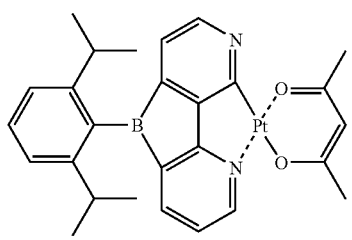
P-236
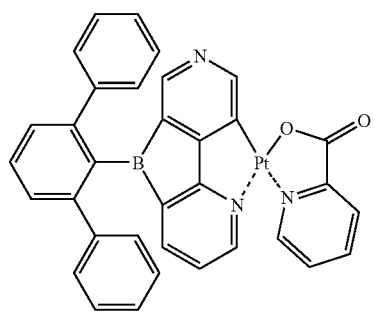
P-237
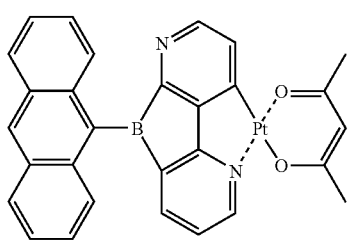
P-238
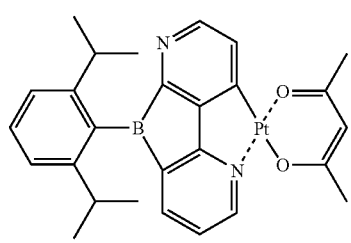

-continued
P-239
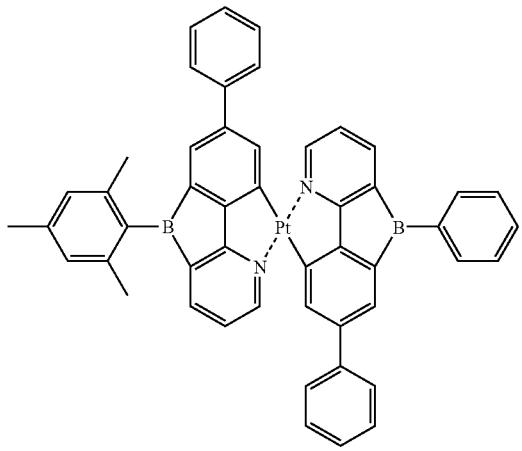
P-240
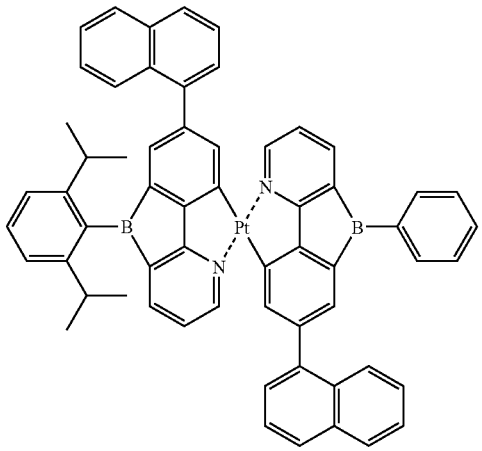
P-241
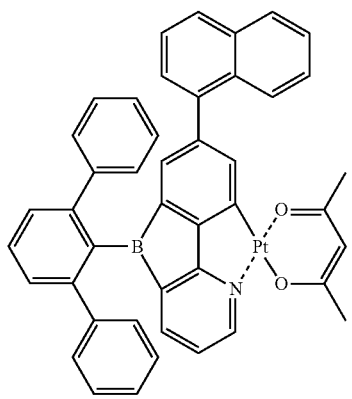
P-242
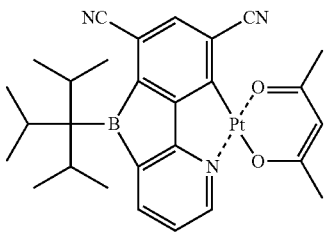
P-243
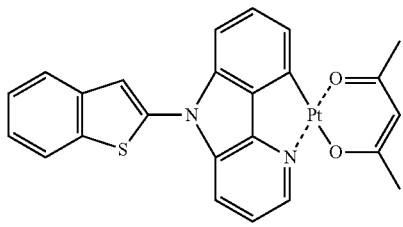
P-244
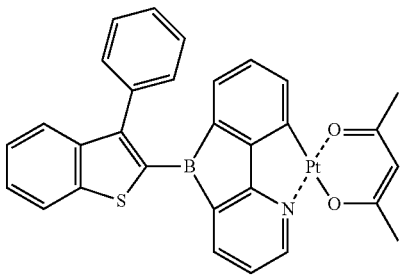
P-245
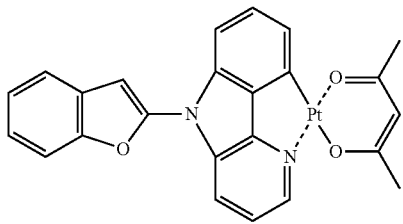
P-246
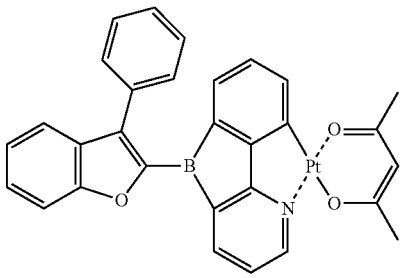

-continued
P-247
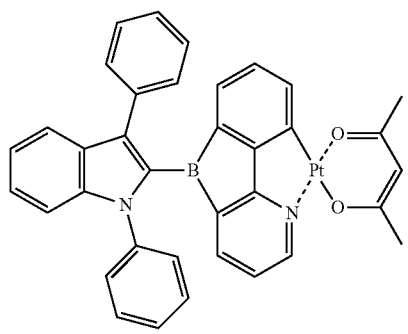
P-248
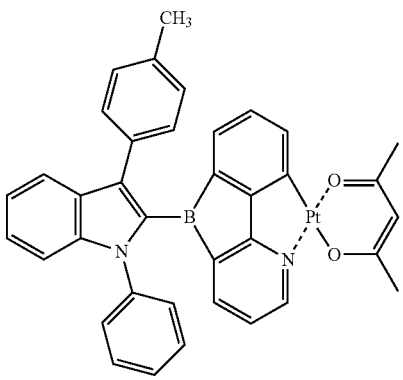
P-249
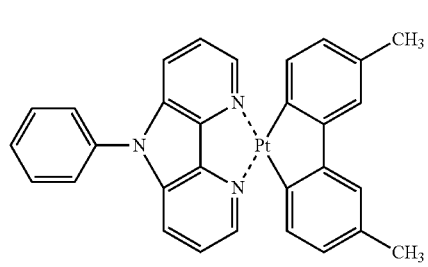
P-250
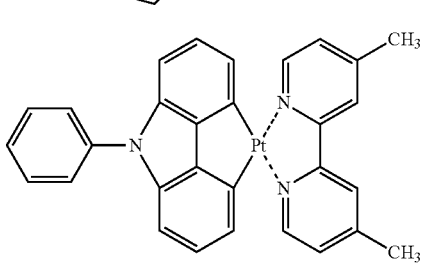
P-251
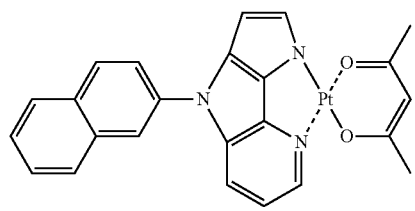
P-252
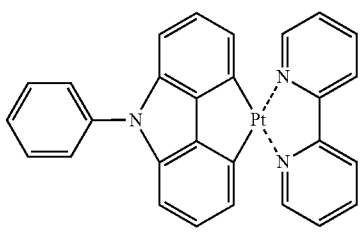
P-253
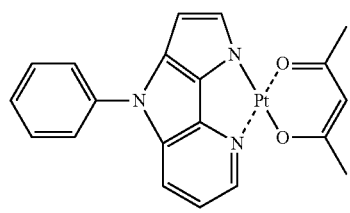
P-254
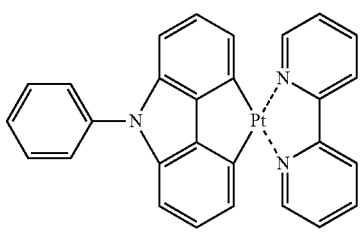
P-255
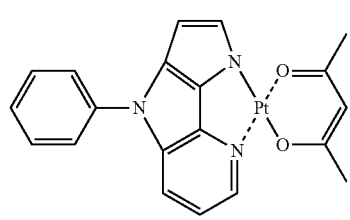
P-256
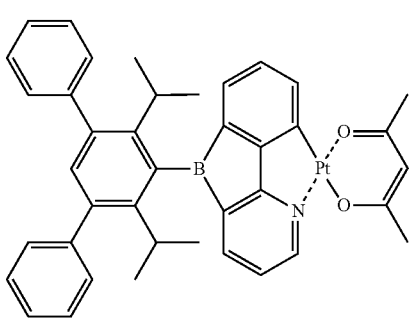
P-257
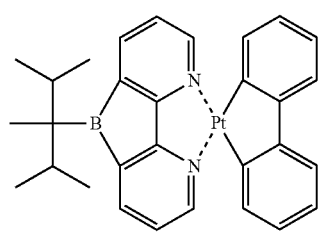
P-258
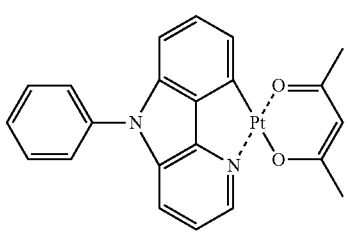

-continued
P-259
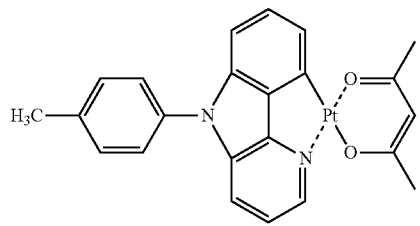
P-260
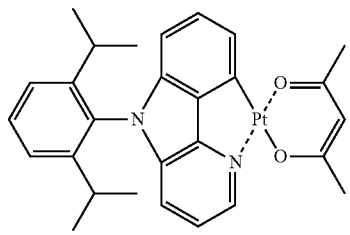
P-261
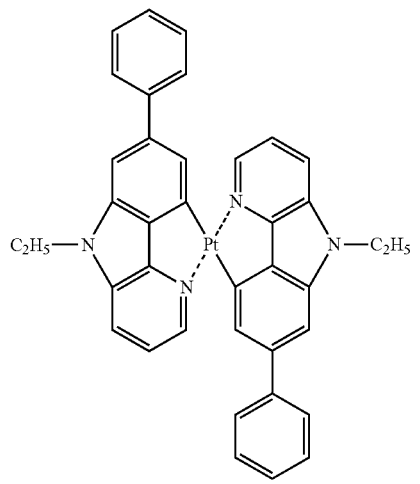
P-262
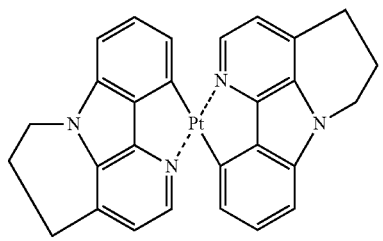
P-263
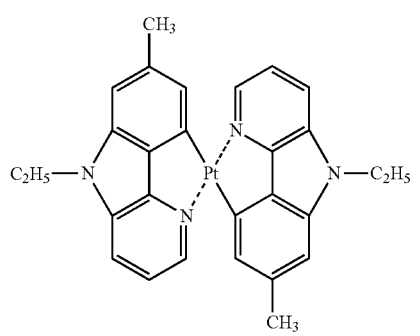
P-264
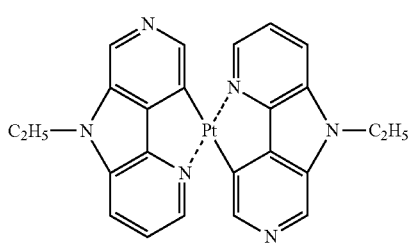
P-265
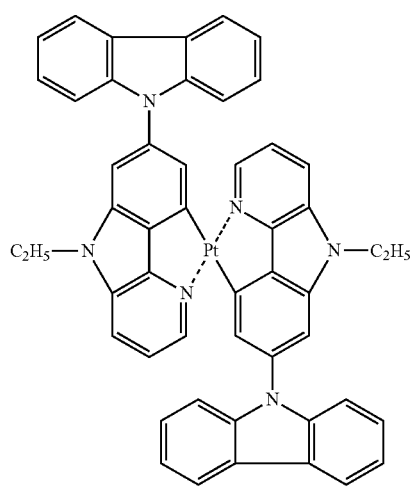
P-266
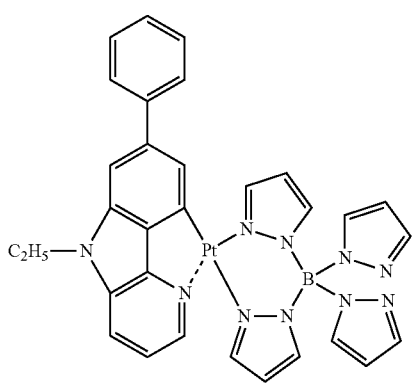

-continued
I-101
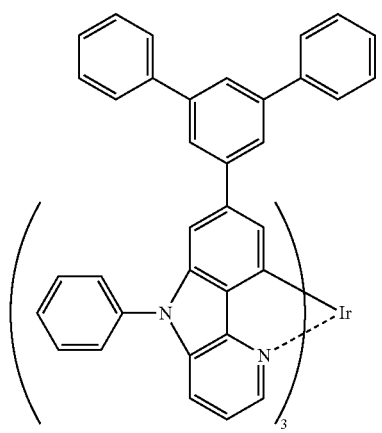
I-102
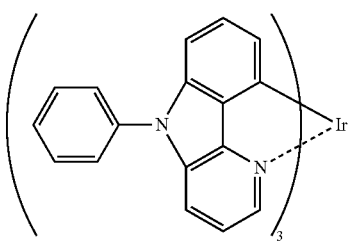
I-103
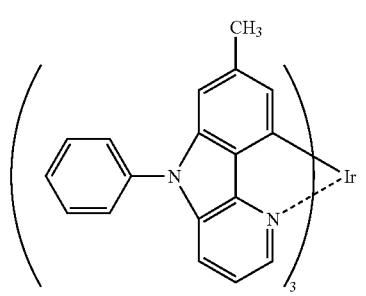
I-104
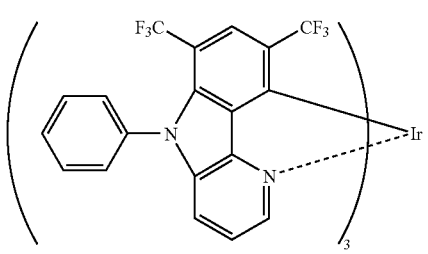
I-105
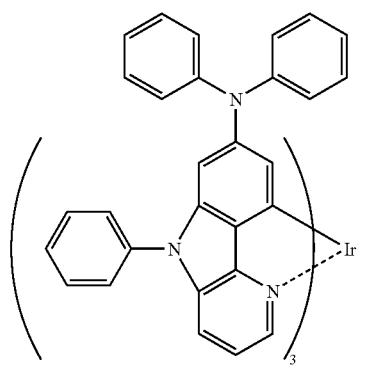
I-106
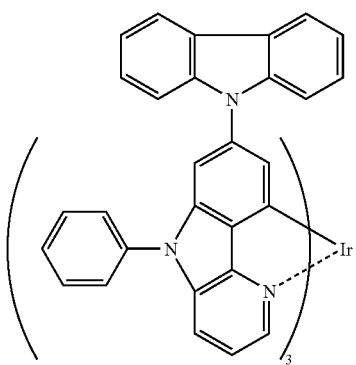
I-107
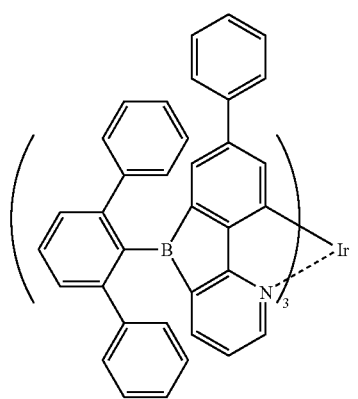
I-108
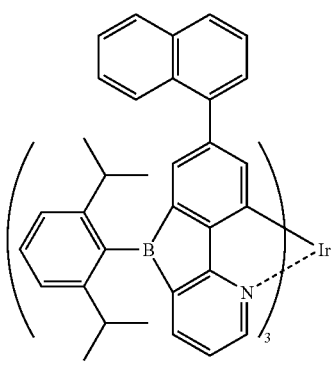

-continued
I-109
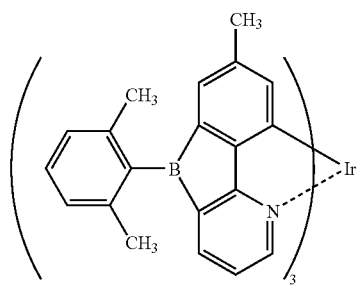
I-110
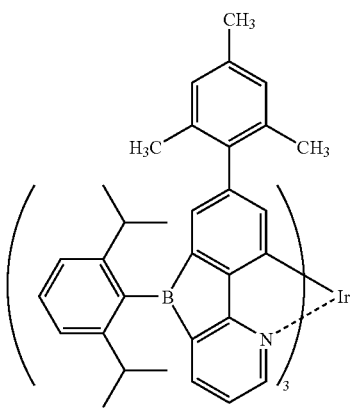
I-111
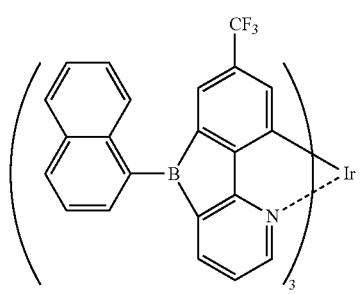
I-112
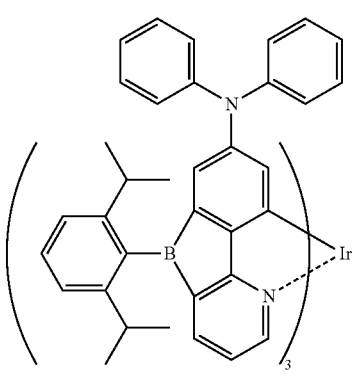
I-113
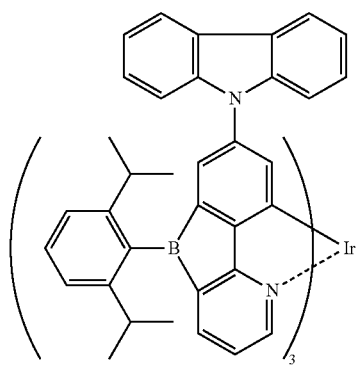
I-114
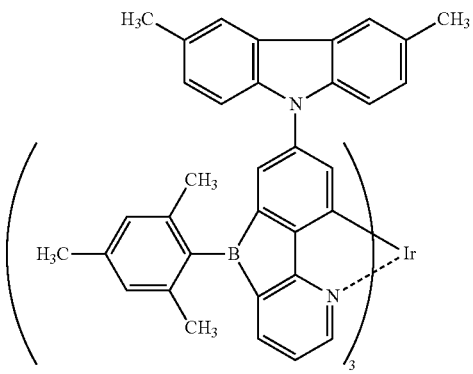
I-115
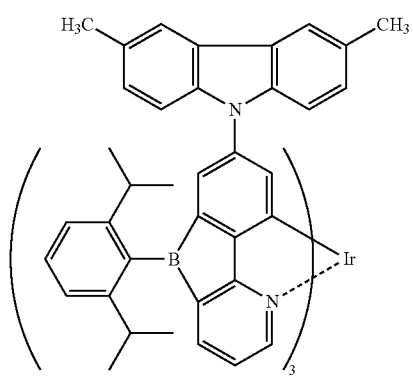
I-116
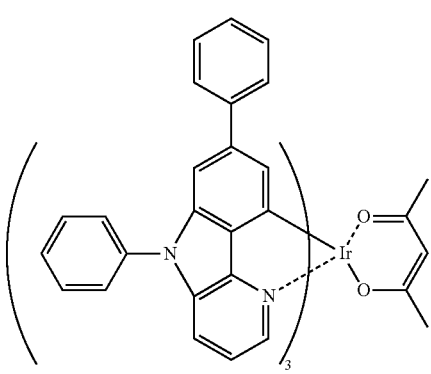

-continued
I-117
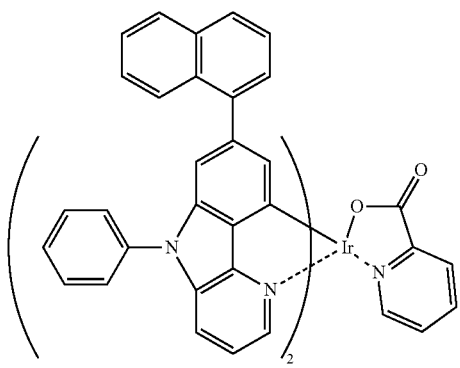
I-118
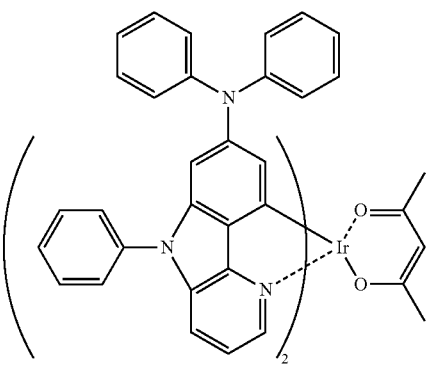
I-119
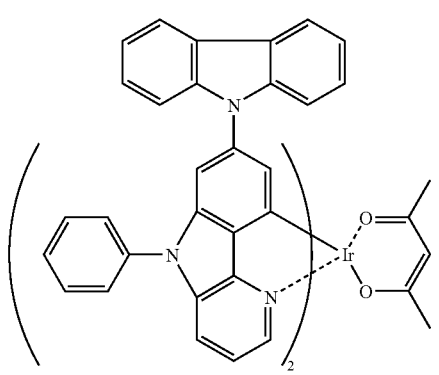
I-120
I-121
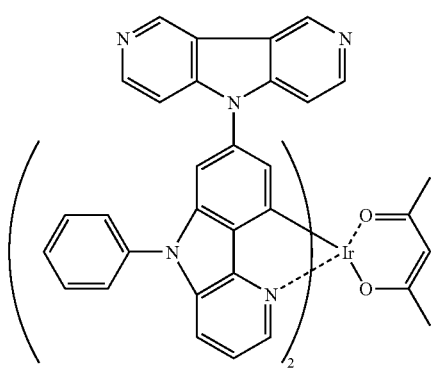
I-122
I-123
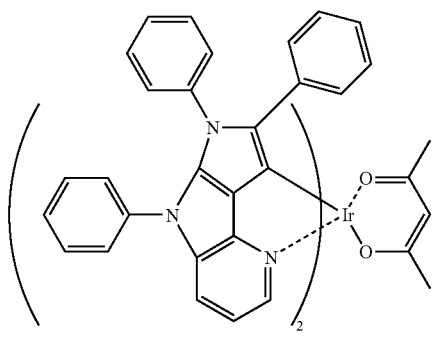
I-124
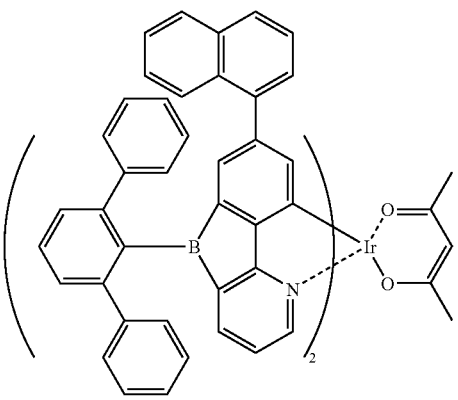

-continued
| | |
|---|---|
| I-125 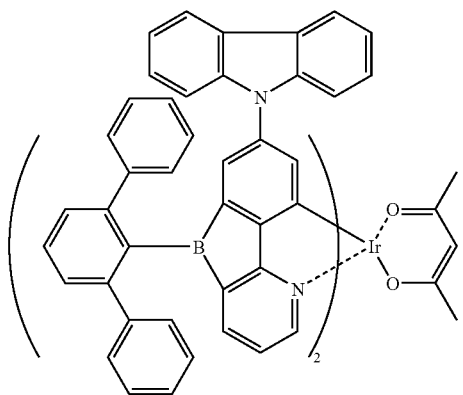 | I-126 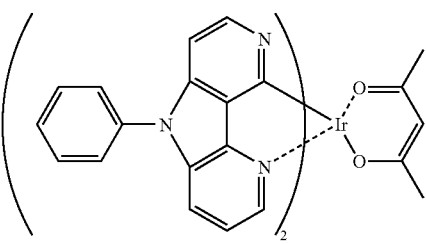 |
| I-127 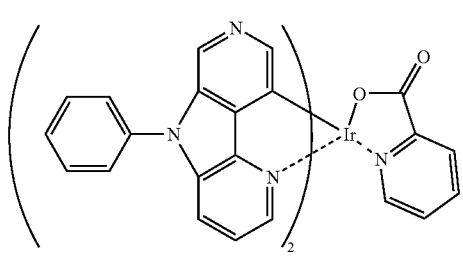 | I-128 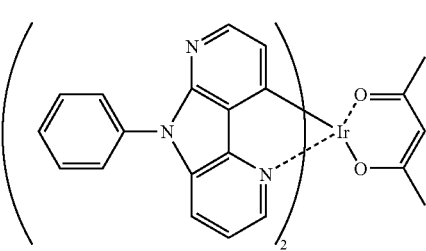 |
| I-129 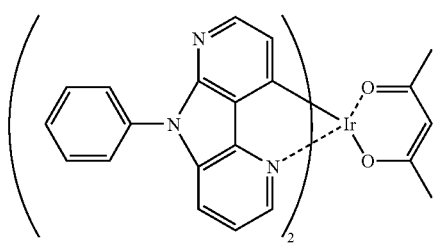 | I-130 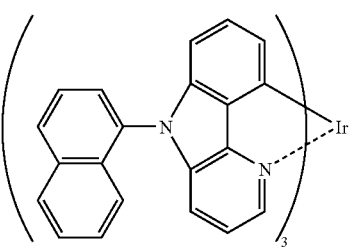 |
| I-131 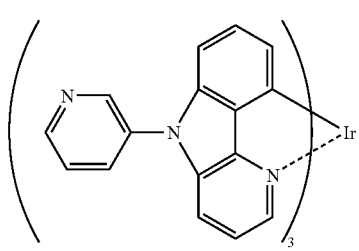 | I-132 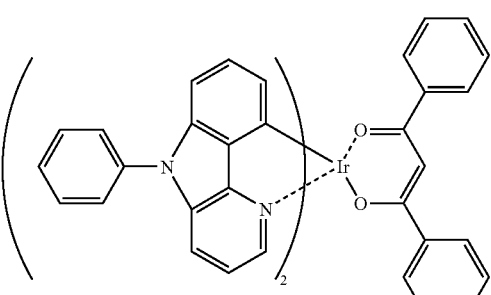 |
| I-133 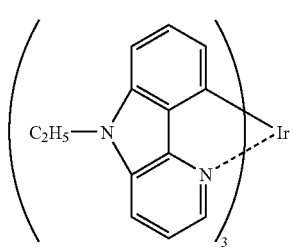 | I-134 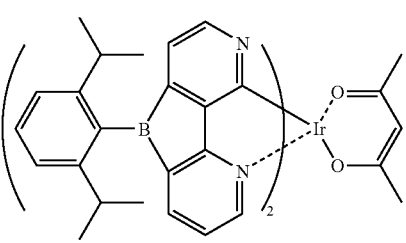 |

-continued
I-135
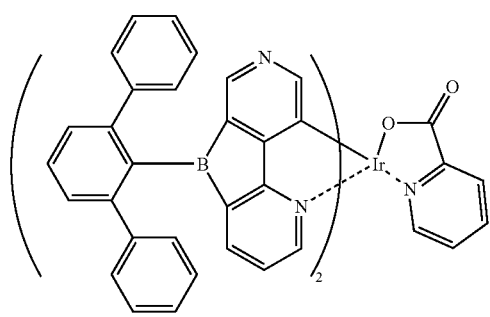
I-136
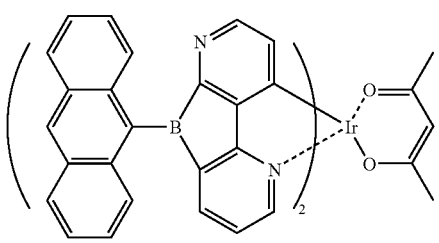
I-137
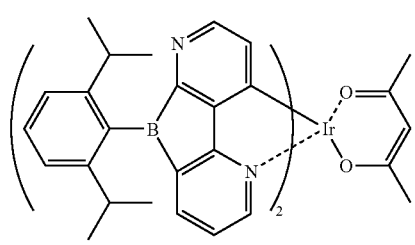
I-138
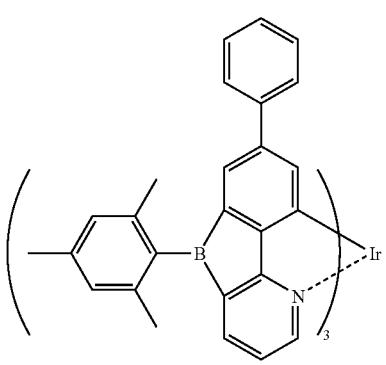
I-139
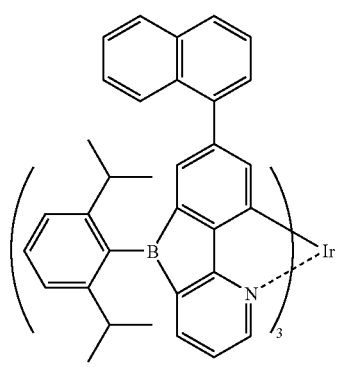
I-140
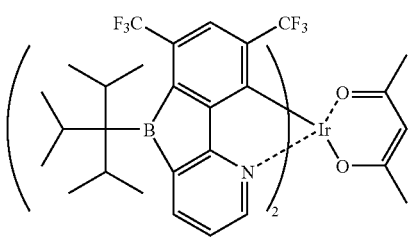
I-141
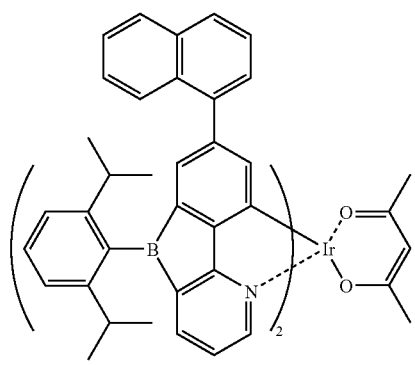
I-142
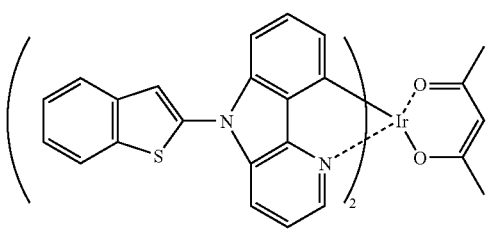

-continued
I-143
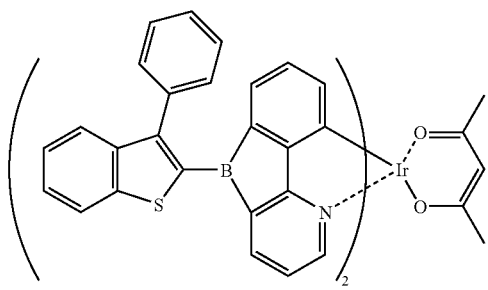
I-144
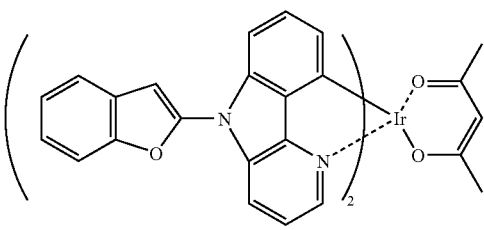
I-145
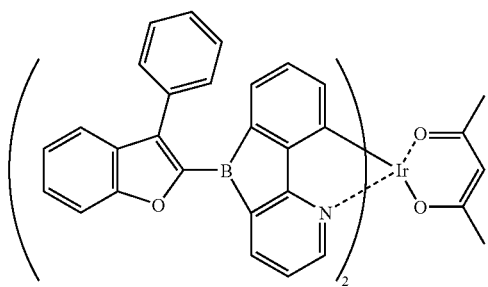
I-146
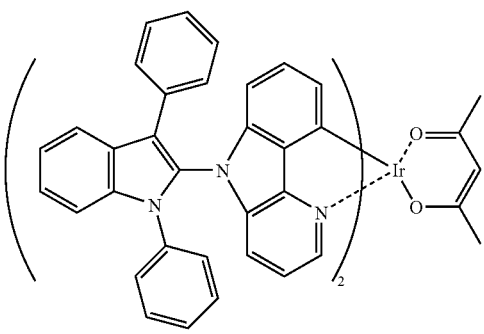
I-147
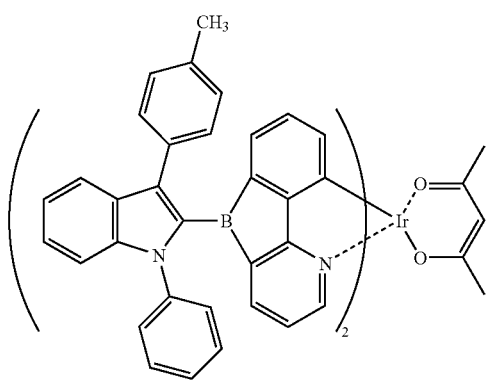
I-148
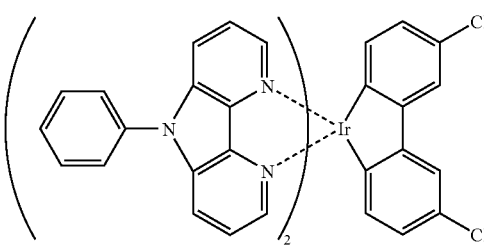
I-149
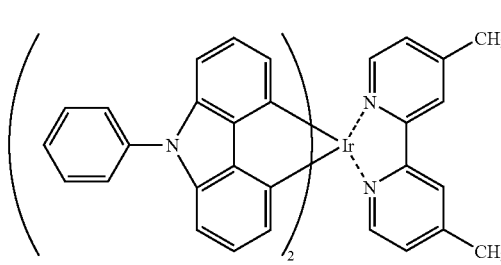
I-150
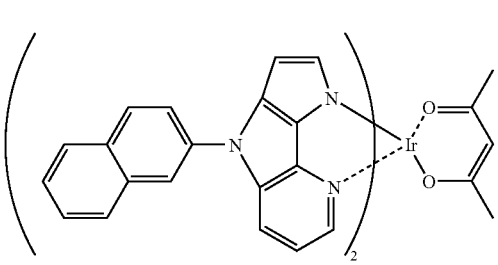
I-151
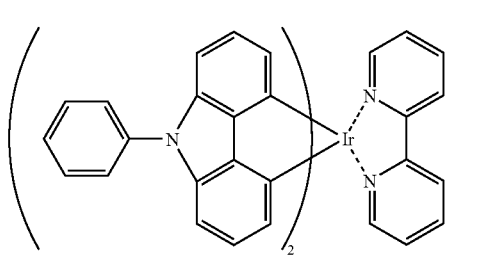
I-152
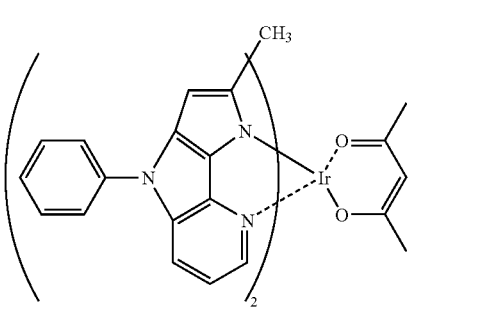

-continued
I-153
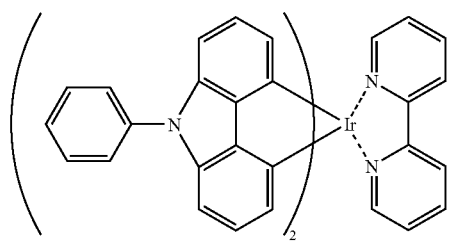
I-154
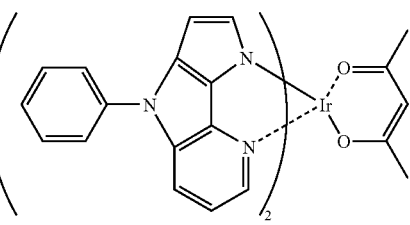
I-155
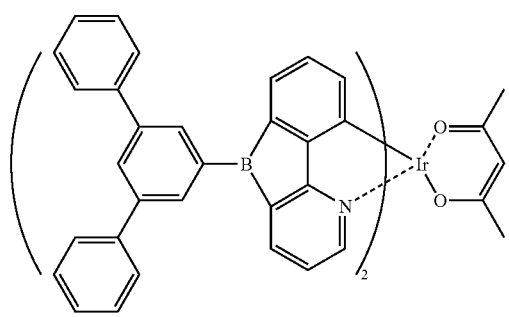
I-156
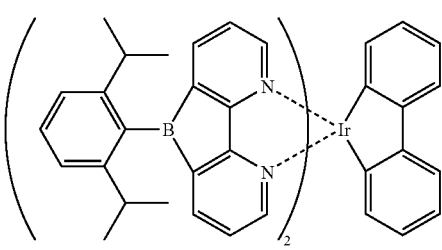
I-157
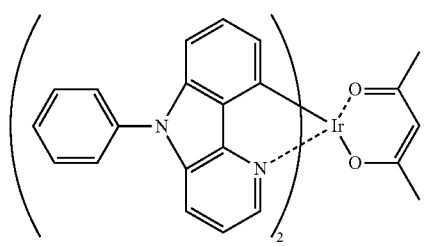
I-158
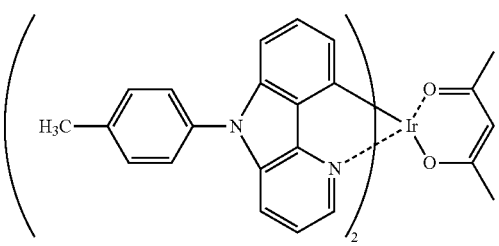
I-159
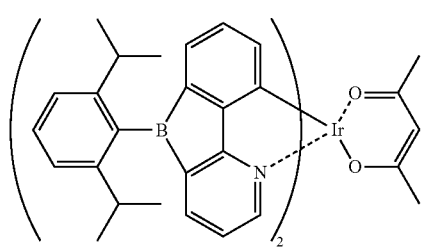
I-160
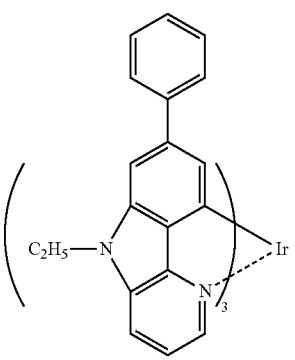
I-161
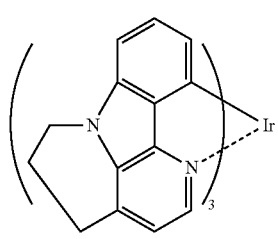
I-162
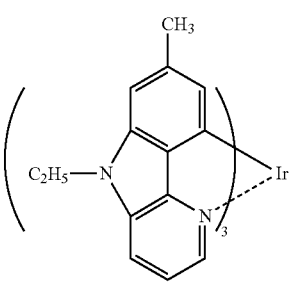

-continued
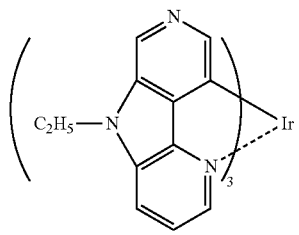
I-163
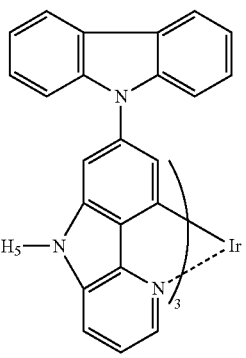
I-164
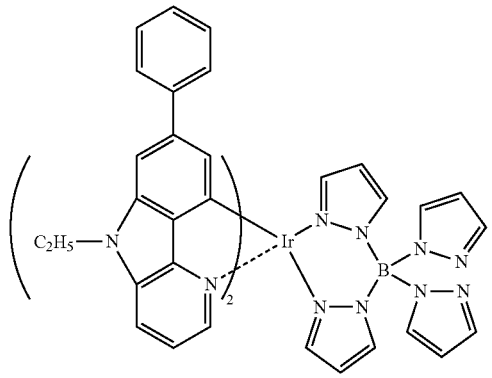
I-165
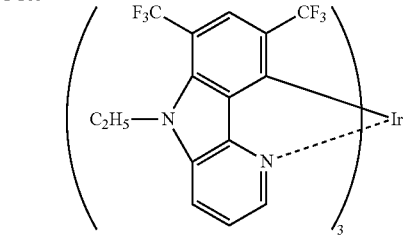
I-166
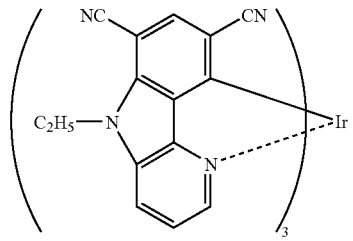
I-167
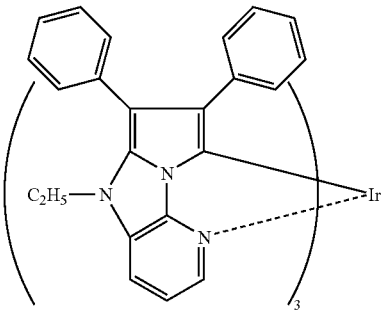
I-168
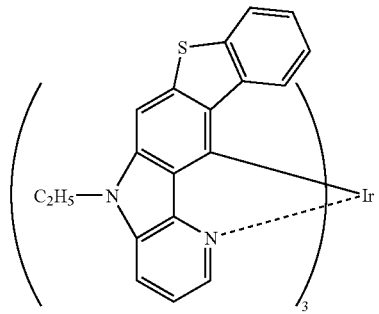
I-169
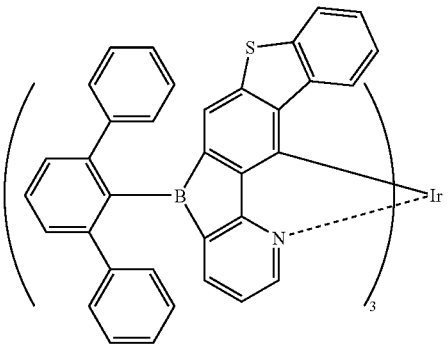
I-170
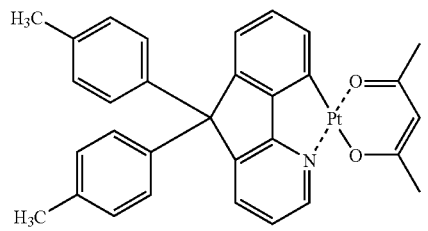
P-301
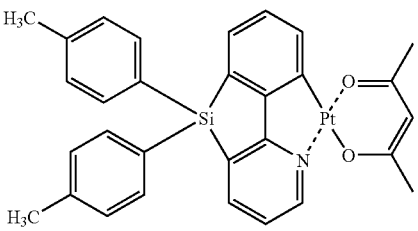
P-302

-continued
P-303
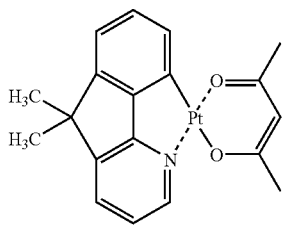
P-304
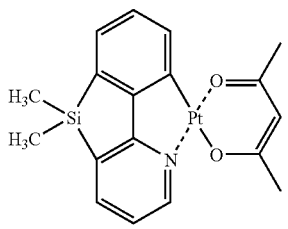
P-305
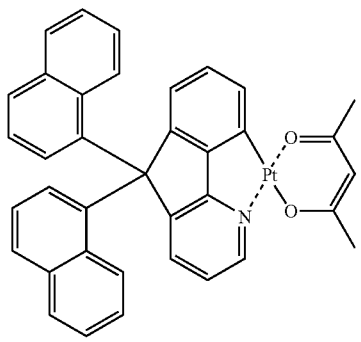
P-306
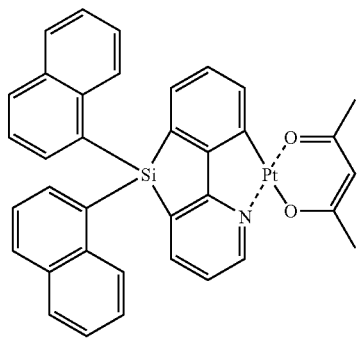
P-307
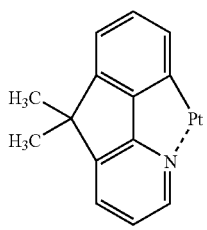
P-308
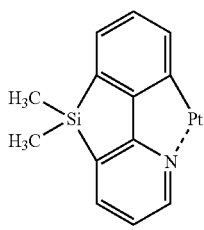
P-309
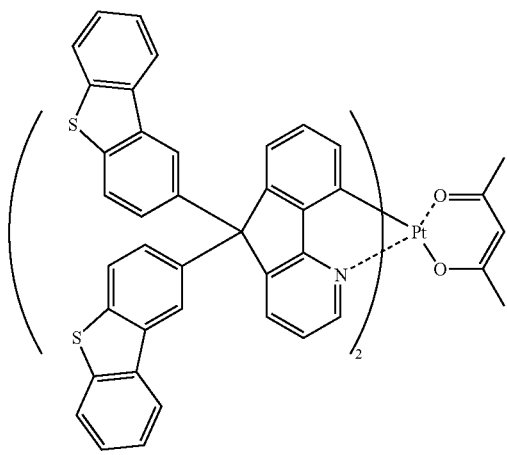
PP-1
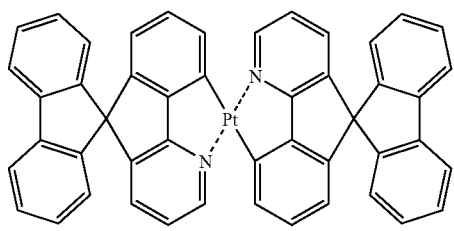
PP-2
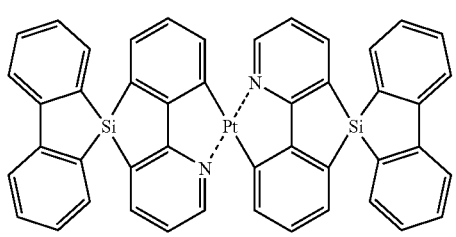
PP-3
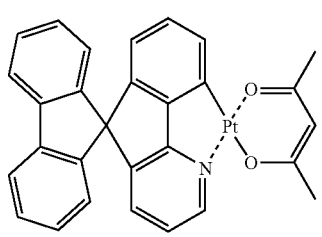

-continued
PP-4
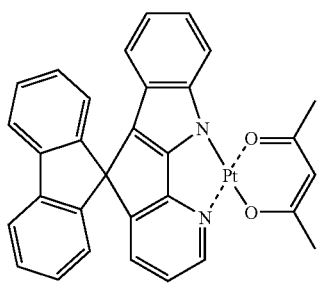
PP-5
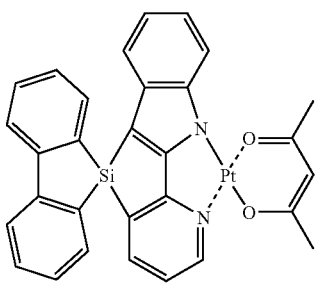
PP-6
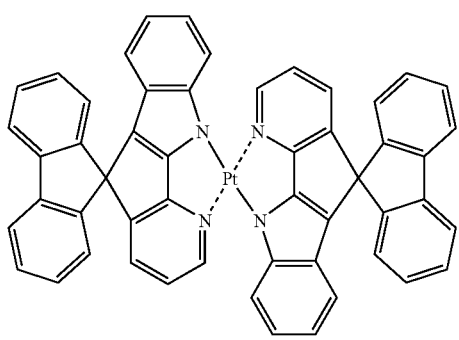
PP-7
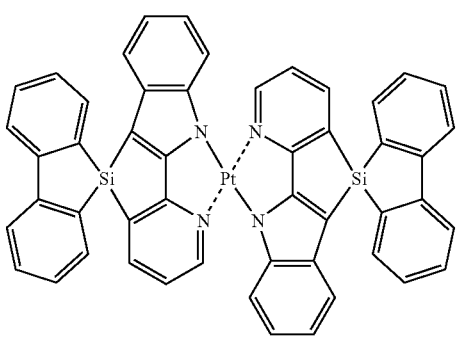
PP-8
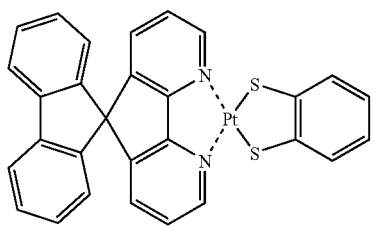
PP-9
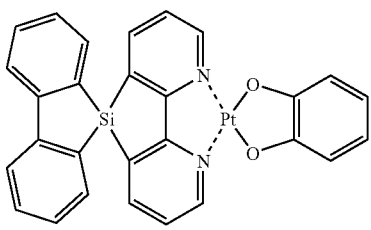
PP-10
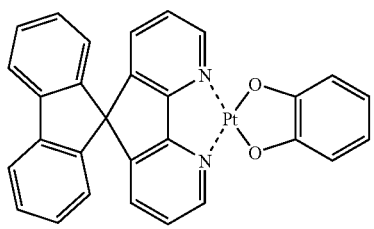
PP-11
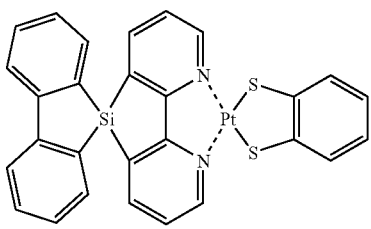
PP-12
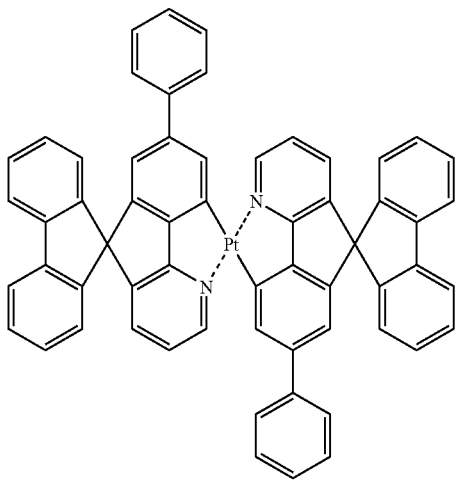
PP-13
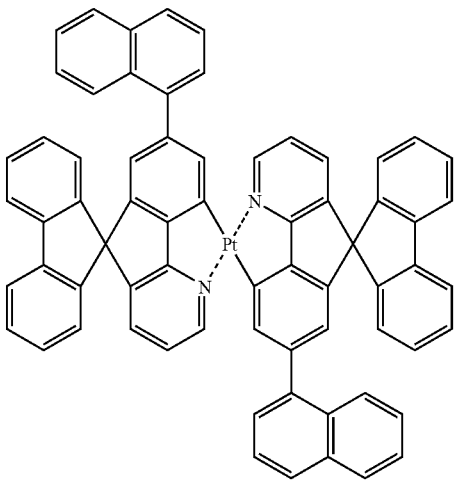

-continued
PP-14
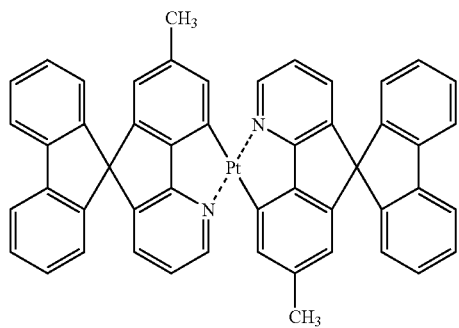
PP-15
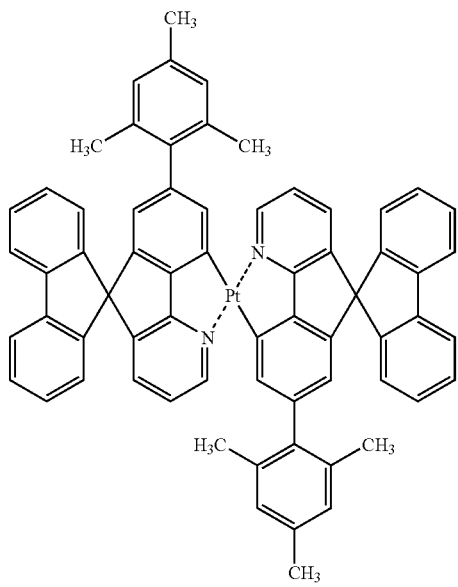
PP-16
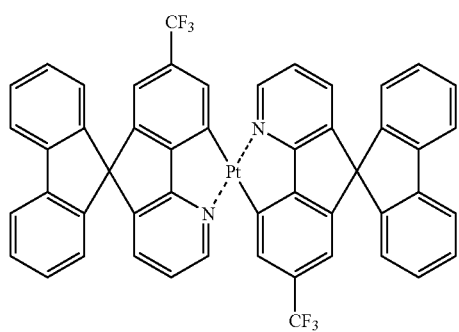
PP-17
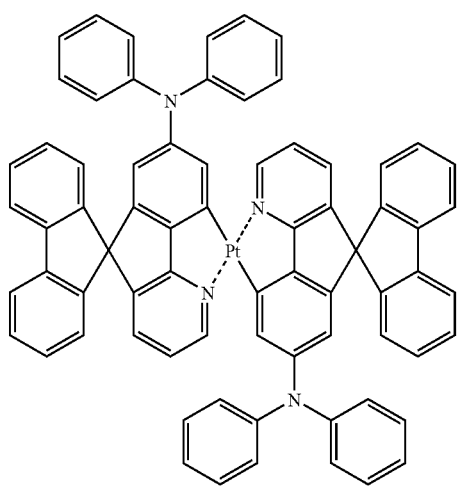
PP-18
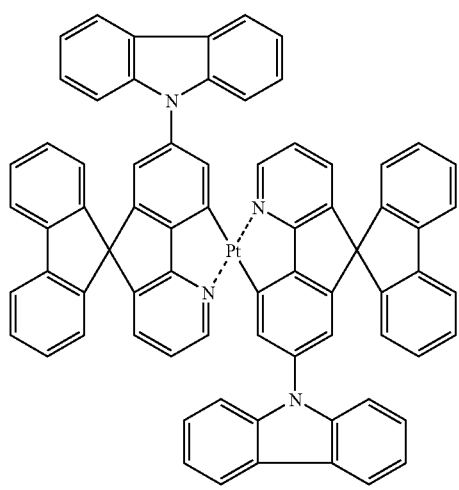
PP-19
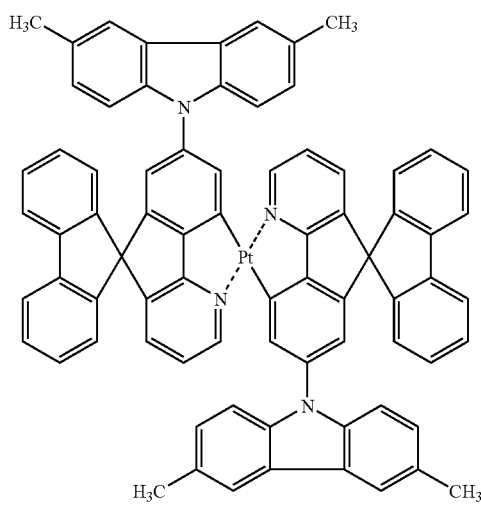

-continued
PP-20
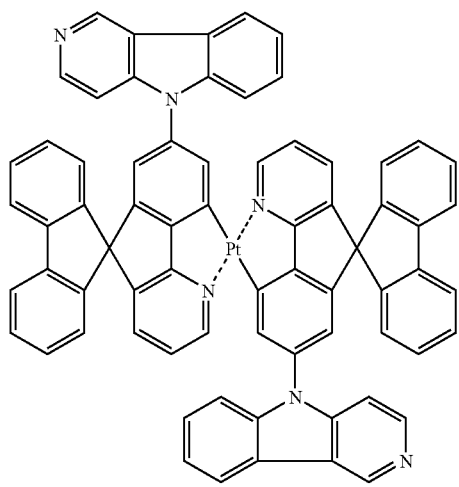
PP-21
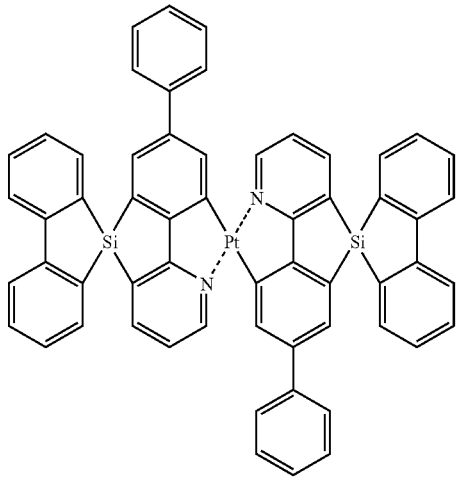
PP-22
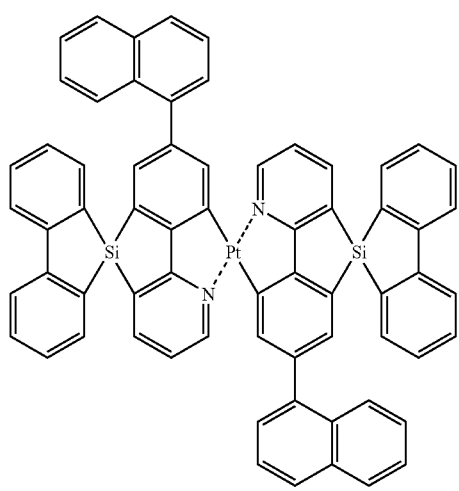
PP-23
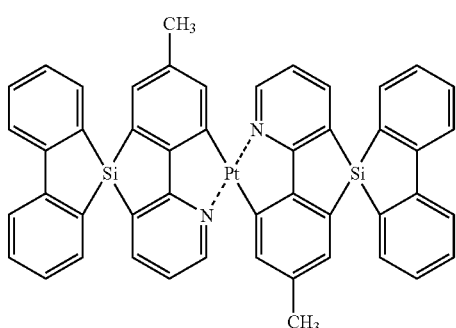
PP-24
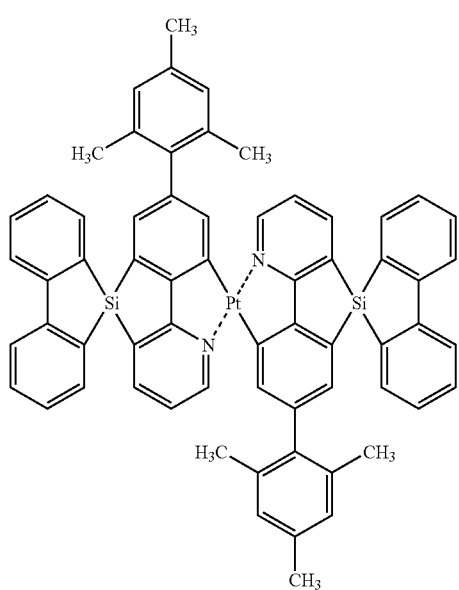
PP-25
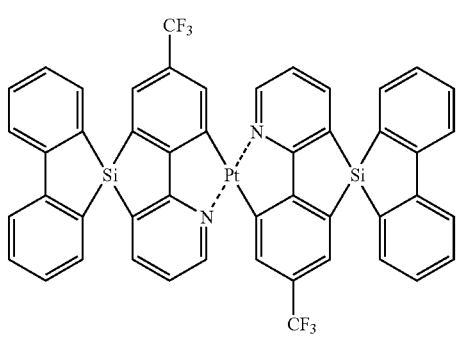

-continued
PP-26
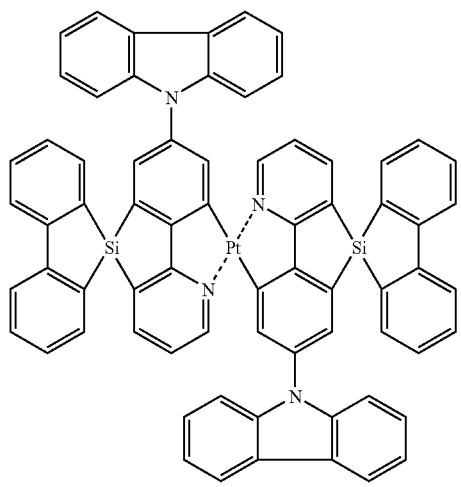
PP-27
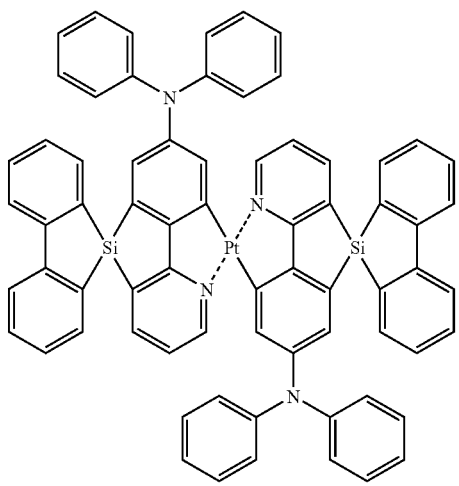
PP-28
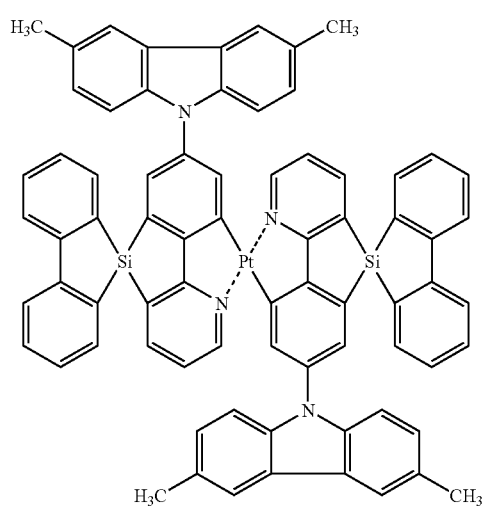
PP-29
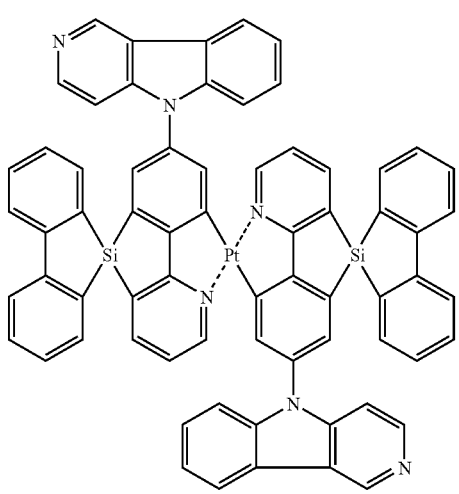
PP-30
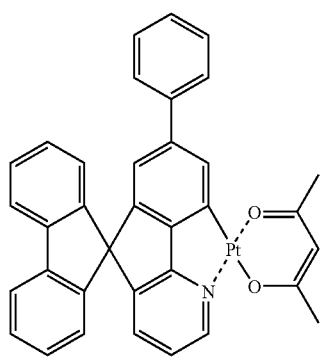
PP-31
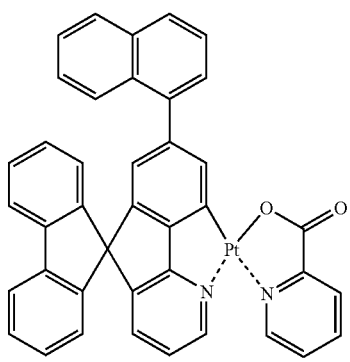

-continued
| PP-32 | PP-33 |
|---|---|
| 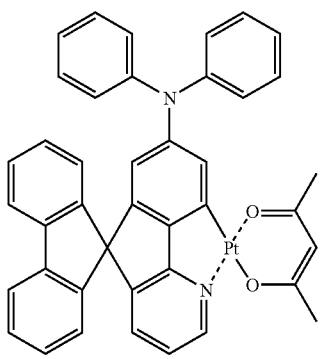 | 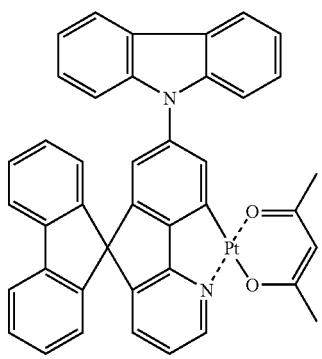 |
| PP-34 | PP-35 |
| 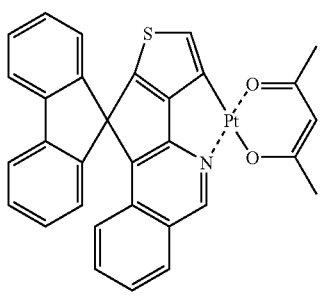 | 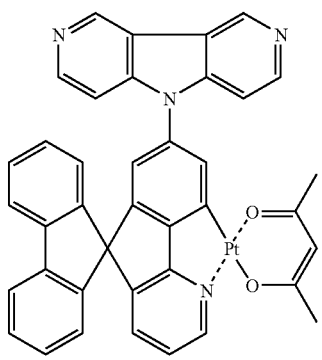 |
| PP-36 | PP-37 |
| 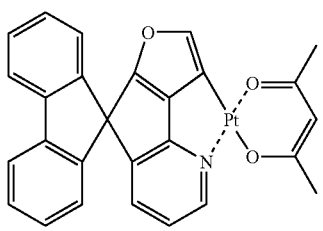 | 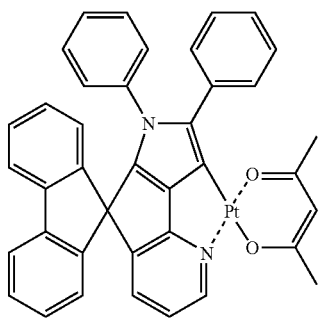 |
| PP-38 | PP-39 |
| 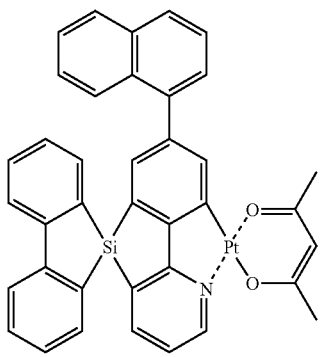 | 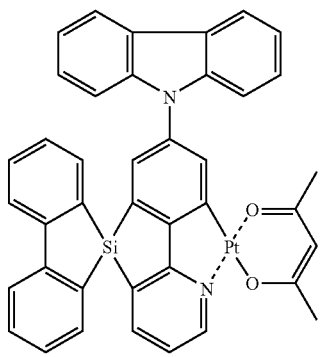 |
| PP-40 | PP-41 |
| 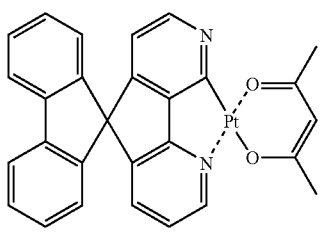 | 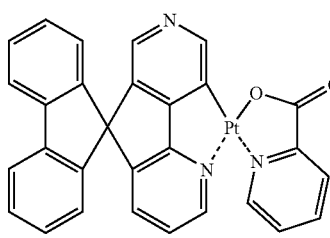 |

-continued
PP-42
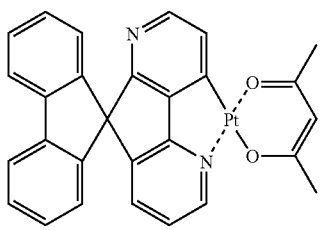
PP-43
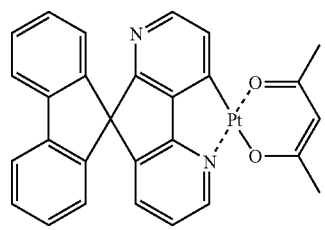
PP-44
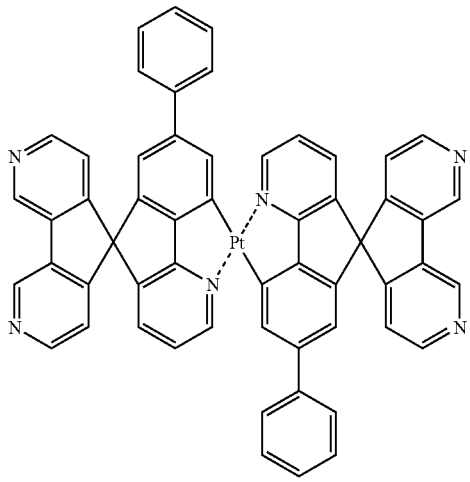
PP-45
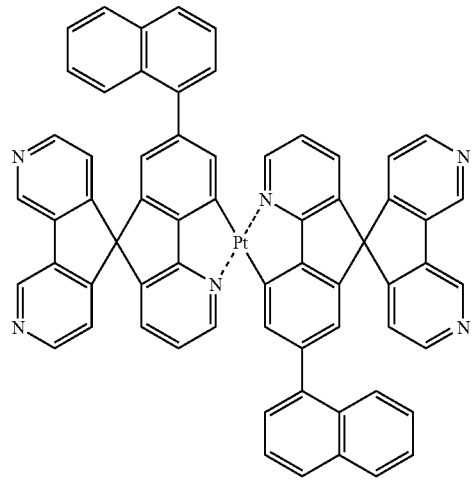
PP-46
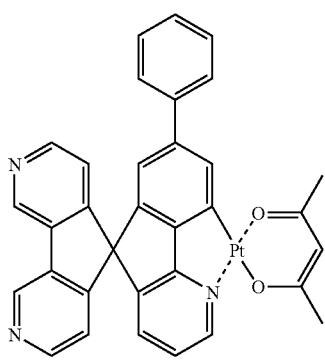
PP-47
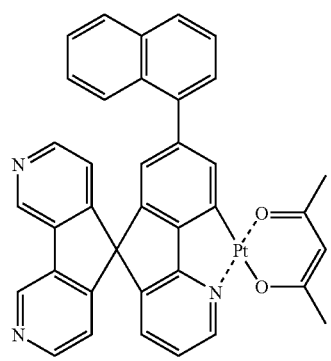
PP-48
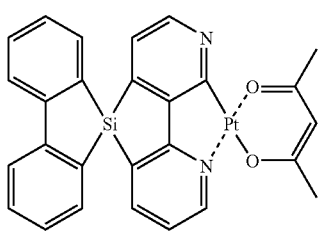
PP-49
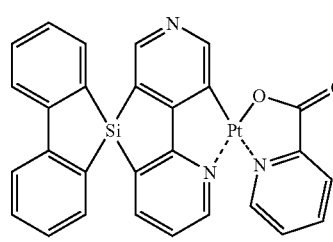
PP-50
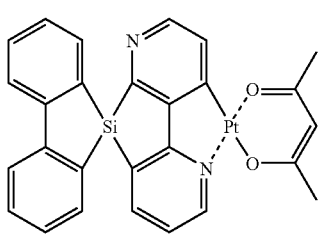
PP-51
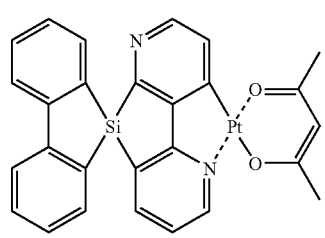

-continued
PP-52
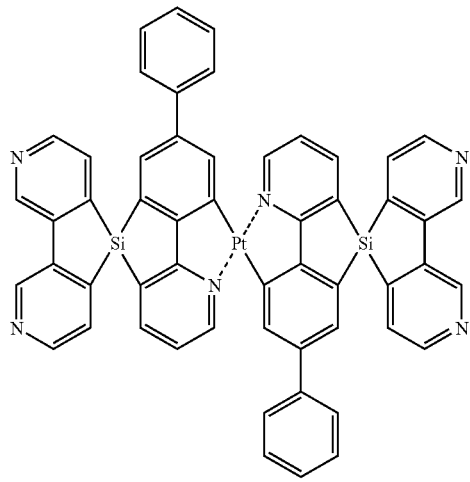
PP-53
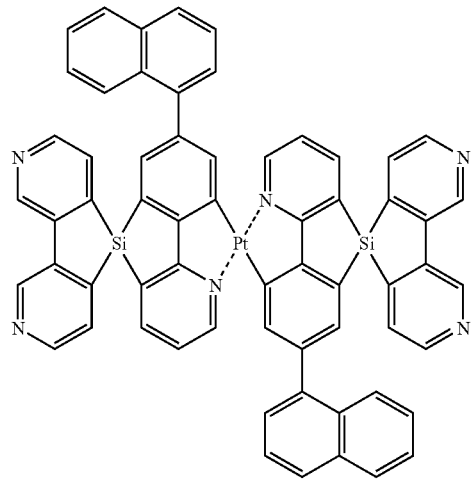
PP-54
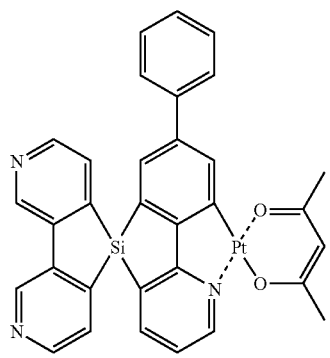
PP-55
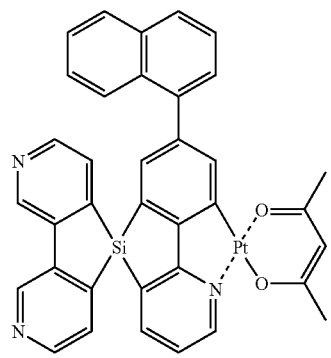
PP-56
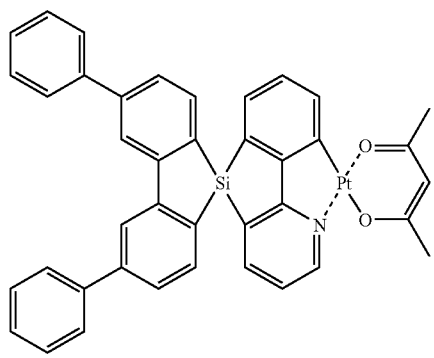
PP-57
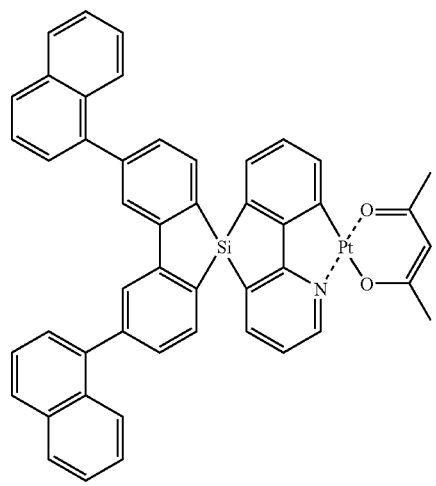

-continued
PP-58
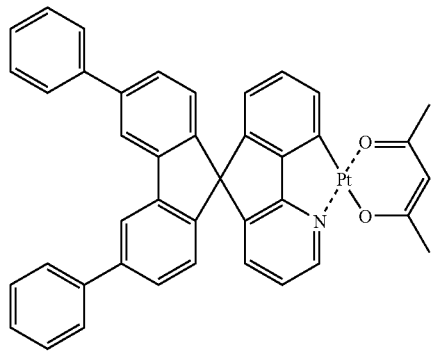
PP-59
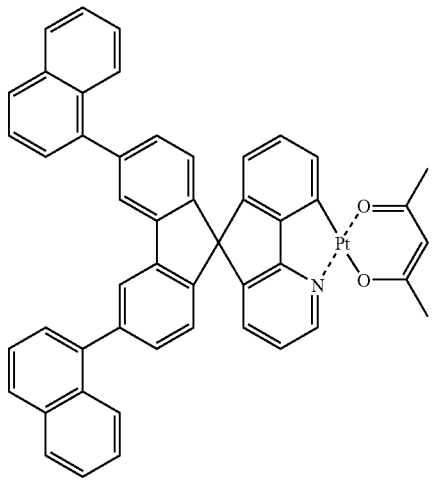
PP-60
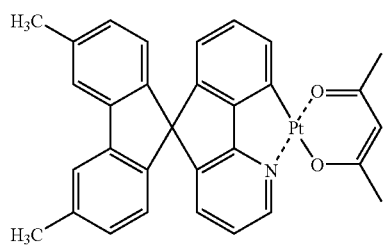
PP-61
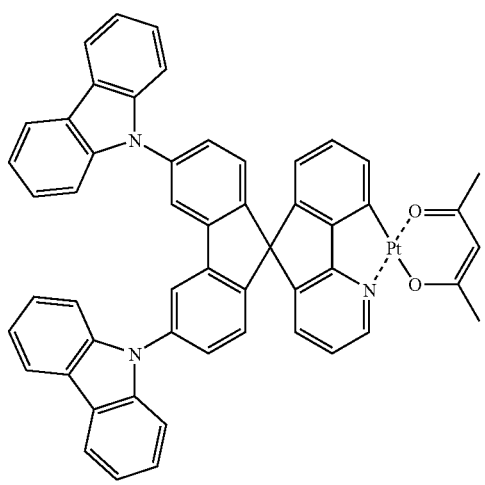
PP-62
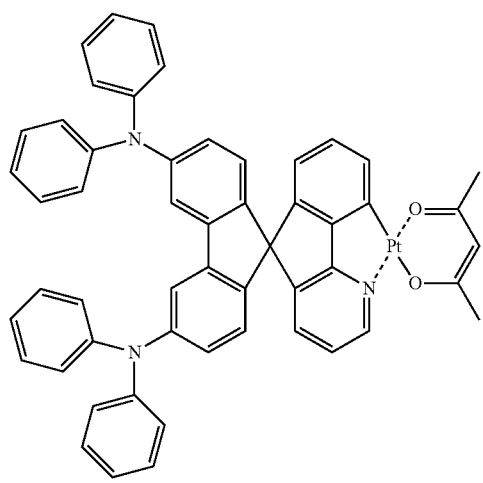
PP-63
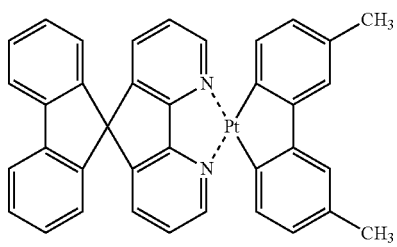

-continued
PP-64
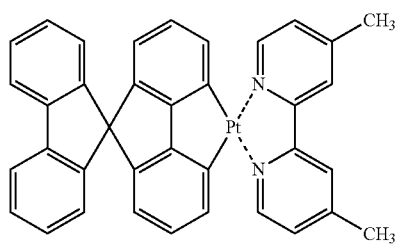
PP-65
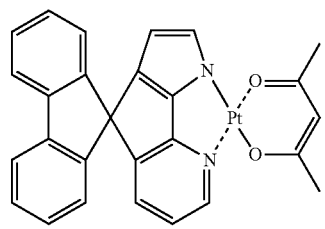
PP-66
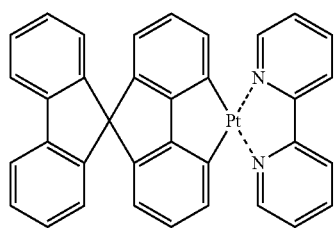
PP-67
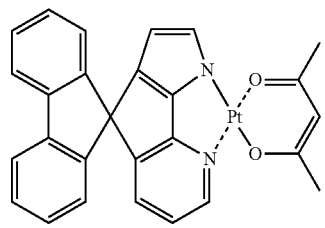
PP-68
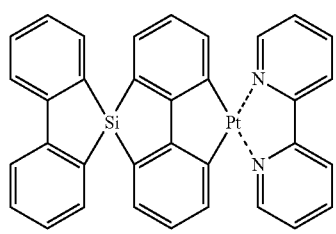
PP-69
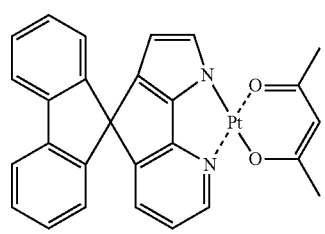
PP-70
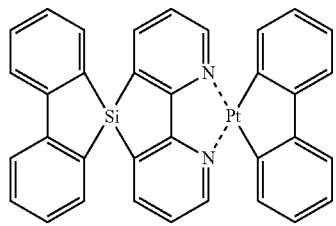
PP-71
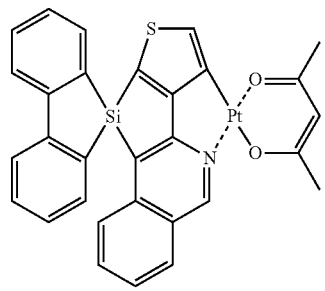
I-201
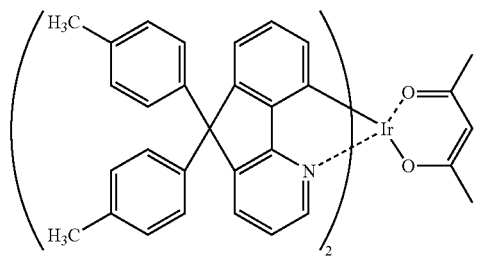
I-202
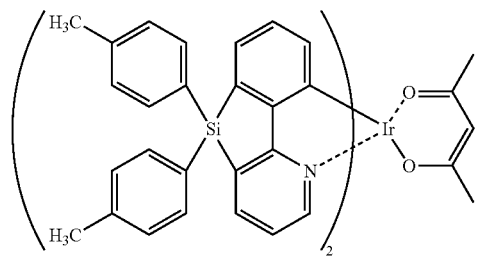
I-203
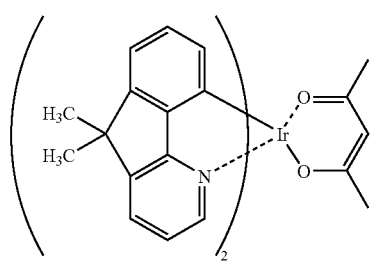
I-204
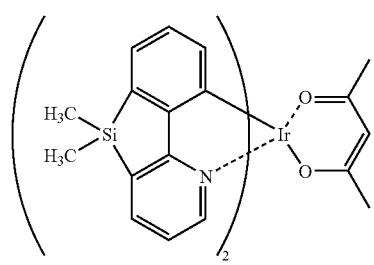

-continued
I-205
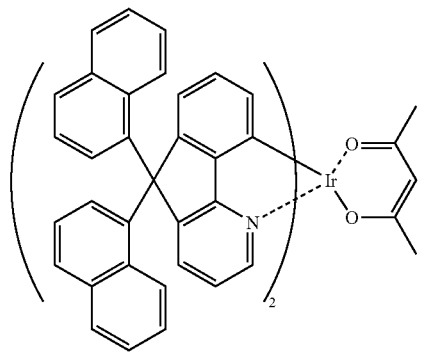
I-206
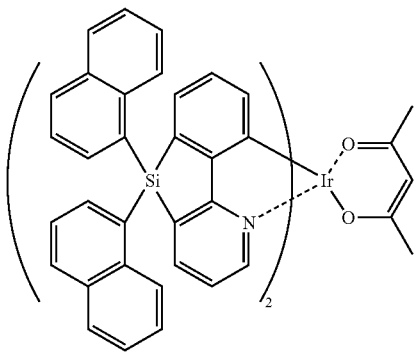
I-207
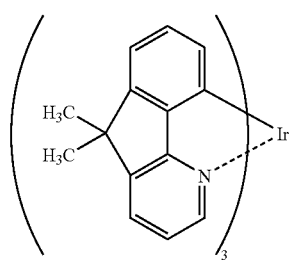
I-208
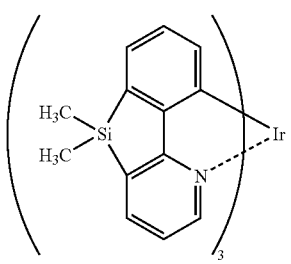
I-209
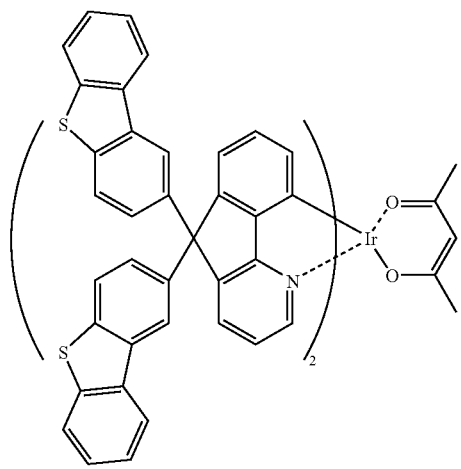
I-210
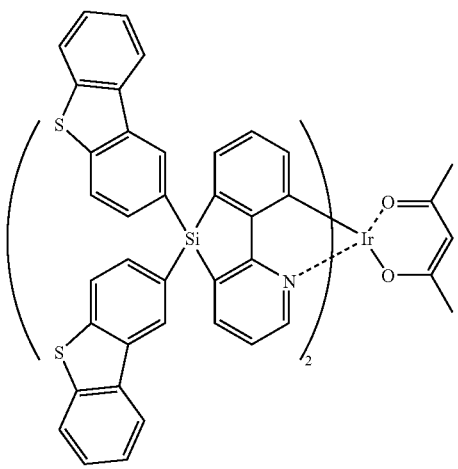
II-1
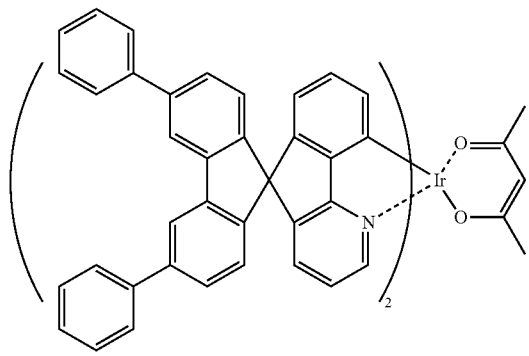
II-2
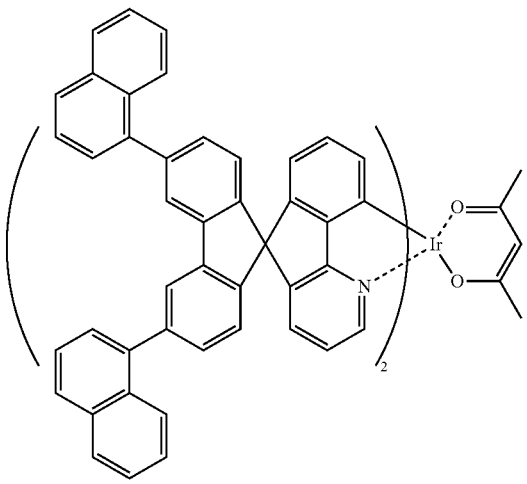

-continued
II-3
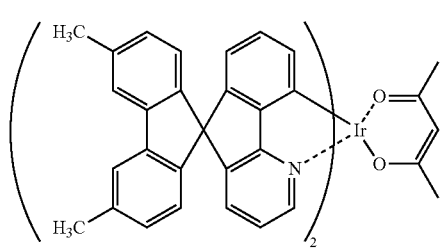
II-4
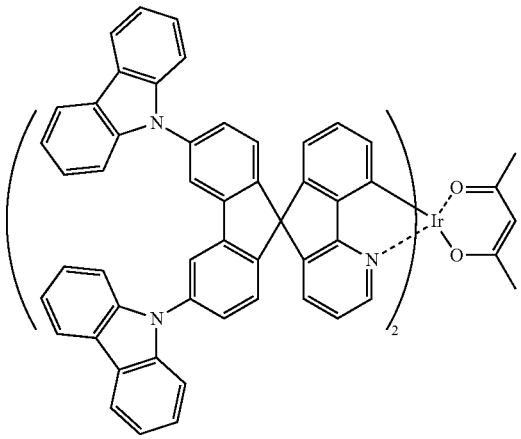
II-5
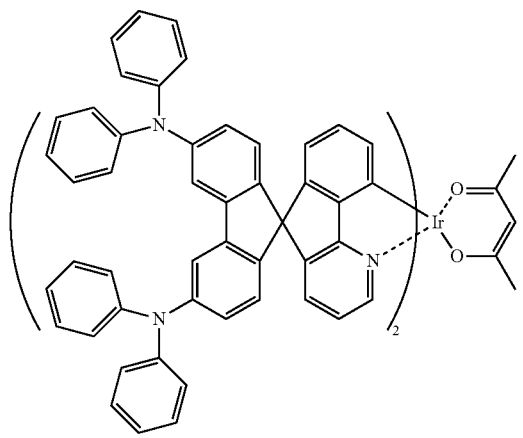
II-6
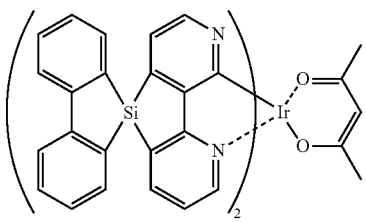
II-7
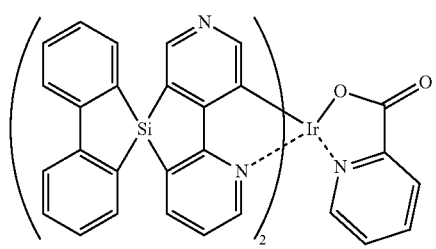
II-8
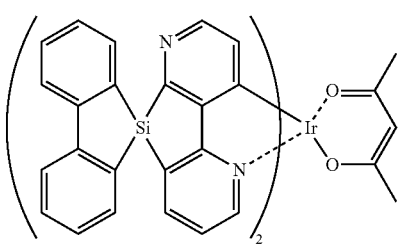
II-9
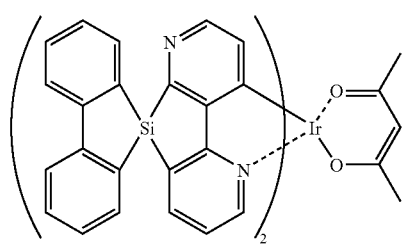
II-10
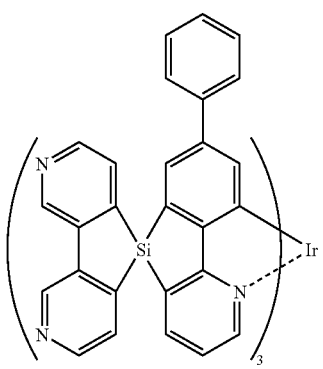

-continued
| II-11 | II-12 |
|---|---|
| 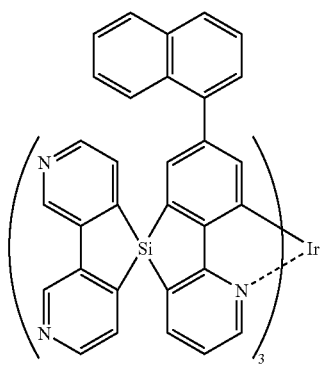 | 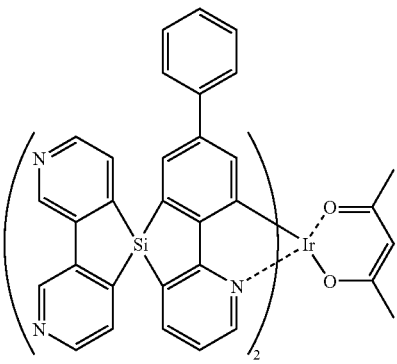 |
| II-13 | II-14 |
| 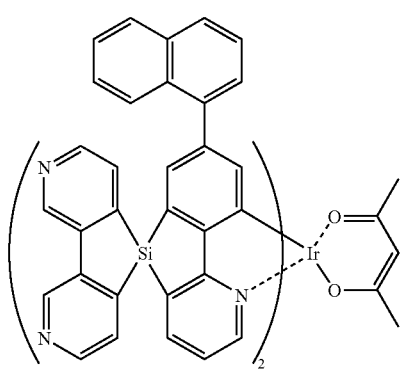 | 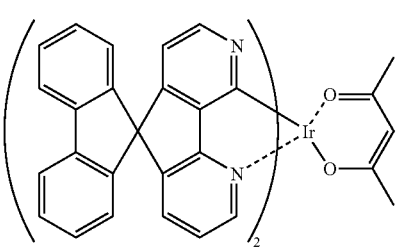 |
| II-15 | II-16 |
| 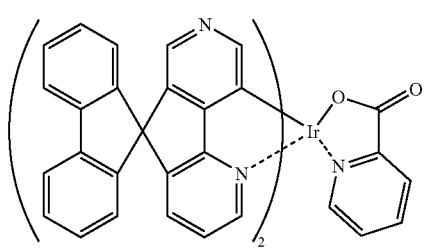 | 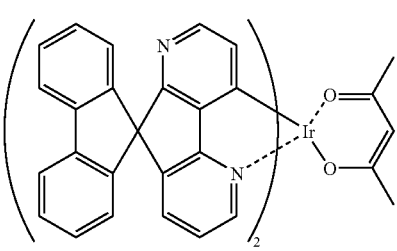 |
| II-17 | II-18 |
| 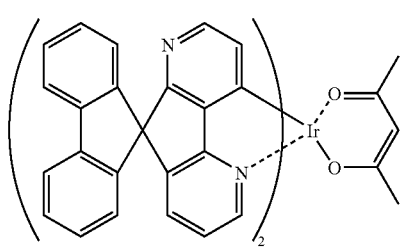 | 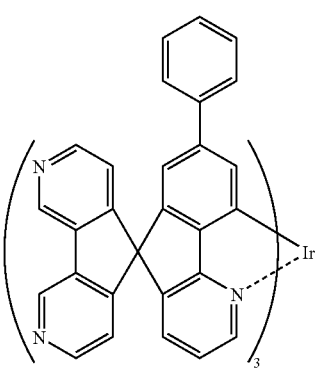 |

-continued
II-19
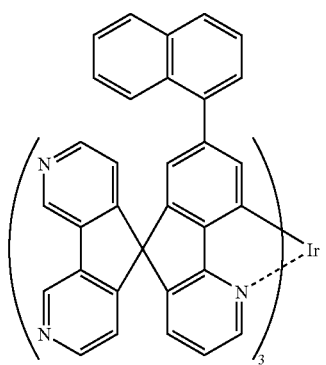
II-20
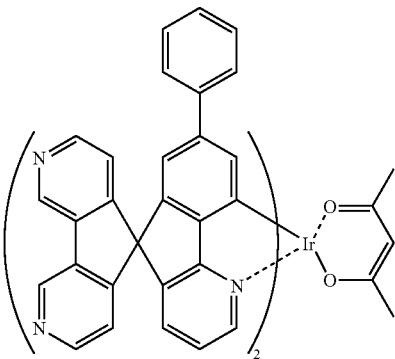
II-21
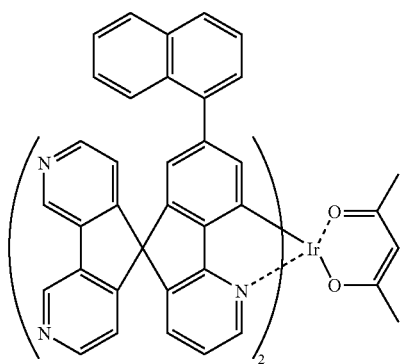
II-22
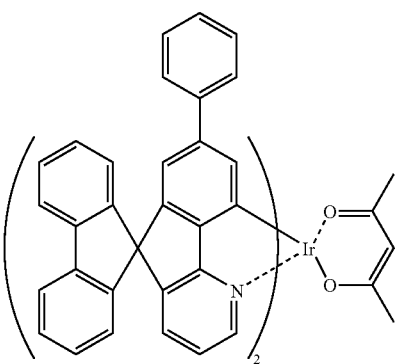
II-23
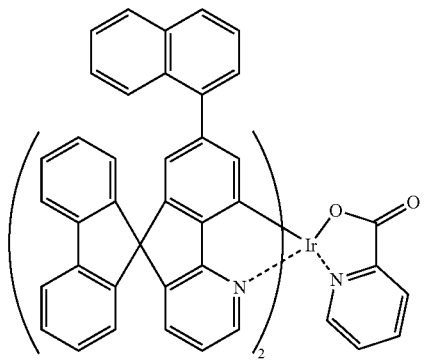
II-24
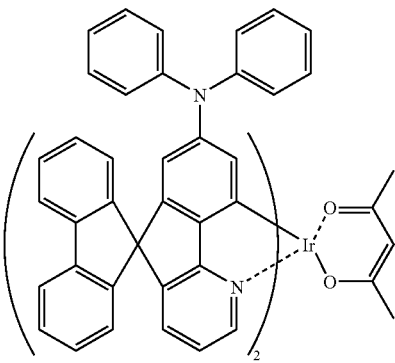
II-25
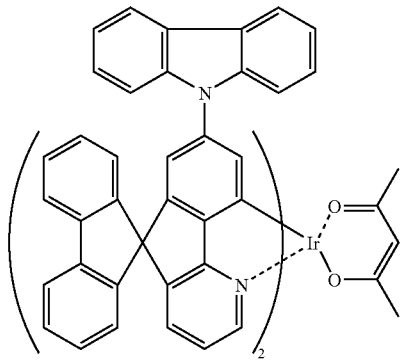
II-26
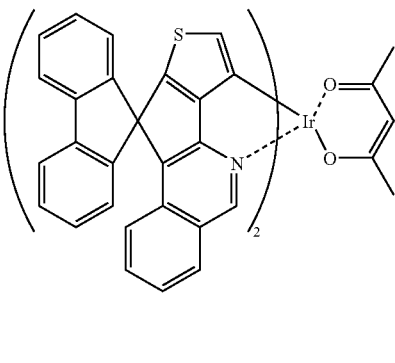

-continued
| | |
|---|---|
| II-27 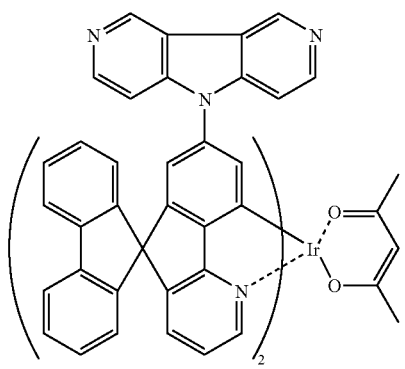 | II-28 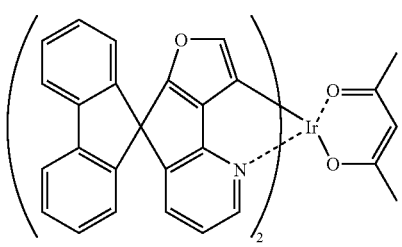 |
| II-29 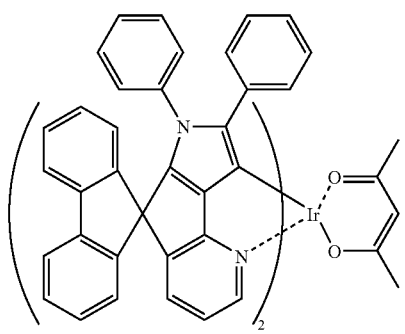 | II-30 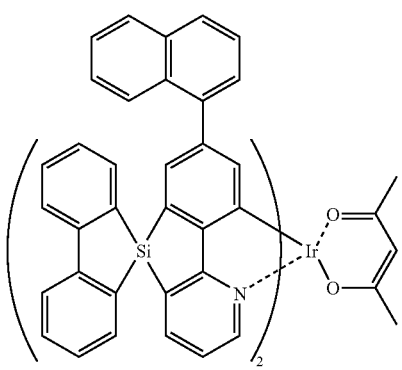 |
| II-31 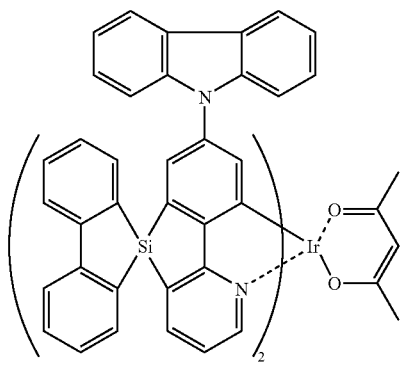 | II-32 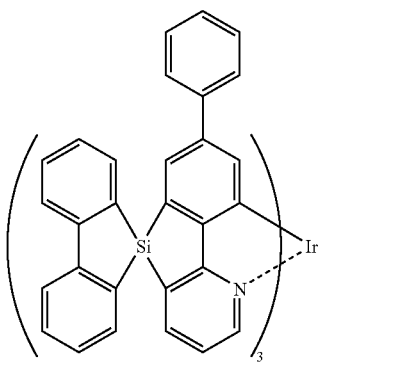 |
| II-33 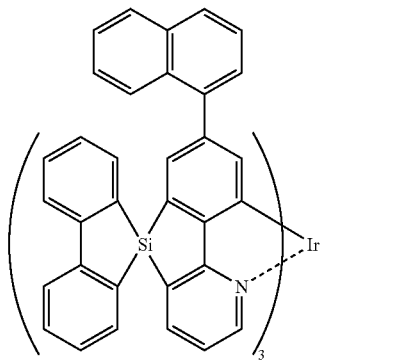 | II-34 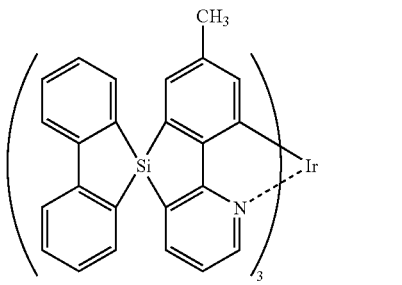 |

-continued
II-35
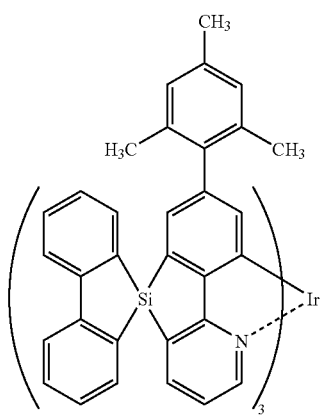
II-36
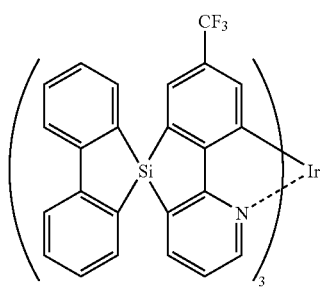
II-37
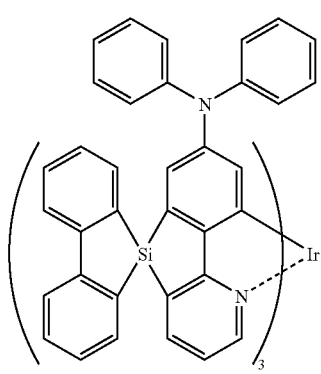
II-38
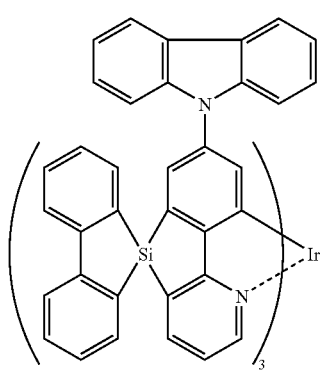
II-39
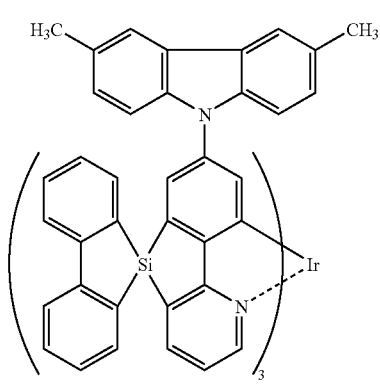
II-40
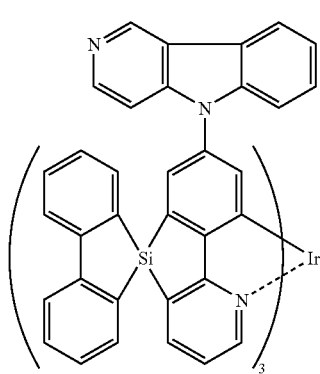
II-41
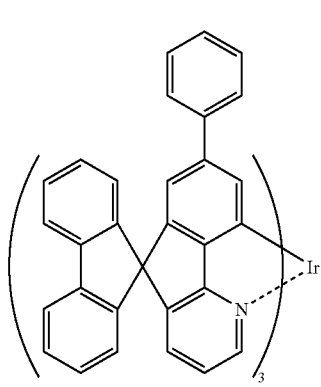
II-42
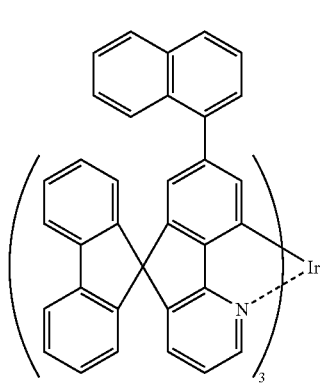

-continued
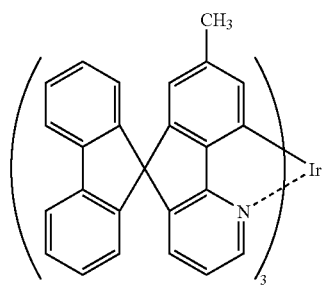
II-43
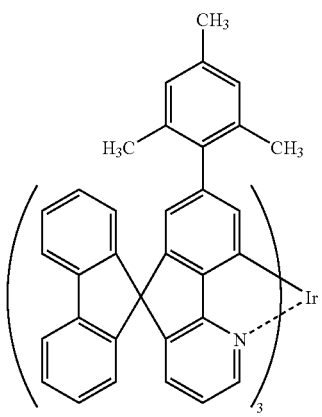
II-44
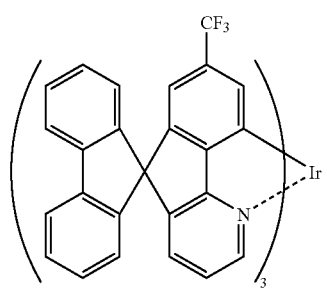
II-45
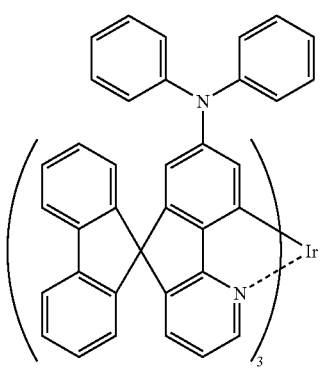
II-46
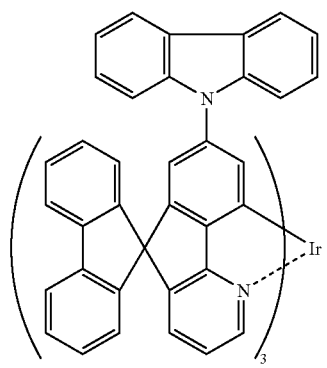
II-47
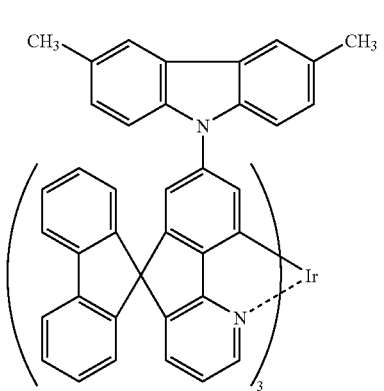
II-48
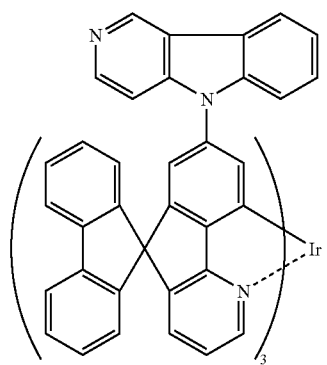
II-49
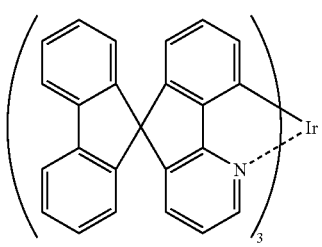
II-50

-continued
II-51
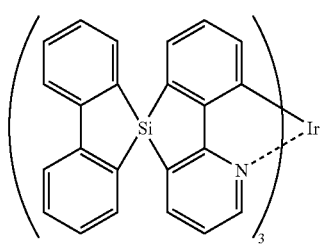
II-52
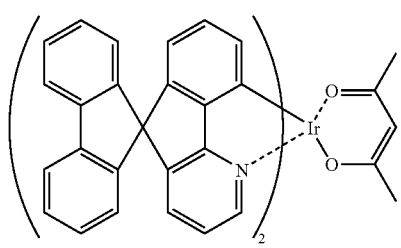
II-53
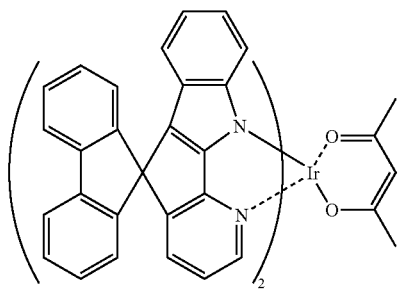
II-54
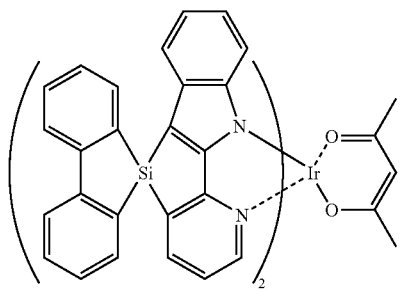
II-55
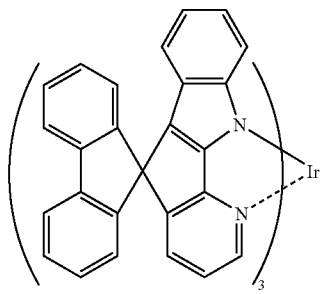
II-56
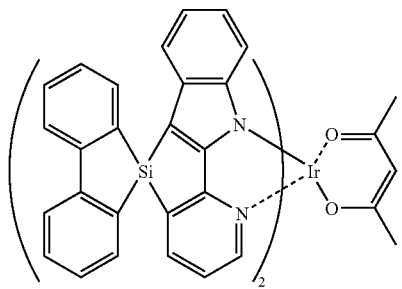
II-57
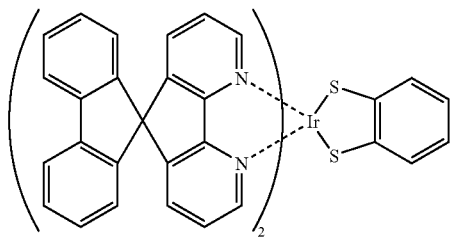
II-58
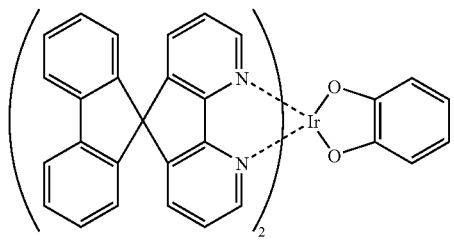
II-59
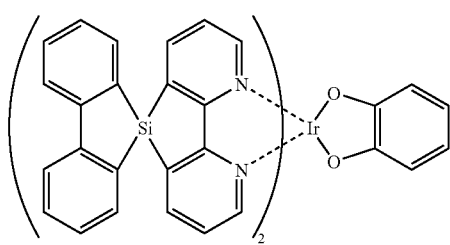
II-60
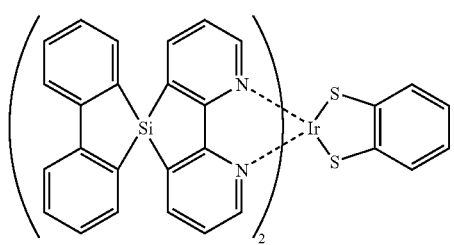
II-61
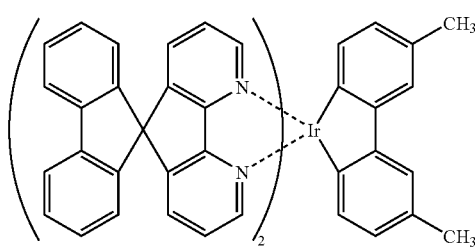
II-62
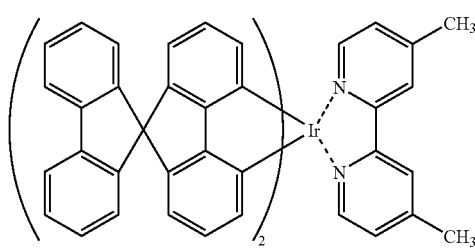

-continued
II-63
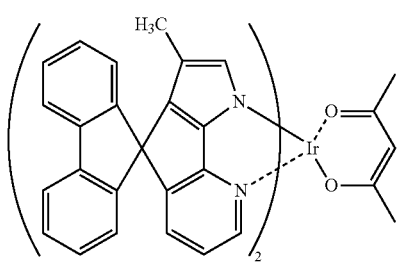
II-64
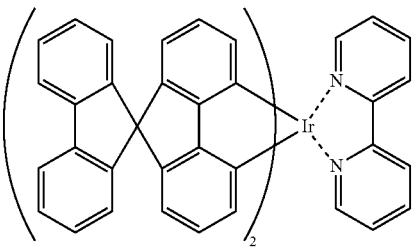
II-65
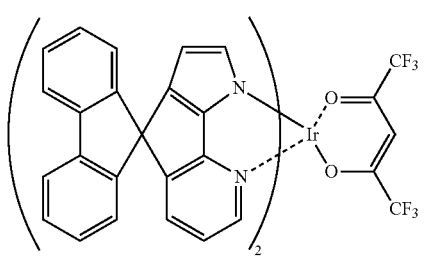
II-66
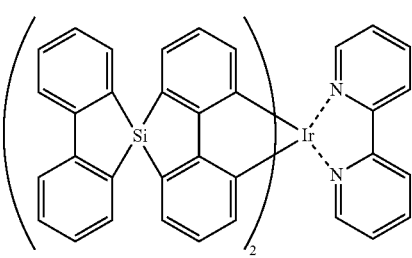
II-67
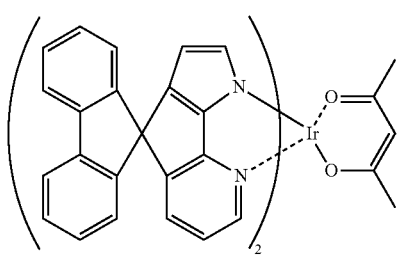
II-68
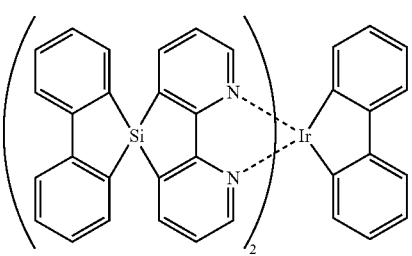
II-69
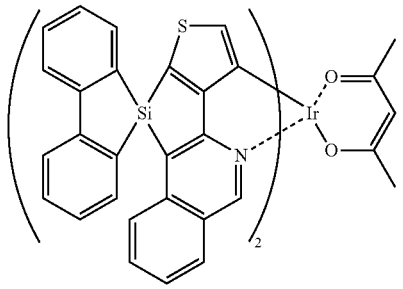
R-1
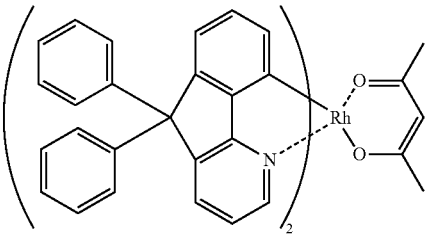
R-2
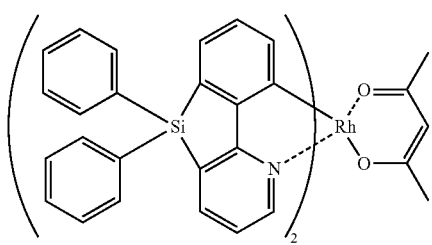
R-3
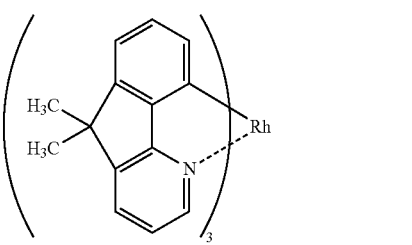
R-4
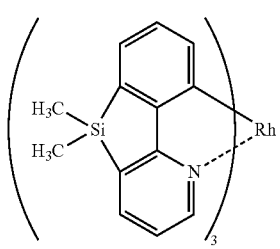
R-5
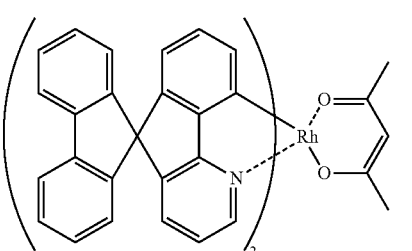

-continued
R-6
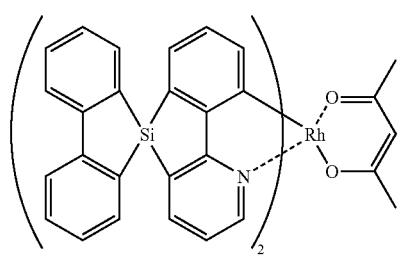
R-7
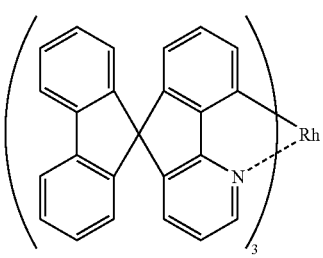
R-8
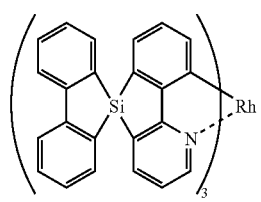
P-401
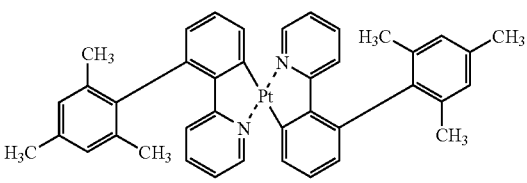
P-402
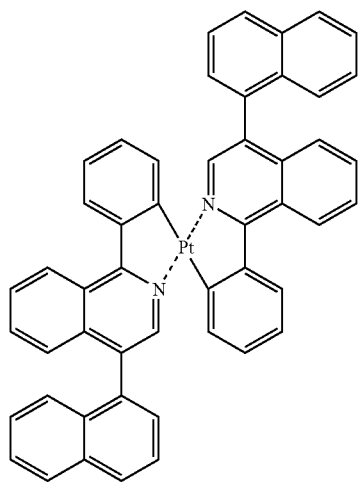
P-403
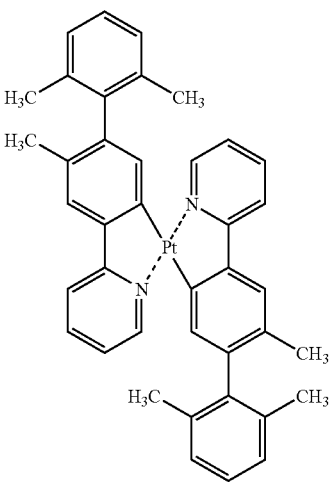
P-404
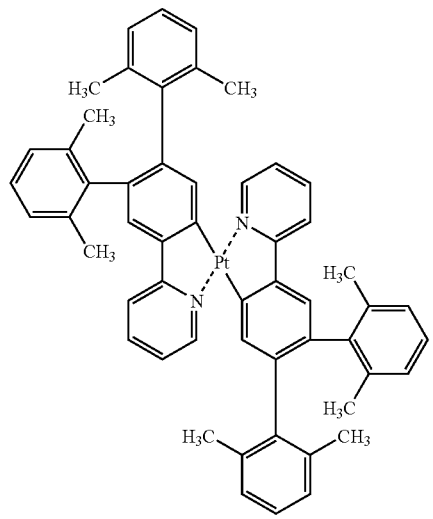
P-405
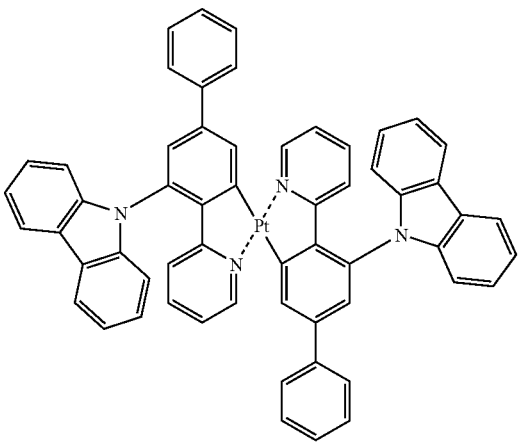

-continued
P-406
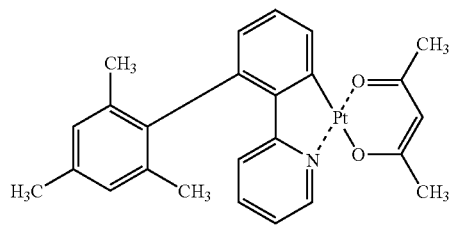
P-407
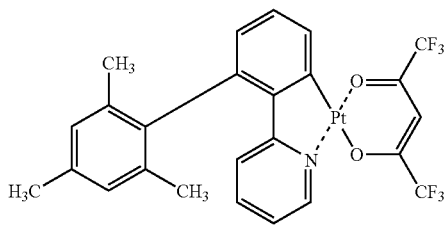
P-408
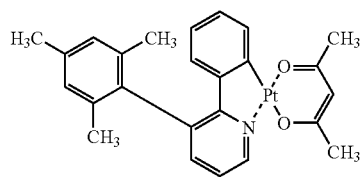
P-409
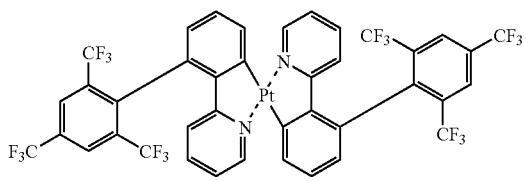
P-410
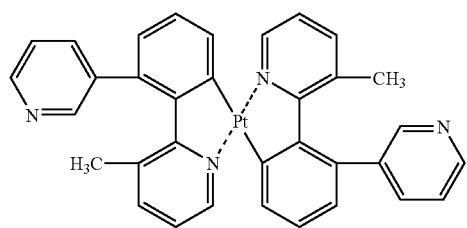
P-411
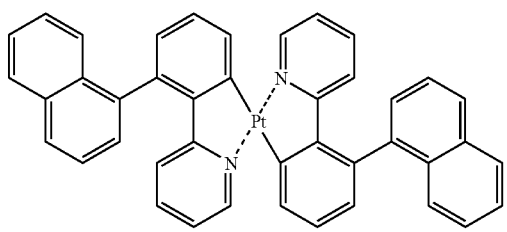
P-412
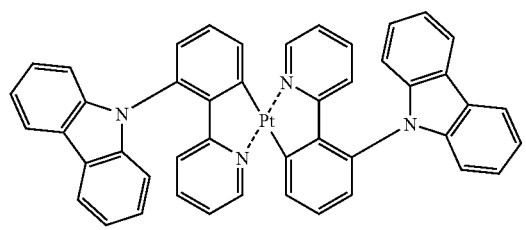
P-413
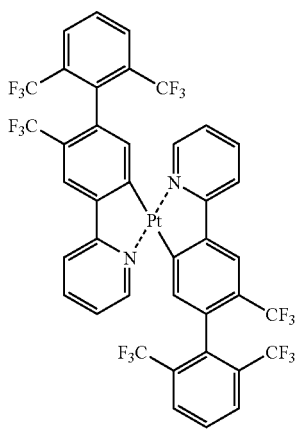
P-414
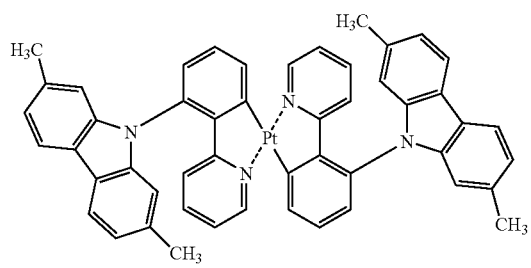
P-415
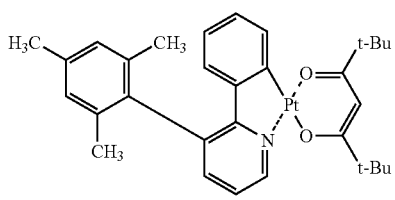

-continued
P-416
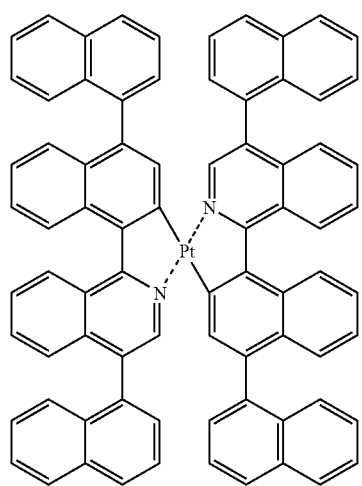
P-417
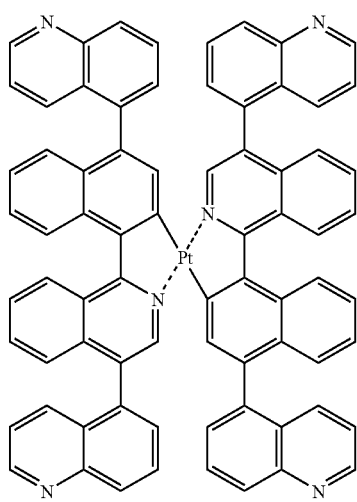
P-418
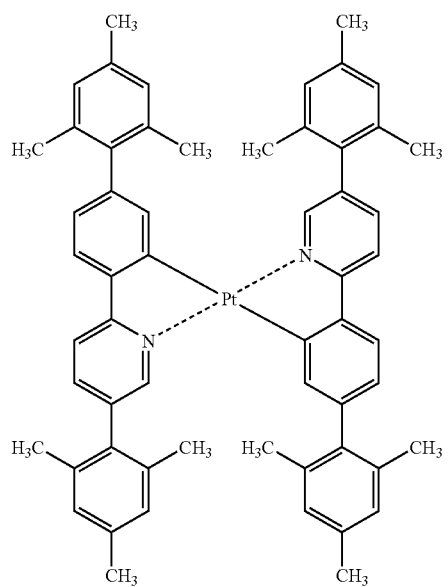
P-419
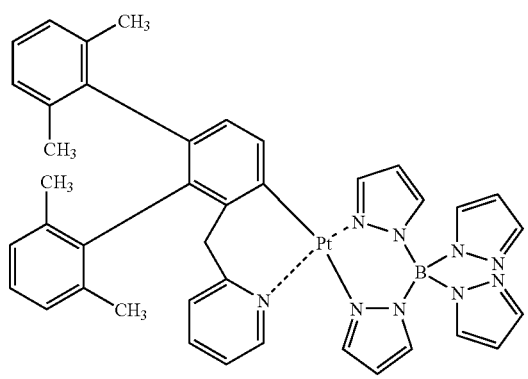
P-420
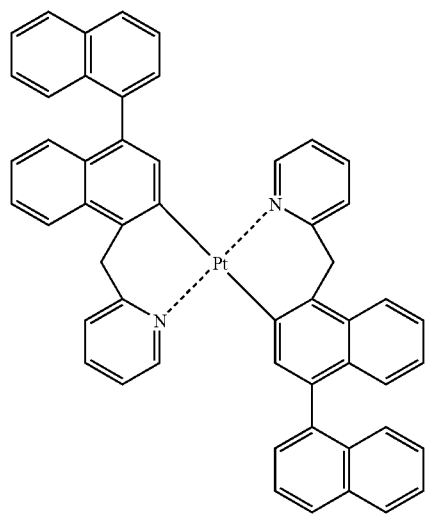
P-421
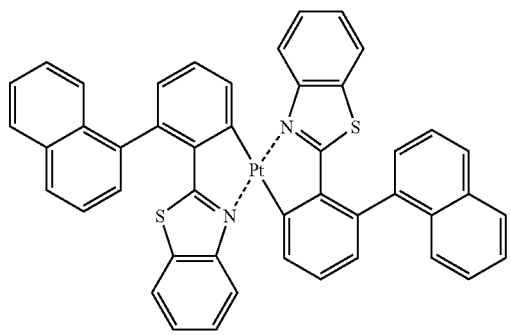

-continued
P-422
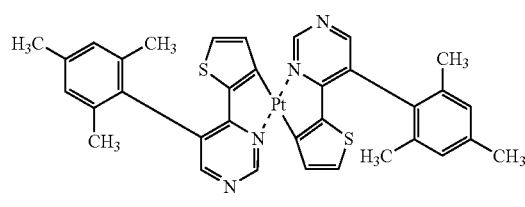
P-423
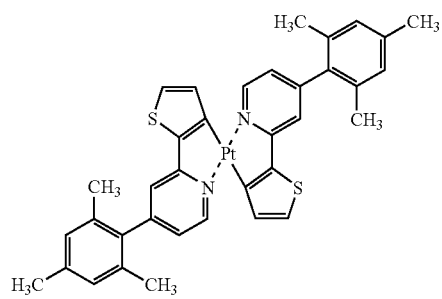
P-424
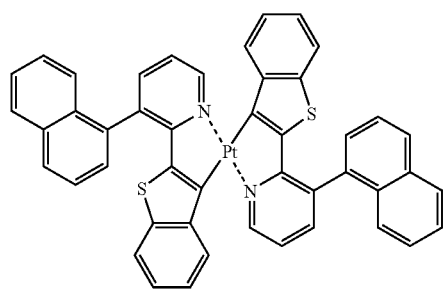
P-425
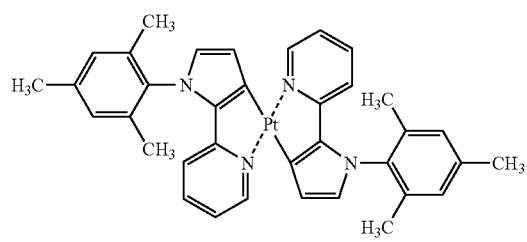
P-426
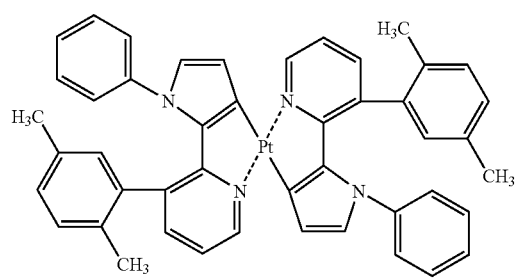
P-427
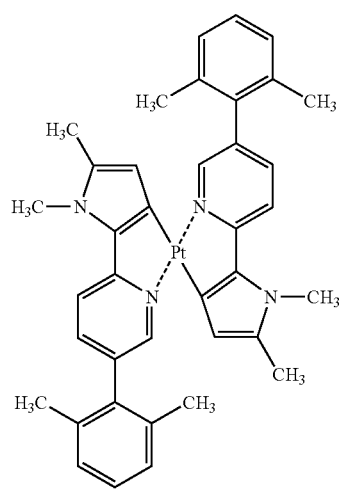
P-428
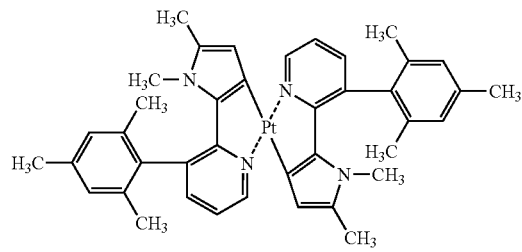
P-429
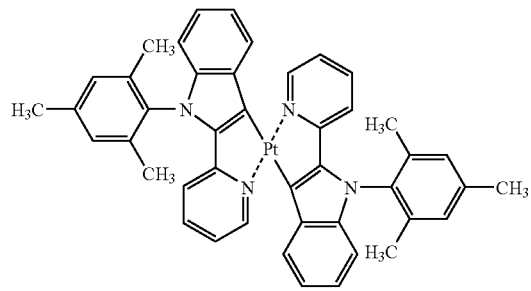

-continued
P-430
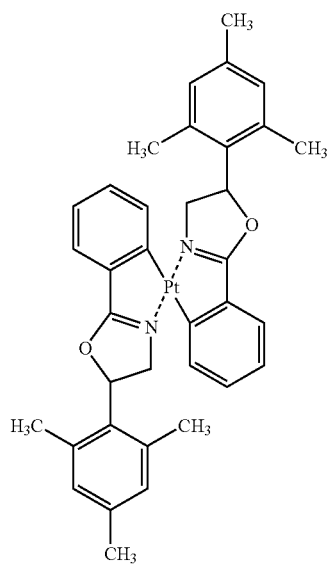
P-431
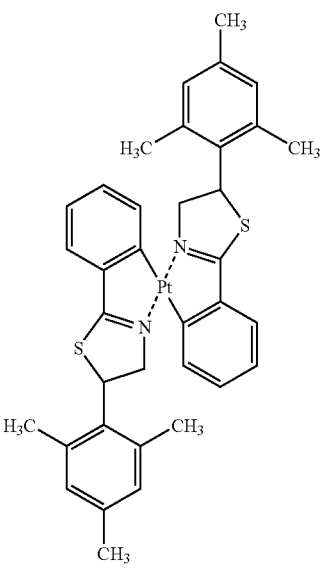
P-432
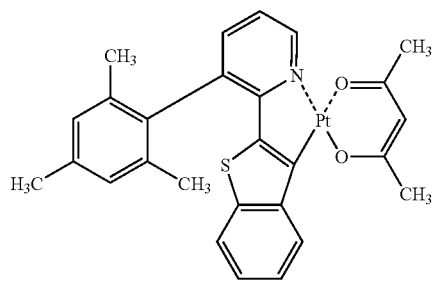
P-433
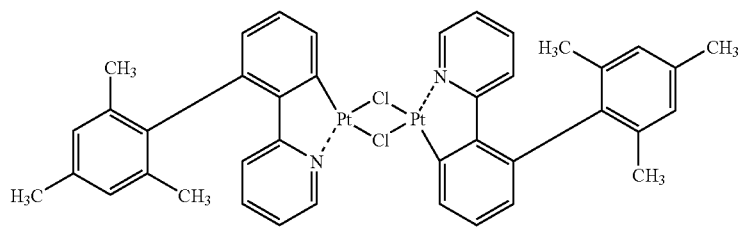
P-434
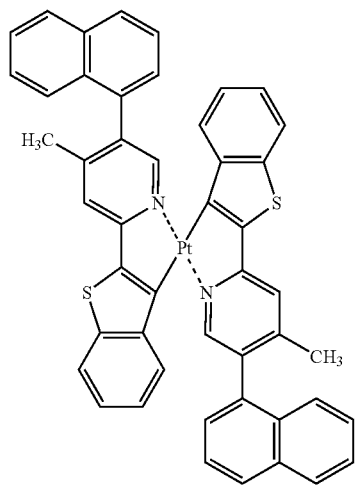
P-435
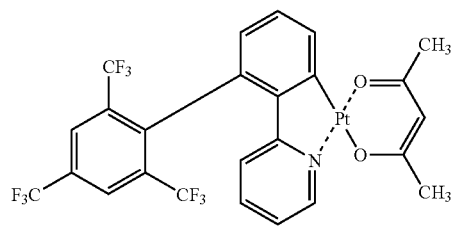

-continued
P-436
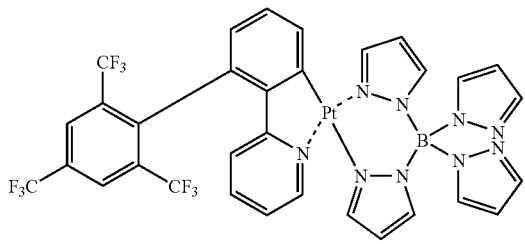
P-437
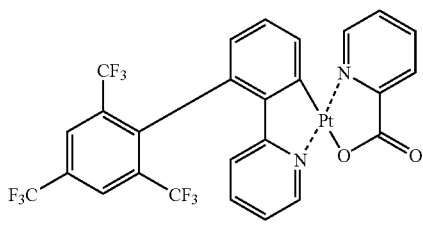
P-438
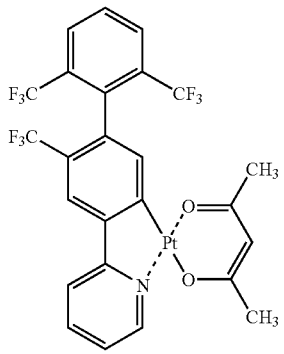
P-439
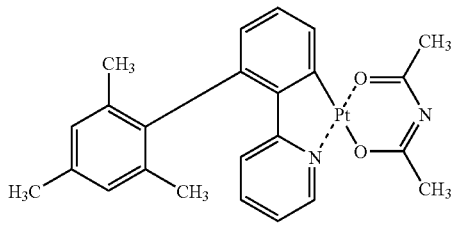
P-440
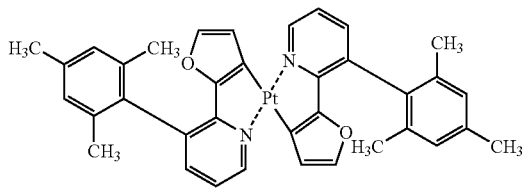
P-441
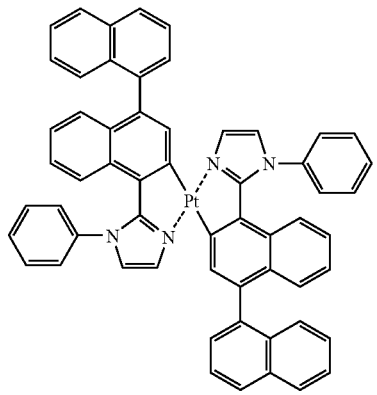
P-442
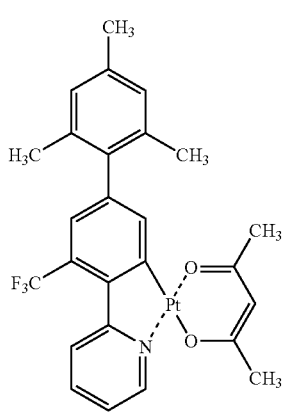
P-443
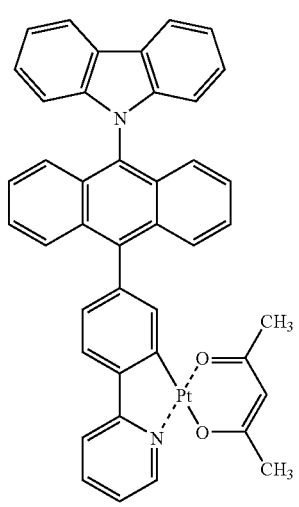

-continued
P-444
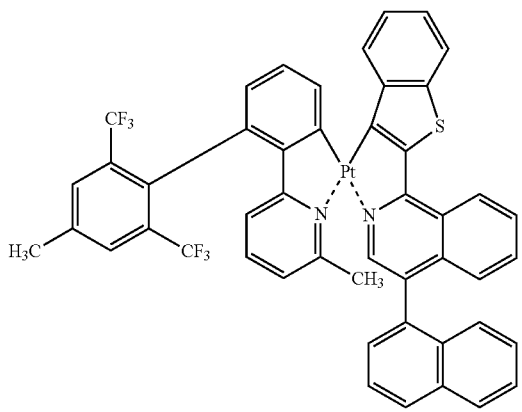
P-445
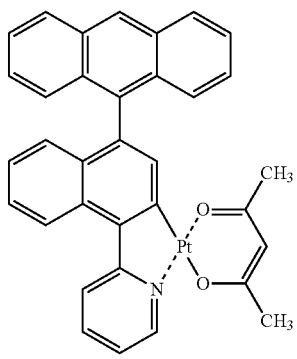
P-446
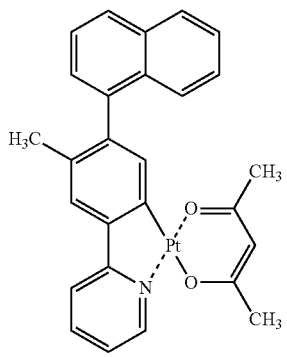
P-447
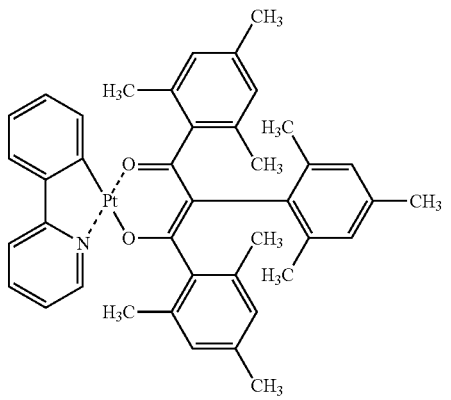
P-448
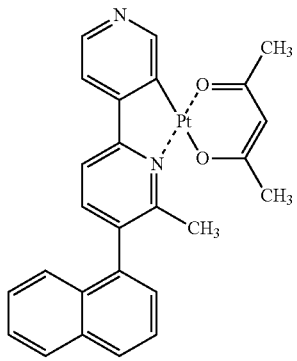
P-449
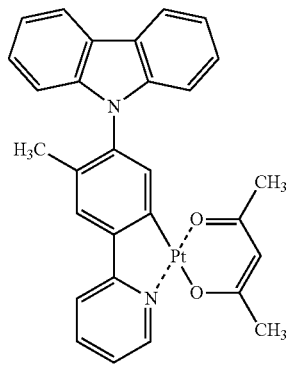
P-450
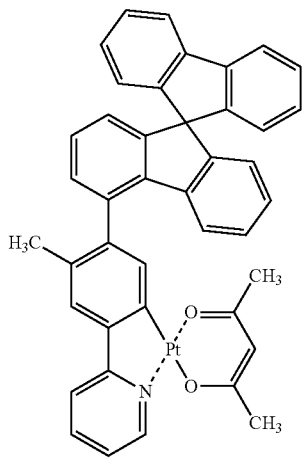
P-451
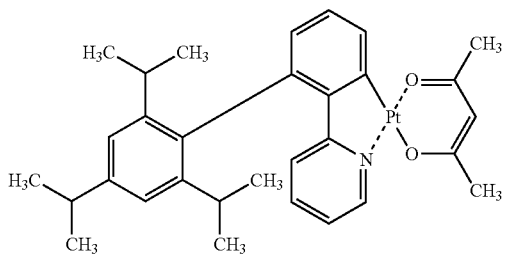

-continued
P-452
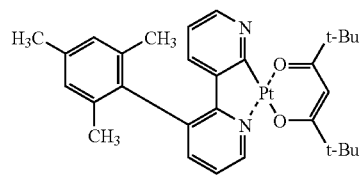
P-453
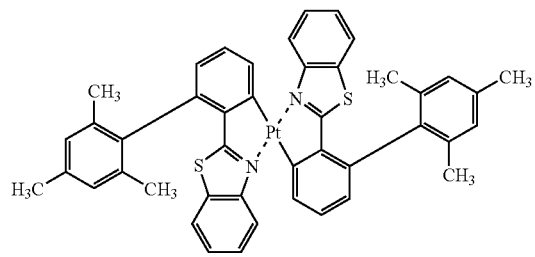
P-454
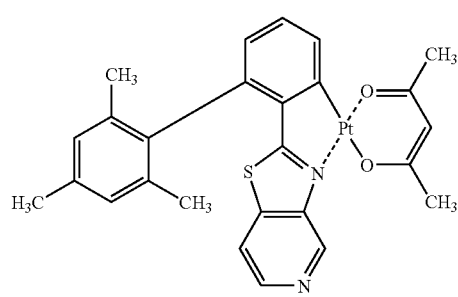
P-455
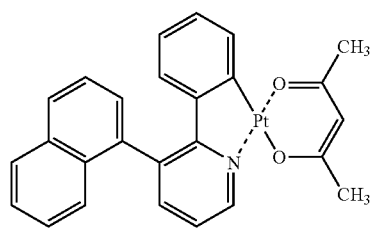
P-456
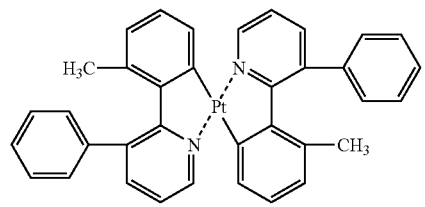
P-457
P-458
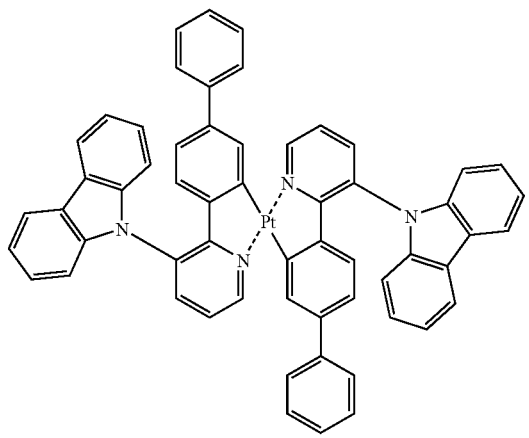
P-459
P-460
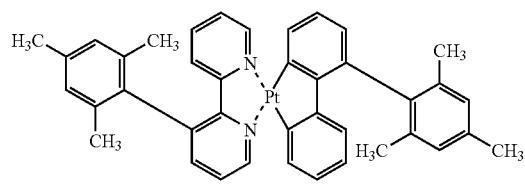
P-461
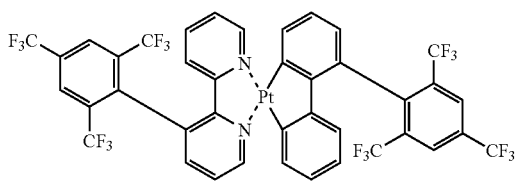

-continued
P-462 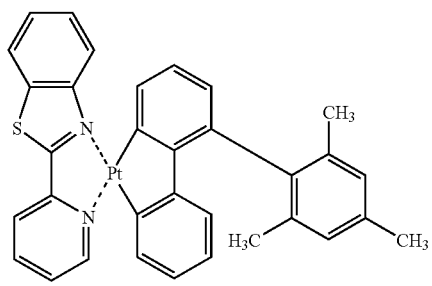
P-463 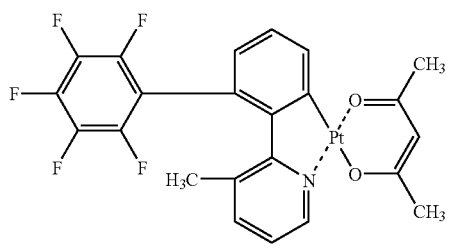
P-464 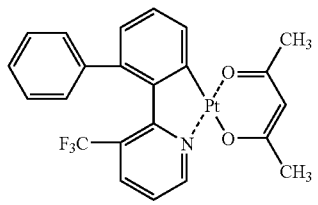
P-465 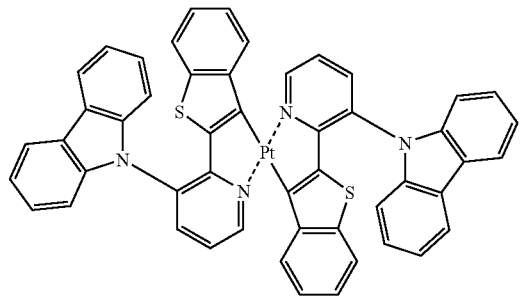
P-466 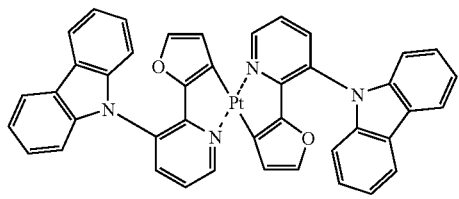
P-467 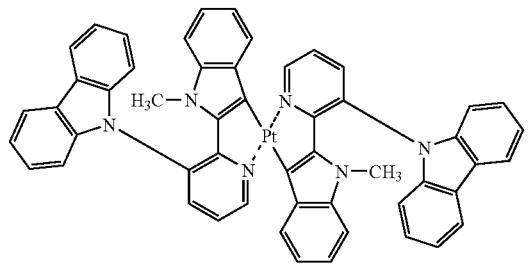
P-468 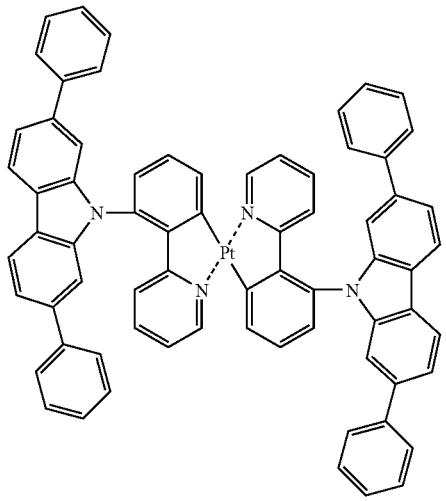
P-469 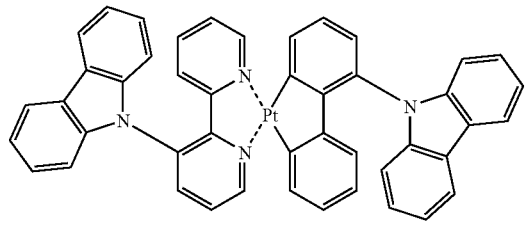
P-470 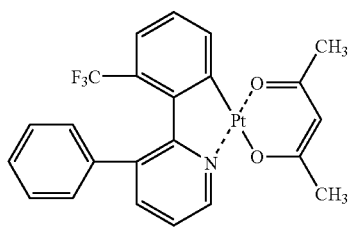
P-471 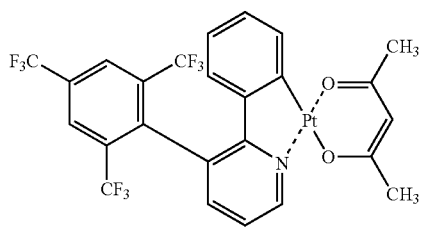

P-472
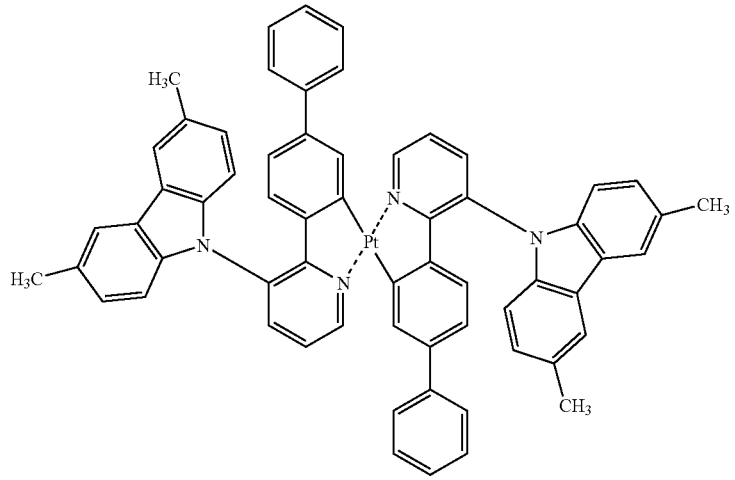
P-473
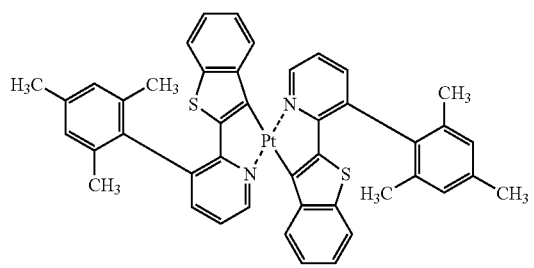
P-474
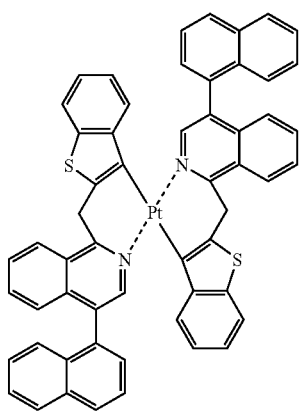
1-101
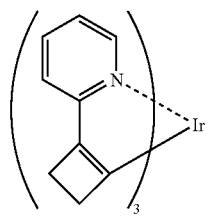
1-102
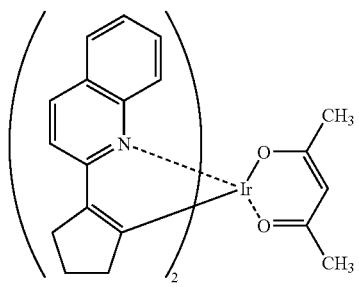
1-103
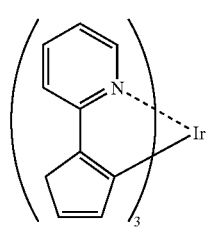
1-104
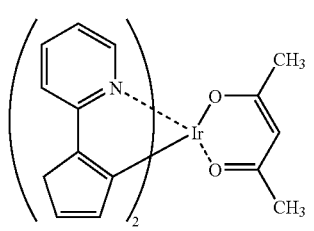

-continued
1-105
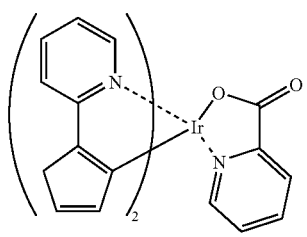
1-106
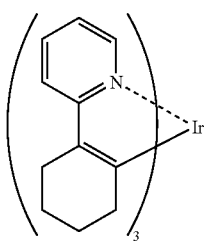
1-107
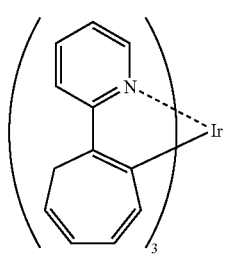
1-108
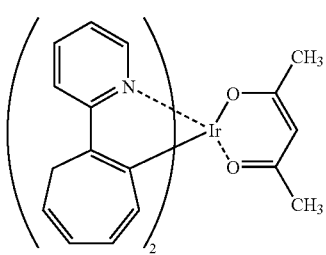
1-109
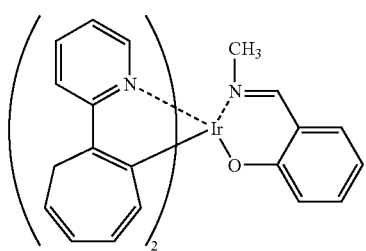
1-110
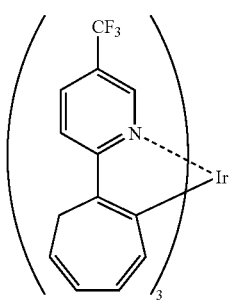
1-111
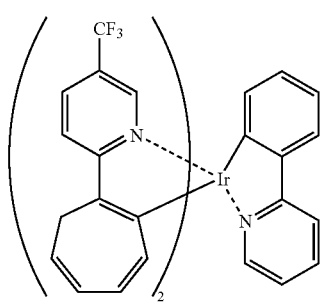
1-112
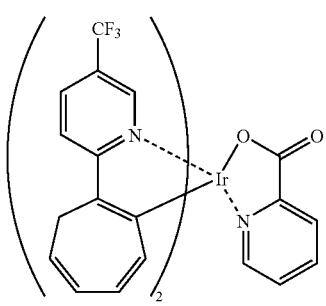
1-113
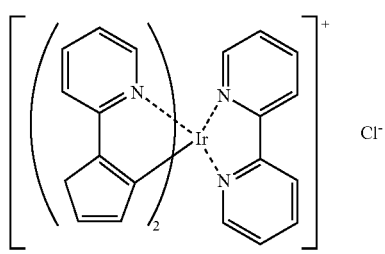
1-114
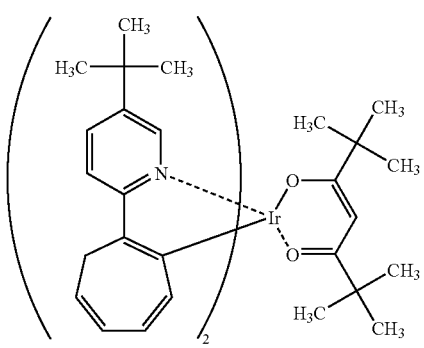

-continued
1-115
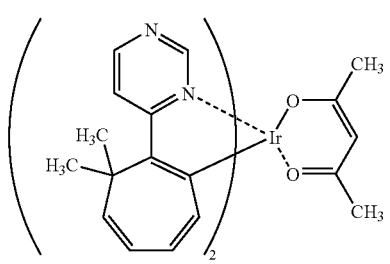
1-116
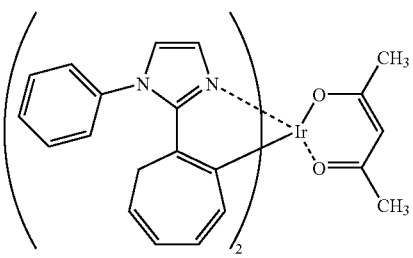
1-117
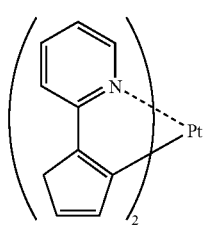
1-118
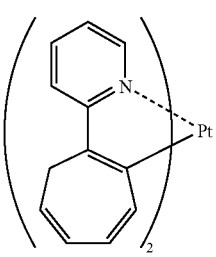
1-119
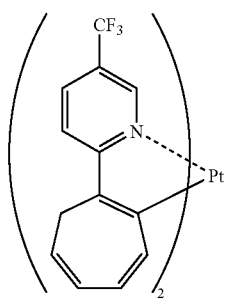
1-120
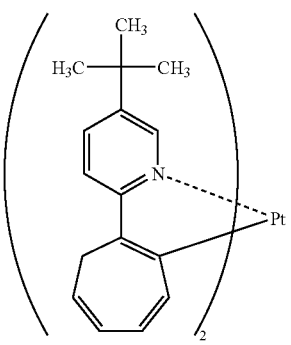
1-121
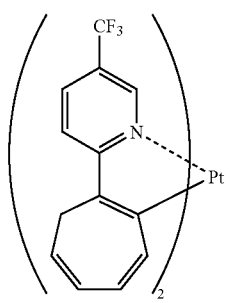
1-122
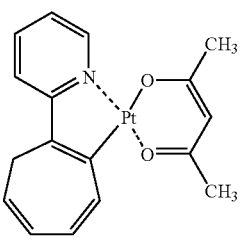
1-123
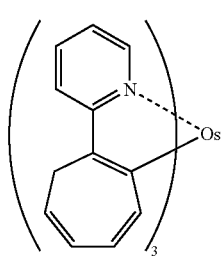
1-124
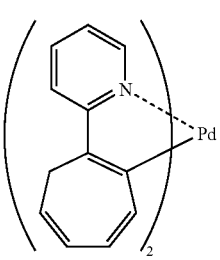

-continued
1-125 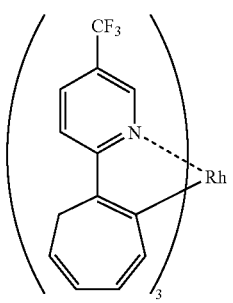
2-101 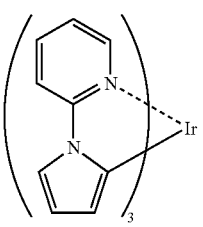
2-102 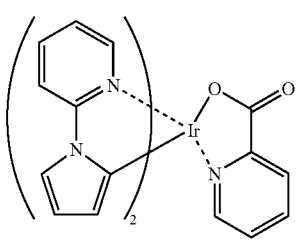
2-103 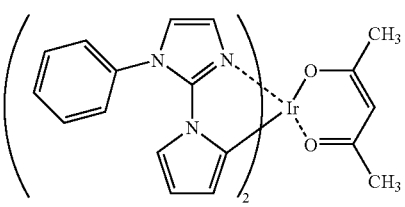
2-104 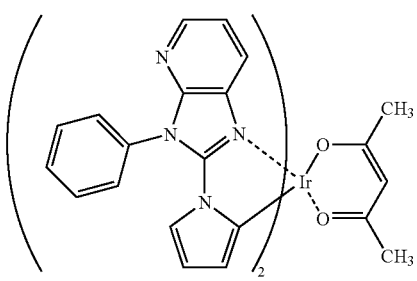
2-105 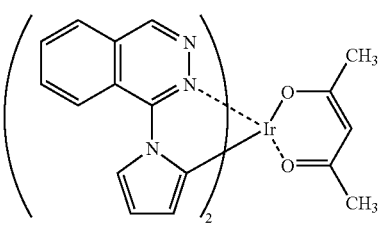
2-106 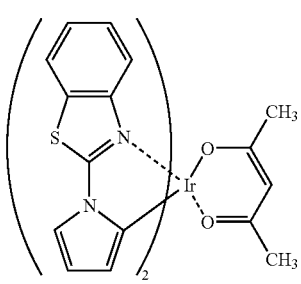
2-107 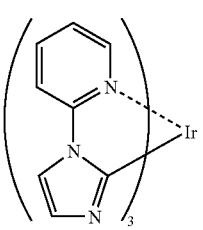
2-108 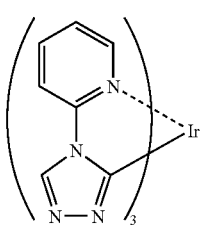
2-109 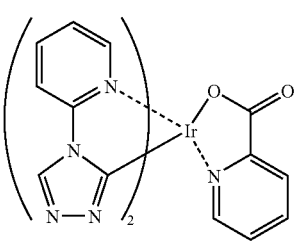
2-110 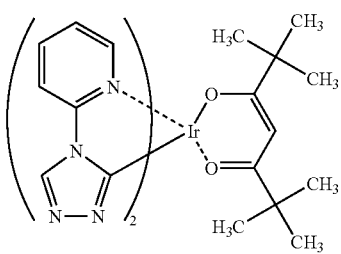
2-111 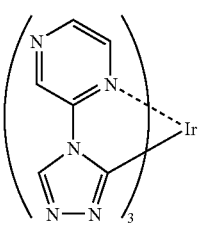

-continued
2-112 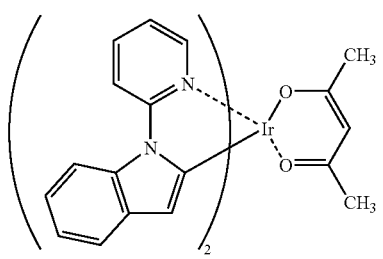
2-113 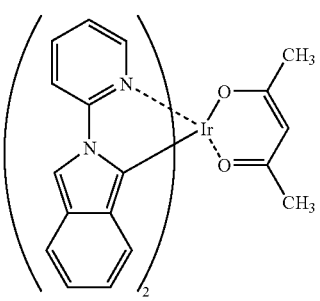
2-114 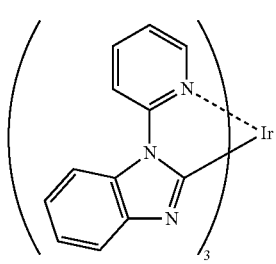
2-115 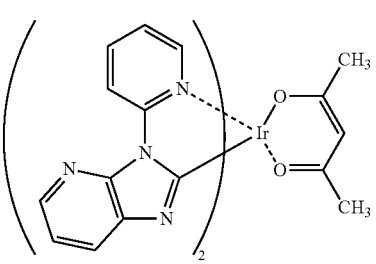
2-116 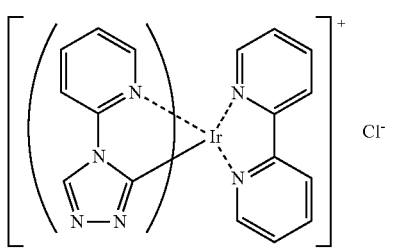
2-117 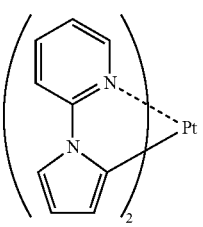
2-118 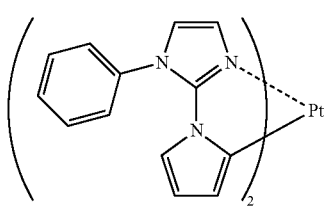
2-119 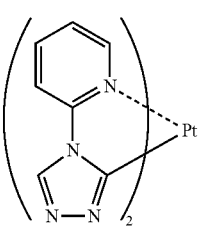
2-120 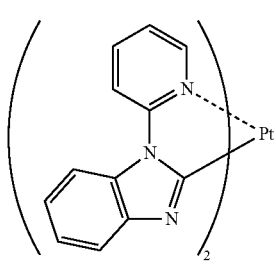
2-121 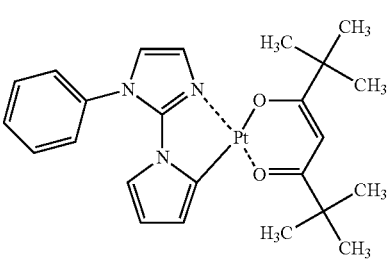
2-122 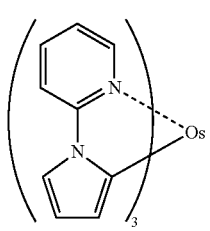
2-123 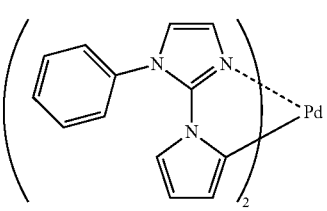

-continued
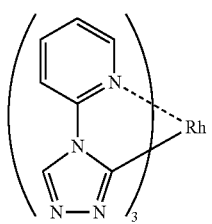
2-124
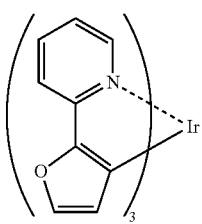
3-101
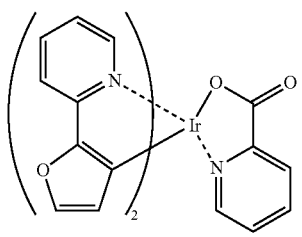
3-102
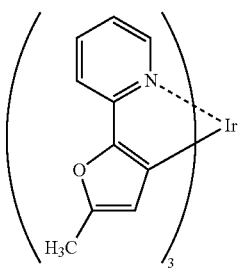
3-103
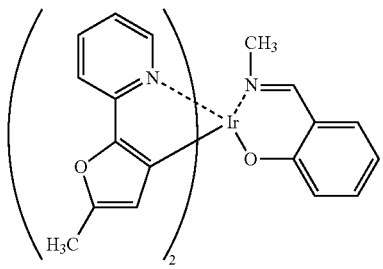
3-104
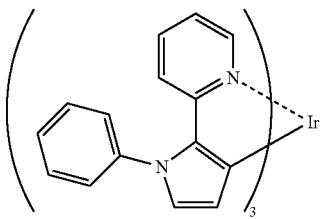
3-105
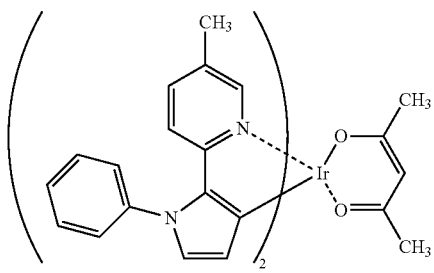
3-106
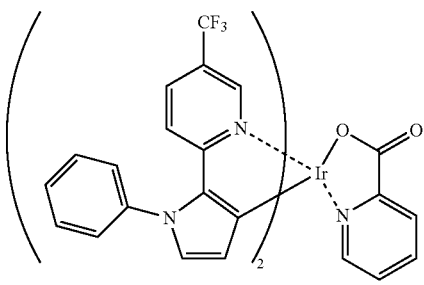
3-107
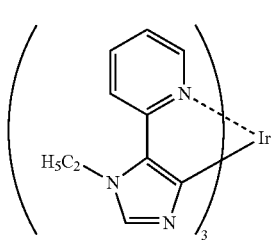
3-108
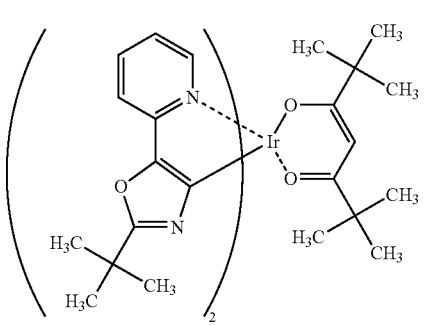
3-109
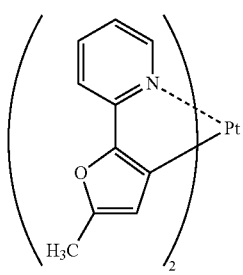
3-110
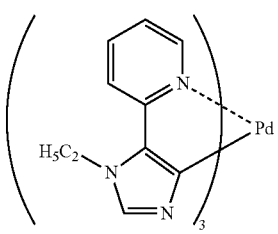
3-111

-continued
3-112
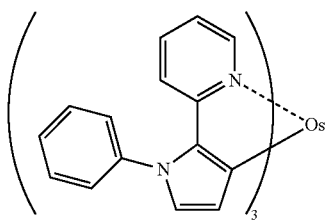
4-101
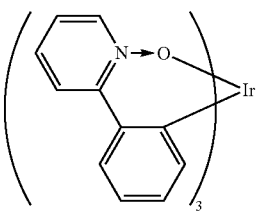
4-102
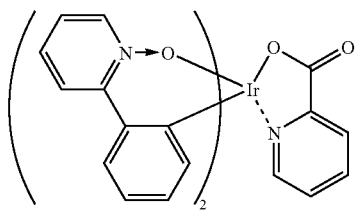
4-103
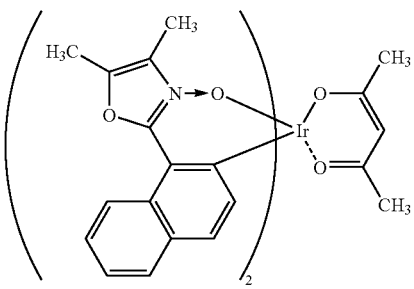
4-104
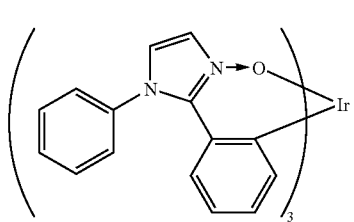
4-105
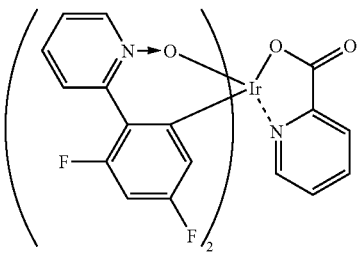
4-106
4-107
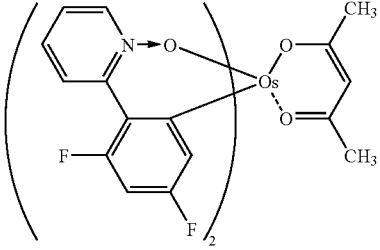
4-108
4-109
5-101
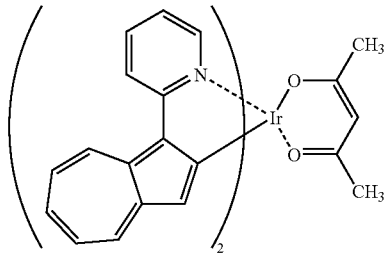
5-102
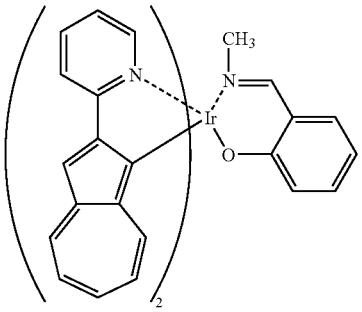

-continued
5-103
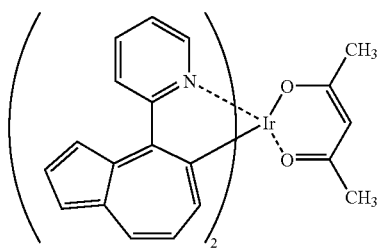
5-104
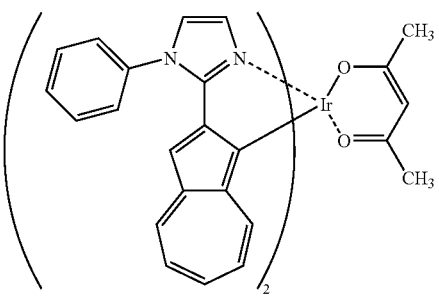
5-105
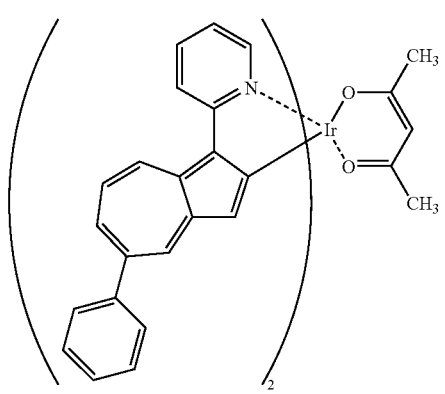
5-106
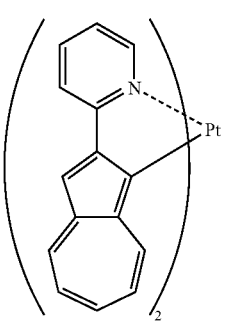
P-501
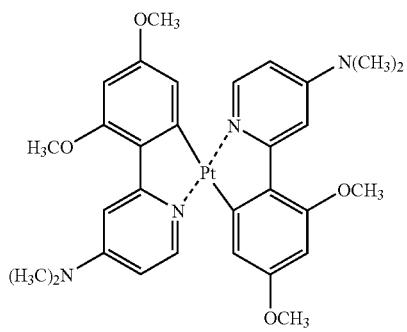
P-502
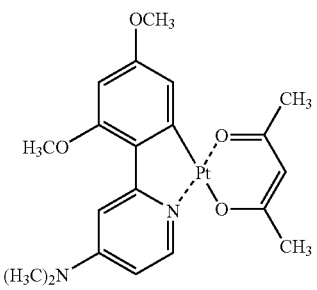
P-503
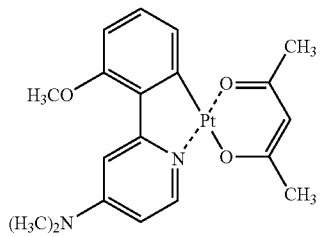
P-504
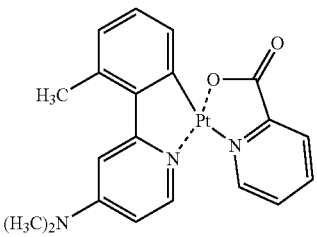
P-505
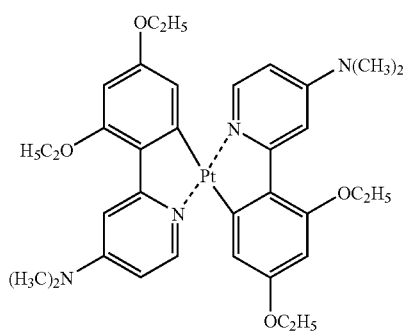
P-506
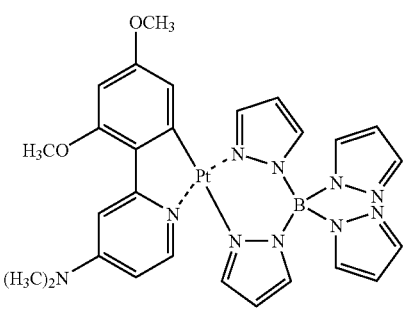

-continued
| | |
|---|---|
| P-507 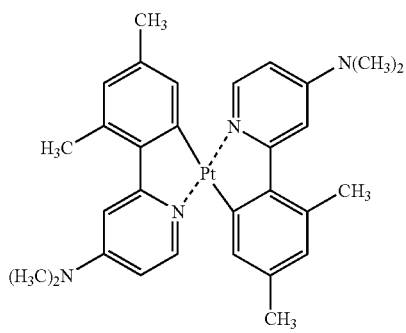 | P-508 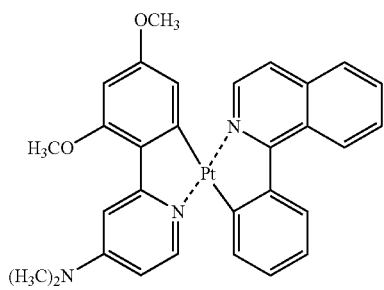 |
| P-509 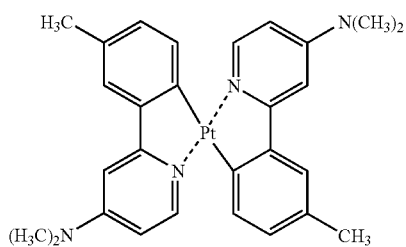 | P-510 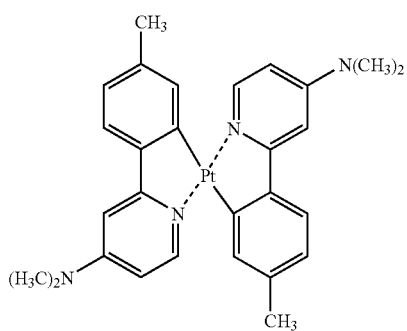 |
| P-511 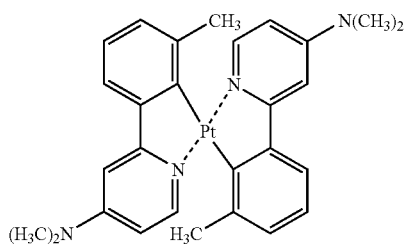 | P-512 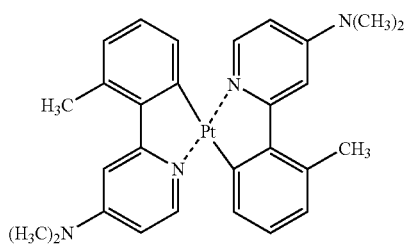 |
| P-513 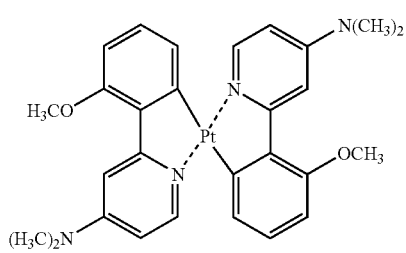 | P-514 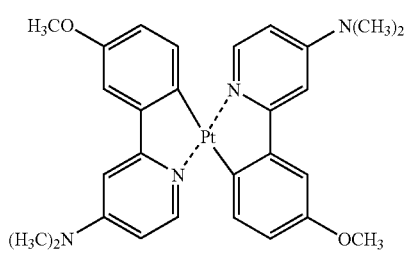 |
| P-515 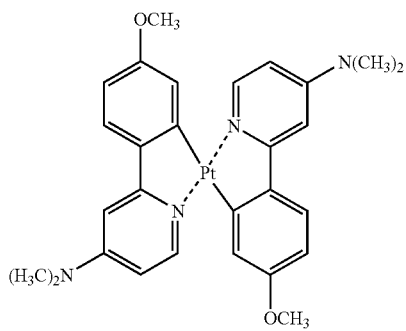 | P-516 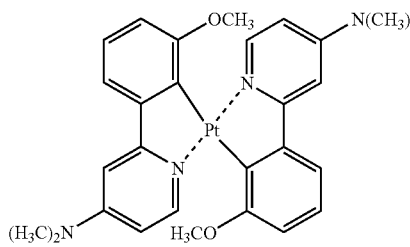 |

-continued
P-517 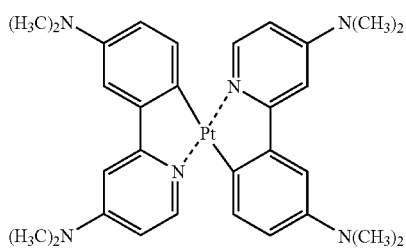
P-518 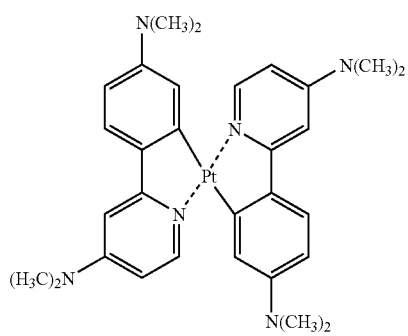
P-519 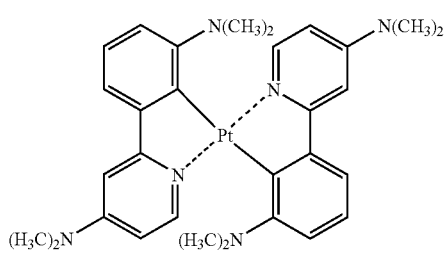
P-520 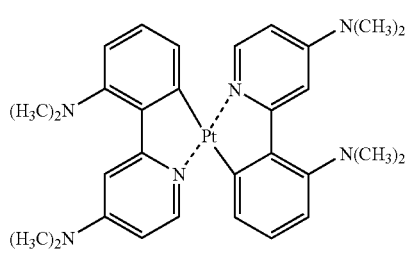
P-521 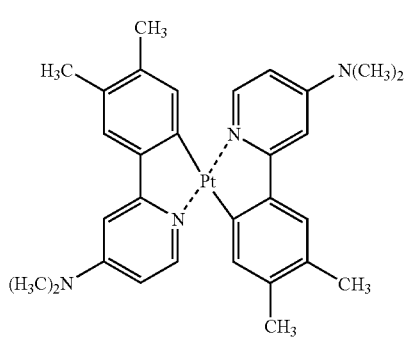
P-522 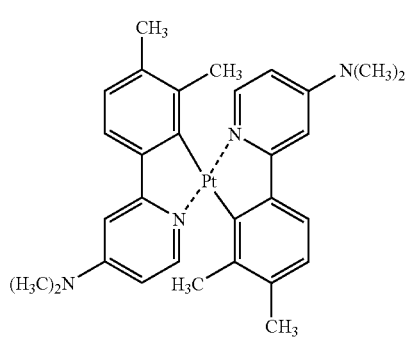
P-523 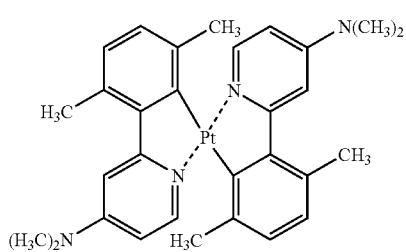
P-524 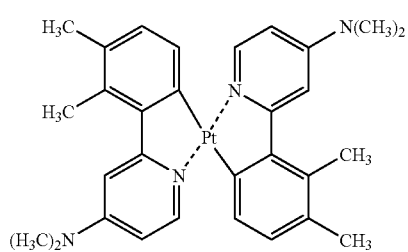
P-525 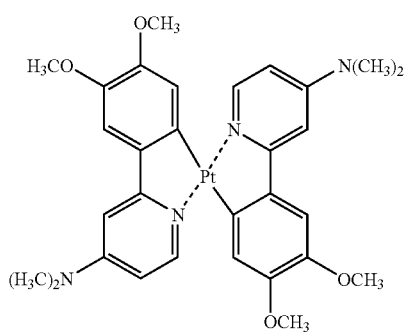
P-526 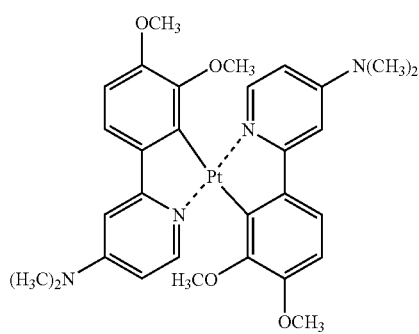

-continued
P-527 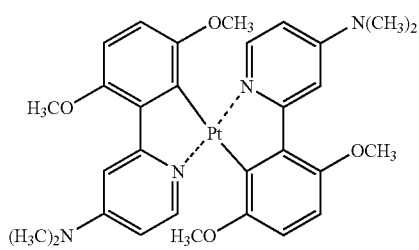
P-528 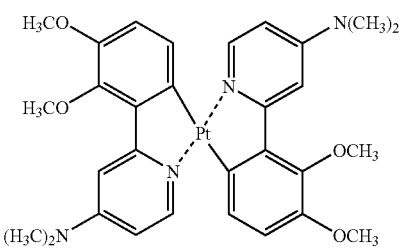
P-529 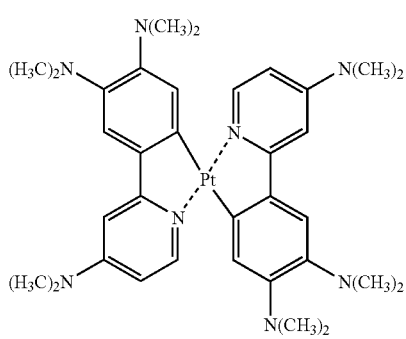
P-530 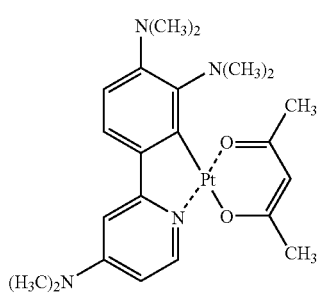
P-531 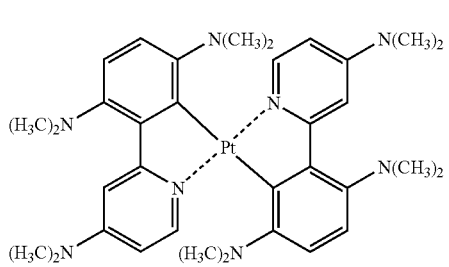
P-532 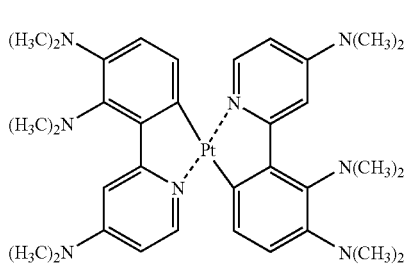
P-533 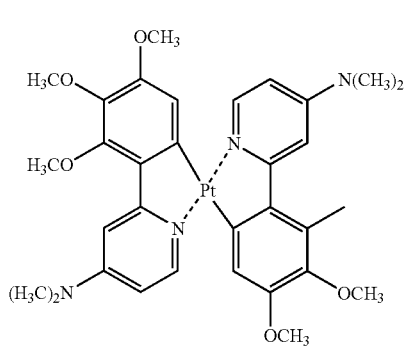
P-534 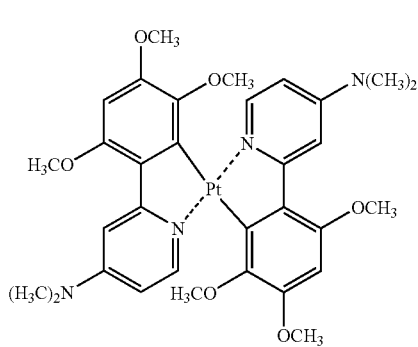
P-535 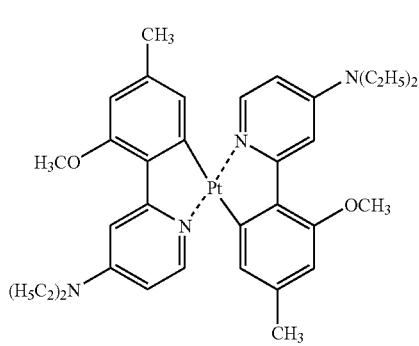
P-536 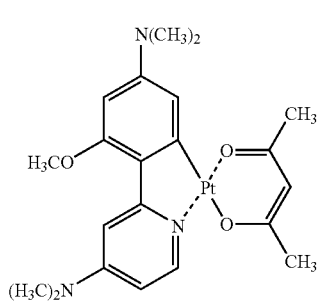

-continued
P-537 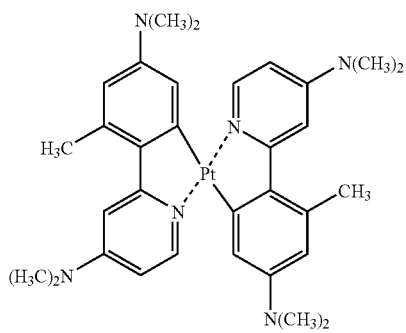
P-538 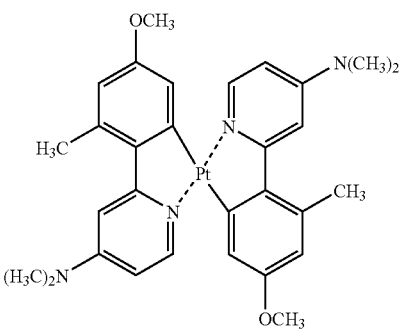
P-539 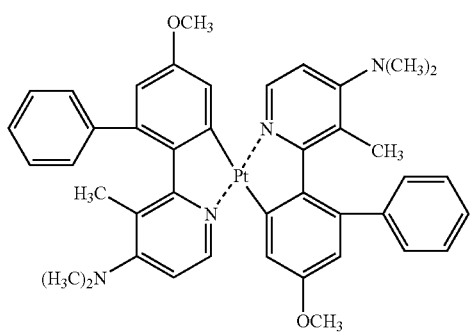
P-540 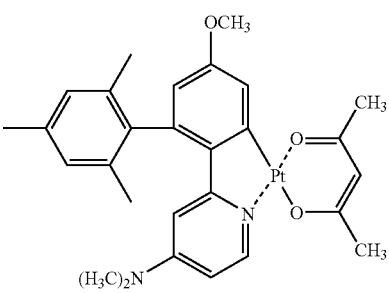
P-541 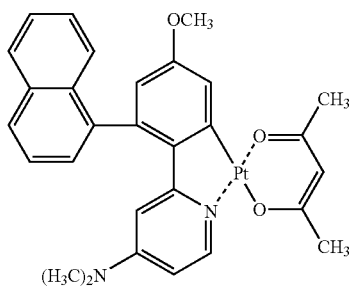
P-542 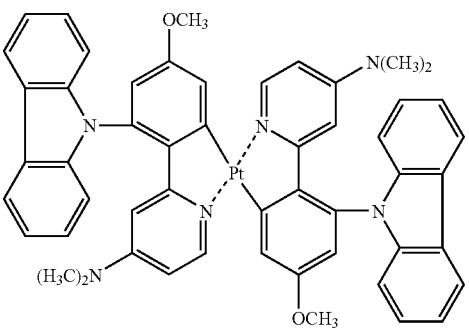
P-543 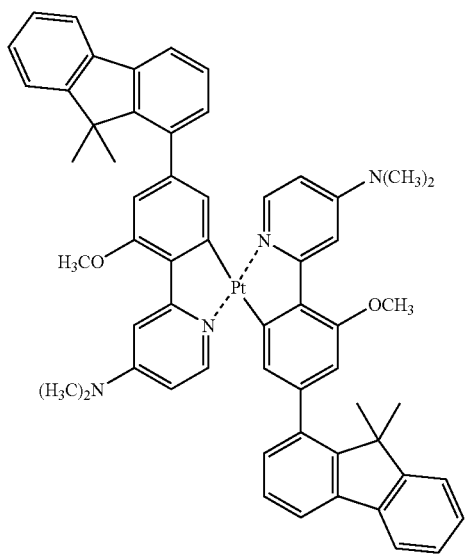
P-544 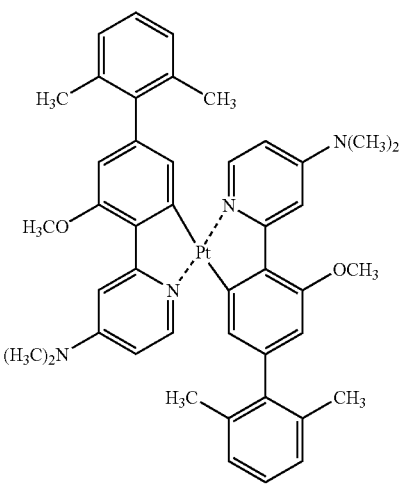

-continued
P-545
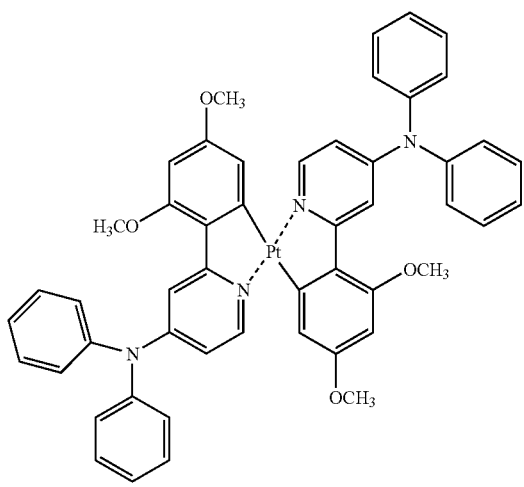
P-546
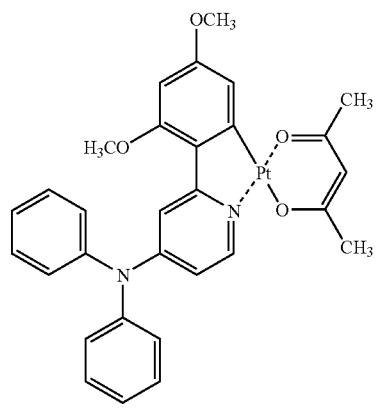
P-547
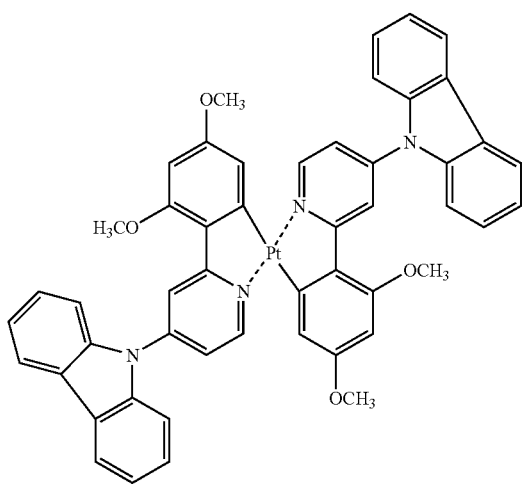
P-548
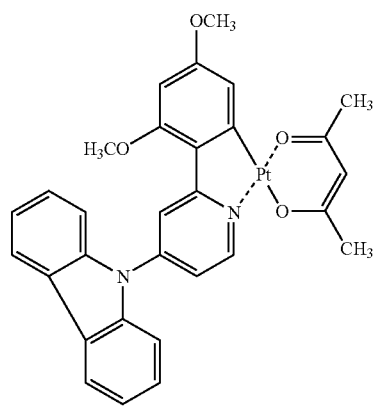
P-549
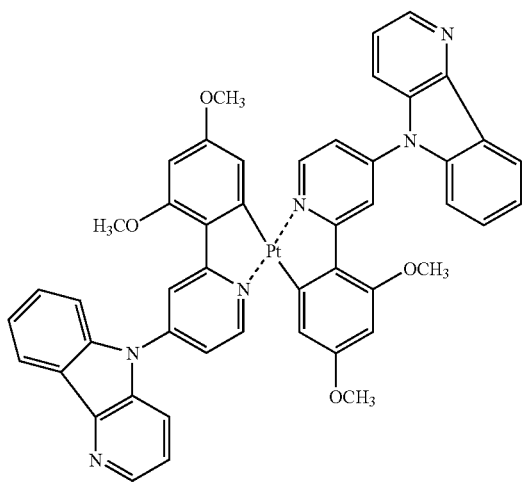
P-550
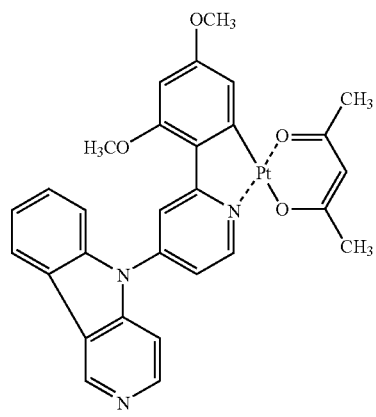

-continued
P-551 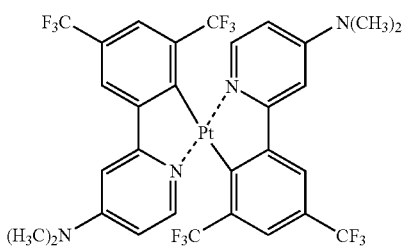
P-552 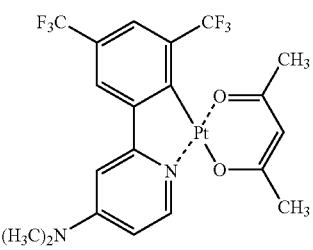
P-553 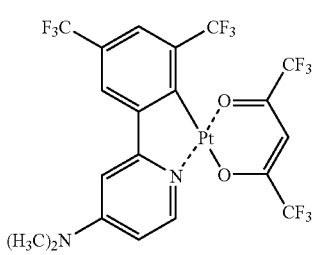
P-554 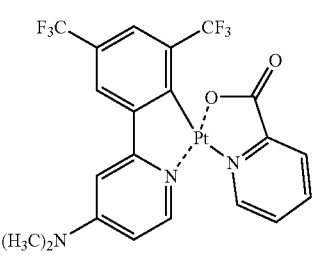
P-555 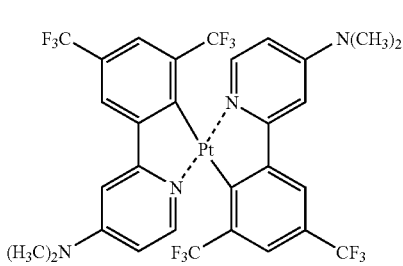
P-556 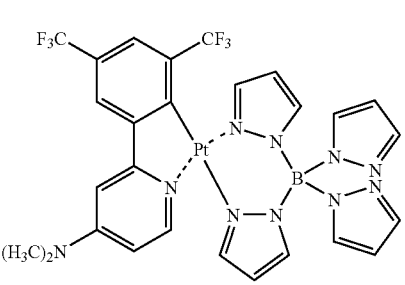
P-557 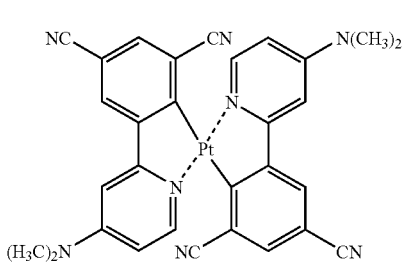
P-558 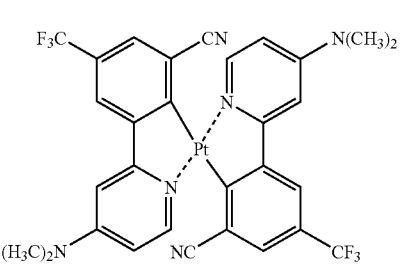
P-559 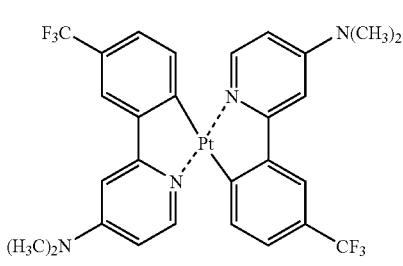
P-560 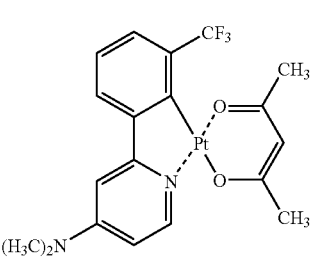
P-561 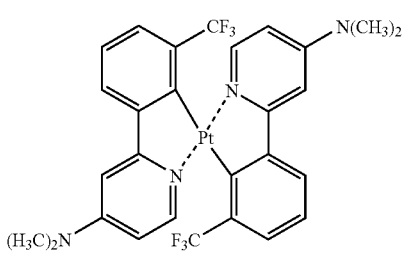
P-562 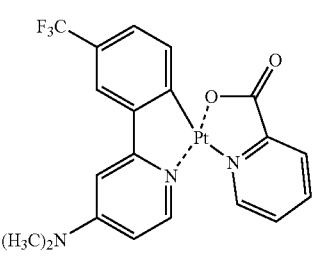

-continued
P-563
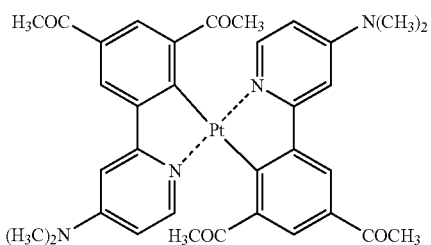
P-564
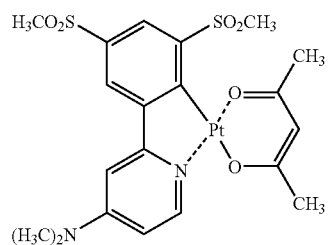
P-565
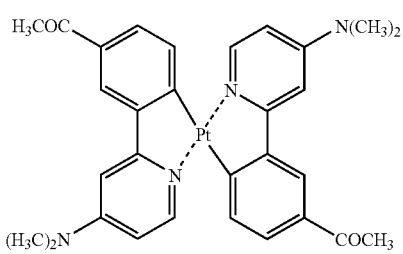
P-566
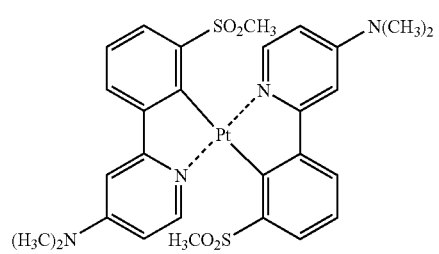
P-567
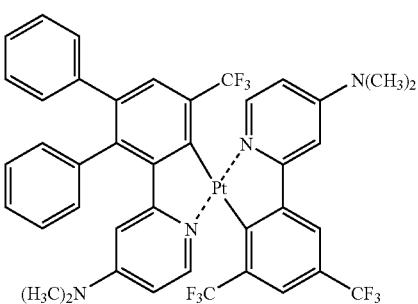
P-568
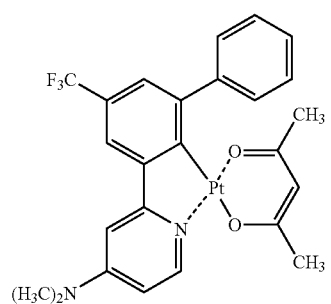
P-569
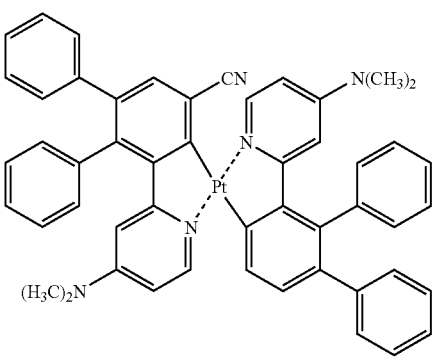
P-570
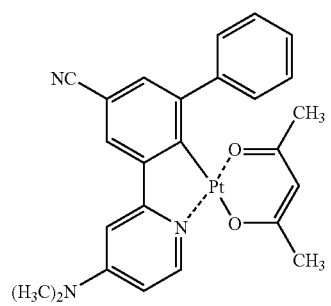
P-571
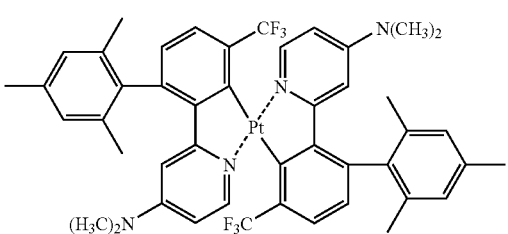
P-572
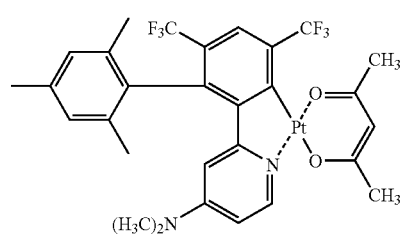

-continued
P-573
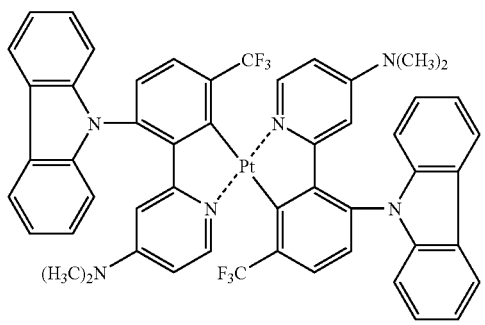
P-574
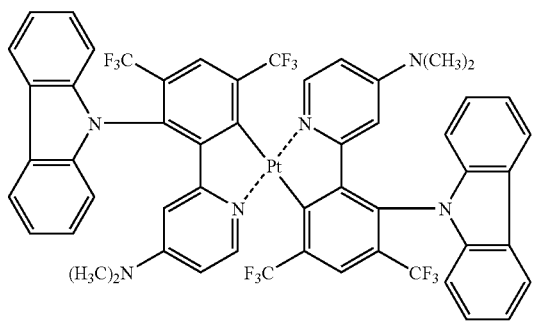
P-575
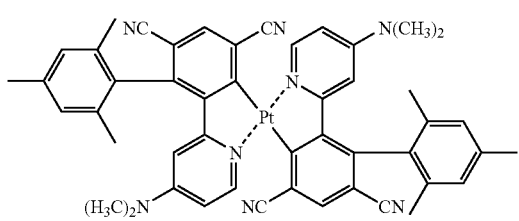
P-576
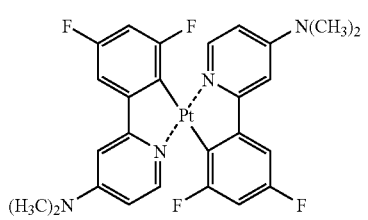
P-577
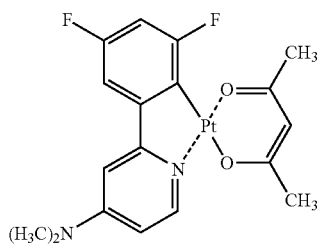
P-578
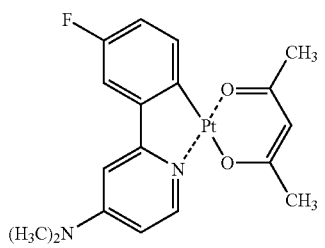
P-579
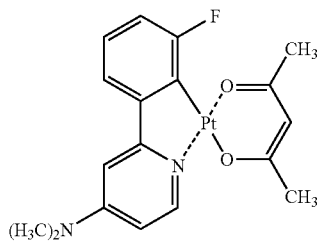
P-580
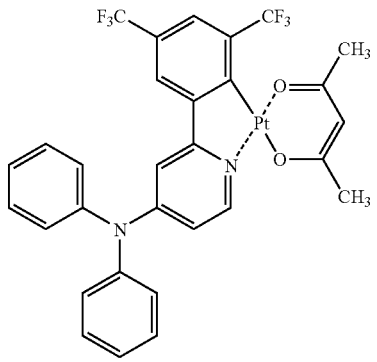
P-581
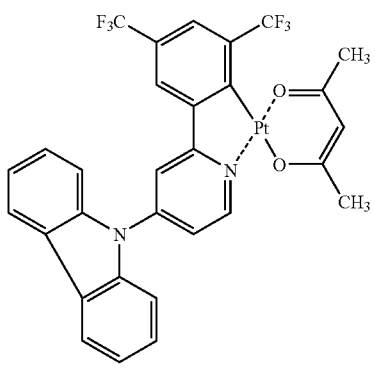
P-582
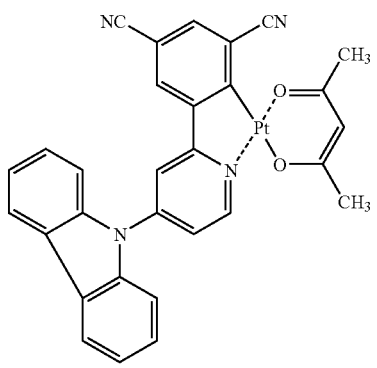

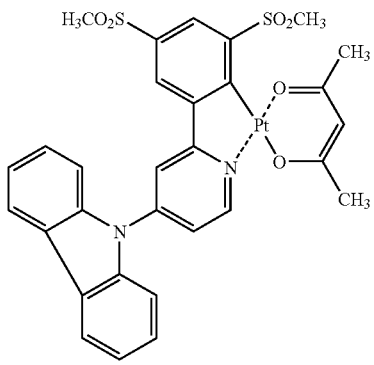

P-583

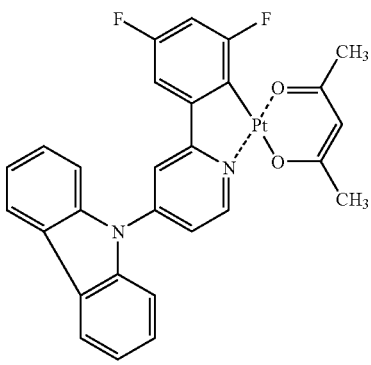

P-584

[Constituent Layer of Organic EL Device]

The constituent layer of the organic EL device of the invention will be explained below.

In the invention, preferred examples of the constituent layer of the organic EL device of the invention will be shown below, but the invention is not limited thereto.

(1) Anode/Light emission layer/Electron transporting layer/Cathode (2) Anode/Hole transporting layer/Light emission layer/Electron transporting layer/Cathode (3) Anode/Hole transporting layer/Light emission layer/Hole inhibiting layer/Electron transporting layer/Cathode (4) Anode/Hole transporting layer/Light emission layer/Hole inhibiting layer/Electron transporting layer/Cathode buffering layer/Cathode (5) Anode/Anode buffering layer/Hole transporting layer/Light emission layer/Hole inhibiting layer/Electron transporting layer/Cathode buffering layer/Cathode Hole inhibiting layer is also called hole blocking layer, and is comprised substantially of an electron transporting material. Accordingly, the electron transporting layer and the hole inhibiting layer may be comprised of a single layer.

[Anode]

For the anode of the organic EL device, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO.

Further, a material capable of forming an amorphous and transparent conductive layer such as IDIXO ($In_2O_3$—ZnO) can be used. The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred Ω/□. The thickness of the layer is ordinarily within the range of from 10 nm to 1 μm, and preferably from 10 to 200 nm, although it may vary due to kinds of materials used.

[Cathode]

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal.

Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred Ω/□, and the thickness of the layer is ordinarily from 10 nm to 1 μm, and preferably from 50 to 200 nm. It is preferable in increasing the emission luminance that either the anode or the cathode of the organic EL device is transparent or semi-transparent.

Next, an injecting layer, a hole transporting layer, and an electron transporting layer used in the component layer of the organic EL device of the invention will be explained.

[Injecting Layer]: Electron Injecting Layer, Hole Injecting Layer

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL device and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing electroconductive polymers such as polyaniline, polythiophene, or those added with an ionic dopant (for example, poly(3,4)ethylenedioxythiophene-polystyrene sulphonate (PEDOT/PSS)).

The cathode buffer layer (electron injecting layer) is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (injecting layer) is preferably very thin and has a thickness of preferably from 0.1 to 100 nm depending on kinds of the material used.

[Inhibiting Layer]: Hole Inhibiting Layer, Electron Inhibiting Layer

The inhibiting layer is a layer provided if necessary in addition to the fundamental configuration layers as described above, and is for example a hole inhibiting layer as described in Japanese Patent O.P.I. Publication Nos. 11-204258, and 11-204359, and on page 237 of "Organic EL device and its frontier of industrialization" (published by NTS Corporation, Nov. 30, 1998).

The hole inhibiting layer is an electron transporting layer in a broad sense, and is comprised of material having an ability of transporting electrons but an extremely poor ability of holes, which can increase a recombination probability of electrons and holes by transporting electrons and inhibiting holes.

On the other hand, the electron inhibiting layer is an hole transporting layer in a broad sense, and is comprised of material having an ability of transporting holes but an extremely poor ability of electrons, which can increase a recombination probability of electrons and holes by transporting holes and inhibiting electrons.

The hole transporting layer is comprised of a material having an ability of transporting holes, and means a hole injecting layer or an electron inhibiting layer in a broad sense.

The hole transporting layer or an electron transporting layer may be a single layer or plural layers.

[Light Emission Layer]

The light emission layer in the invention is a layer where electrons and holes, injected from electrodes, an electron transporting layer or a hole transporting layer, are recombined to emit light. The portions where light emits may be in the light emission layer or at the interface between the light emission layer and the layer adjacent thereto.

The light emission layer can be formed employing a known method such as a vacuum deposition method, a spin coat method, a casting method or an LB method. The thickness of the light emission layer is not specifically limited, but is ordinarily from 5 nm to 5 µm. The light emission layer may be composed of a single layer or plural layers containing two or more kinds of host compounds and at least one phosphorescent dopant, wherein the energy difference between the ground state and the excited triplet state in the two or more kinds of host is not less than 2.7 eV. When the light sensitive layer is plural, one of the plural layers may contain two or more kinds of host compounds and at least one phosphorescent dopant, wherein the energy difference between the ground state and the excited triplet state in the two or more kinds of host is not less than 2.7 eV, and another may contain the same compounds as above.

[Hole Transporting Layer]

The hole transporting layer is comprised of a hole transporting material having an ability of transporting holes, and means a hole injecting layer or an electron inhibiting layer in a broad sense. The hole transporting layer may be a single layer or plural layers.

The hole transporting material is not specifically limited, and those employed as a hole transporting material in a conventional photoconductive material or those employed in a hole injecting layer or a hole transporting layer in an EL device can be used.

The hole transporting material has a hole injecting ability, a hole transporting ability or an ability to form a barrier to electrons, and may be either an organic substance or an inorganic substance. Examples of thereof include a porphyrin, a triphenylamine derivative, a phenylenediamine derivative, a fluorenone derivative, a hydrazone derivative, a stilbene derivative, a silazane derive, an aniline copolymer, and an electroconductive oligomer, particularly a thiophene oligomer.

As the hole transporting material, those described above are used, but a porphyrin compound, an aromatic tertiary amine compound or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4''-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used.

The hole transporting layer can be formed by layering the hole transporting material by a known method such as a vacuum deposition method, a spin coat method, a casting method, an ink jet method, and an LB method. The thickness of the hole transporting layer is not specifically limited, but is ordinarily from 5 to 5000 nm. The hole transporting layer may be composed of a single layer structure comprising one or two or more of the materials mentioned above.

[Electron Transporting Layer]

The electron transporting layer comprises a material (an electron transporting material) having an electron transporting ability, and in a broad sense refers to an electron injecting layer or a hole inhibiting layer. The electron transporting layer can be provided as a single layer or plural layers.

As an electron transporting material (which serves also as a hole inhibiting material) used in a single electron transporting layer or in the electron transporting layer closest to the cathode of plural electron transporting layers, compounds to be described below are known.

Typical examples of the electron transporting material include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative.

Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer side chain or a polymer having the material as the polymer main chain can be also used.

A metal complex of an 8-quinolynol derivative such as aluminum tris-(8-quinolynol) ($Alq_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) ($Znq_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material.

In the invention, bis(2-methyl-8-quinolinol)phenyl phenol aluminum (BAlq), or $Alq_3$ is more preferably used.

[Substrate (Also Referred to as Base Plate, Base or Support)]

The organic EL device of the invention is preferably provided on a substrate.

The substrate employed for the organic electroluminescent device of the invention is not restricted to specific kinds of materials such as glass and plastic, as far as it is transparent. Examples of the substrate preferably used include glass, quartz and light transmissible plastic film. Especially preferred one is a resin film capable of providing flexibility to the organic EL device.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP) and so on.

The surface of the resin film may have a layer of an inorganic or organic compound or a hybrid layer of both compounds.

A hue-improving filter such as a color filter may be used in combination.

A preferred method of preparing the organic EL device of the invention will be explained below.

[Preparation of Organic EL Device]

For one example, the preparation of the organic EL device, which has the constitution, Anode/Hole injecting layer/Hole transporting layer/Light emission layer/Electron transporting layer/Electron injecting layer/Cathode, will be described.

A thin layer of a desired material for an electrode such as a material of the anode is formed on a suitable substrate by a deposition or sputtering method to prepare the anode, so that the thickness of the layer is not more than 1 μm, and preferably within the range of from 10 to 200 nm. Then the hole injecting layer, the hole transporting layer, the light emission layer, the electron transporting layer and the electron injecting layer, which constitute the organic EL device, are formed on the resulting anode in that order as organic compound thin layers.

As methods for formation of the thin layers, there are a spin coating method, a casting method, an ink jet method, a vacuum deposition method, and a printing method, however, a spin coating method and a vacuum deposition method are preferably used, since a uniform layer can be formed and a pinhole is formed with difficulty. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from −50 to 300° C. to form a layer with a thickness of from 0.1 nm to 5 μm, and preferably from 5 to 200 nm.

After these layers has been formed, a thin layer comprised of a material for a cathode is formed thereon to prepare a cathode, employing, for example, a deposition method or sputtering method to give a thickness of not more than 1 μm, and preferably from 50 to 200 nm. Thus, a desired organic EL device is obtained. It is preferred that the layers from the hole injecting layer to the cathode are continuously formed under one time of vacuuming to obtain an organic EL device. However, on the way of the layer formation under vacuum a different layer formation method may be inserted. When the different method is used, its process is required to be carried out under a dry inert gas atmosphere.

[Display]

In the multicolor display of the invention, the light emission layer only is formed using a shadow mask, and other layers than the light emission layer are common, and can be formed employing a vacuum method, a casting method, a spin coat method or a printing method in which patterning employing the shadow mask is not required.

When the light emission layer only is formed by patterning, the layer formation method, although not specifically limited, is carried out preferably according to a deposition method, an ink jet method or a printing method. When a deposition method is used as the layer formation method, patterning of the layer is preferably carried out employing a shadow mask.

Further, the organic EL device can be prepared in the reverse order, in which the cathode, the electron injecting layer, the electron transporting layer, the light emission layer, the hole transporting layer, the hole injecting layer, and the anode are formed in that order. When a direct current voltage, a voltage of 2 to 40V is applied to the thus obtained multicolor display, setting the anode as a + polarity and the cathode as a − polarity, light emission occurs. When voltage is applied with the reverse polarity, no current flows, and light is not emitted at all. When an alternating voltage is applied, light emission occurs only at the time when the polarity of the anode is "+" and that of the cathode is "−". The wave shape of the alternating current may be any one.

The display of the invention can be used as a display device, a display or various light emission sources. The display device or the display, which employs three kinds of organic EL devices, a device emitting a blue light, a device emitting a red light and a device emitting a green light, can present a full color image.

Examples of the display device or the display include a television, a personal computer, a mobile device or an AV device, a display for text broadcasting, and an information display used in a car. The multicolor emission apparatus may be used as particularly a display for reproducing a still image or a moving image. When the apparatus is used as a display for reproducing a moving image, the driving method may be either a simple matrix (passive matrix) method or an active matrix method.

[Illuminating Device]

Examples of the illuminating device of the invention include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, but are not limited thereto.

The organic EL device of the invention may be an organic EL device having a resonator structure. The organic EL device having a resonator structure is applied to a light source for a photo-memory medium, a light source for an electrophotographic copier, a light source for an optical communication instrument, or a light source for a photo-sensor, but its application is not limited thereto. In the above application, a laser oscillation may be carried out.

The organic EL device of the invention can be used as a lamp such as an illuminating lamp or a light source for exposure, as a projection device for projecting an image, or as a display for directly viewing a still image or a moving image. When the device is used in a display for reproducing a moving image, the driving method may be either a simple matrix (passive matrix) method or an active matrix method. The display can present a full color image, employing two or more kinds of organic EL devices each emitting light with a different color. A monochromatic color, for example, a white color can be converted to a full color of BGR, employing a color filter. Further, employing a color conversion filter, light color emitted from the organic EL device can be converted to another color or full color, where the λmax of the light emitted from the organic EL device is preferably not more than 480 nm.

One example of the display comprising the organic EL device of the invention will be explained below employing Figures.

Figure 4:
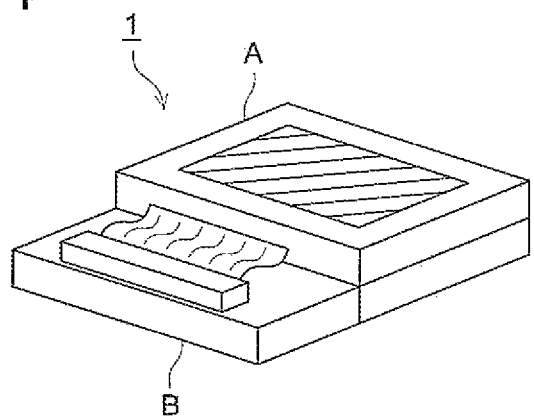
FIG. 4 is a schematic drawing of one example of a display comprising an organic EL device.

FIG. 4 is a schematic drawing of one example of a display comprising an organic EL device. FIG. 4 is a display such as that of a cellular phone, displaying image information due to light emission from the organic EL. A display 1 comprises a display section A having plural pixels and a control section B carrying out image scanning based on image information to display an image in the display section A. The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 5:
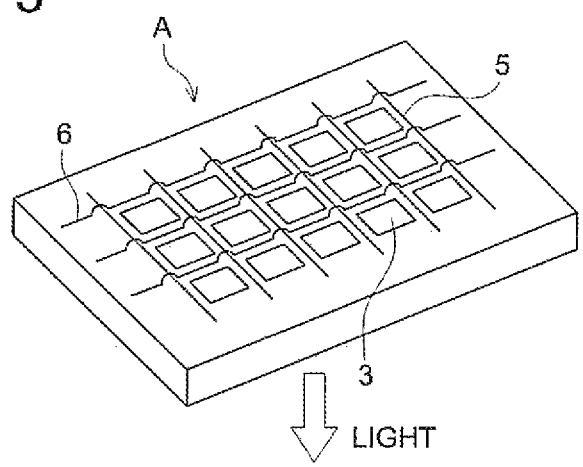
FIG. 5 is a schematic drawing of a display section.

FIG. 5 is a schematic drawing of a display section A. The display section A comprises a glass substrate, plural pixels 3, and a wiring section comprising plural scanning lines 5 and plural data lines 6. The main members of the display section A will be explained below. In FIG. 5, light from pixels 3 is emitted in the direction of an arrow. The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated). The plural pixels 3, when the scanning signal is applied from the scanning lines 5, receive the data signal from the data lines 6, and emit light corresponding to the image data received. Provision of red light emission pixels, green light emission pixels, and blue light emission pixels side by side on the same substrate can display a full color image.

Next, an emission process of pixels will be explained.

Figure 6:
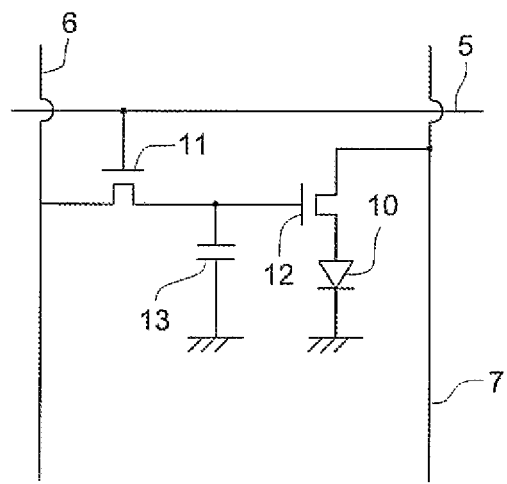
FIG. 6 is a schematic drawing of a pixel.

FIG. 6 is a schematic drawing of a pixel. The pixel comprises an organic EL device 10, a switching transistor 11, a driving transistor 12, and a capacitor 13. When a pixel with a red light emission organic EL device, a pixel with a green light emission organic EL device, and a pixel with a blue light emission organic EL device are provided side by side on the same substrate, a full color image can be displayed.

In FIG. 6, an image data signal is applied through the data lines 6 from the control section B (not illustrated) to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12. The capacitor 13 is charged according to the electric potential of the image data signal transmitted, and the driving transistor 12 is switched on. In the driving transistor 12, the drain is connected to an electric source line 7, and the source to an organic EL device 10. Current is supplied from the electric source line 7 to the organic EL device 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL device 10 continues until the next scanning signal is applied. When the next scanning signal is applied according the successive scanning, the driving transistor 12 works according to an electric potential of the next image data signal synchronized with the scanning signal, and light is emitted from the organic EL device 10. That is, light is emitted from the organic EL device 10 in each of the plural pixels 3 due to the switching transistor 11 as an active element and the driving transistor 12 each being provided in the organic EL device 10 of each of the plural pixels 3. This emission process is called an active matrix process.

Herein, light emission from the organic EL device 10 may be emission with plural gradations according to image signal data of multiple value having plural gradation potentials, and emission due to on-off according to a binary value of the image data signals. The electric potential of the capacitor 13 may be maintained till the next application of the scanning signal, or may be discharged immediately before the next scanning signal is applied.

In the invention, light emission may be carried out employing a passive matrix method as well as the active matrix method as described above. The passive matrix method is one in which light is emitted from the organic EL device according to the data signal only when the scanning signals are scanned.

Figure 7:
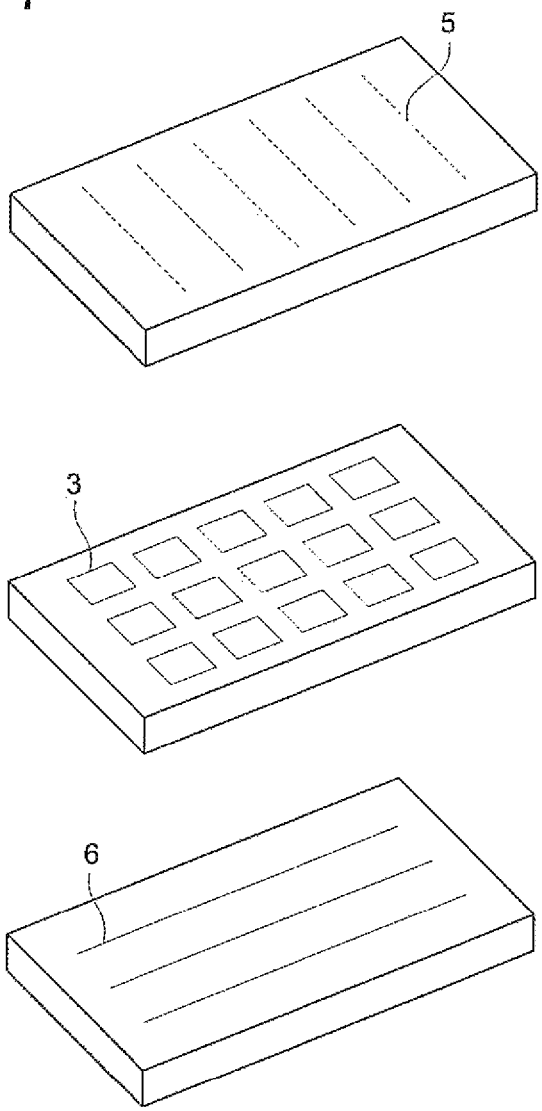
FIG. 7 is a schematic drawing of a full-color display employing a passive matrix.

FIG. 7 is a schematic drawing of a display employing a passive matrix method. In FIG. 7, pixels 3 are provided between the scanning lines 5 and the data lines 6, crossing with each other.

When scanning signal is applied to scanning line 5 according to successive scanning, pixel 3 connecting the scanning line 5 emits according to the image data signal. The passive matrix method has no active element in the pixel 3, which reduces manufacturing cost of a display.

The organic EL materials in the invention are applied to an organic EL device emitting a substantially white light as an illuminating device. Plural color lights emit from plural light emitting materials and are mixed to obtain a white light. As such an admixture of the plural color lights, there is an admixture of the emission maximum wavelength of each of three primary colors blue, green and red or an admixture of the emission maximum wavelength of each of complementary colors such as blue and yellow or blue-green and orange.

As a combination of light emitting materials to obtain plural emission colors, there is a combination of plural light emitting materials (emitting dopants) emitting plural phosphorescence or fluorescence or a combination of materials emitting phosphorescence or fluorescence and dyes, which are excited by light from the light emitting materials to emit light. In the white light emitting organic EL device regarding the invention, a combination of plural emitting dopants is preferred.

As a layer structure of the organic EL device to obtain plural emission colors, there is mentioned a single light emission layer containing plural emission dopants, plural light emission layers each containing a emission dopant having a different emission wavelength, a layer in which pixels emitting light with a different wavelength are formed in a matrix form.

In the white light-emitting organic EL device, patterning may be carried out through a metal mask or according to an ink-jet printing method. The patterning may be carried out only in electrodes, in both electrodes and light emission layer, or in all the layers of the organic EL device.

The light emitting materials used in the light emission layer are not specifically limited. For example, in a back light of a liquid crystal display, platinum complex in the invention or known light emitting materials are appropriately selected to suit the wavelength range corresponding to the CF (color filter) and mixed to obtain a white light.

The white light-emitting organic EL device can be applied to various light emission sources, an illuminating device such as a home lamp or a room lamp in a car, a lamp such as an exposure lamp and a backlight for a liquid crystal display, besides the displaying device as described above or a display. Further, the white light-emitting organic EL device can be applied to a backlight for a watch, a light source for boarding advertisement, a signal device, a light source for a photo memory medium, a light source for an electrophotographic copier, a light source for an optical communication instrument, and a light source for an optical sensor or home electric appliances requiring a displaying device.

EXAMPLES

The present invention will be explained in the following examples, but is not limited thereto. In the examples, "%" represents "% by weight", unless otherwise specified.

Example 1

Preparation of Organic EL Device Samples 1-1

A pattern was formed on a substrate (NA45, manufactured by NH Technoglass Co., Ltd.) composed of a glass plate (100 mm×100 mm×1.1 mm) and a 100 nm ITO (indium tin oxide) layer as an anode. Then the resulting transparent substrate having the ITO transparent electrode was subjected to ultrasonic washing in isopropyl alcohol and dried by a dry nitrogen gas and subjected to UV-ozone cleaning for 5 minutes. The thus obtained transparent substrate was fixed on a substrate holder of a vacuum deposition apparatus available on the market. Further, 200 mg of m-MTDATXA were put in a first resistive heating molybdenum boat, 200 mg of Compound 1 were put in a second resistive heating molybdenum boat, 200 mg of Compound 2 were put in a third resistive heating molybdenum boat, 100 mg of PL-26 were put in a fourth resistive heating molybdenum boat, 100 mg of Compound 3 were put in a fifth resistive heating molybdenum boat, and 200 mg of $Alq_3$ were put in a sixth resistive heating molybdenum boat.

The resulting boats were set in the vacuum deposition apparatus, and pressure in the vacuum tank was reduced to $4\times10^{-4}$ Pa. Then, the boat carrying m-MTDATXA being heated by supplying an electric current to the boat, m-MTDATXA was deposited onto the transparent substrate at a depositing speed of 0.1 nm/sec to form a hole transporting layer with a thickness of 15 nm.

After that, the boat carrying Compound 1, the boat carrying Compound 2 and the boat carrying PL-26 being heated by supplying an electric current to those boats, Compound 1 at a depositing speed of 0.1 nm/sec, Compound 2 at a depositing speed of 0.1 nm/sec and PL-26 at a depositing speed of 0.006 nm/sec were co-deposited onto the resulting hole transporting layer to form a light emission layer with a thickness of 30 nm. Subsequently, the boat carrying Compound 3 being heated by supplying an electric current to the boat, Compound 3 was deposited onto the resulting light emission layer at a depositing speed of 0.1 nm/sec to form a hole inhibiting layer with a thickness of 10 nm. Further, the boat carrying $Alq_3$ being heated by supplying an electric current to the boat, $Alq_3$ was deposited onto the resulting hole inhibiting layer at a depositing speed of 0.1 nm/sec to form an electron transporting layer with a thickness of 25 nm. The temperature of the substrate at the time of the deposition was room temperature.

After that, a 0.5 nm thick lithium fluoride layer was deposited as a cathode buffer layer, and a 110 nm thick aluminum layer were deposited on the resulting material to form a cathode. Thus, organic EL device sample 1-1 was prepared.

Preparation of Organic EL Device Samples 1-2 Through 1-7

Organic EL device samples 1-2 through 1-7 were prepared in the same manner as organic EL device sample 1-1 above, except that Compounds 1 and 2 as host compounds were changed to those as shown in Table 1 in the light emission layer.

TABLE 1

| Organic EL device sample No. | Host compounds 1 | 2 | Remarks |
|---|---|---|---|
| 1-1 | Compound 1 | Compound 2 | Inventive |
| 1-2 | Compound 1 | Compound 8 | Inventive |
| 1-3 | Compound 1 | TCTA | Inventive |
| 1-4 | Compound 1 | Compound 7 | Inventive |
| 1-5 | Compound 1 | Compound 5 | Inventive |
| 1-6 | Compound 1 | None | Comparative |
| 1-7 | Compound 2 | None | Comparative |

Preparation of Organic EL Device Samples 2-1

A pattern was formed on a substrate (NA45, manufactured by NH Technoglass Co., Ltd.) composed of a glass plate (100 mm×100 mm×1.1 mm) and a 100 nm ITO (indium tin oxide)

layer as an anode. Then the resulting transparent substrate having the ITO transparent electrode was subjected to ultrasonic washing in isopropyl alcohol and dried by a dry nitrogen gas and subjected to UV-ozone cleaning for 5 minutes. The thus obtained transparent substrate was fixed on a substrate holder of a vacuum deposition apparatus available on the market. Further, 200 mg of α-NPD were put in a first resistive heating molybdenum boat, 200 mg of Compound 1 were put in a second resistive heating molybdenum boat, 200 mg of Compound 4 were put in a third resistive heating molybdenum boat, 100 mg of PL-26 were put in a fourth resistive heating molybdenum boat, 200 mg of Compound 5 were put in a fifth resistive heating molybdenum boat, and 200 mg of BAlq were put in a sixth resistive heating molybdenum boat. The resulting boats were set in the vacuum deposition apparatus.

Subsequently, pressure in the vacuum tank was reduced to $4 \times 10^{-4}$ Pa. Then, the boat carrying α-NPD being heated by supplying an electric current to the boat, α-NPD was deposited onto the transparent substrate at a depositing speed of 0.1 nm/sec to form a hole transporting layer with a thickness of 100 nm.

After that, the boat carrying Compound 1, the boat carrying Compound 4 and the boat carrying PL-26 being heated by supplying an electric current to those boats, Compound 1 at a depositing speed of 0.1 nm/sec, Compound 4 at a depositing speed of 0.1 nm/sec and PL-26 at a depositing speed of 0.006 nm/sec were co-deposited onto the resulting hole transporting layer to form a light emission layer with a thickness of 40 nm. Subsequently, the boat carrying Compound 5 being heated by supplying an electric current to the boat, Compound 5 was deposited onto the resulting light emission layer at a depositing speed of 0.1 nm/sec to form a hole inhibiting layer with a thickness of 10 nm. Further, the boat carrying BAlq being heated by supplying an electric current to the boat, BAlq was deposited onto the resulting hole inhibiting layer at a depositing speed of 0.1 nm/sec to form an electron transporting layer with a thickness of 20 nm. The temperature of the substrate at the time of the deposition was room temperature.

After that, a 0.5 nm thick lithium fluoride layer was deposited as a cathode buffer layer, and a 110 nm thick aluminum layer were deposited on the resulting material to form a cathode. Thus, organic EL device sample 2-1 was prepared.

Preparation of Organic EL Device Samples 2-2 through 2-13

Organic EL device samples 2-2 through 2-13 were prepared in the same manner as organic EL device sample 2-1 above, except that Compounds 1 and 4 as host compounds were changed to those as shown in Table 2 in the light emission layer.

Figure 8:
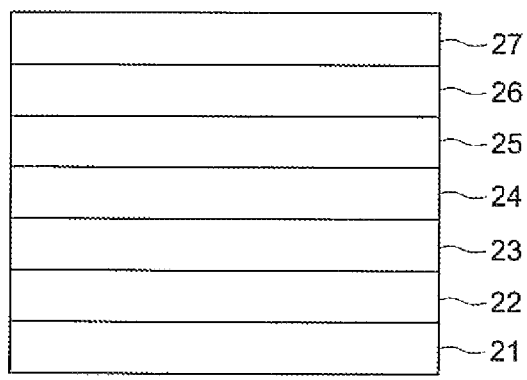
FIG. 8 is a schematic drawing of a multi-layered organic EL device.

The prepared multi-layered organic EL device is shown in FIG. 8.

TABLE 2

| Organic EL device sample No. | Host compounds 1 | 2 | Remarks |
|---|---|---|---|
| 2-1 | Compound 1 | Compound 4 | Inventive |
| 2-2 | Compound 4 | Compound 2 | Inventive |
| 2-3 | Compound 4 | Compound 8 | Inventive |
| 2-4 | Compound 4 | Compound 5 | Inventive |
| 2-5 | Compound 2 | Compound 8 | Inventive |
| 2-6 | Compound 4 | TCTA | Inventive |
| 2-7 | Compound 5 | TCTA | Inventive |
| 2-8 | Compound 8 | TCTA | Inventive |
| 2-9 | CBP | Compound 8 | Inventive |
| 2-10 | CBP | Compound 1 | Inventive |
| 2-11 | Compound 4 | None | Comparative |
| 2-12 | Compound 5 | None | Comparative |
| 2-13 | TAZ | CBP | Comparative |

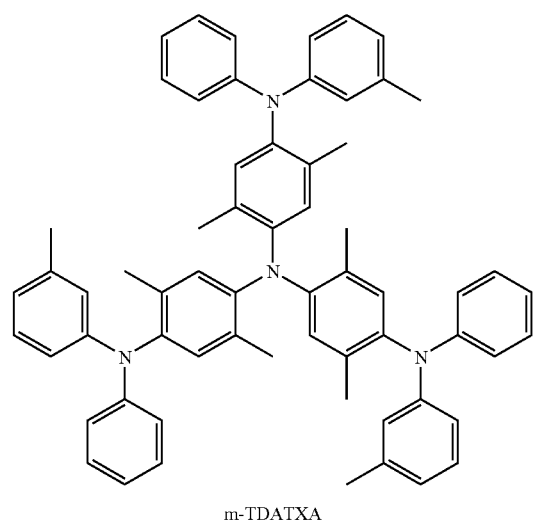

m-TDATXA

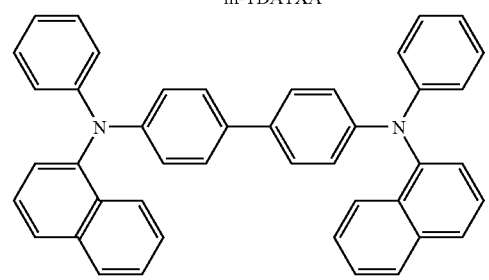

α-NPD

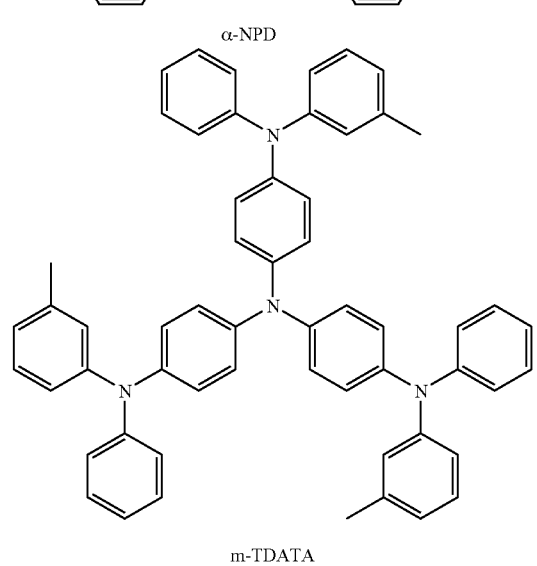

m-TDATA

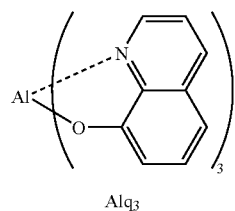
Alq3
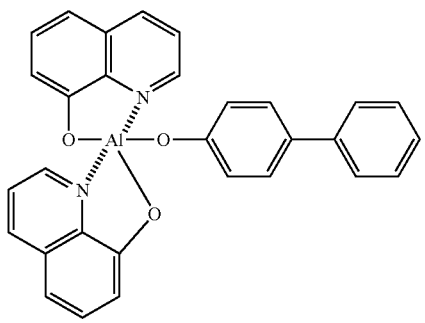
BAlq
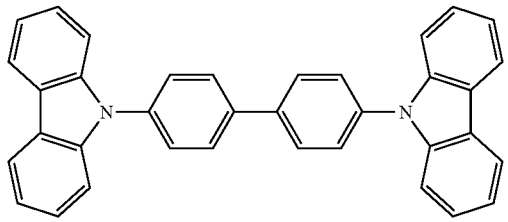
CBP
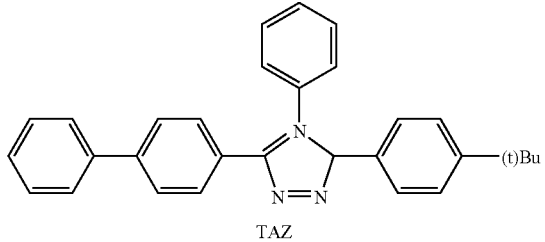
TAZ
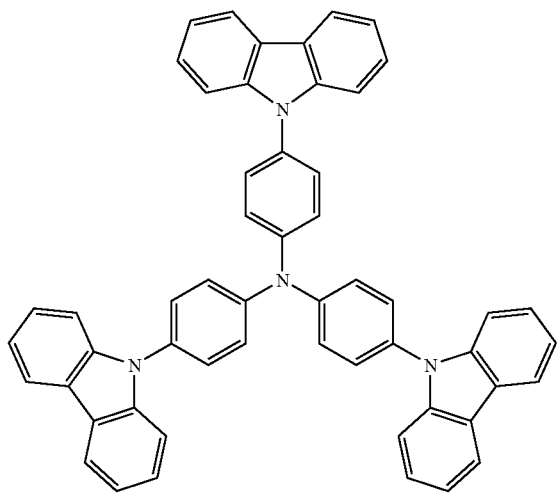
TCTA
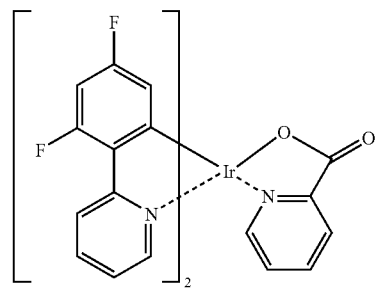
PL-26
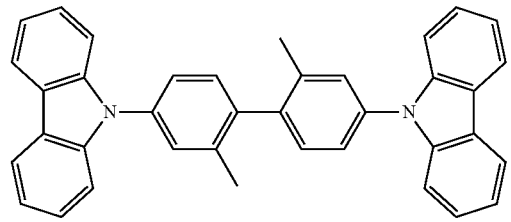
Compound 1
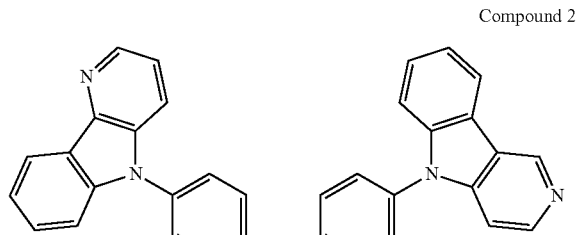
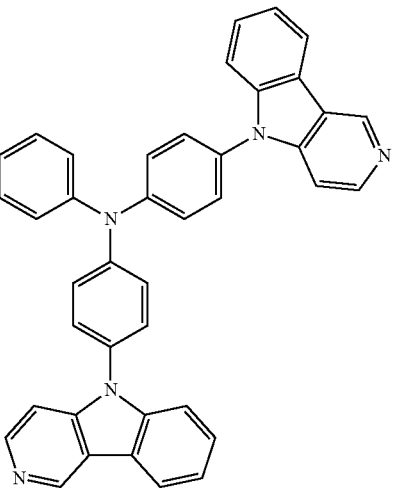
Compound 2
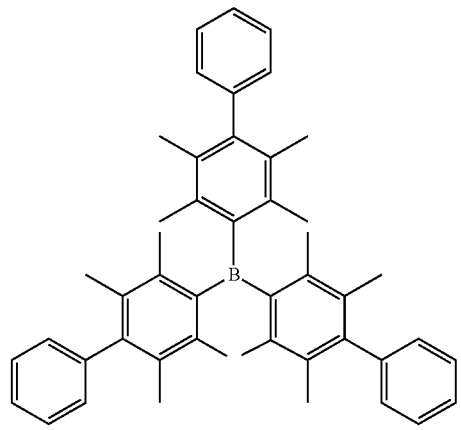
Compound 3

-continued

Compound 4

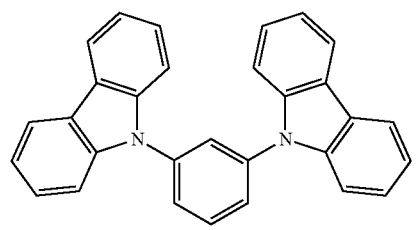

Compound 5

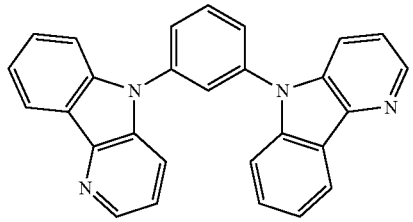

Compound 7

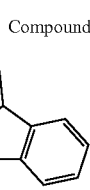
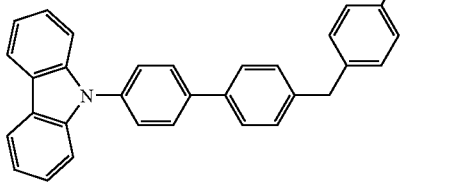

Compound 8

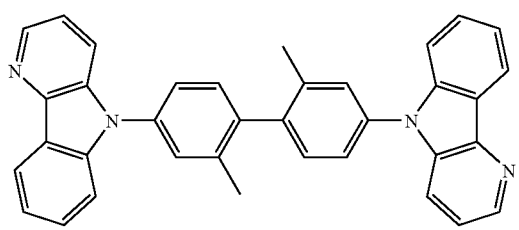

<Evaluation of Organic EL Device Samples>

The organic EL device samples obtained above were evaluated according to the following method.

<Emission Lifetime>

When a constant electric current of 2.5 mA/cm² was supplied to each sample, time required to reduce to half of luminance (initial luminance) at the beginning of emission was determined as a half-life period (τ0.5) and evaluated as a measure of emission lifetime. The half-life period of the samples was expressed by a relative value when the emission lifetime of organic EL device sample 1-6 was set at 100 in Table 3, and by a relative value when the emission lifetime of organic EL device sample 2-13 was set at 100 in Table 4. The Luminance was measured employing a spectral radiance meter CS-1000 (produced by Konica Minolta Co., Ltd.).

<Emission Luminance>

When a constant electric current of 2.5 mA/cm² was supplied to each sample, emission luminance was measured employing a spectral radiance meter CS-1000 (produced by Konica Minolta Sensing Co., Ltd.). The emission luminance of the samples was expressed by a relative value when the emission luminance of organic EL device sample 1-6 was set at 100 in Table 3, and by a relative value when the emission luminance of organic EL device sample 2-13 was set at 100 in Table 4.

<Driving Voltage>

Driving voltage of each sample was expressed by a relative value when driving voltage of organic EL device sample 1-6 providing a luminance of 50 (cd/cm²) was set at 100.

The results are shown in Tables 3 and 4.

TABLE 3

| Organic EL device sample No. | Emission lifetime (Relative value) | Emission luminance (Relative value) | Driving voltage (Relative value) | Remarks |
|---|---|---|---|---|
| 1-1 | 550 | 150 | 81 | Inventive |
| 1-2 | 670 | 200 | 80 | Inventive |
| 1-3 | 410 | 140 | 82 | Inventive |
| 1-4 | 300 | 120 | 83 | Inventive |
| 1-5 | 320 | 110 | 87 | Inventive |
| 1-6 | 100 | 100 | 100 | Comparative |
| 1-7 | 88 | 70 | 95 | Comparative |

TABLE 4

| Organic EL device sample No. | Emission lifetime (Relative value) | Emission luminance (Relative value) | Remarks |
|---|---|---|---|
| 2-1 | 300 | 370 | Inventive |
| 2-2 | 250 | 300 | Inventive |
| 2-3 | 270 | 300 | Inventive |
| 2-4 | 280 | 220 | Inventive |
| 2-5 | 230 | 230 | Inventive |
| 2-6 | 200 | 170 | Inventive |
| 2-7 | 210 | 180 | Inventive |
| 2-8 | 220 | 240 | Inventive |
| 2-9 | 150 | 140 | Inventive |
| 2-10 | 140 | 130 | Inventive |
| 2-11 | 80 | 48 | Comparative |
| 2-12 | 120 | 23 | Comparative |
| 2-13 | 100 | 100 | Comparative |

As is apparent from Tables 3 and 4, inventive organic EL device samples provide excellent emission luminance and emission lifetime and reduced driving voltage as compared with comparative organic EL device samples. Regarding emission from adjacent layer to a light emission layer, which has been hitherto problem, only a slight emission peak from m-MTDATXA or α-NPD in the organic EL device samples 1-6, 1-7, 2-9, and 2-11 through 2-13 was observed, but no emission from the compound in the hole transporting layer was observed in other organic EL device samples.

Example 2

Inventive: Preparation and Evaluation of Organic EL Device Sample 3-1

A 55 nm thick hole transporting layer 3, a 30 nm light emission layer 4, a 10 nm thick hole inhibiting layer comprised of BAlq, a 40 nm thick electron transporting layer 5 comprised of Alq₃, a 0.5 nm cathode buffer layer 6 comprised of lithium fluoride and a 100 nm cathode 7 comprised of Aluminum were provided on that order on the glass substrate 1 with an ITO transparent anode in a similar manner as Example 1. The hole transporting layer 3 was comprised of a 40 nm first hole transporting layer of m-MTDATA and a 15 nm second hole transporting layer of m-MTDATAX provided in that order. The light emission layer 4 was comprised of three layers, i.e., a 15 nm first layer doped with a blue phosphorescence-emitting phosphorescent compound PL-26 in an amount of 3% based on the total amount of Compounds 1 and 2, a 5 nm second layer of Compound 5 and a 10 nm third layer doped with a red phosphorescence-emitting phosphorescent compound PL-22 in an amount of 8% based on the total amount of Compounds 2 and 6, the first, second and third layers being provided in that order on the anode. When positive voltage of about not less than 3 V was applied to the ITO electrode of the organic EL device obtained above, emission occurred from each of the phosphorescent compounds and a white light emission with high emission luminance and high emission efficiency was obtained. When a constant electric current of 2.5 mA/cm$^2$ was supplied to the sample, luminance was 560 cd, and external quantum efficiency was at maximum about 15%, exhibiting an extremely high value.

Comparative: Preparation and Evaluation of Organic EL Device Sample 3-2

Organic EL device sample 3-2 was prepared in the same manner as organic EL device sample 3-1, except that Compound 2 as a host compound was not used. When a constant electric current of 2.5 mA/cm$^2$ was supplied to this sample, luminance was 340 cd, and external quantum efficiency was at maximum about 10%.

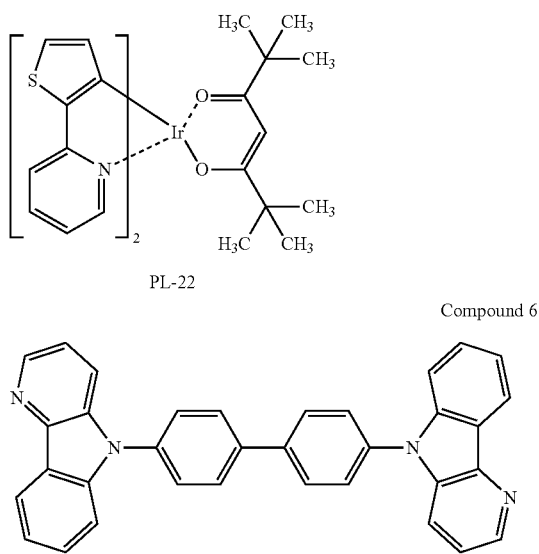

PL-22

Compound 6

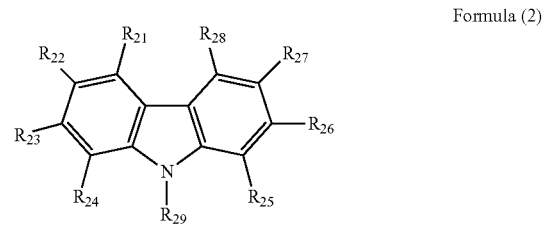

HOMO energy level, LUMO energy level and excited triplet energy of the host compounds used in Examples 1 and 2 are shown in Table 5.

TABLE 5

| Compounds used | Energy level (eV) | | |
|---|---|---|---|
| | HOMO | LUMO | Excited triplet energy |
| Compound 1 | 6.10 | 2.55 | 3.02 |
| Compound 2 | 5.75 | 2.39 | 2.86 |
| Compound 4 | 6.35 | 2.77 | 3.02 |
| Compound 5 | 6.37 | 2.87 | 2.95 |
| Compound 6 | 6.11 | 2.67 | 2.70 |

TABLE 5-continued

| Compounds used | Energy level (eV) | | |
|---|---|---|---|
| | HOMO | LUMO | Excited triplet energy |
| Compound 7 | 5.98 | 2.44 | 2.71 |
| Compound 8 | 6.33 | 2.88 | 2.95 |
| CBP | 6.05 | 2.53 | 2.67 |
| TAZ | 6.20 | 1.90 | 2.65 |
| TCTA | 5.70 | 2.30 | 2.87 |

Example 3

Figure 9:
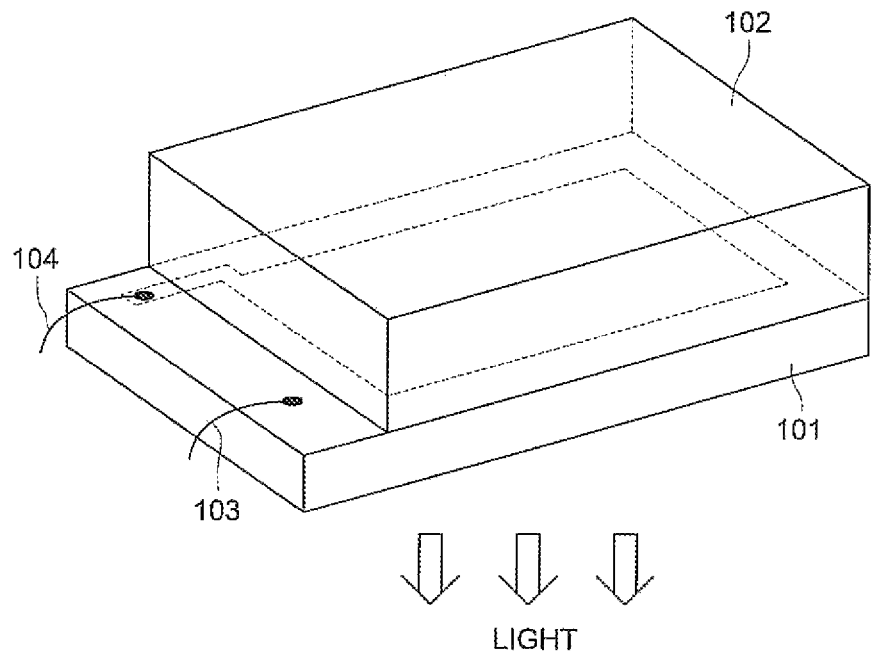
FIG. 9 is a schematic drawing of an illuminating device.
Figure 10:
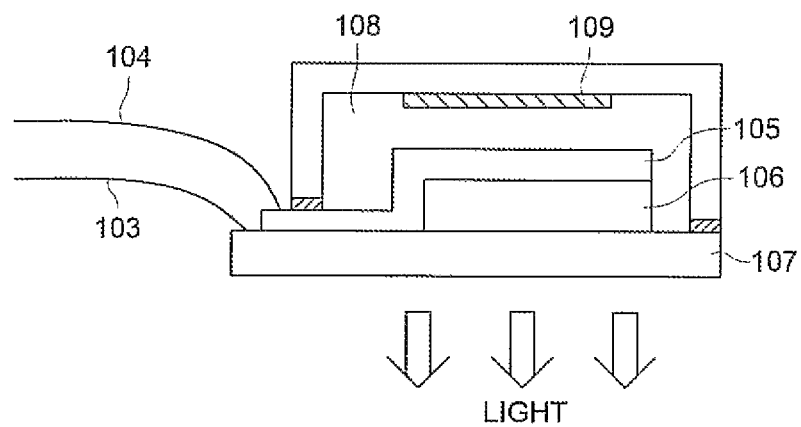
FIG. 10 is a sectional view of an illuminating device.

The non-emitting surface of organic EL device sample 3-1 obtained above was covered with a glass plate to obtain an illuminating device. The illuminating device can be used as a thin, white light-emitting illuminating device with high emission efficiency, high power efficiency and long emission lifetime. FIG. 9 is a schematic drawing of an illuminating device. FIG. 10 is a sectional view of an illuminating device.

The invention claimed is:

1. An organic electroluminescent device comprising:
a light emission layer containing a) two or more kinds of host compounds, wherein two of the two or more host compounds are Host A, and Host B, different from Host A, and b) Dopant D, wherein the dopant D emits blue light, and at least one of the Host A and Host B has an excited triplet energy of not less than 2.70 eV, and the Dopant D is a phosphorescent compound selected from an iridium complex comprising only bidentate ligands and a platinum complex comprising only bidentate ligands, each of Host A and Host B being selected from compounds having a partial structure of one to three carbazole rings represented by Formula (2) and compounds having a partial structure of one to three azacarbazole rings represented by Formula (3), Formula (2)

wherein $R_{21}$ through $R_{28}$ independently represent a hydrogen atom, an aromatic hydrocarbon group or an aromatic heterocyclic group; and $R_{29}$ represents a substituted or unsubstituted aromatic hydrocarbon group or aromatic heterocyclic group, the substituent of the substituted aromatic hydrocarbon group or aromatic heterocyclic group being selected from an alkyl group, a cycloalkyl group, an aromatic hydrocarbon ring group and an aromatic heterocyclic group,

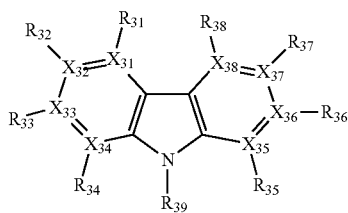

Formula (3)

wherein $X_{31}$ through $X_{38}$ independently represent a carbon atom or a nitrogen atom, provided that any one of $X_{31}$ through $X_{38}$ is a nitrogen atom; any of $R_{31}$ through $R_{38}$ bonding to the carbon atom independently represents a hydrogen atom, an aromatic hydrocarbon group or an aromatic heterocyclic group; any one of $R_{31}$ through $R_{38}$ bonding to the nitrogen atom represents a lone electron pair; and $R_{39}$ represents a substituted or unsubstituted aromatic hydrocarbon group or aromatic heterocyclic group, the substituent of the substituted aromatic hydrocarbon group or aromatic heterocyclic group being selected from an alkyl group, a cycloalkyl group, an aromatic hydrocarbon ring group and an aromatic heterocyclic group, wherein the following relationships are satisfied:

wherein HOMO-A and HOMO-B represent energy level of HOMO of Host A and energy level of HOMO of Host B, respectively; LUMO-A and LUMO-B represent energy level of LUMO of Host A and energy level of LUMO of Host B, respectively; and HOMO-D and LUMO-D represent energy level of HOMO of Dopant D and energy level LUMO of Dopant D, respectively.

2. The organic electroluminescent device of claim 1, wherein at least one of the two or more kinds of host compounds is selected from compounds having a partial structure of a diazacarbazole ring represented by Formula (4),

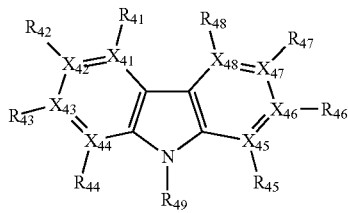

Formula (4)

wherein $X_{41}$ through $X_{48}$ independently represent a carbon atom or a nitrogen atom, provided that $X_{44}$ and $X_{45}$ are nitrogen atoms, $X_{43}$ and $X_{46}$ are nitrogen atoms $X_{42}$ and $X_{47}$ are nitrogen atoms or $X_{41}$ and $X_{48}$ are nitrogen atoms; any of $R_{41}$ through $R_{48}$ bonding to the carbon atom represents a hydrogen atom, an aromatic hydrocarbon group or an aromatic heterocyclic group; any of $R_{41}$ through $R_{48}$ bonding to the nitrogen atom represents a lone electron pair; and $R_{49}$ represents a substituted or unsubstituted aromatic hydrocarbon group or aromatic heterocyclic group, the substituent of the substituted aromatic hydrocarbon group or aromatic heterocyclic group being selected from an alkyl group, a cycloalkyl group, an aromatic hydrocarbon ring group and an aromatic heterocyclic group.

3. The organic electroluminescent device of claim 1, wherein each of the Host A and Host B is selected from compounds having a partial structure of a carbazole ring represented by Formula (2).

4. The organic electroluminescent device of claim 1, wherein the each of the Host A and Host B is selected from compounds having a partial structure of an azacarbazole ring represented by Formula (3).

5. The organic electroluminescent device of claim 1, wherein one of the Host A and Host B is selected from compounds having a partial structure of a carbazole ring represented by formula (2), and the other of the Host A and Host B is selected from compounds having a partial structure of an azacarbazole ring represented by Formula (3).

6. The organic electroluminescent device of claim 1, wherein the organic electroluminescent device emits a white light.

7. A display comprising the organic electroluminescent device of claim 1.

8. An illuminating device comprising the organic electroluminescent device of claim 1.

9. A display comprising a liquid crystal device as a displaying means and the illuminating device of claim 8.

10. The organic electroluminescent device of claim 1, wherein at least two of the two or more kinds of host compounds have an excited triplet energy of not less than 2.70 eV.

11. The organic electroluminescent device of claim 1, wherein the content in the light emission layer of the phosphorescent compound is 1 to 10% by weight of that of the host compound.

12. The organic electroluminescent device of claim 1, wherein the dopant D is an iridium complex.

13. The organic electroluminescent device of claim 1, wherein, in the substituent of the substituted aromatic hydrocarbon group or aromatic heterocyclic group of $R_{29}$ in formula (2) and of $R_{39}$ in formula (3), the alkyl group is selected from the group consisting of methyl group, an ethyl group, a propyl group, an isopropyl group, a t-butyl group, a pentyl group, a hexyl group, an octyl group, a dodecyl group, a tridecyl group, a tetradecyl group, and a pentadecyl group;

the cycloalkyl group is selected from the group consisting of a cyclopentyl group and a cyclohexyl group;

the aromatic hydrocarbon ring group is selected from the group consisting of a phenyl group, a p-chlorophenyl group, a mesityl group, a tolyl group, a xylyl group, a naphthyl group, an anthryl group, azulenyl group, acenaphthyl group, a fluorenyl group, a phenanthryl group, an indenyl group, a pyrenyl group, and a biphenyl group; and the aromatic heterocyclic group is selected from the group consisting of a pyridyl group, a pyrimidinyl group, a furyl group, a pyrrolyl group, an imidazolyl group, an benzoimidazolyl group, a pyrazolyl group, a triazolyl group, an oxazolyl group, a benzoxazolyl group, a thiazolyl group, an isooxazolyl group, an isothiazolyl group, a phthalazinyl group, a thienyl group, a quinolyl group, a benzofuryl group, a benzothienyl group, a dibenzothienyl group, an indonyl group, a carbazolyl group, a carbolinyl group, a diazacarbazolyl group, a quinoxalinyl group, a pyridazinyl group, a triazinyl group, a quinazolinyl group, and a phtharazinyl group.

14. The organic electroluminescent device of claim 2, wherein, in the substituent of the substituted aromatic hydrocarbon group or aromatic heterocyclic group of $R_{49}$ in formula (4), the alkyl group is selected from the group consisting of a methyl group, an ethyl group, a propyl group, an isopropyl group, a t-butyl group, a pentyl group, a hexyl group, an octyl group, a dodecyl group, a tridecyl group, a tetradecyl group, and a pentadecyl group;

the cycloalkyl group is selected from the group consisting of a cyclopentyl group and a cyclohexyl group;

the aromatic hydrocarbon ring group is selected from the group consisting of a phenyl group, a p-chlorophenyl group, a mesityl group, a tolyl group, a xylyl group, a naphthyl group, an anthryl group, azulenyl group, acenaphthyl group, a fluoroenyl group, a phenanthryl group, an indenyl group, a pyrenyl group, and a biphenyl group; and the aromatic heterocylcic group is selected from the group consisting of a pyridyl group, a pyrimidinyl group, a furyl group, a pyrrolyl group, an imidazolyl group, an benzoimidazolyl group, a pyrazolyl group, a triazolyl group, an oxazolyl group, a benzoxazolyl group, a thiazolyl group, an isooxazolyl group, an isothiazolyl group, a phthalazinyl group, a thienyl group, a quinolyl group, a benzofuryl group, a benzothienyl group, a dibenzothienyl group, an indonyl group, a carbazolyl group, a carbolinyl group, a diazacarbazolyl group, a quinoxalinyl group, a pyridazinyl group, a triazinyl group, a quinazolinyl group, and a phtharazinyl group.

15. The organic electroluminescent device of claim 10, emitting white light.

16. A display comprising the organic electroluminescent device of claim 10.

17. An illuminating device comprising the organic electroluminescent device of claim 10.

18. A display comprising a liquid crystal device as a displaying device and the illuminating device of claim 17.

* * * * *